United States Patent
Toba et al.

(10) Patent No.: US 9,263,291 B2
(45) Date of Patent: Feb. 16, 2016

(54) METHOD OF MANUFACTURING SEMICONDUCTOR DEVICE

(71) Applicant: Renesas Electronics Corporation, Kanagawa (JP)

(72) Inventors: Koichi Toba, Kanagawa (JP); Hiraku Chakihara, Kanagawa (JP); Yoshiyuki Kawashima, Kanagawa (JP); Kentaro Saito, Kanagawa (JP); Takashi Hashimoto, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 133 days.

(21) Appl. No.: 14/079,120

(22) Filed: Nov. 13, 2013

(65) Prior Publication Data

US 2014/0242796 A1    Aug. 28, 2014

(30) Foreign Application Priority Data

Feb. 28, 2013    (JP) .................. 2013-040061

(51) Int. Cl.
*H01L 21/44*  (2006.01)
*H01L 21/3105* (2006.01)
*H01L 27/092* (2006.01)
*H01L 29/423* (2006.01)
*H01L 29/66* (2006.01)
*H01L 27/115* (2006.01)
*H01L 21/8234* (2006.01)

(52) U.S. Cl.
CPC .... *H01L 21/3105* (2013.01); *H01L 21/823412* (2013.01); *H01L 21/823468* (2013.01); *H01L 27/0922* (2013.01); *H01L 27/1157* (2013.01); *H01L 27/11573* (2013.01); *H01L 29/4234* (2013.01); *H01L 29/42324* (2013.01); *H01L 29/66825* (2013.01); *H01L 29/66833* (2013.01)

(58) Field of Classification Search
CPC .................................. H01L 27/0922
See application file for complete search history.

(56) References Cited

U.S. PATENT DOCUMENTS

| 7,843,013 | B2 | 11/2010 | Nakagawa et al. |
| 7,915,131 | B2 | 3/2011 | Nakagawa et al. |
| 8,354,631 | B2 | 1/2013 | Tateshita |
| 2008/0026572 | A1* | 1/2008 | Wirbeleit et al. ............ 438/663 |
| 2008/0237723 | A1* | 10/2008 | Wei et al. ..................... 257/368 |
| 2008/0280391 | A1* | 11/2008 | Shin et al. .................... 438/104 |

(Continued)

FOREIGN PATENT DOCUMENTS

| JP | 2009-032962 | 2/2009 |
| JP | 2009-252841 | 10/2009 |
| JP | 2010-205951 | 9/2010 |

*Primary Examiner* — Angel Roman
(74) *Attorney, Agent, or Firm* — Young & Thompson

(57) ABSTRACT

To improve a semiconductor device having a nonvolatile memory. a first MISFET, a second MISFET, and a memory cell are formed, and a stopper film made of a silicon oxide film is formed thereover. Then, over the stopper film, a stress application film made of a silicon nitride film is formed, and the stress application film over the second MISFET and the memory cell is removed. Thereafter, heat treatment is performed to apply a stress to the first MISFET. Thus, a SMT is not applied to each of elements, but is applied selectively. This can reduce the degree of degradation of the second MISFET due to H (hydrogen) in the silicon nitride film forming the stress application film. This can also reduce the degree of degradation of the characteristics of the memory cell due to the H (hydrogen) in the silicon nitride film forming the stress application film.

10 Claims, 100 Drawing Sheets

(56) References Cited

U.S. PATENT DOCUMENTS

| | | |
|---|---|---|
| 2009/0026551 A1 | 1/2009 | Nakagawa et al. |
| 2009/0250744 A1 | 10/2009 | Cho |
| 2010/0224766 A1 | 9/2010 | Tateshita |
| 2011/0039379 A1 | 2/2011 | Nakagawa et al. |
| 2012/0119299 A1* | 5/2012 | Iizuka et al. .................. 257/368 |
| 2012/0156839 A1* | 6/2012 | Scheiper et al. .............. 438/229 |
| 2013/0105870 A1 | 5/2013 | Tateshita |

* cited by examiner

|  | CURRENT | HC |
|---|---|---|
| LT | INCREASED | DETERIORATED |
| HT | UNCHANGED | DETERIORATED |

|  | CURRENT | HC |
|---|---|---|
| LT | INCREASED | DETERIORATED |
| MC | UNCHANGED | DETERIORATED |

FIG. 62

|  | CURRENT | HC |
|---|---|---|
| LT | INCREASED | DETERIORATED |
| HT | UNCHANGED | DETERIORATED |
| MC | UNCHANGED | DETERIORATED |

METHOD OF MANUFACTURING SEMICONDUCTOR DEVICE

CROSS-REFERENCE TO RELATED APPLICATIONS

The disclosure of Japanese Patent Application No. 2013-040061 filed on Feb. 28, 2013 including the specification, drawings and abstract is incorporated herein by reference in its entirety.

BACKGROUND

The present invention relates to a method of manufacturing a semiconductor device which can be used appropriately as a method of manufacturing a semiconductor device having, e.g., a MISFET and a nonvolatile memory cell.

Examples of a technique which improves the characteristics of a MISFET includes a SMT (Stress Memorization Technique). The SMT is a technique which applies a stress to a channel from over a gate electrode to cause the crystal in the channel to strain and improve the mobility of carriers in the channel.

For example, in Japanese Unexamined Patent Publication No. 2010-205951 (Patent Document 1), a solid-stage image sensing device is disclosed in which a first stress liner film (81) is formed so as to cover only an NMOS transistor (50N) from thereabove in a peripheral circuit portion (15), while a second stress liner film (82) is formed so as to cover only a PMOS transistor (52P) from thereabove (see [0036] to [0039], and FIG. 2). By thus not forming a stress liner film over a pixel portion (13), the occurrence of noise resulting from the stress liner film is suppressed.

In Japanese Unexamined Patent Publication No. 2009-32962 (Patent Document 2), it is disclosed that, with regard to the relationship between a SMT film and the activation rate of B (boron) during anneal, hydrogen in a silicon nitride film reduces the activation rate of B (see [0006] and [0007]). Additionally, a technique is also disclosed which provides a stressor film (24) in an n-type MOS transistor region (A) and does not provide the stressor film (24) in p-type MOS transistor regions (B and C) to thus improve the current driving ability of the n-type MOS transistor without degrading the current driving ability of the p-type MOS transistor (see [0024] to [0026], [0034], [0035], FIG. 1, and the like).

In Japanese Unexamined Patent Publication No. 2009-252841 (Patent Document 3), it is disclosed that the diffusion of hydrogen into the gate insulating film of a transistor degrades the reliability of a device. Additionally, a technique is also disclosed which suppresses the diffusion of hydrogen atoms from an interlayer insulating film into a memory cell to improve the reliability of the operation of the memory cell.

Note that, in the present section, the parenthesized numbers are the reference numerals and the like shown in the documents.

RELATED ART DOCUMENTS

Patent Documents

[Patent Document 1]
Japanese Unexamined Patent Publication No. 2010-205951
[Patent Document 2]
Japanese Unexamined Patent Publication No. 2009-32962
[Patent Document 3]
Japanese Unexamined Patent Publication No. 2009-252841

SUMMARY

The present inventors have been engaged in the research and development of a semiconductor device having a MISFET and studied improvements in the characteristics of a semiconductor device using the SMT.

The MISFET provided in the semiconductor device comes in various configurations depending on applications. The MISFET may be mounted together with an element in another form such as a nonvolatile memory in mixed relation. The study conducted by the present inventors has revealed that, for general improvements in the characteristics of the semiconductor device, mere application of the SMT is insufficient and there is a room for improvement in a portion to which the SMT is applied.

Other problems and novel features of the present invention will become apparent from a statement in the present specification and the accompanying drawings.

The following is a brief description of the outline of a configuration shown in a representative embodiment disclosed in the present application.

A method of manufacturing a semiconductor device shown in the representative embodiment disclosed in the present application is a method of manufacturing a semiconductor device having a plurality of elements and includes the step of applying a SMT to a predetermined one of the plurality of elements.

In accordance with the method of manufacturing the semiconductor device shown in the representative embodiment disclosed in the present application, a semiconductor device having excellent characteristics can be manufactured.

BRIEF DESCRIPTION OF THE DRAWINGS

FIG. 62 is a view showing the characteristics of the MISFET (LT), the MISFET (HT), and the memory cell MC after the SMT has been applied thereto;

DETAILED DESCRIPTION

Figure 1:
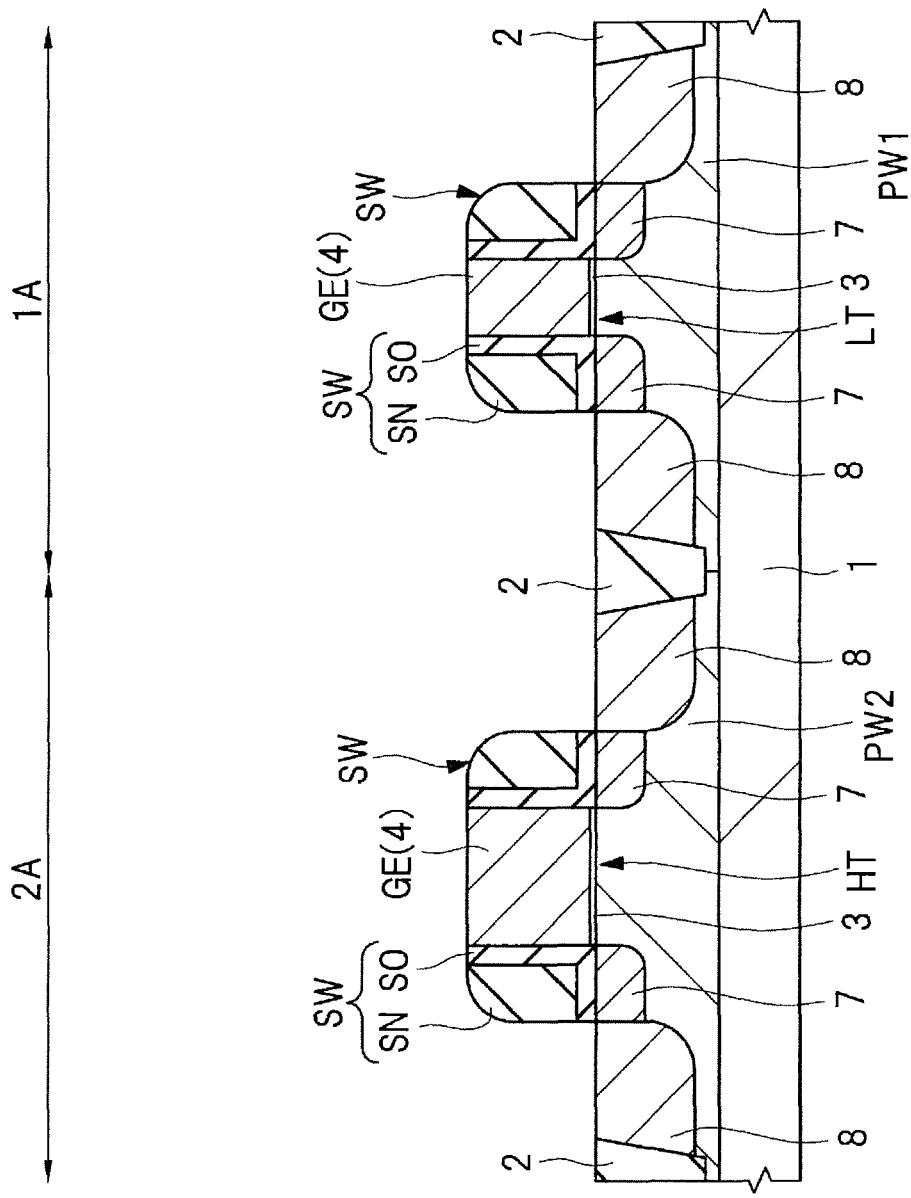
FIG. 1 is a main-portion cross-sectional view showing a configuration of a semiconductor device in Embodiment 1.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, application examples, details, supplementary explanation, and so forth of part or the whole of the others. Also in the following embodiments, when the number and the like (including the number, numerical value, amount, range, and the like) of elements are mentioned, they are not limited to specific numbers unless particularly explicitly described otherwise or unless they are obviously limited to the specific numbers in principle. The number and the like of the elements may be not less than or not more than the specific numbers.

Also in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing number and the like (including the number, numerical value, amount, range, and the like).

Hereinbelow, the embodiments of the present invention will be described in detail based on the drawings. Note that, throughout all the drawings for illustrating the embodiments, members having the same functions are designated by the same or associated reference numerals, and a repeated description thereof is omitted. When there are a plurality of similar members (portions), marks may be added to general reference numerals to show individual or specific portions. In the following embodiments, a description of the same or like parts will not be repeated in principle unless particularly necessary.

In the drawings used in the embodiments, hatching may be omitted even in a cross-sectional view for improved clarity of illustration.

In a cross-sectional view, the sizes of individual portions do not correspond to those in a real device. For improved clarity of illustration, a specific portion may be shown in a relatively large size.

(Embodiment 1)

Referring now to the drawings, a description will be given of a structure of a semiconductor device in the present embodiment.

—Description of Structure—

FIG. 1 is a main-portion cross-sectional view showing a configuration of the semiconductor device in the present embodiment. The semiconductor device in the present embodiment has a MISFET (LT), and a MISFET (HT).

The MISFET (LT) is a MISFET formed in a core MIS formation region 1A and having a gate length smaller than that of the MISFET (HT). The gate length of the MISFET (LT) is, e.g., about 40 nm when the manufacturing process thereof belongs to a 40-nm rule generation. Such a MISFET having a relatively small gate length is used in, e.g., a circuit (referred to also as a core circuit or peripheral circuit) for driving another element such as a memory MC or the like. The drive voltage of the MISFET (LT) tends to be lower than that of the MISFET (HT). The insulating film 3 of the MISFET (LT) may be thinner than the insulating film 3 of the MISFET (HT).

On the other hand, the MISFET (HT) is a MISFET formed in an I/O MIS formation region 2A and having the gate length larger than that of the MISFET (LT). The gate length of the MISFET (HT) is, e.g., about 1000 nm. Such a MISFET having a relatively large gate length is used in, an input/output circuit (referred to also as an I/O circuit) or the like. The drive voltage of the MISFET (HT) tends to be higher than that of the MISFET (LT). The insulating film 3 of the MISFET (HT) may be thicker than the insulating film 3 of the MISFET (LT).

The MISFET (LT) has a gate electrode GE disposed over a semiconductor substrate 1 (p-type well PW1) via the insulating film 3, and source/drain regions disposed in the semiconductor substrate 1 (p-type well PW1) located on both sides of the gate electrode GE. Over the side wall portions of the gate electrode GE, side wall insulating films (sidewalls or sidewall spacers) SW each made of an insulating film are formed. Here, each of the side wall insulating films SW is formed of a laminated body of a silicon oxide film SO and a silicon nitride film SN. Each of the source/drain regions has an LDD structure and includes an $n^+$-type semiconductor region 8, and an $n^-$-type semiconductor region 7. The $n^-$-type semiconductor regions 7 are formed by self-alignment with the side walls of the gate electrode GE. The $n^+$-type semiconductor regions 8 are formed by self-alignment with the side surfaces of the side wall insulating films SW to have junction depths deeper than those of the $n^-$-type semiconductor regions 7 and impurity concentrations higher than those of the $n^-$-type semiconductor regions 7.

The MISFET (HT) has the gate electrode GE disposed over the semiconductor substrate 1 (p-type well PW2) via the insulating film 3, and source/drain regions disposed in the semiconductor substrate 1 (p-type well PW2) located on both sides of the gate electrode GE. Over the side wall portions of the gate electrode GE, the side wall insulating films SW each made of an insulating film are formed. Here, each of the side wall insulating films SW is formed of the laminated body of the silicon oxide film SO and the silicon nitride film SN. Each of the source/drain regions has the LDD structure and includes the n$^+$-type semiconductor region 8, and the n$^-$-type semiconductor region 7. The n$^-$-type semiconductor regions 7 are formed by self-alignment with the side walls of the gate electrode GE. The n$^+$-type semiconductor regions 8 are formed by self-alignment with the side surfaces of the side wall insulating films SW to have junction depths deeper than those of the n$^-$-type semiconductor regions 7 and impurity concentrations higher than those of the n$^-$-type semiconductor regions 7.

Here, in the present embodiment (FIG. 1), to the channel region of the MISFET (LT), a stress is applied using an SMT while, to the channel region of the MISFET (HT), no stress is applied.

The SMT is a technique which applies a stress from the upper portion and side surface portions of the gate electrode of a MISFET to the channel region thereof to cause the crystal in the channel region to strain and thus improve the mobility of carriers in the channel region.

Specifically, a stress application film is formed over the upper portion and side surface portions of each of the gate electrodes and subjected to heat treatment. By the heat treatment, a stress (compressive stress or tensile stress) is applied to the stress application film. The stress reaches the channel region under the gate electrode GE to change a crystal spacing in the channel region and thus allow an improvement in the mobility of carriers. The stress applied to the channel region is maintained even after the stress application film is removed.

As a result, in the present embodiment (FIG. 1), the crystal spacing in the channel region of the MISFET (LT) has been changed by the SMT. On the other hand, since the SMT is not applied to the MISFET (HT), there is no change due to the SMT in the crystal spacing in the channel region of the MISFET (HT). Thus, in the semiconductor device of the present embodiment, the SMT is not applied to each of the elements, but is selectively applied to be able to generally improve the characteristics of the semiconductor device. A detailed description will be further given in the following "Description of Manufacturing Method" section.

—Description of Manufacturing Method—

Next, referring to FIGS. 2 to 14, a method of manufacturing the semiconductor device in the present embodiment will be described. FIGS. 2 to 14 are main-portion cross-sectional views showing the manufacturing process of the semiconductor device in the present embodiment.

<Process of Forming MISFET (LT) and MISFET (HT)>

First, a description will be given of an example of the process of forming the MISFET (LT) and the MISFET (HT).

Figure 2:
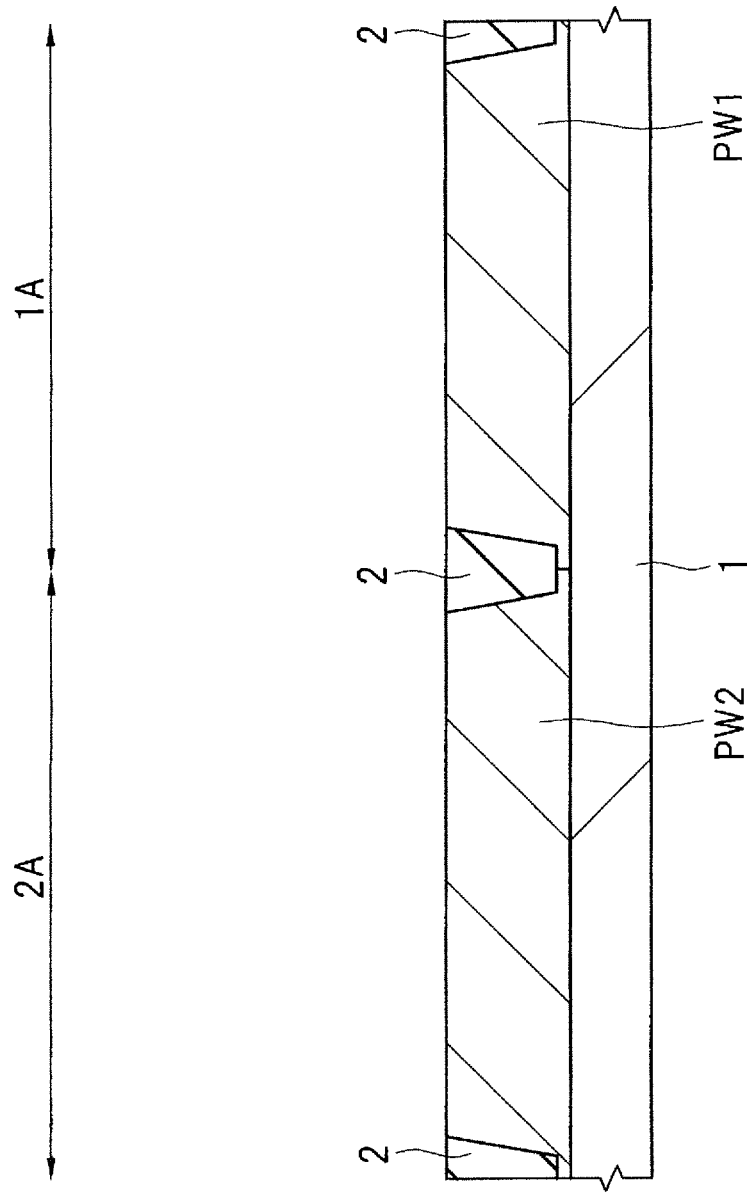
FIG. 2 is a main-portion cross-sectional view showing the manufacturing process of the semiconductor device in Embodiment 1.

As shown in FIG. 2, as the semiconductor substrate 1, a silicon substrate made of p-type monocrystalline silicon having a specific resistance of, e.g., about 1 to 10 Ωcm is provided. Note that the semiconductor substrate 1 other than the silicon substrate may also be used.

Next, in the main surface of the semiconductor substrate 1, an isolation region 2 is formed. For example, in the semiconductor substrate 1, an isolation trench is formed and an insulating film such as a silicon oxide film is embedded in the isolation trench to form the isolation region 2.

Then, in the core MIS formation region 1A of the semiconductor substrate 1, the p-type well PW1 is formed and, in the I/O MIS formation region 2A thereof, the p-type well PW2 is formed. The p-type wells PW1 and PW2 are formed by ion-implanting a p-type impurity (such as, e.g., boron (B)).

Figure 3:
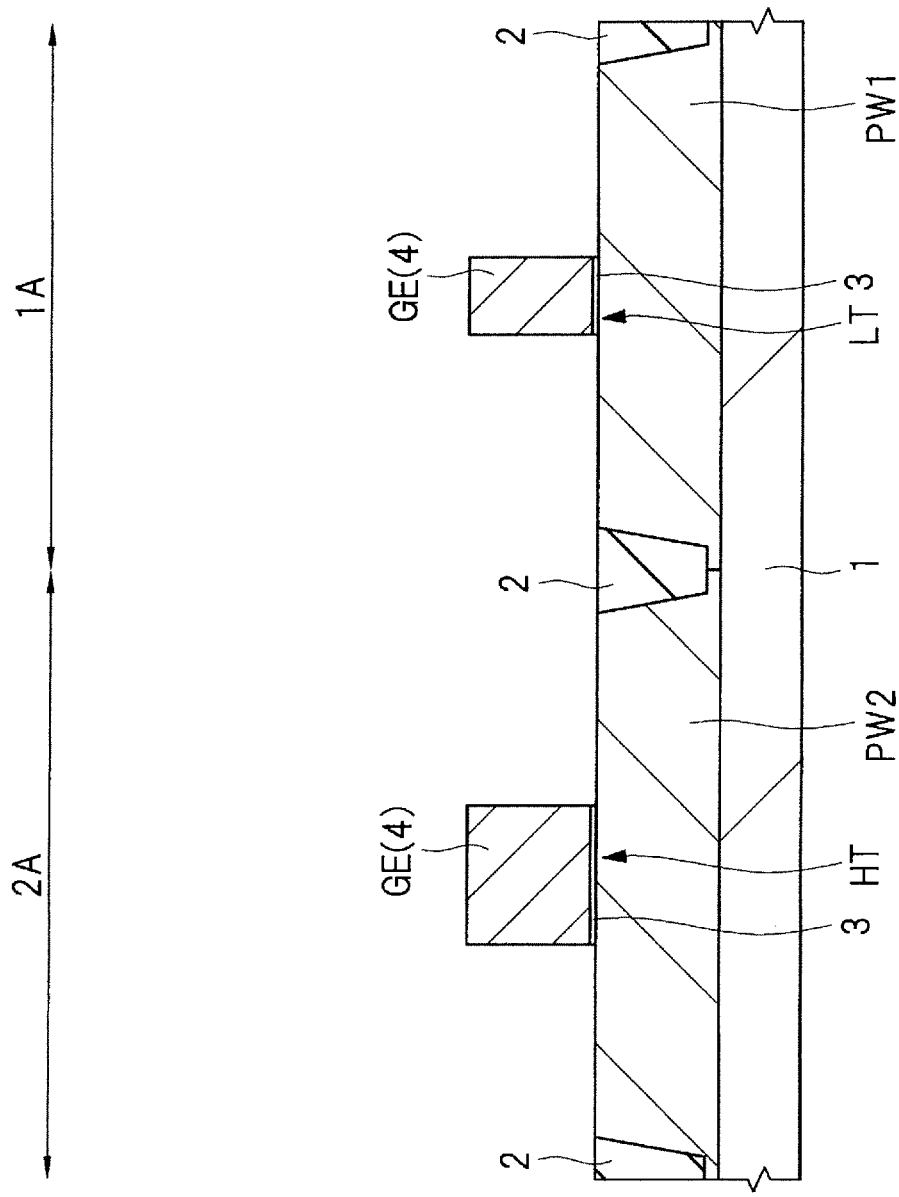
FIG. 3 is a main-portion cross-sectional view showing the manufacturing process of the semiconductor device in Embodiment 1, which is subsequent to FIG. 2.

Next, by diluted hydrofluoric acid cleaning or the like, the surface of the semiconductor substrate 1 (p-type wells PW1 and PW2) is cleaned. Then, as shown in FIG. 3, over the main surface of the semiconductor substrate 1 (surfaces of the p-type wells PW1 and PW2), e.g., a silicon oxide film is formed as the insulating film (gate insulating film) 3 by a thermal oxidation method. As the insulating film 3, instead of the silicon oxide film, another insulating film such as a silicon oxynitride film may also be used. Besides, a metal oxide film having a dielectric constant higher than that of a silicon nitride film such as a hafnium oxide film, an aluminum oxide film (alumina), or a tantalum oxide film and a laminated film of an oxide film or the like and the metal oxide film may also be formed. Instead of the thermal oxidation method, a CVD (Chemical Vapor Deposition which is chemical vapor phase growth) method may also be used to form the insulating film 3. The insulating film (gate insulating film) 3 over the core MIS formation region 1A and the insulating film (gate insulating film) 3 over the I/O MIS formation region 2A may also be formed of different types of films or to different thicknesses.

Then, over the entire surface of the semiconductor substrate 1, a silicon film 4 is formed as a conductive film (conductor film). As the silicon film 4, e.g., a polycrystalline silicon film is formed using a CVD method or the like. As the silicon film 4, an amorphous silicon film may also be deposited and subjected to heat treatment to be crystallized (crystallization treatment). The silicon film 4 serves as the gate electrode GE of the MISFET (LT) in the core MIS formation region 1A, while serving as the gate electrode GE of the MISFET (HT) in the I/O MIS formation region 2A.

Next, an impurity is introduced into the silicon film 4. For example, into the silicon film 4, an n-type impurity such as phosphorus is implanted.

Next, over the regions of the silicon film 4 where the gate electrode GE of the MISFET (LT) is to be formed and where the gate electrode GE of the MISFET (HT) is to be formed, a photoresist film (not shown) is formed using a photolithographic method and, using the photoresist film as a mask, the silicon film 4 is etched. Thereafter, by removing the photoresist film (not shown) by ashing or the like, the gate electrode GE of the MISFET (LT) is formed in the core MIS formation region 1A and the gate electrode GE of the MISFET (HT) is formed in the I/O MIS formation region 2A, as shown in FIG. 3. The gate length of the gate electrode GE of the MISFET (LT) is, e.g., about 40 nm, while the gate length of the gate electrode GE of the MISFET (HT) is, e.g., about 1000 nm.

The insulating films 3 remaining under the respective gate electrodes GE serve as the gate insulating films of the individual MISFETs (LT and HT). Note that the insulating film 3 except for the portion thereof covered with the gate electrodes GE may also be removed during the formation of the foregoing gate electrodes GE or by the subsequent patterning process or the like.

Figure 4:
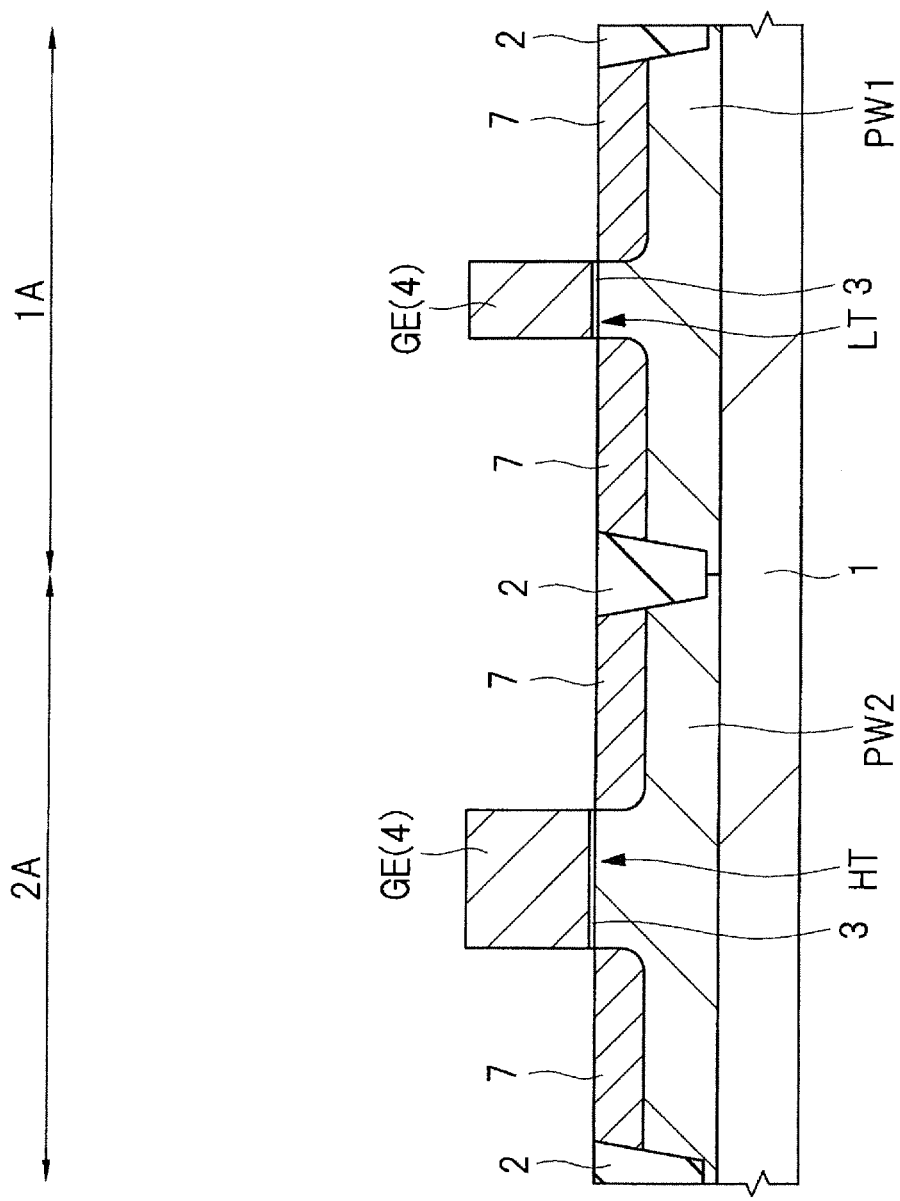
FIG. 4 is a main-portion cross-sectional view showing the manufacturing process of the semiconductor device in Embodiment 1, which is subsequent to FIG. 3.

Next, in the core MIS formation region 1A and the I/O MIS formation region 2A, into the semiconductor substrate 1 (p-type wells PW1 and PW2) located on both sides of the gate electrodes GE, an n-type impurity such as arsenic (As) or phosphorus (P) is implanted to form the n$^-$-type semiconductor regions 7 (FIG. 4). At this time, the n$^-$-type semiconductor regions 7 are formed by self-alignment with the side walls of the gate electrodes GE. The n$^-$-type semiconductor regions 7 in the core MIS formation region 1A and the n$^-$-type semiconductor regions 7 in the I/O MIS formation region 2A may also be formed to have different impurity concentrations, and different junction depths.

Figure 5:
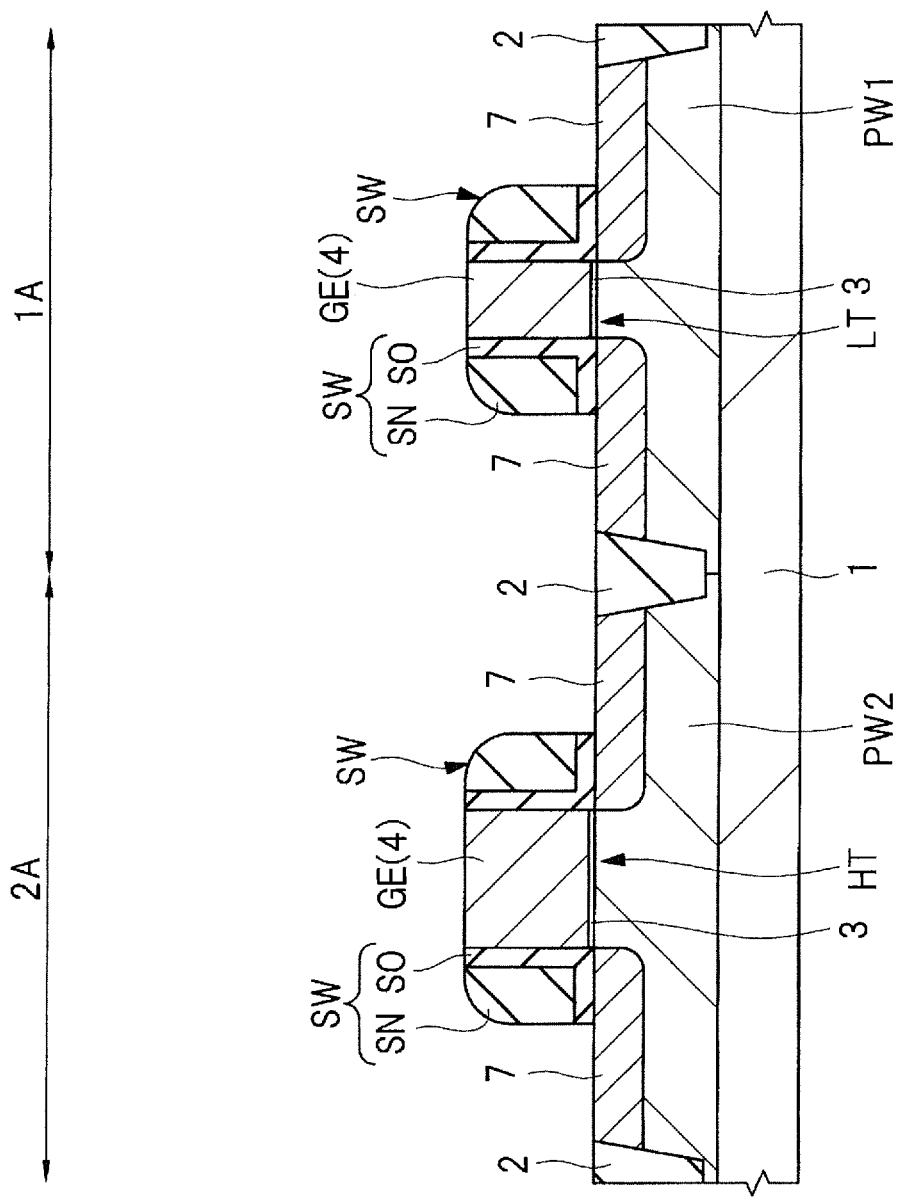
FIG. 5 is a main-portion cross-sectional view showing the manufacturing process of the semiconductor device in Embodiment 1, which is subsequent to FIG. 4.

Next, as shown in FIG. 5, in the core MIS formation region 1A and the I/O MIS formation region 2A, over the side wall portions of the gate electrodes GE, the side wall insulating films SW are formed. For example, by depositing the silicon oxide film SO over the entire main surface of the semiconductor substrate 1 and further depositing the silicon nitride film SN thereover, an insulating film made of a laminated film of the silicon oxide film SO and the silicon nitride film SN is formed. By etching back the insulating film, the side wall insulating films. SW are formed over the side wall portions of the gate electrodes GE. As the side wall insulating films SW, instead of the laminated film of the silicon oxide film and the silicon nitride film, an insulating film such as a single-layer silicon oxide film or a single-layer silicon nitride film may also be used.

Figure 6:
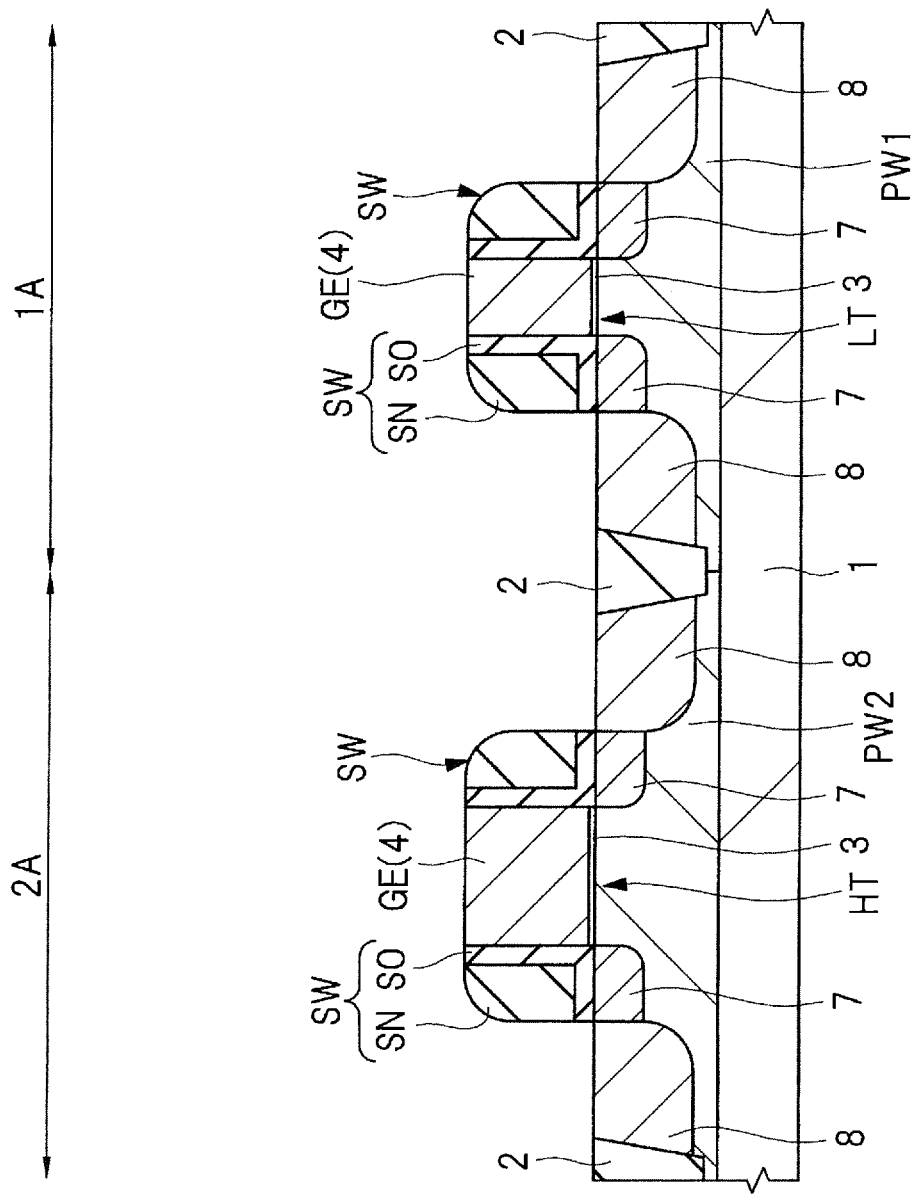
FIG. 6 is a main-portion cross-sectional view showing the manufacturing process of the semiconductor device in Embodiment 1, which is subsequent to FIG. 5.

Next, as shown in FIG. 6, in the core MIS formation region 1A and the I/O MIS formation region 2A, an n-type impurity such as arsenic (As) or phosphorus (P) is implanted into the semiconductor substrate 1 (p-type wells PW1 and PW2) on both sides of the gate electrodes GE to form the $n^+$-type semiconductor regions 8. At this time, the $n^+$-type semiconductor regions 8 are formed by self-alignment with the side wall insulating films SW over the side wall portions of the gate electrodes GE. The $n^+$-type semiconductor regions 8 are formed as semiconductor regions having impurity concentrations higher than those of the $n^-$-type semiconductor regions 7 and having junction depths deeper than those of the $n^-$-type semiconductor regions 7. The $n^+$-type semiconductor regions 8 in the core MIS formation region 1A and the $n^+$-type semiconductor regions 8 in the I/O MIS formation region 2A may also be formed to have different impurity concentrations, and different junction depths.

By the foregoing process, in the core MIS formation region 1A and the I/O MIS formation region 2A, the source/drain regions each having the LDD structure including the $n^-$-type semiconductor region 7, and the $n^+$-type semiconductor region 8 are formed.

Next, heat treatment (activation treatment) for activating the impurities introduced into the source/drain regions (7 and 8) is performed.

By the foregoing process, the MISFET (LT) is formed in the core MIS formation region 1A, and MISFET (HT) is formed in the I/O MIS formation region 2A (FIG. 6).

Note that the process of forming the MISFET (LT), and the MISFET (HT) is not limited to the foregoing process.

<SMT and Silicide Process>

Figure 7:
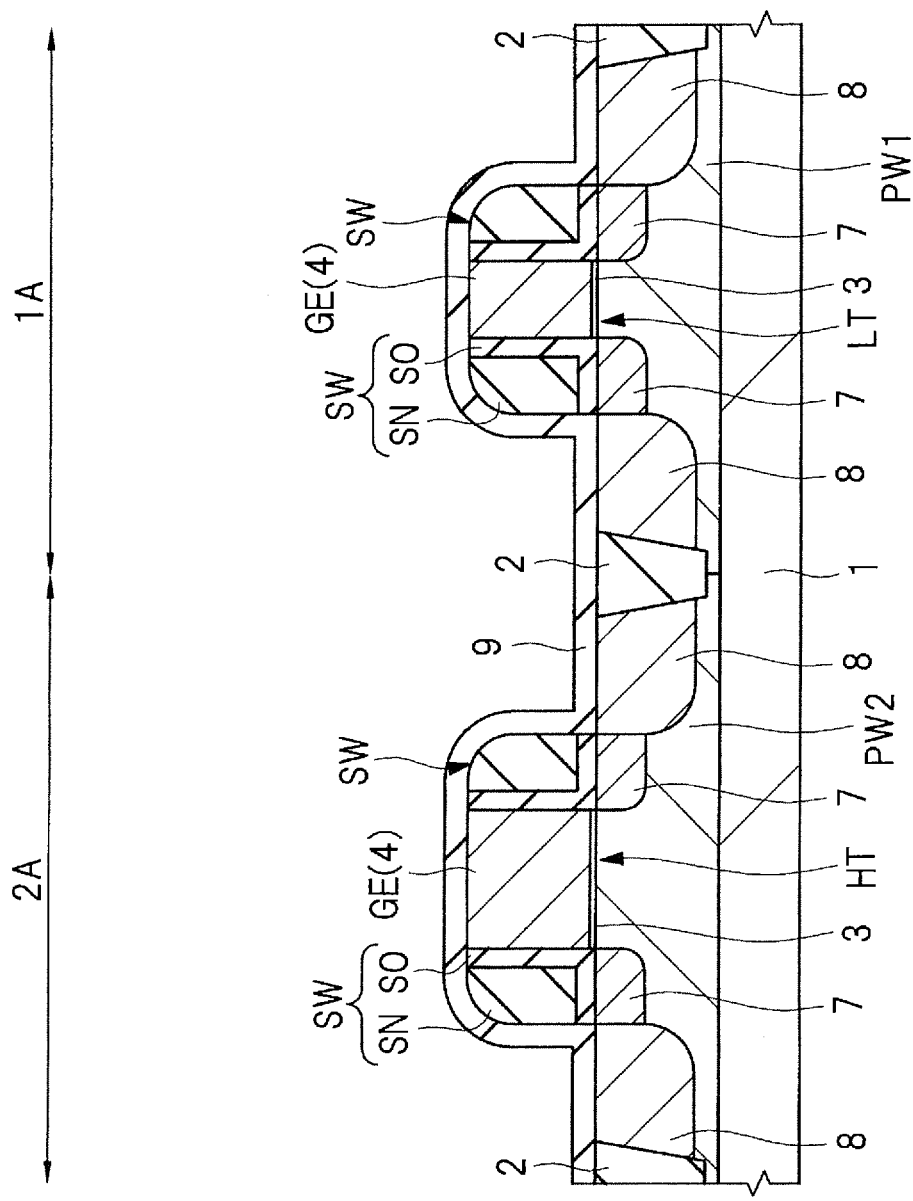
FIG. 7 is a main-portion cross-sectional view showing the manufacturing process of the semiconductor device in Embodiment 1, which is subsequent to FIG. 6.
Figure 8:
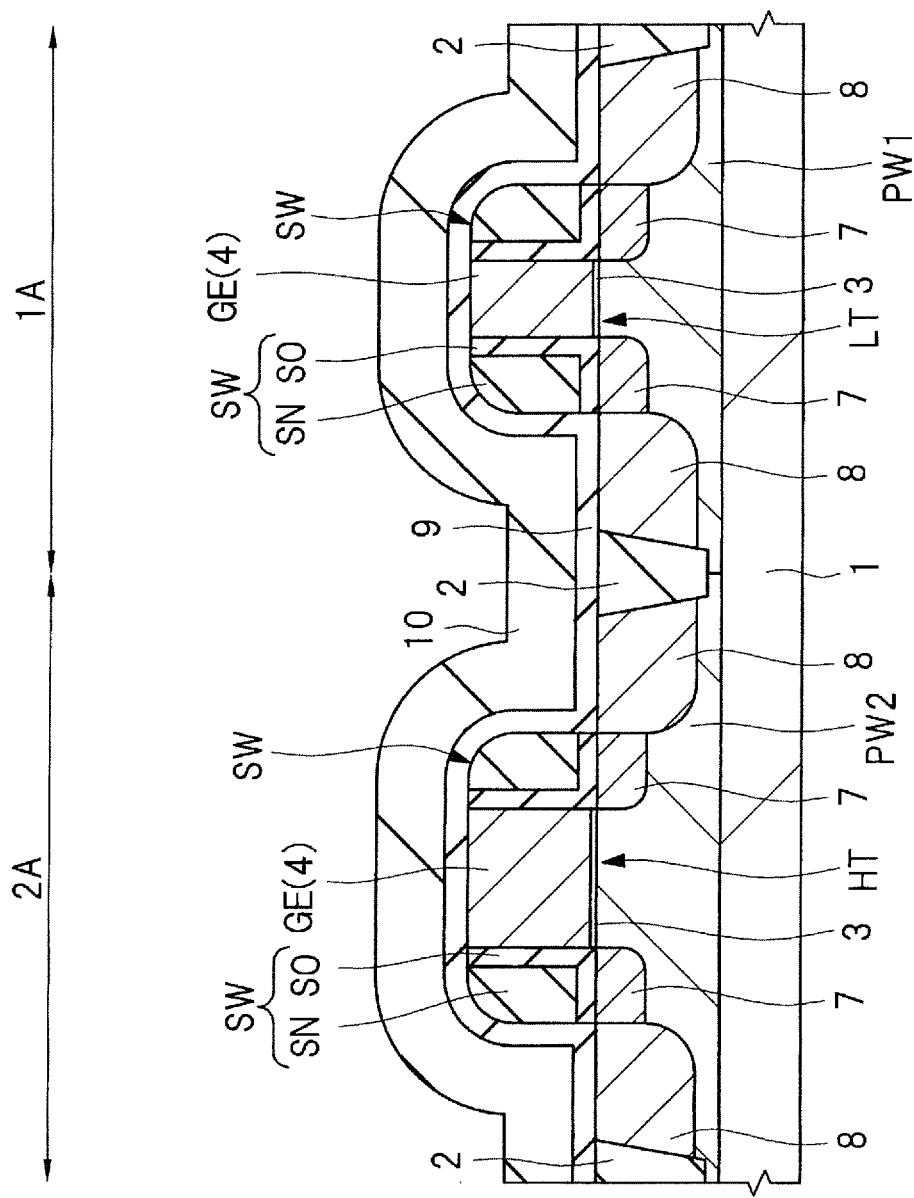
FIG. 8 is a main-portion cross-sectional view showing the manufacturing process of the semiconductor device in Embodiment 1, which is subsequent to FIG. 7.

Next, as shown in FIG. 7, over the semiconductor substrate 1 including the MISFET (LT), and the MISFET (HT), a silicon oxide film is formed as a stopper film 9 to a thickness of about 13 nm using a CVD method. For example, the silicon oxide film is formed by a CVD method using, e.g., TEOS (Tetraethoxysilane) and ozone ($O_3$) as raw material gases. The stopper film 9 functions as an etching stopper in the etching of a stress application film 10 described later. The stopper film 9 can prevent undesired etching of each of the patterns (such as, e.g., portions each made of the silicon film) forming the MISFET (LT), and the MISFET (HT). Then, as shown in FIG. 8, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Figure 9:
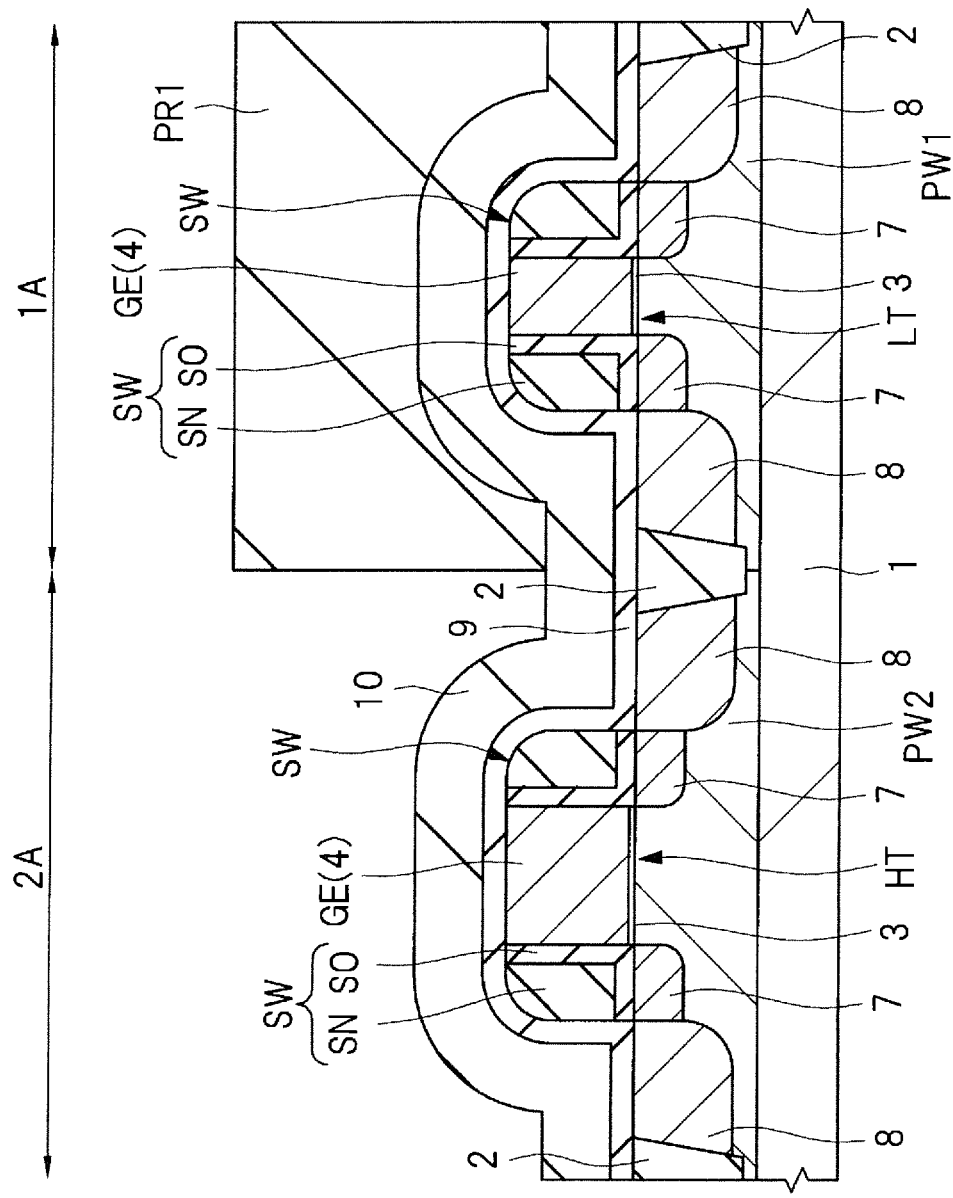
FIG. 9 is a main-portion cross-sectional view showing the manufacturing process of the semiconductor device in Embodiment 1, which is subsequent to FIG. 8.
Figure 10:
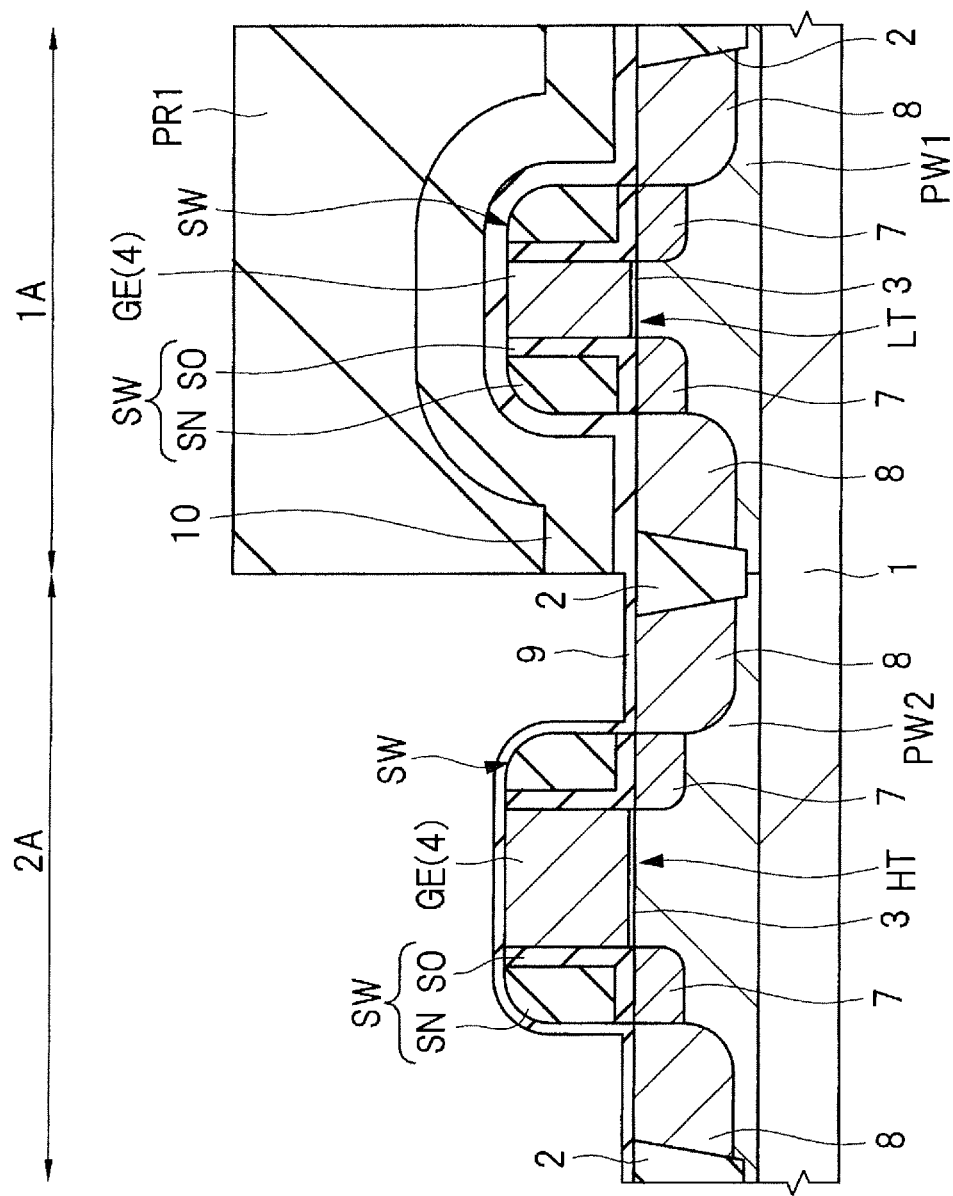
FIG. 10 is a main-portion cross-sectional view showing the manufacturing process of the semiconductor device in Embodiment 1, which is subsequent to FIG. 9.

Next, the stress application film 10 in the I/O MIS formation region 2A is removed therefrom. First, as shown in FIG. 9, over the stress application film 10 in the core MIS formation region 1A, a photoresist film PR1 is formed using a photolithographic method. Then, as shown in FIG. 10, using the photoresist film PR1 as a mask, the stress application film 10 is etched. Here, the silicon nitride film forming the stress application film 10 is dry-etched. For example, using $CH_4$ as an etching gas, isotropic dry etching is performed. As a result, only the core MIS formation region 1A is covered with the stress application film 10. In other words, only the MISFET (LT) is covered with the stress application film 10. On the other hand, the stopper film 9 in the I/O MIS formation region 2A is exposed.

Here, the foregoing etching is performed under such a condition that the etching selectivity is high, i.e., the ratio of the etching speed of the stress application film 10 to the etching speed of the stopper film 9 is high, but the stopper film 9 is also etched slightly. Accordingly, the thickness of the stopper film 9 in the I/O MIS formation region 2A becomes smaller than the thickness of the stopper film 9 remaining under the stress application film 10 in the core MIS formation region 1A (FIG. 10). Note that, when the thickness of the stopper film 9 in the I/O MIS formation region 2A is T92 and the thickness of the stopper film 9 in the core MIS formation region 1A is T91, a relationship given by T92<T91 is established.

Figure 11:
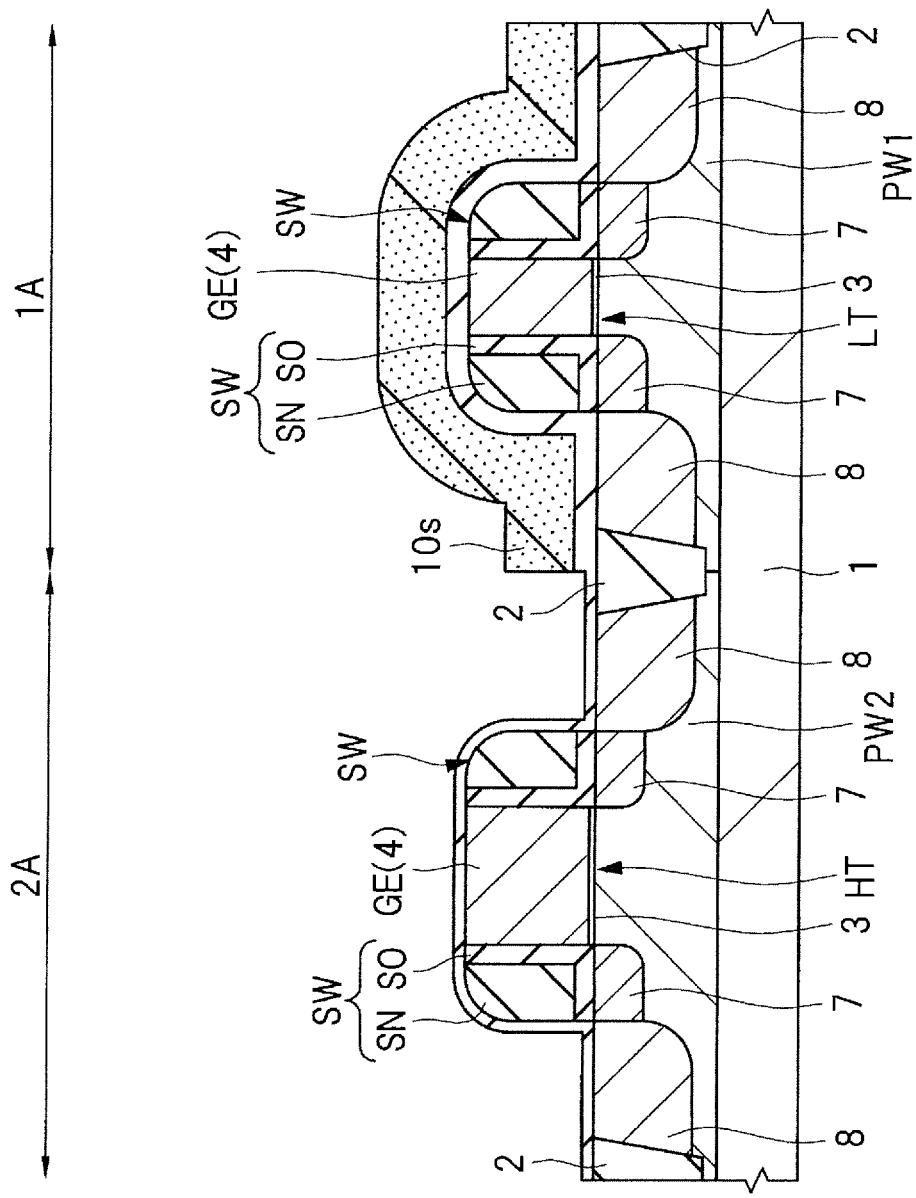
FIG. 11 is a main-portion cross-sectional view showing the manufacturing process of the semiconductor device in Embodiment 1, which is subsequent to FIG. 10.

Then, as shown in FIG. 11, after the photoresist film PR1 is removed by ashing treatment or the like, heat treatment (referred to also as anneal) is performed. For example, as first treatment, momentary anneal (referred to also as spike RTA (Rapid Thermal Annealing)) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to the MISFET (LT) in the core MIS formation region 1A. On the other hand, the stress application film 10 has been removed from the I/O MIS formation region 2A so that no stress is applied to the MISFET (HT).

It may also be possible to activate the impurity introduced into the source/drain regions (7 and 8) using the heat treatment and omit the previous heat treatment (activation treatment). It may also be possible to crystallize the silicon film 4 made of the amorphous silicon film by the heat treatment (crystallization treatment).

Figure 12:
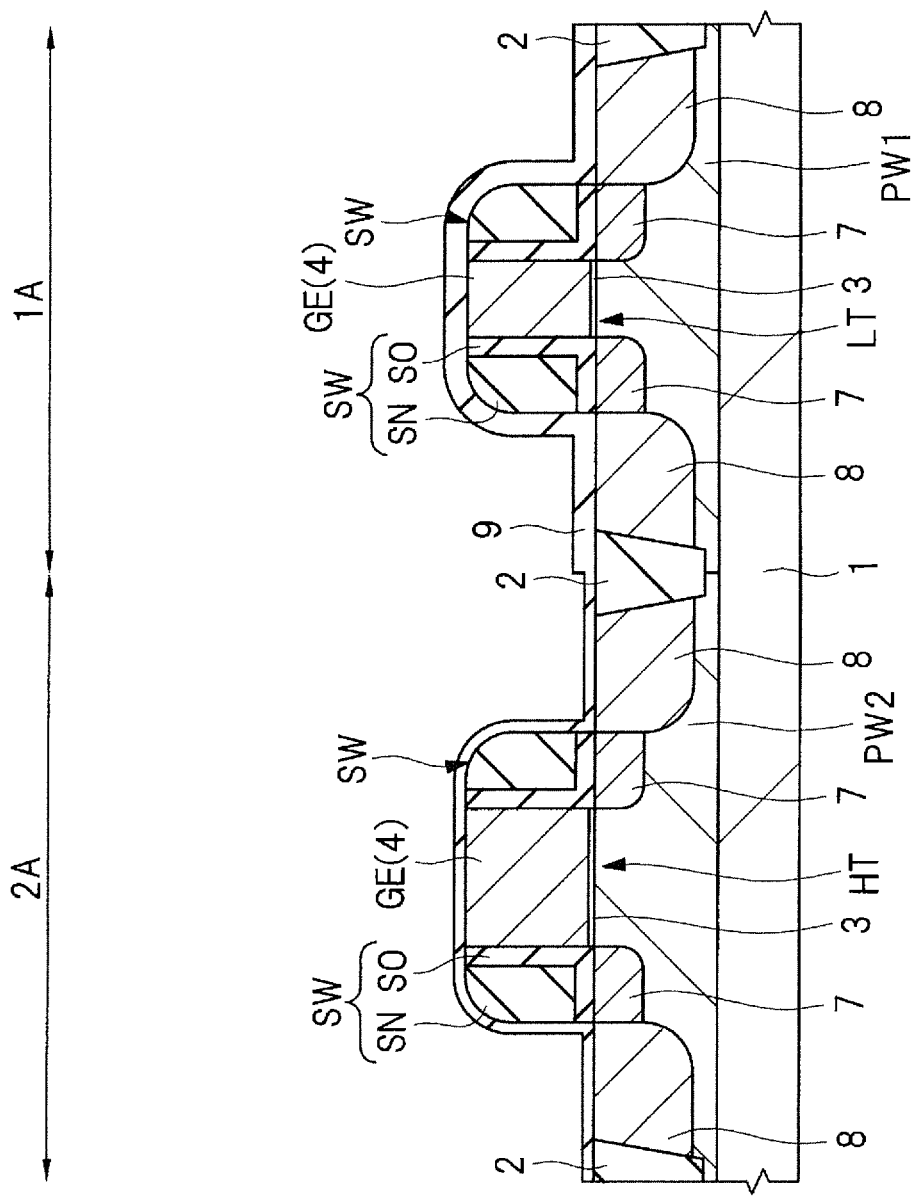
FIG. 12 is a main-portion cross-sectional view showing the manufacturing process of the semiconductor device in Embodiment 1, which is subsequent to FIG. 11.

Next, as shown in FIG. 12, the stress application film 10S in the core MIS formation region 1A is removed therefrom. Here, the silicon nitride film forming the stress application film 10S is wet-etched under such a condition that the etching selectivity is high, i.e., the ratio of the etching speed of the stress application film 10 to the etching speed of the stopper film 9 is high. For example, using a phosphoric acid ($H_3PO_4$) solution as an etchant, the wet etching is performed at 155° C. for 600 seconds. As a result, the stopper film 9 in each of the core MIS formation region 1A and the I/O MIS formation region 2A is exposed.

Figure 13:
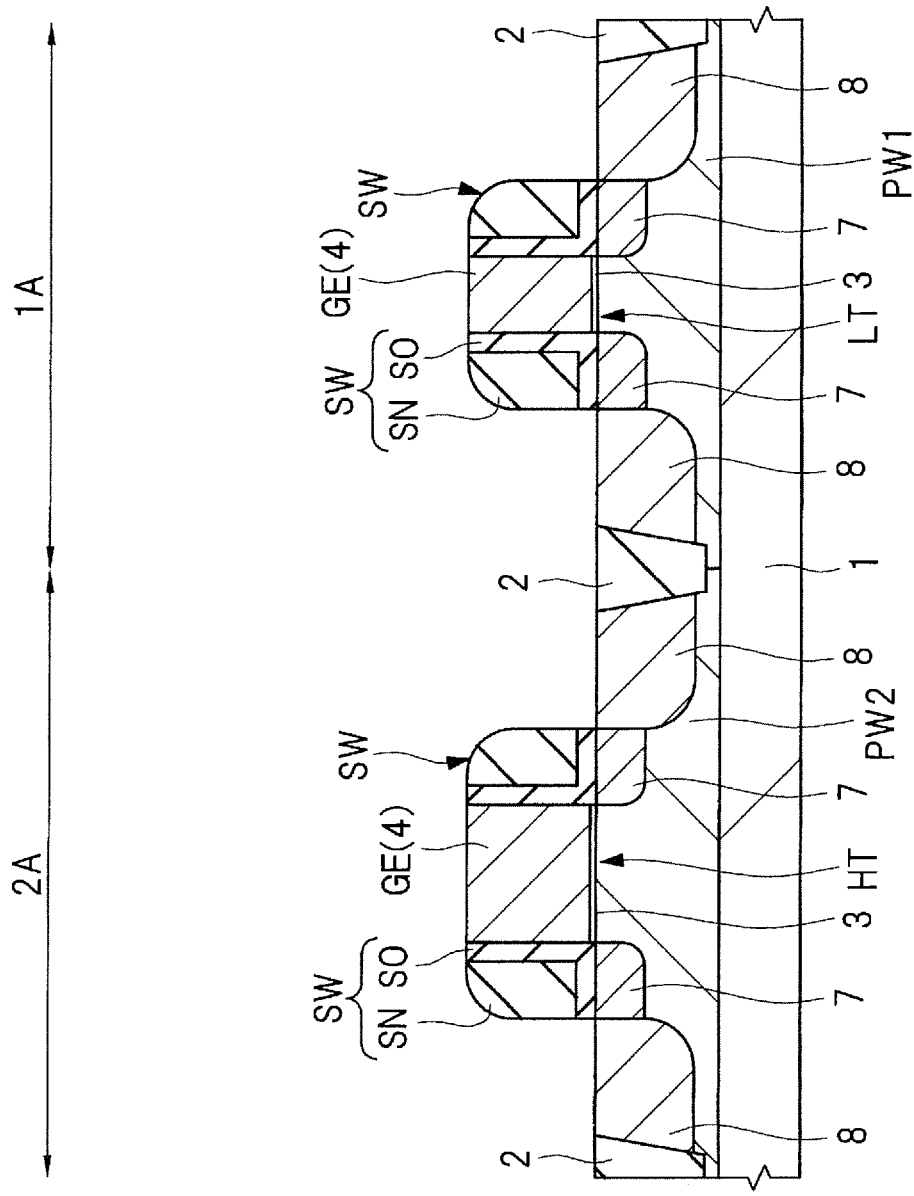
FIG. 13 is a main-portion cross-sectional view showing the manufacturing process of the semiconductor device in Embodiment 1, which is subsequent to FIG. 12.

Next, as shown in FIG. 13, the foregoing stopper film 9 is removed. Here, the silicon oxide film forming the stopper film 9 is wet-etched under such a condition that the etching selectivity is high, i.e., the ratio of the etching speed of the stopper film 9 to the etching speed of the semiconductor substrate 1 is high. For example, using a HF solution as an etchant, the wet etching is performed at 25° C. for 100 seconds.

Figure 14:
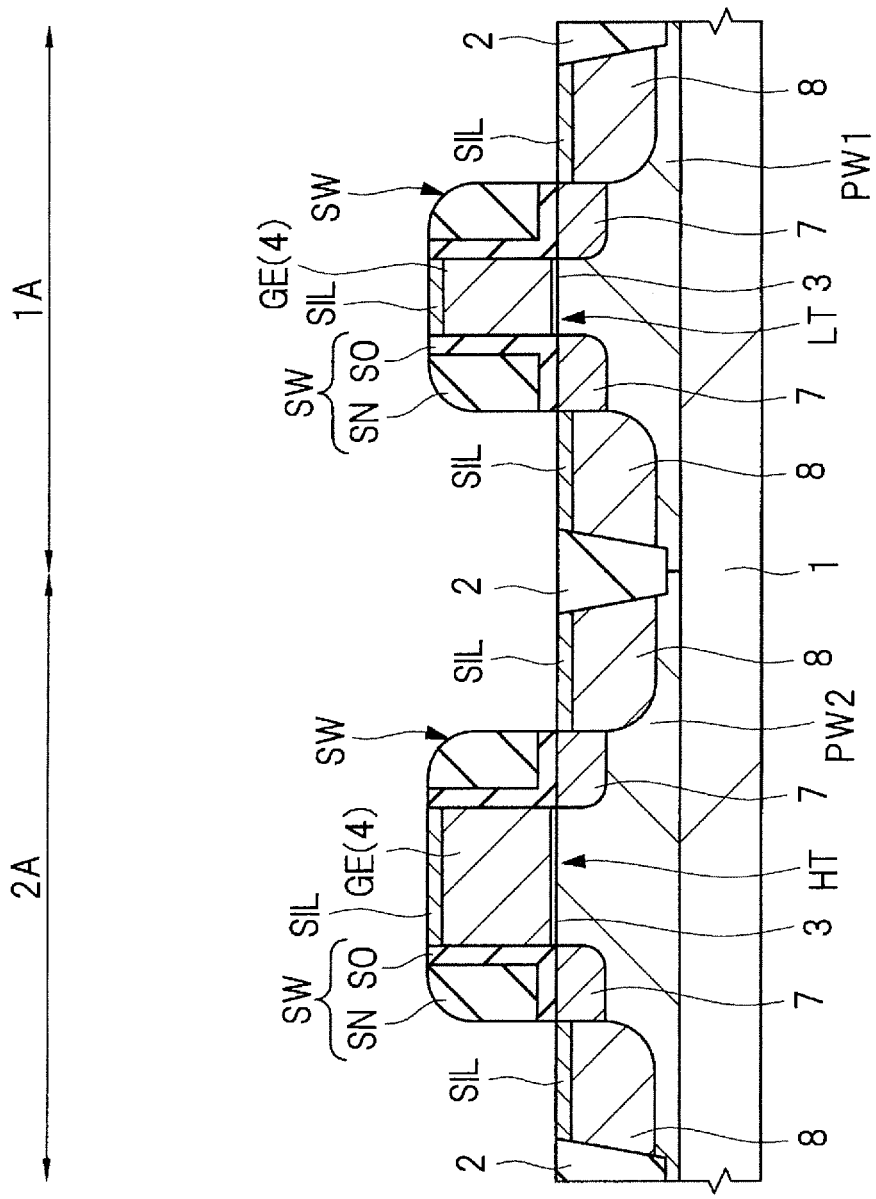
FIG. 14 is a main-portion cross-sectional view showing the manufacturing process of the semiconductor device in Embodiment 1, which is subsequent to FIG. 13.

Next, as shown in FIG. 14, using a salicide technique, in the respective upper portions of the gate electrodes GE and the $n^+$-type semiconductor regions 8 in the core MIS formation region 1A and the I/O MIS formation region 2A, metal silicide layers SIL are formed.

The metal silicide layers SIL can reduce diffusion resistance, contact resistance, and the like. The metal silicide layers SIL can be formed as follows.

For example, over the entire main surface of the semiconductor substrate 1, a metal film (not shown) is formed and, by performing heat treatment on the semiconductor substrate 1, the respective upper-layer portions of the gate electrodes GE and the n+-type semiconductor regions 8 are caused to react with the foregoing metal film. In this manner, in the respective upper portions of the gate electrodes GE and the n+-type semiconductor regions 8, the metal silicide layers SIL are formed. The foregoing metal film is made of, e.g., a cobalt (Co) film, a nickel (Ni) film, or the like and can be formed using a sputtering method or the like. Then, the unreacted metal film is removed.

Thereafter, over the entire main surface of the semiconductor substrate 1, an interlayer insulating film (not shown) is formed, though the illustration thereof is omitted. Then, in the interlayer insulating film, contact holes (not shown) which expose, e.g., the surfaces of the n+-type semiconductor regions 8 are formed. By embedding a conductive film in the contact holes, plugs (not shown) are formed. Then, over the interlayer insulating film in which the plugs are embedded, wires (not shown) are formed.

Thus, according to the present embodiment, the SMT is applied only to the MISFET (LT) of the MISFET (LT) and the MISFET (HT). This can generally improve the characteristics of the semiconductor device.

Figures 15, 16:
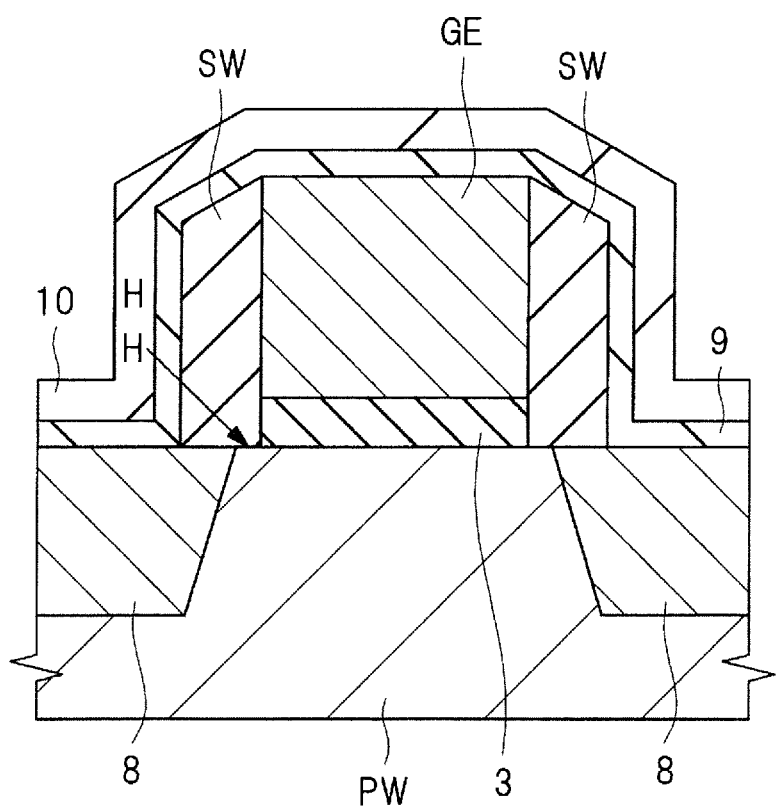
FIG. 15 is a view showing the characteristics of a MISFET (LT) and a MISFET (HT) after an SMT has been applied thereto.
FIG. 16 is a cross-sectional view of a MISFET provided with a silicon nitride film as a stress application film.

The present inventors have studied the case where the SMT is applied to each of the MISFET (LT) and the MISFEAT (HT) and obtained the result shown in FIG. 15. FIG. 15 is a view showing the characteristics of the MISFET (LT) and the MISFET (HT) after the SMT has been applied thereto.

That is, the present inventors have studied the case where, in a state in which the silicon nitride film as the stress application film 10 is present over each of the core MIS formation region 1A and the I/O MIS formation region 2A (see, e.g., FIG. 8), heat treatment is performed to apply a stress to each of the elements.

As shown in FIG. 15, with regard to the MISFET (LT), an increase in channel current (simply shown as "Current" in FIG. 15) due to the effect of the SMT can be recognized. However, the channel current in the MISFET (HT) has not changed. This may be conceivably because, with regard to the MISFET (HT) having a relatively large gate length, the effect of the SMT is poor and consequently the channel current has not increased.

On the other hand, HC has decreased in both of the elements of the MISFET (LT) and the MISFET (HT). Here, the "HC" shows degradation due to hot carriers, and a time over which 10% of the channel current decreases is defined as a HC lifetime. This may be conceivably because hydrogen (H) contained in the silicon nitride film used as the stress application film 10 affects the HC.

FIG. 16 is a cross-sectional view of a MISFET provided with the silicon nitride film as the stress application film. With regard to the MISFET shown in FIG. 16, the member having the same function as that of the MISFET (HT) shown in FIG. 1 is designated by the same reference numeral and a repeated description thereof is omitted. Note that "PW" denotes a p-type well.

As shown in FIG. 16, the silicon nitride film used as the stress application film 10 contains a large amount of H (hydrogen). The H (hydrogen) in the silicon nitride film is diffused into the MISFET by the heat treatment for applying a stress. For example, when the H (hydrogen) reaches the interface between the semiconductor substrate 1 (p-type well) and the insulating film 3, the H (hydrogen) is bonded to silicon (Si) to form a Si—H bond. When the MISFET performs a driving operation, if hot carriers are generated in the drain region to which a high potential is applied, the Si—H bond is cut to result in an interfacial level. If a large number of such interfacial levels are formed, the carriers are trapped to degrade the driving ability of the MISFET.

By contrast, in the present embodiment, the SMT is not applied to the MISFET (HT) to which the effect of the SMT is poor, and the stress application film (silicon nitride film) over the MISFET (HT) is removed therefrom. Therefore, it is possible to avoid the degradation of the driving ability of the MISFET due to the H (hydrogen) in the foregoing silicon nitride film.

By thus selectively applying the SMT, it is possible to generally improve the characteristics of the semiconductor device.

(Description of Application Example)

In the foregoing process, the stress application film 10 in the I/O MIS formation region 2A is entirely removed therefrom to expose the stopper film 9 in the region (see FIGS. 9 and 10). However, it may also be possible to remove the portion of the stress application film 10 in the I/O MIS formation region 2A corresponding to a predetermined thickness from the surface thereof so as to reduce the thickness of the stress application film 10 in the I/O MIS formation region 2A.

Figure 17:
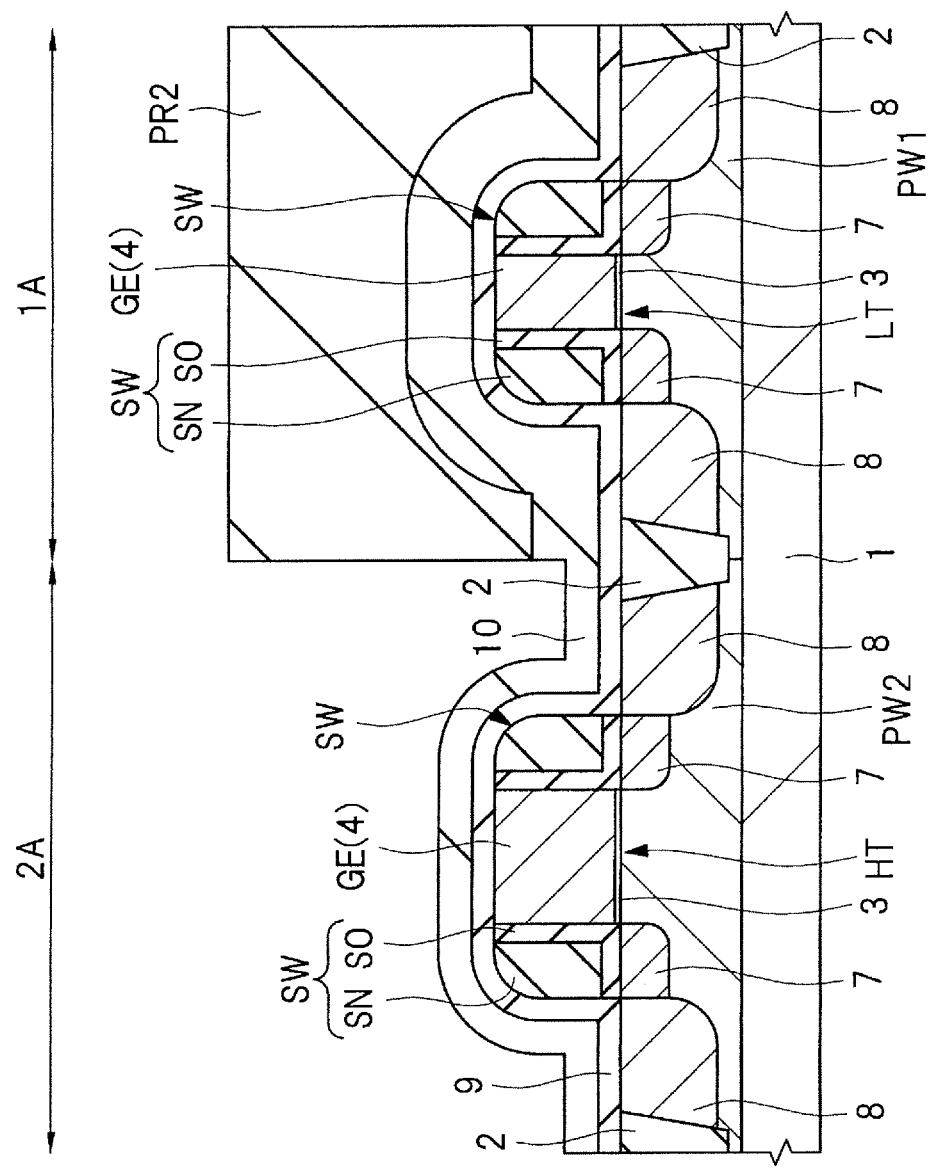
FIG. 17 is a main-portion cross-sectional view showing the manufacturing process of a semiconductor device in an application example of Embodiment 1.
Figure 18:
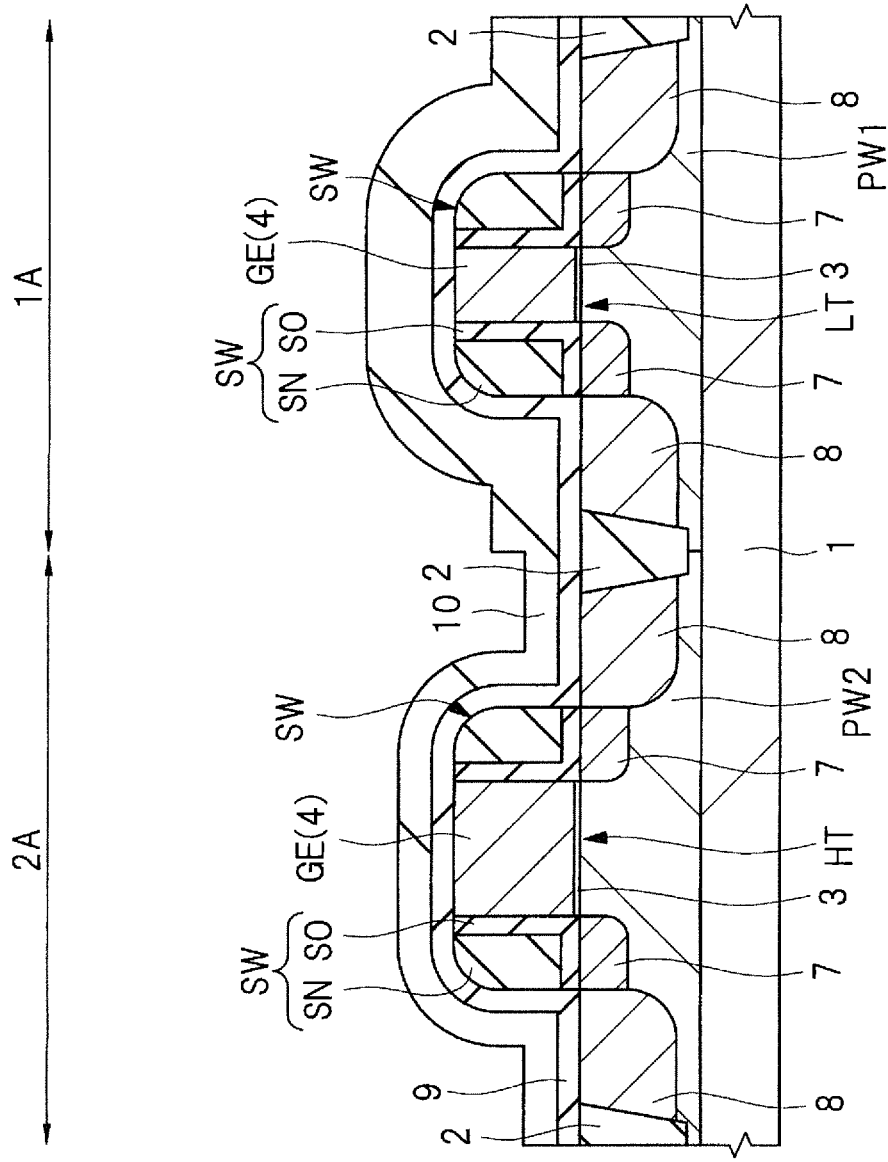
FIG. 18 is a main-portion cross-sectional view showing the manufacturing process of the semiconductor device in the application example of Embodiment 1, which is subsequent to FIG. 17.

FIGS. 17 and 18 are main-portion cross-sectional views showing the manufacturing process of the semiconductor device in an application example of the present embodiment.

<Process of Forming MISFET (LT) and MISFET (HT)>

As has been described with reference to FIGS. 2 to 6, the MISFET (LT) is formed in the core MIS formation region 1A, and the MISFET (HT) is formed in the I/O MIS formation region 2A (FIG. 6).

<SMT and Silicide Process>

Next, as shown in FIG. 17, over the semiconductor substrate 1 including the MISFET (LT), and the MISFET (HT), a silicon oxide film is formed as the stopper film 9 to a thickness of about 5 nm using a CVD method. Then, over the stopper film 9, a silicon nitride film is formed as the stress application film 10 to a thickness of about 35 nm using a CVD method.

Next, over the stress application film 10 in the core MIS formation region 1A, a photoresist film PR2 is formed using a photolithographic method. Then, using the photoresist film PR2 as a mask, the portion of the stress application film 10 corresponding to the predetermined thickness is etched from the surface thereof. Here, from the surface of the silicon nitride film forming the stress application film 10, the portion thereof corresponding to a thickness of about 25 nm is anisotropically or isotropically dry-etched. In other words, the dry etching is performed until the thickness of the silicon nitride film becomes about 10 nm. For example, using $CF_4$ as an etching gas, the dry etching is performed. As a result, the thickness of the stress application film 10 in the I/O MIS formation region 2A becomes smaller than the thickness of the stress application film 10 in the core MIS formation region 1A (FIG. 17). Note that, when the thickness of the stress application film 10 in the I/O MIS formation region 2A is T102 and the thickness of the stress application film 10 in the core MIS formation region 1A is T101, a relationship given by T102<T101 is established.

Then, as shown in FIG. 18, the photoresist film PR2 is removed by ashing treatment or the like. Thereafter, heat treatment is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. By the stress application film 10, the stress is applied to the MISFET (LT) in the core MIS formation region 1A. Here, as the heat treatment for applying the stress to the stress application film 10, heat treatment performed at a temperature of not less than 1000° C. for a moment of not longer than one second is preferred. On the other hand, since the stress application film 10 in the I/O MIS formation region 2A has a small thickness, a large stress is not applied to the MISFET (HT). The thickness of the stress application film 10 in the I/O MIS formation region 2A is preferably adjusted to be not more than 20 nm.

Thereafter, as has been described with reference to FIGS. 11 to 14, the stress application film 10 after the heat treatment is removed, and the stopper film 9 is further removed. Then, using a salicide technique, the metal silicide layers (metal silicide films) SIL are formed.

Thus, according to the present embodiment, over the MISFET (LT) and the MISFET (HT), the stress application film 10 is formed and subjected to the heat treatment. However, since the thickness of the stress application film 10 in the I/O MIS formation region 2A is reduced, it is possible to reduce the influence of the H (hydrogen) in the silicon nitride film used as the stress application film. Therefore, it is possible to reduce the degree of degradation of the characteristics of the MISFET HT due to the H (hydrogen) in the silicon nitride film described above.

Also, in the present embodiment, the thin stress application film 10 remains in the I/O MIS formation region 2A so that no thickness difference is produced between the stopper film 9 in the I/O MIS formation region 2A and the stopper film 9 in the core MIS formation region 1A.

That is, in FIG. 12, the thickness of the stopper film 9 in the I/O MIS formation region 2A is smaller than the thickness of the stopper film 9 in the core MIS formation region 1A. In such a case, depending on the thickness of the remaining stopper film 9 and a thickness difference therein, it becomes difficult to control the etching.

Figure 19:
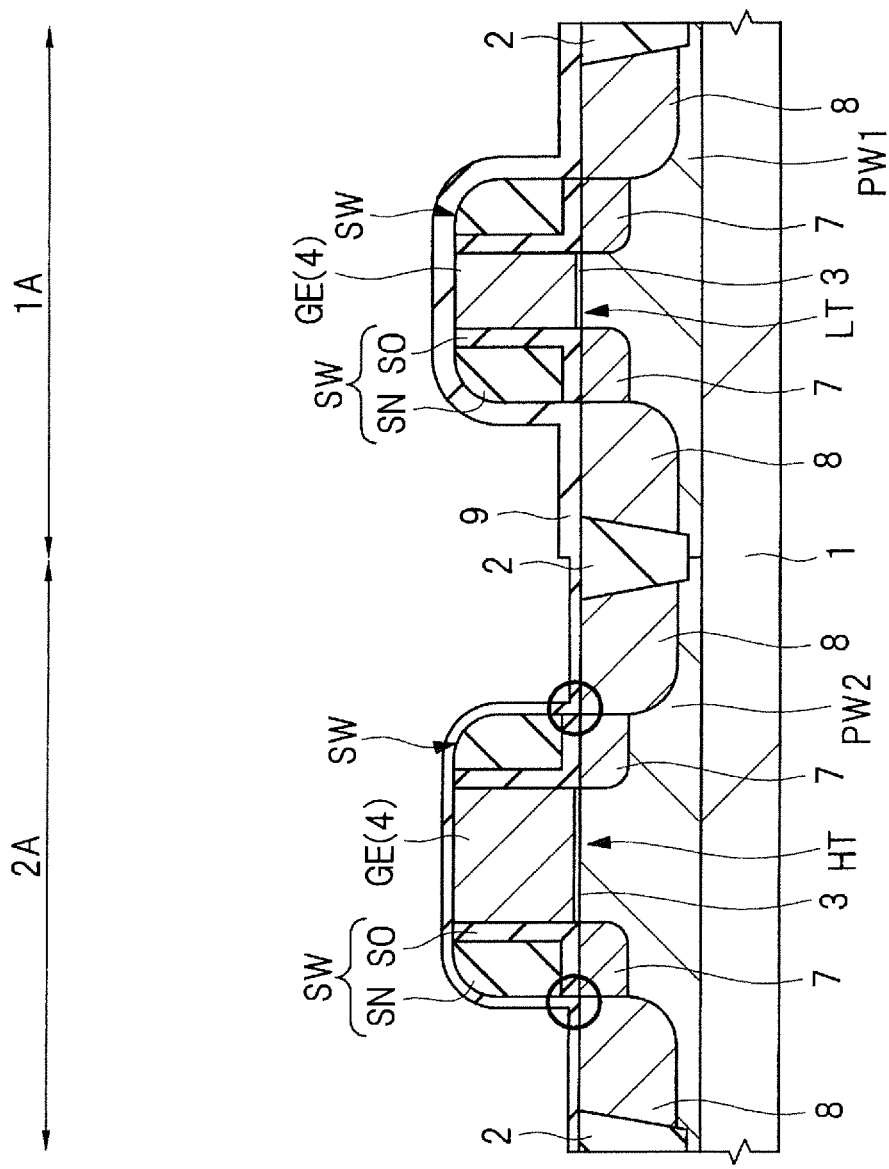
FIG. 19 is a main-portion cross-sectional view for illustrating the effect of the manufacturing process of the semiconductor device in the application example of Embodiment 1.

That is, when the etching is performed based on a thicker film portion, a thinner film portion is brought into an over-etched state. For example, an end portion of the silicon oxide film SO forming the side wall insulating films SW and the portions enclosed in the circles in FIG. 19 are etched undesirably. If the metal silicide layers SIL grow in such portions, an increase in leakage current or the degradation of breakdown voltage may occur. FIG. 19 is a main-portion cross-sectional view for illustrating the effect of the manufacturing process of the semiconductor device in the application example of the present embodiment.

On the other hand, when the etching is performed based on the thinner film portion, the residues of the stopper film 9 may be left in the thicker film portion. Over such residues, the metal silicide layers SIL do not sufficiently grow to result in a problem.

By contrast, according to the present embodiment, by preventing a thickness difference in the stopper film 9, it is possible to avoid the growth of the metal silicide layers SIL in the foregoing portions where it is undesired as well as no growth of the metal silicide layers SIL due to the residues of the stopper film 9. As a result, even when, e.g., the silicon oxide film is formed of a thin film having a thickness of about nm, a thickness difference in the stopper film 9 can be prevented to allow the excellent metal silicide layers SIL to be formed.

(Embodiment 2)

Referring to the drawings, a description will be given below of a structure of a semiconductor device (semiconductor storage device) in the present embodiment.

—Description of Structure—

Figure 20:
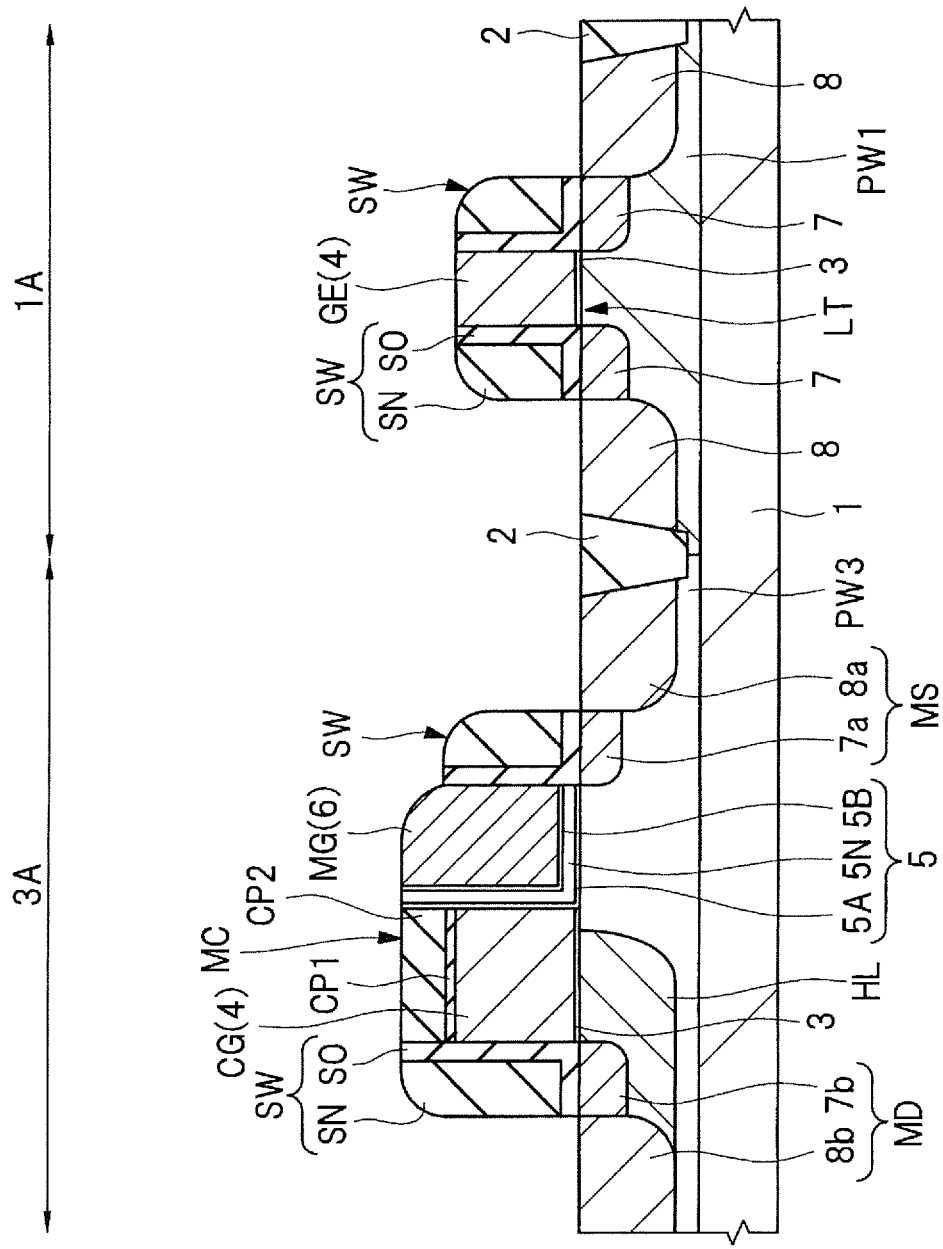
FIG. 20 is a main-portion cross-sectional view showing a configuration of a semiconductor device in Embodiment 2.
Figure 21:
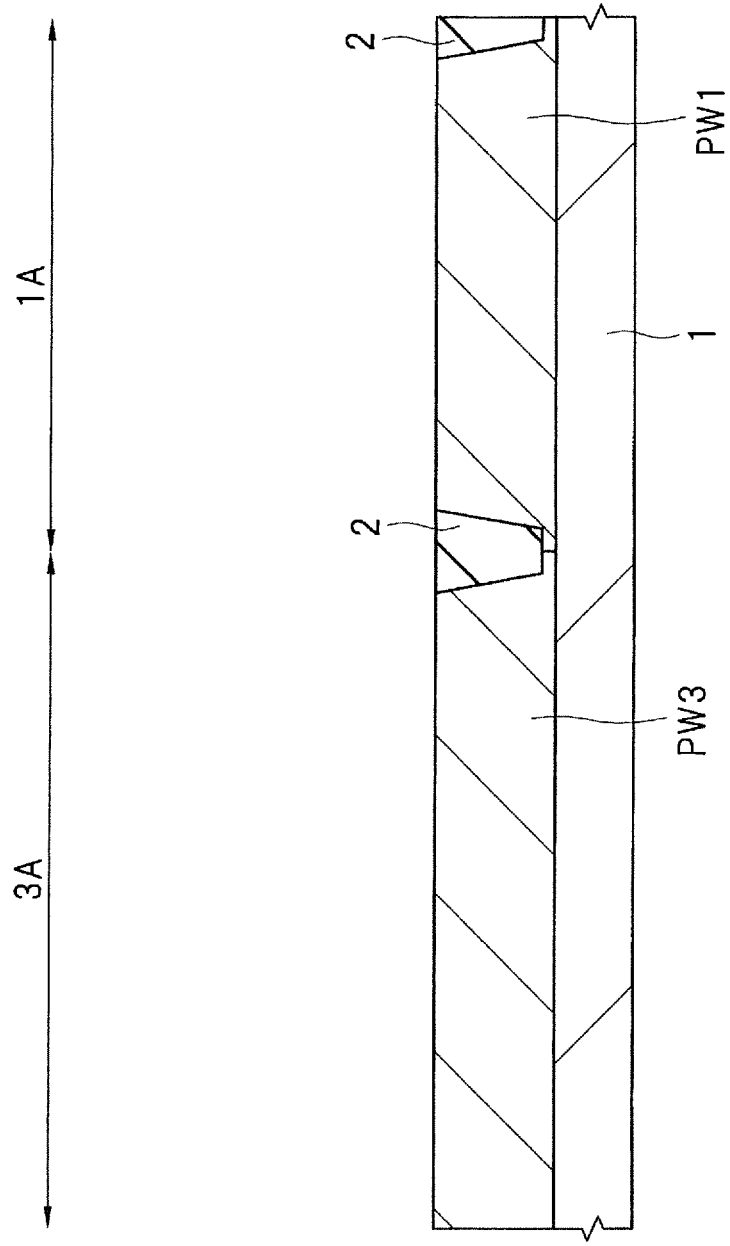
FIG. 21 is a main-portion cross-sectional view showing the manufacturing process of the semiconductor device in Embodiment 2.

FIG. 20 is a main-portion cross-sectional view showing a configuration of the semiconductor device in the present embodiment. The semiconductor device in the present embodiment has the MISFET (LT), and a memory cell (referred to also as a nonvolatile memory cell, nonvolatile storage element, nonvolatile semiconductor storage device, EEPROM, or flash memory).

The MISFET (LT) is the MISFET formed in the core MIS formation region 1A and having a relatively small gate length. For example, the gate length of the MISFET (LT) is smaller than the sum of the gate length of a control gate electrode CG of a memory cell MC and the gate length of a memory gate electrode MG thereof and is, e.g., about 40 nm. Such a MISFET having a relatively small gate length is used in, e.g., a circuit (referred to also as a core circuit or peripheral circuit) for driving the memory cell or the like. The drive voltage of the MISFET (LT) tends to be relatively low.

The MISFET (LT) has the gate electrode GE disposed over the semiconductor substrate 1 (p-type well PW1) via the insulating film 3, and the source/drain regions disposed in the semiconductor substrate 1 (p-type well PW1) located on both sides of the gate electrode GE. Over the side wall portions of the gate electrode GE, the side wall insulating films (sidewalls or sidewall spacers) SW each made of an insulating film are formed. Here, each of the side wall insulating films SW is formed of the laminated body of the silicon oxide film SO and the silicon nitride film SN. Each of the source/drain regions has the LDD structure and includes the $n^+$-type semiconductor region 8, and the $n^-$-type semiconductor region 7. The $n^-$-type semiconductor regions 7 are formed by self-alignment with the side walls of the gate electrode GE. The $n^+$-type semiconductor regions 8 are formed by self-alignment with the side surfaces of the side wall insulating films SW to have the junction depths deeper than those of the $n^-$-type semiconductor regions 7 and the impurity concentrations higher than those of the $n^-$-type semiconductor regions 7.

The memory cell MC has the control gate electrode (gate electrode) CG disposed over the semiconductor substrate 1 (p-type well PW3), and the memory gate electrode (gate electrode) MG disposed over the semiconductor substrate 1 (p-type well PW3) to be adjacent to the control gate electrode CG. Over the control gate electrode CG, a thin silicon oxide film CP1 and a silicon nitride film (cap insulating film) CP2 are disposed. The memory cell MC further has the insulating film 3 disposed between the control gate electrode CG and the semiconductor substrate 1 (p-type well PW3), and an insulating film 5 disposed between the memory gate electrode MG and the semiconductor substrate 1 (p-type well PW3) and disposed between the memory gate electrode MG and the control gate electrode CG.

The memory cell MC further has a source region MS, and a drain region MD which are formed in the p-type well PW3 of the semiconductor substrate 1. Over the side wall portions of a combined pattern of the memory gate electrode MG and the control gate electrode CG, the side wall insulating films (sidewalls or sidewall spacers) SW each made of an insulating film are formed. Here, each the side wall insulating films SW is formed of the laminated body of the silicon oxide film SO and the silicon nitride film SN. The source region MS includes an $n^+$-type semiconductor region 8a, and an $n^-$-type semiconductor region 7a. The $n^-$-type semiconductor region 7a is formed by self-alignment with the side wall of the memory gate electrode MG. The $n^+$-type semiconductor region 8a is formed by self-alignment with the side surface of the side wall insulating film SW closer to the memory gate electrode MG to have a junction depth deeper than that of the n⁻-type semiconductor region 7a, and an impurity concentration higher than that of the n⁻-type semiconductor region 7a. The drain region MD includes an n⁺-type semiconductor region 8b, and an n⁻-type semiconductor region 7b. The n⁻-type semiconductor region 7b is formed by self-alignment with the side wall of the control gate electrode CG. The n⁺-type semiconductor region 8b is formed by self-alignment with the side surface of the side wall insulating film SW closer to the control gate electrode CG to have a junction depth deeper than that of the n⁻-type semiconductor region 7b, and an impurity concentration higher than that of the n⁻-type semiconductor region 7b.

Here, in the present embodiment (FIG. 20), to the channel region of the MISFET (LT), a stress is not applied using the SMT while, to the channel region of the memory cell MC, no stress is applied.

The SMT is the technique which applies a stress from the upper portion and side surface portions of the gate electrode of a MISFET to the channel region thereof to cause the crystal in the channel region to strain and thus improve the mobility of carriers in the channel region.

As a result, in the present embodiment (FIG. 20), the crystal spacing in the channel region of the MISFET (LT) has been changed by the SMT. On the other hand, since the SMT is not applied to the memory cell MC, there is no change due to the SMT in the crystal spacing in the channel region of the memory cell MC. Thus, in the semiconductor device of the present embodiment, the SMT is not applied to each of the elements, but is selectively applied to be able to generally improve the characteristics of the semiconductor device. A detailed description will be further given in the following "Description of Manufacturing Method" section.

—Description of Manufacturing Method—

Next, referring to FIGS. 21 to 37, a method of manufacturing the semiconductor device in the present embodiment will be described. FIGS. 21 to 37 are main-portion cross-sectional views showing the manufacturing process of the semiconductor device in the present embodiment.

<Process of Forming MISFET (LT) and Memory Cell MC>

First, a description will be given of an example of the process of forming the MISFET (LT) and the memory cell MC.

As shown in FIG. 2, as the semiconductor substrate 1, a silicon substrate made of p-type monocrystalline silicon having a specific resistance of, e.g., about 1 to 10 Ωcm is provided. Note that the semiconductor substrate 1 other than the silicon substrate may also be used.

Next, in the main surface of the semiconductor substrate 1, the isolation region 2 is formed. For example, in the semiconductor substrate 1, an isolation trench is formed and an insulating film such as a silicon oxide film is embedded in the isolation trench to form the isolation region 2.

Then, in the core MIS formation region 1A of the semiconductor substrate 1, the p-type well PW1 is formed and, in a memory cell region 3A thereof, the p-type well PW3 is formed. The p-type wells PW1 and PW3 are formed by ion-implanting a p-type impurity (such as, e.g., boron (B)).

Figure 22:
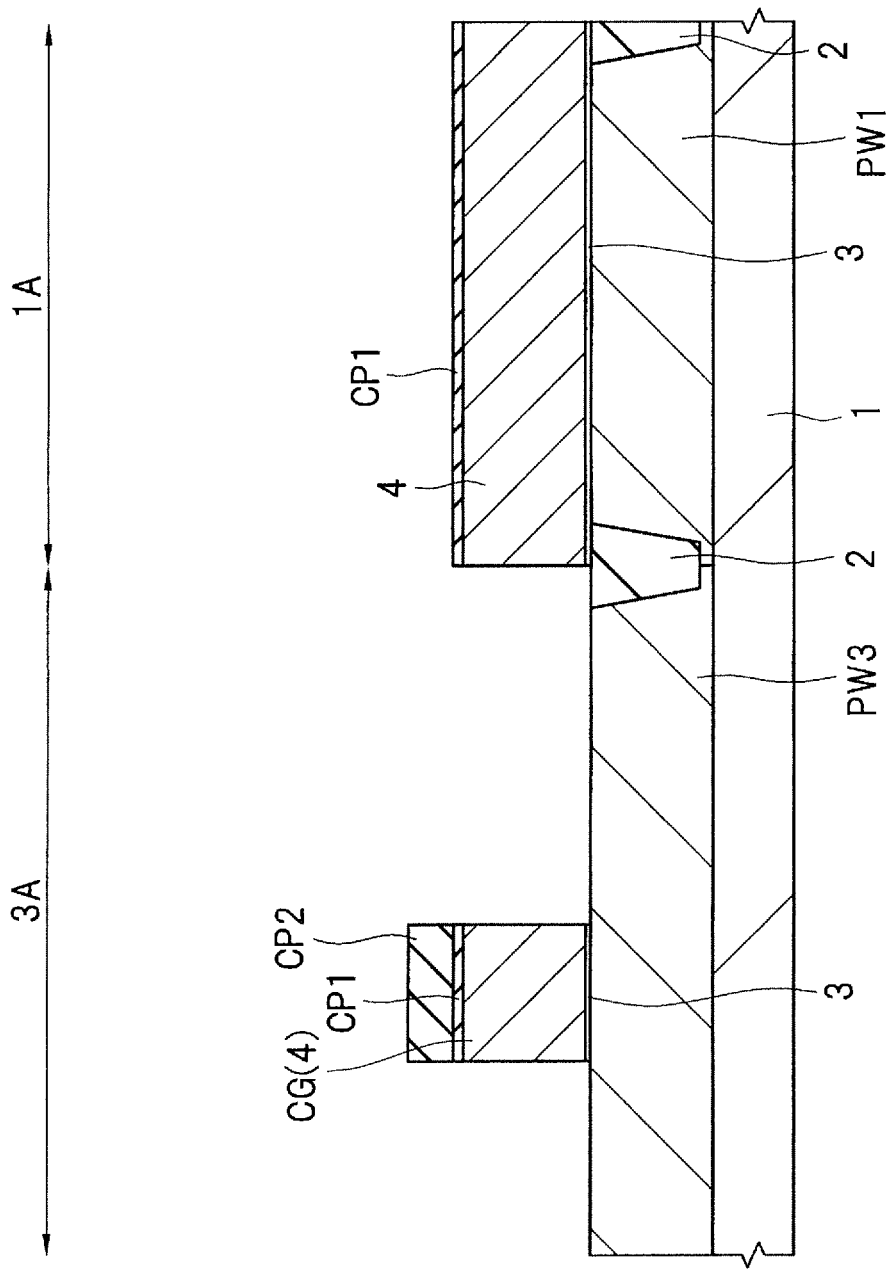
FIG. 22 is a main-portion cross-sectional view showing the manufacturing process of the semiconductor device in Embodiment 2, which is subsequent to FIG. 21.

Next, by diluted hydrofluoric acid cleaning or the like, the surface of the semiconductor substrate 1 (p-type wells PW1 and PW3) is cleaned. Then, as shown in FIG. 22, over the main surface of the semiconductor substrate 1 (surfaces of the p-type wells PW1 and PW3), e.g., a silicon oxide film is formed as the insulating film (gate insulating film) 3 to a thickness of about 2 to 3 nm by a thermal oxidation method. As the insulating film 3, instead of the silicon oxide film, another insulating film such as a silicon oxynitride film may also be used. Besides, a metal oxide film having a dielectric constant higher than that of a silicon nitride film such as a hafnium oxide film, an aluminum oxide film (alumina), or a tantalum oxide film and a laminated film of an oxide film or the like and the metal oxide film may also be formed. Instead of the thermal oxidation method, a CVD method may also be used to form the insulating film 3. The insulating film (gate insulating film) 3 over the core MIS formation region 1A and the insulating film (gate insulating film) 3 over the memory cell region 3A may also be formed of different types of films or to different thicknesses.

Then, over the entire surface of the semiconductor substrate 1, the silicon film 4 is formed as a conductive film (conductor film). As the silicon film 4, e.g., a polycrystalline silicon film is formed to a thickness of about 100 to 200 nm using, e.g., a CVD method or the like. As the silicon film 4, an amorphous silicon film may also be deposited and subjected to heat treatment to be crystallized (crystallization treatment). The silicon film 4 serves as the gate electrode GE of the MISFET (LT) in the core MIS formation region 1A, while serving as the control gate electrode CG of the memory cell MC in the memory cell region 3A.

Next, an n-type impurity (such as arsenic (As) or phosphorus (P)) is introduced into the silicon film 4 in the memory cell region 3A.

Next, the surface of the silicon film 4 is thermally oxidized to form a thin silicon oxide film CP1 having a thickness of, e.g., about 3 to 10 nm. Note that the silicon oxide film CP1 may also be formed using a CVD method. Then, over the silicon oxide film CP1, using a CVD method or the like, a silicon nitride film (cap insulating film) CP2 having a thickness of about 50 to 150 nm is formed.

Next, in a region where the control gate electrode CG is to be formed, a photoresist film (not shown) is formed using a photolithographic method and, using the photoresist film as a mask, the silicon nitride film CP2, the silicon oxide film CP1, and the silicon film 4 are etched. Thereafter, the photoresist film is removed by ashing or the like to form the control gate electrode CG (having a gate length of, e.g., about 80 nm). Such a series of process steps from photolithography to the removal of a photoresist film is referred to as patterning. Here, over the control gate electrode CG, the silicon nitride film CP2 and the silicon oxide film CP1 are formed, but such films can also be omitted.

Here, in the memory cell region 3A, the insulating film 3 remaining under the control gate electrode CG serves as the gate insulating film of the control transistor. Note that the insulating film 3 except for the portion thereof covered with the control gate electrode CG may also be removed by the subsequent patterning process or the like. On the other hand, in the core MIS formation region 1A, the silicon nitride film CP2, the silicon oxide film CP1, and the silicon film 4 are left.

Next, in the core MIS formation region 1A, the silicon nitride film CP2 over the silicon film 4 is removed therefrom.

Figure 23:
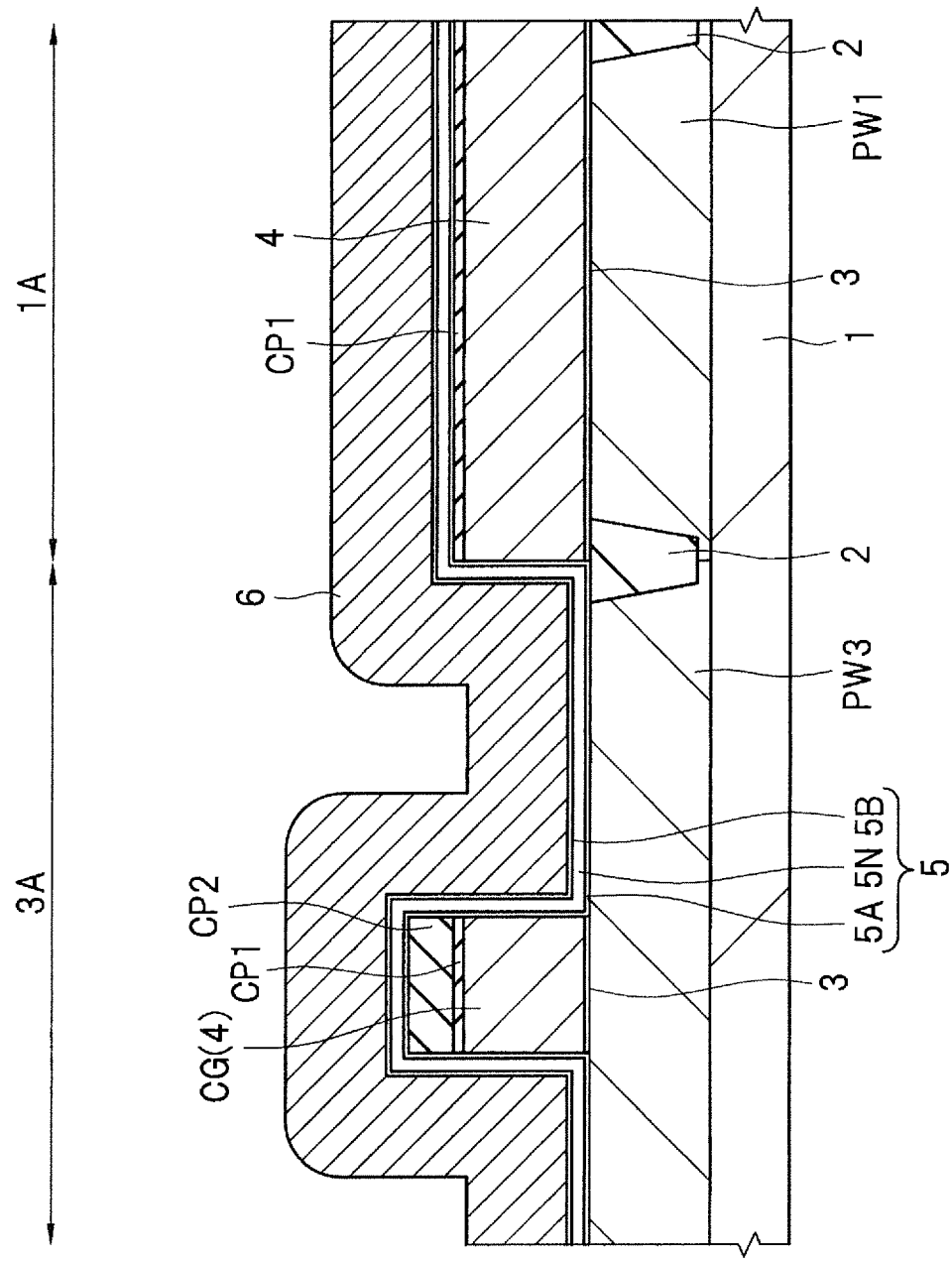
FIG. 23 is a main-portion cross-sectional view showing the manufacturing process of the semiconductor device in Embodiment 2, which is subsequent to FIG. 22.

Next, as shown in FIG. 23, over the semiconductor substrate 1 including the silicon nitride film CP2, and the silicon oxide film CP1, the insulating film 5 (5A, 5N, and 5B) is formed. First, after the main surface of the semiconductor substrate 1 is subjected to cleaning treatment, as shown in FIG. 23, the silicon oxide film 5A is formed over the semiconductor substrate 1 including the silicon nitride film CP2, and the silicon oxide film CP1. The silicon oxide film 5A is formed to a thickness of, e.g., about 4 nm by, e.g., a thermal oxidation method (preferably ISSG (In Situ Steam Generation) oxidation). Note that the silicon oxide film 5A may also be formed using a CVD method. In the drawing, the shape of the silicon oxide film 5A when formed by the CVD method is shown. Then, over the silicon oxide film 5A, the silicon nitride film 5N is formed to a thickness of, e.g., about 10 nm by a CVD method. The silicon nitride film 5N serves as the charge storage portion of the memory cell to form a middle layer forming the insulating film (ONO film) 5. Then, over the silicon nitride film 5N, the silicon oxide film 5B is deposited to a thickness of, e.g., about 5 nm by a CVD method.

By the foregoing process, the insulating film (ONO film) 5 including the silicon oxide film 5A, the silicon nitride film 5N, and the silicon oxide film 5B can be formed. Note that, over the silicon oxide film CP1 in the core MIS formation region 1A shown in FIG. 23, the insulating film (ONO film) 5 may also remain.

Also, in the present embodiment, as the charge storage portion (charge storage layer or insulating film having a trap level) in the insulating film 5, the silicon nitride film 5N is formed. However, another insulating film such as, e.g., a silicon oxynitride film, an aluminum oxide film, a hafnium oxide film, or a tantalum oxide film may also be used as the charge storage portion. Such films are high-dielectric-constant films each having a dielectric constant higher than that of the silicon nitride film. Alternatively, the charge storage layer may also be formed using an insulating film having silicon nano-dots.

The insulating film 5 formed in the memory cell region 3A functions as the gate insulating film of the memory gate electrode MG and has a charge holding (charge storing) function. Accordingly, the insulating film 5 has a laminated structure including at least three layers and is configured such that the potential barrier height of the inner layer (silicon nitride film 5N) is lower than the potential barrier heights of the outer layers (silicon oxide films 5A and 5B). The thickness of each of the layers has an optimal value for each of the operation methods of the memory cell.

Then, over the insulating film 5, a silicon film 6 is formed as a conductive (conductor film). Over the insulating film 5, as the silicon film 6, e.g., a polycrystalline silicon film is formed to a thickness of about 50 to 200 nm using a CVD method or the like. As the silicon film 6, an amorphous silicon film may also be deposited and subjected to heat treatment to be crystallized (crystallization treatment). Note that, into the silicon film 6, an impurity may also be introduced as necessary. As will be described later, the silicon film 6 serves as the memory gate electrode MG (having a gate length of, e.g., about 50 nm) in the memory cell region 3A.

Figure 24:
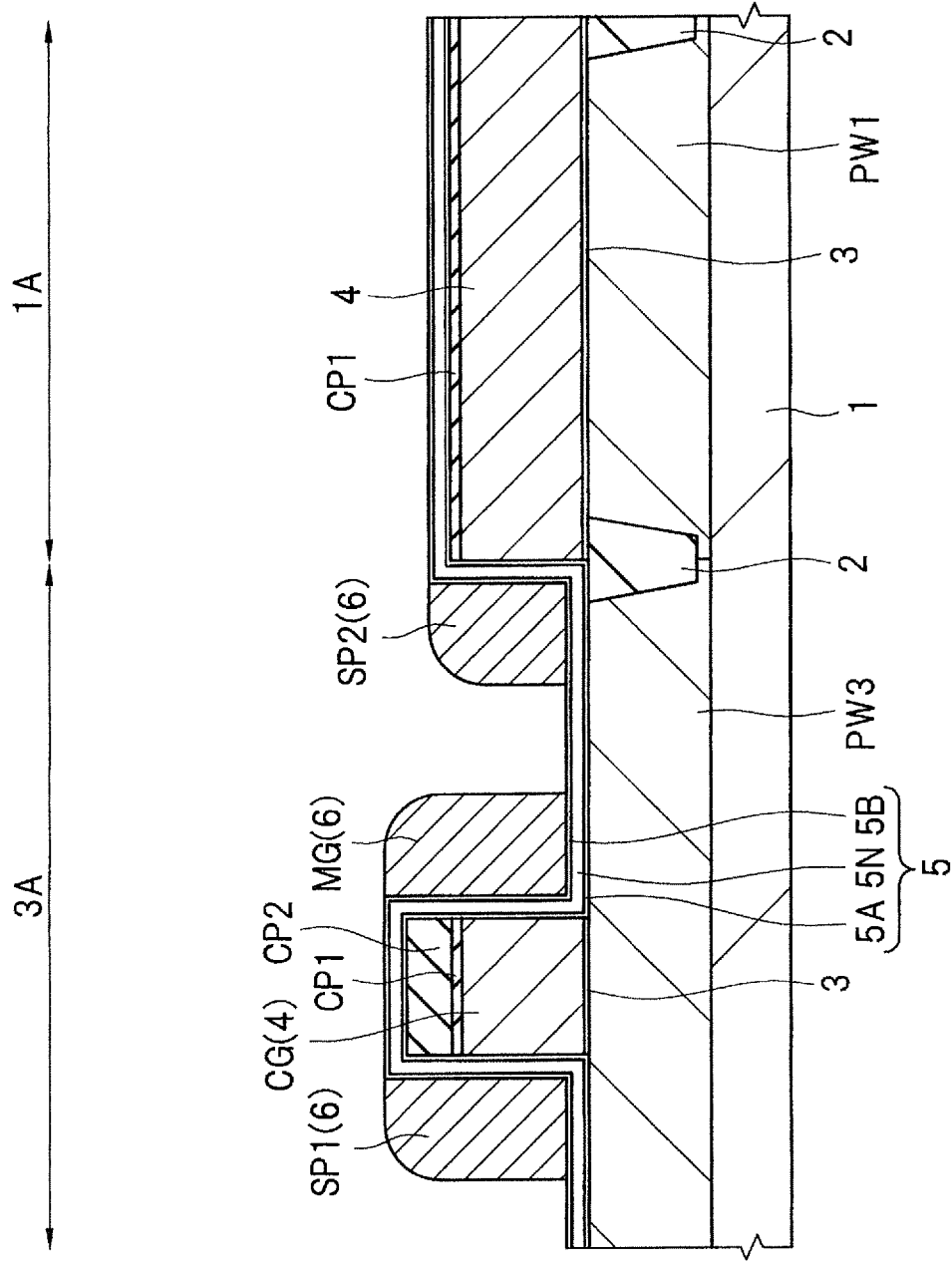
FIG. 24 is a main-portion cross-sectional view showing the manufacturing process of the semiconductor device in Embodiment 2, which is subsequent to FIG. 23.

Next, as shown in FIG. 24, the silicon film 6 is etched back. In the etch-back process, the portion of the silicon film 6 corresponding to a predetermined thickness is removed from the surface thereof by anisotropic dry etching. By the process, the silicon film 6 can be left in sidewall shapes (side wall film shapes) over the both side wall portions of the control gate electrode CG via the insulating film 5. At this time, in the core MIS formation region 1A and the memory cell region 3A, the silicon film 6 is etched over the silicon film 4 to expose the insulating film 5. Note that in the boundary portion between the core MIS formation region 1A and the memory cell region 3A, over the side wall of the laminated film of the silicon oxide film CP1 and the silicon film 4, the silicon film 6 remains in a sidewall shape (side wall film shape) as a silicon spacer SP2 via the insulating film 5.

The silicon film 6 remaining over one of the both side wall portions of the foregoing control gate electrode CG forms the memory gate electrode MG. On the other hand, the silicon film 6 remaining over the other side wall portion forms a silicon spacer SP1. The insulating film 5 under the foregoing memory gate electrode MG serves as the gate insulating film of a memory transistor. The memory gate length (gate length of the memory gate electrode MG) is determined in correspondence to the thickness of the deposited silicon film 6.

Figure 25:
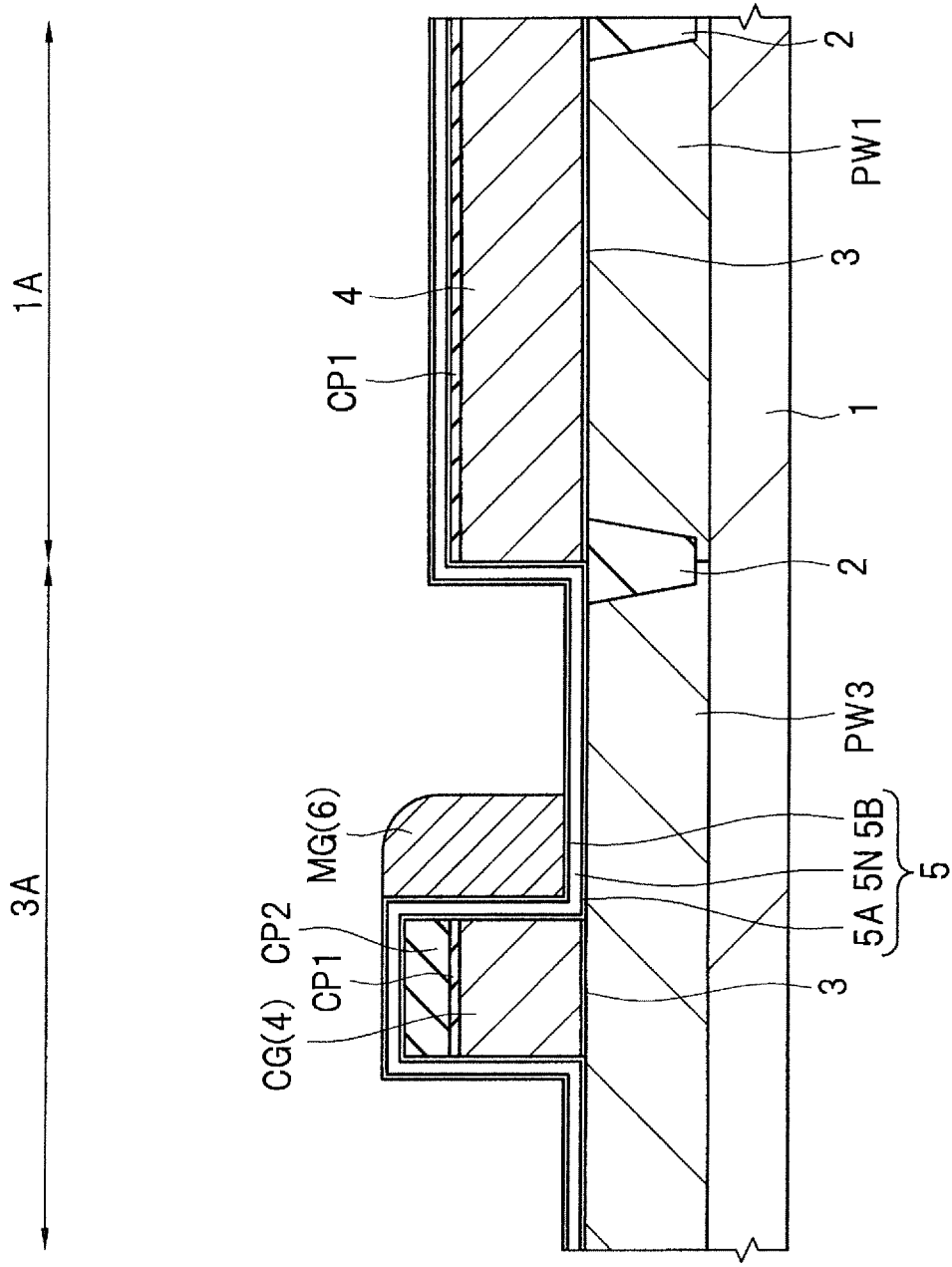
FIG. 25 is a main-portion cross-sectional view showing the manufacturing process of the semiconductor device in Embodiment 2, which is subsequent to FIG. 24.

Next, as shown in FIG. 25, the silicon spacer SP1 over the side wall portion of the control gate electrode CG over which the memory gate electrode MG is not formed and the silicon spacer SP2 (silicon film 6) in the boundary portion between the core MIS formation region 1A and the memory cell region 3A are removed.

Next, the insulating film 5 is removed by etching. As a result, in the memory cell region 3A, the silicon nitride film CP2 over the control gate electrode CG is exposed, and the p-type well PW3 is exposed. On the other hand, in the core MIS formation region 1A, the silicon oxide film CP1 is also removed to expose the silicon film 4.

Next, in the core MIS formation region 1A, an impurity is introduced into the silicon film 4. For example, into the silicon film 4, an n-type impurity such as phosphorus is introduced.

Figure 26:
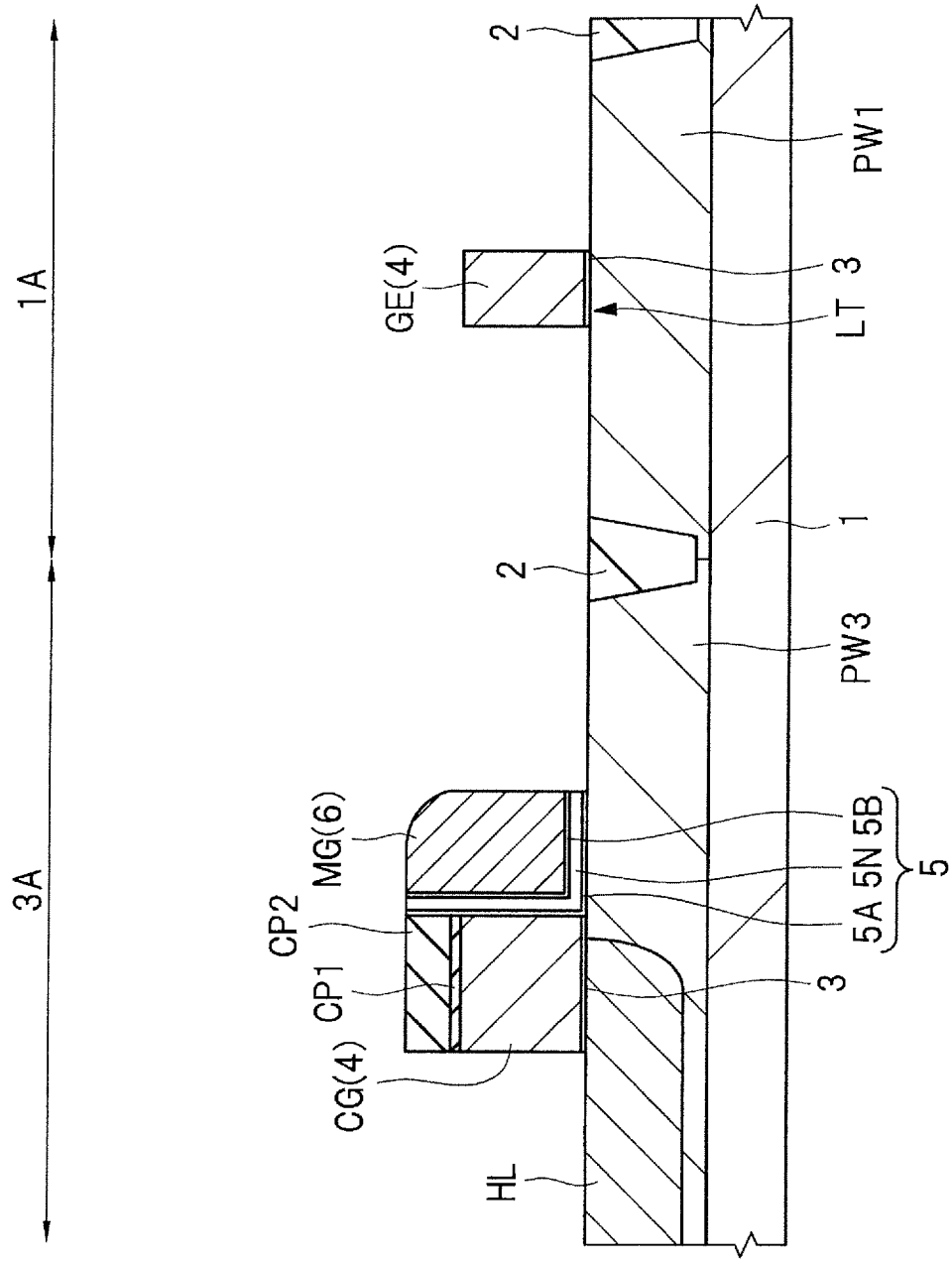
FIG. 26 is a main-portion cross-sectional view showing the manufacturing process of the semiconductor device in Embodiment 2, which is subsequent to FIG. 25.

Next, in the region of the silicon film 4 where the gate electrode GE of the MISFET (LT) is to be formed, a photoresist film (not shown) is formed using a photolithographic method and, using the photoresist film as a mask, the silicon film 4 is etched. Thereafter, the photoresist film (not shown) is removed by ashing or the like to form the gate electrode GE of the MISFET (LT) in the core MIS formation region 1A, as shown in FIG. 26. The gate length of the gate electrode GE of the MISFET (LT) is, e.g., about 40 μm.

The insulating film 3 remaining under the gate electrode GE serves as the gate insulating film of the MISFET (LT). The insulating film 3 except for the portion thereof covered with the gate electrode GE may also be removed during the formation of the foregoing gate electrode GE or by the subsequent patterning process or the like.

Figure 27:
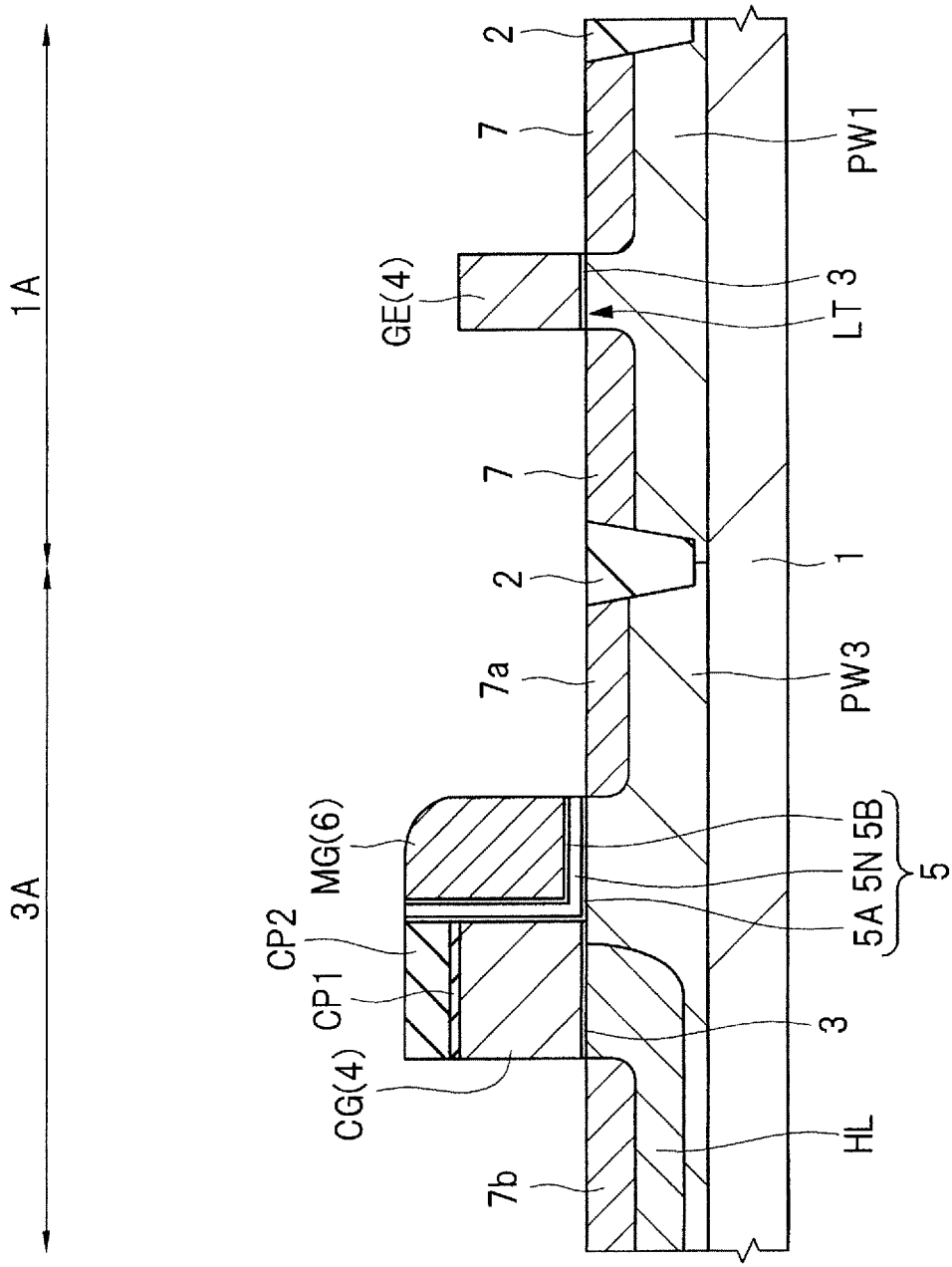
FIG. 27 is a main-portion cross-sectional view showing the manufacturing process of the semiconductor device in Embodiment 2, which is subsequent to FIG. 26.

Next, as shown FIG. 27, using a photoresist film (not shown) having an opening on one side (opposite to the memory gate electrode MG) of the control gate electrode CG as a mask, a p-type impurity is obliquely implanted (oblique implantation is performed). Thus, in the semiconductor substrate 1 located under the control gate electrode CG, a p-type halo region (p-type impurity region) HL is formed. The p-type halo region HL need not necessarily be formed. However, when the p-type halo region HL is formed, a depletion layer is inhibited from expanding from the drain region MD to the channel region of the memory transistor so that a short-channel effect in the memory transistor is suppressed. This can inhibit a reduction in the threshold voltage of the memory transistor. Thereafter, the foregoing photoresist film (not shown) is removed.

Next, in the memory cell region 3A, in the semiconductor substrate 1 (p-type well PW1), an n-type impurity such as arsenic (As) or phosphorus (P) is implanted to form the n$^-$-type semiconductor region 7a and the n$^-$-type semiconductor region 7b. At this time, the n$^-$-type semiconductor region 7a is formed by self-alignment with the side wall (side wall opposite to the side wall adjacent to the control gate electrode CG via the insulating film 5) of the memory gate electrode MG. On the other hand, the n$^-$-type semiconductor region 7b is formed by self-alignment with the side wall (side wall opposite to the side wall adjacent to the memory gate electrode MG via the insulating film 5) of the control gate electrode CG. In the core MIS formation region 1A, into the semiconductor substrate 1 (p-type well PW1) located on both sides of the gate electrode GE, an n-type impurity such as arsenic (As) or phosphorus (P) is implanted to form the n$^-$-type semiconductor regions 7. At this time, the n$^-$-type semiconductor regions 7 are formed by self-alignment with the side walls of the gate electrode GE.

The n⁻-type semiconductor region 7a, the n⁻-type semiconductor region 7b, and the n⁻-type semiconductor regions 7 may be formed by the same ion implantation process, but are formed herein by different ion implantation processes. By thus forming the n⁻-type semiconductor region 7a, the n⁻-type semiconductor region 7b, and the n⁻-type semiconductor regions 7 by the different ion implantation processes, the n⁻-type semiconductor region 7a, the n⁻-type semiconductor region 7b, and the n⁻-type semiconductor regions 7 can be formed to have respective desired impurity concentrations and desired junction depths.

Figure 28:
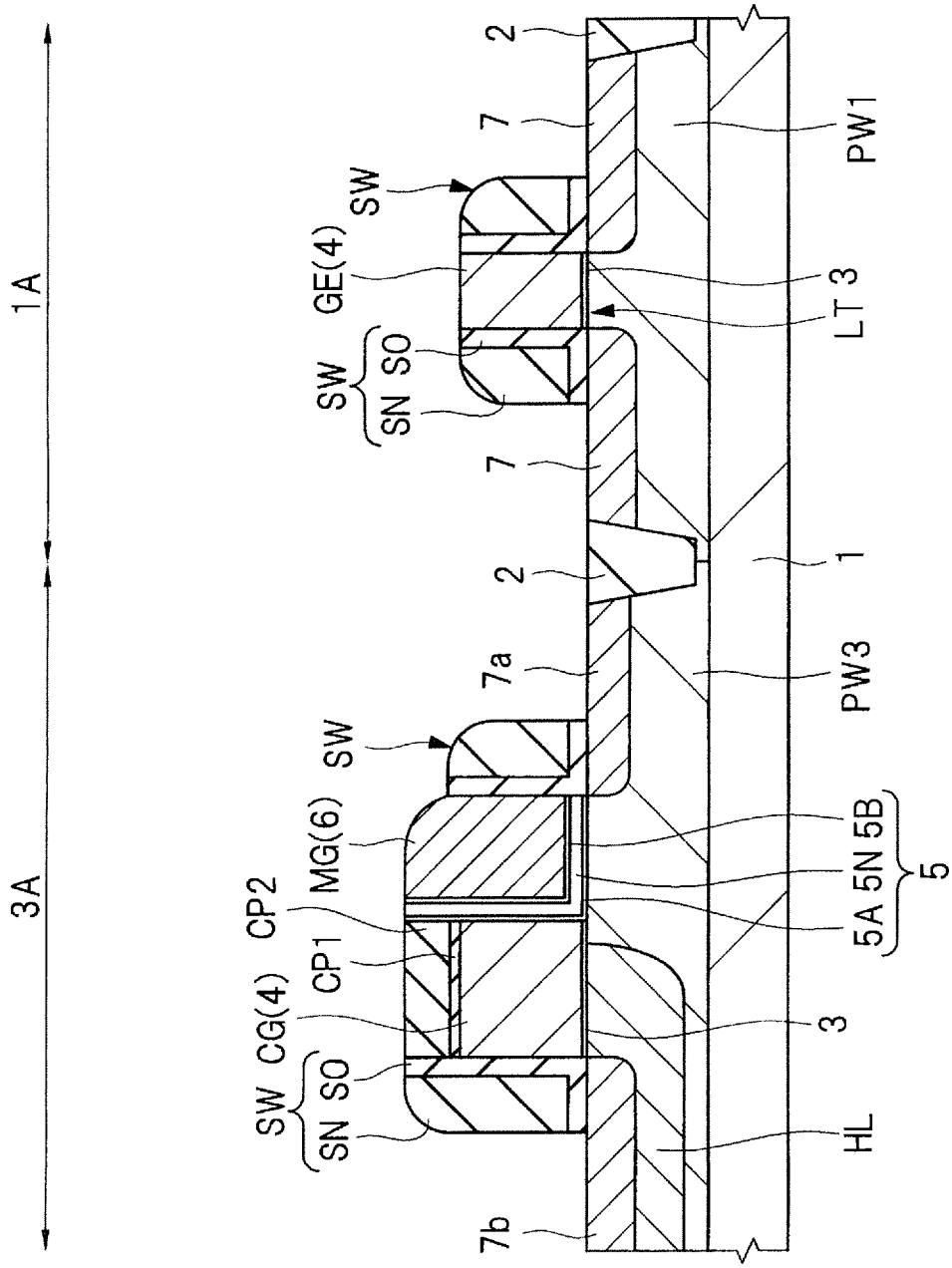
FIG. 28 is a main-portion cross-sectional view showing the manufacturing process of the semiconductor device in Embodiment 2, which is subsequent to FIG. 27.

Next, as shown in FIG. 28, in the memory cell region 3A, the side wall insulating films SW are formed over the side wall portions of the combined pattern of the control gate electrode CG and the memory gate electrode MG. On the other hand, in the core MIS formation region 1A, the side wall insulating films SW are formed over the side wall portions of the gate electrode GE. For example, by depositing the silicon oxide film SO over the entire main surface of the semiconductor substrate 1 and further depositing the silicon nitride film SN thereover, an insulating film made of the laminated film of the silicon oxide film SO and the silicon nitride film SN is formed. By etching back the insulating film, the side wall insulating films SW are formed over the side wall portions of the foregoing combined pattern (CG and MG) and over the side wall portions of the gate electrode GE. As each of the side wall insulating films SW, instead of the laminated film of the silicon oxide film and the silicon nitride film, an insulating film such as a single-layer silicon oxide film or a single-layer silicon nitride film may also be used.

Figure 29:
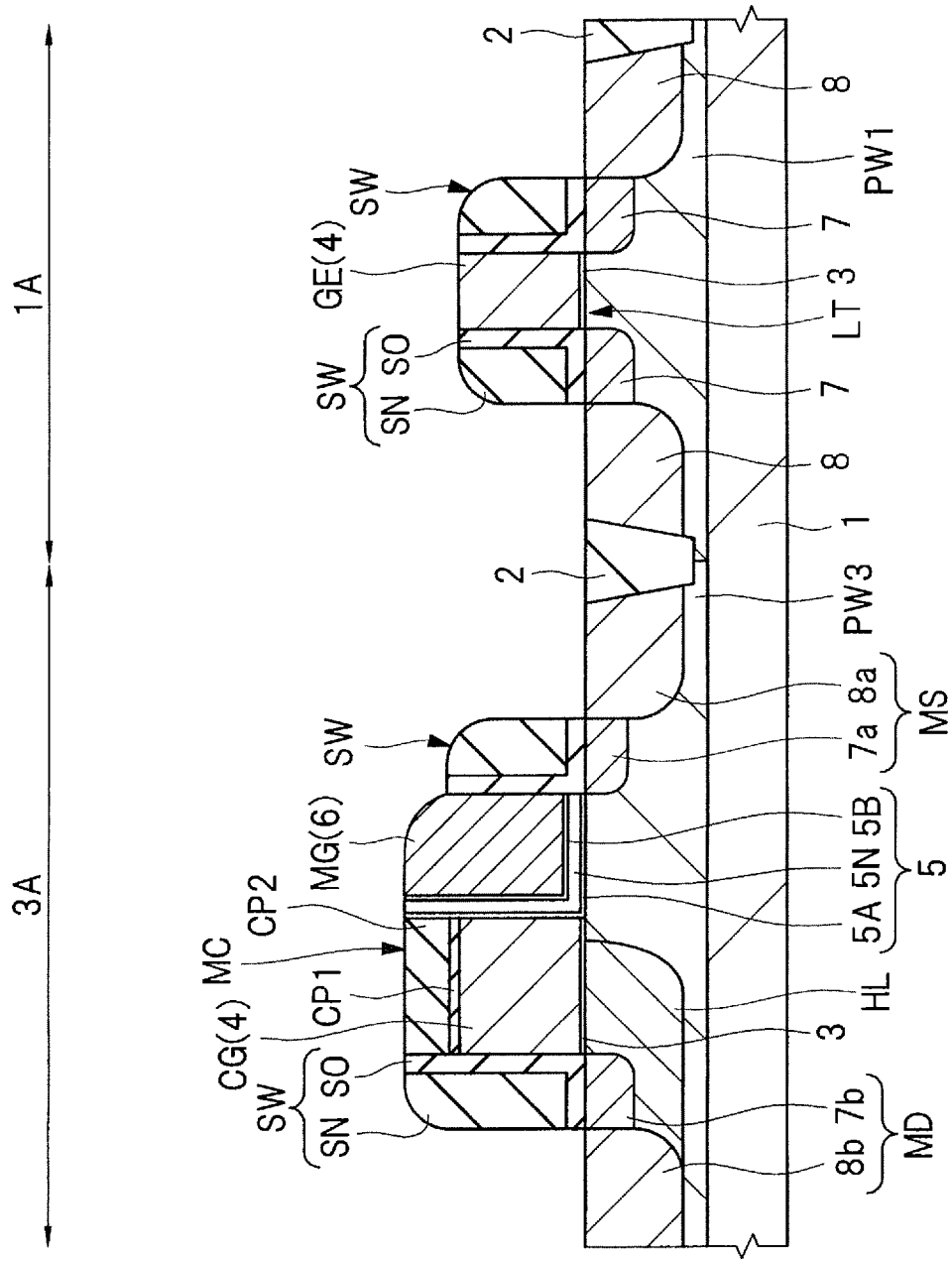
FIG. 29 is a main-portion cross-sectional view showing the manufacturing process of the semiconductor device in Embodiment 2, which is subsequent to FIG. 28.

Next, as shown in FIG. 29, using the control gate electrode CG, the memory gate electrode MG, and the side wall insulating films SW as a mask, an n-type impurity such as arsenic (As) or phosphorus (P) is implanted into the semiconductor substrate 1 (p-type well PW3) to form the high-impurity-concentration n⁺-type semiconductor region 8a, and the high-impurity-concentration n⁺-type semiconductor region 8b. At this time, the n⁺-type semiconductor region 8a is formed by self-alignment with the side wall insulating film SW closer to the memory gate electrode MG in the memory cell region 3A. On the other hand, the n⁺-type semiconductor region 8b is formed by self-alignment with the side wall insulating film SW closer to the control gate electrode CG in the memory cell region 3A. The n⁺-type semiconductor region 8a is formed as a semiconductor region having an impurity concentration higher than that of the n⁻-type semiconductor region 7a, and a junction depth deeper than that of the n⁻-type semiconductor region 7a. The n⁺-type semiconductor region 8b is formed as a semiconductor region having an impurity concentration higher than that of the n⁻-type semiconductor region 7b, and a junction depth deeper than that of the n⁻-type semiconductor region 7b. In the core MIS formation region 1A, into the semiconductor substrate 1 (p-type well PW1) located on both sides of the gate electrode GE, an n-type impurity such as arsenic (As) or phosphorus (P) is implanted to form the n⁺-type semiconductor regions 8. At this time, the n⁺-type semiconductor regions 8 are formed by self-alignment with the side wall insulating films SW over the side wall portions of the gate electrode GE. The n⁺-type semiconductor regions 8 are formed as semiconductor regions having impurity concentrations higher than those of the n⁻-type semiconductor regions 7 and junction depths deeper than those of the n⁻-type semiconductor regions 7. The n⁺-type semiconductor region 8a, the n⁺-type semiconductor region 8b, and the n⁺-type semiconductor regions 8 may also be formed to have different impurity concentrations, and different junction depths.

By the foregoing process, in the memory cell region 3A, the n-type drain region MD including the n⁻-type semiconductor region 7b, and the n⁺-type semiconductor region 8b and functioning as the drain region of the memory transistor is formed, and the source region MS including the n⁻-type semiconductor region 7a, and the n⁺-type semiconductor region 8a and functioning as the source region of the memory transistor is formed. On the other hand, in the core MIS formation region LA, the source/drain regions each having an LDD structure including the n⁻-type semiconductor region 7, and the n⁺-type semiconductor region 8 are formed.

Next, heat treatment (activation treatment) for activating the impurity introduced into the source region MS (n⁻-type semiconductor region 7a and n⁺-type semiconductor region 8a), the drain region MD (n⁻-type semiconductor region 7b and n⁺-type semiconductor region 8b), and the source/drain regions (7 and 8) is performed.

By the foregoing process, the MISFET (LT) is formed in the core MIS formation region 1A, and the memory cell MC is formed in the memory cell region 3A (FIG. 29).

Note that the process of forming the MISFET (LT), and the memory cell MC is not limited to the foregoing process.

<SMT and Silicide Process>

Figure 30:
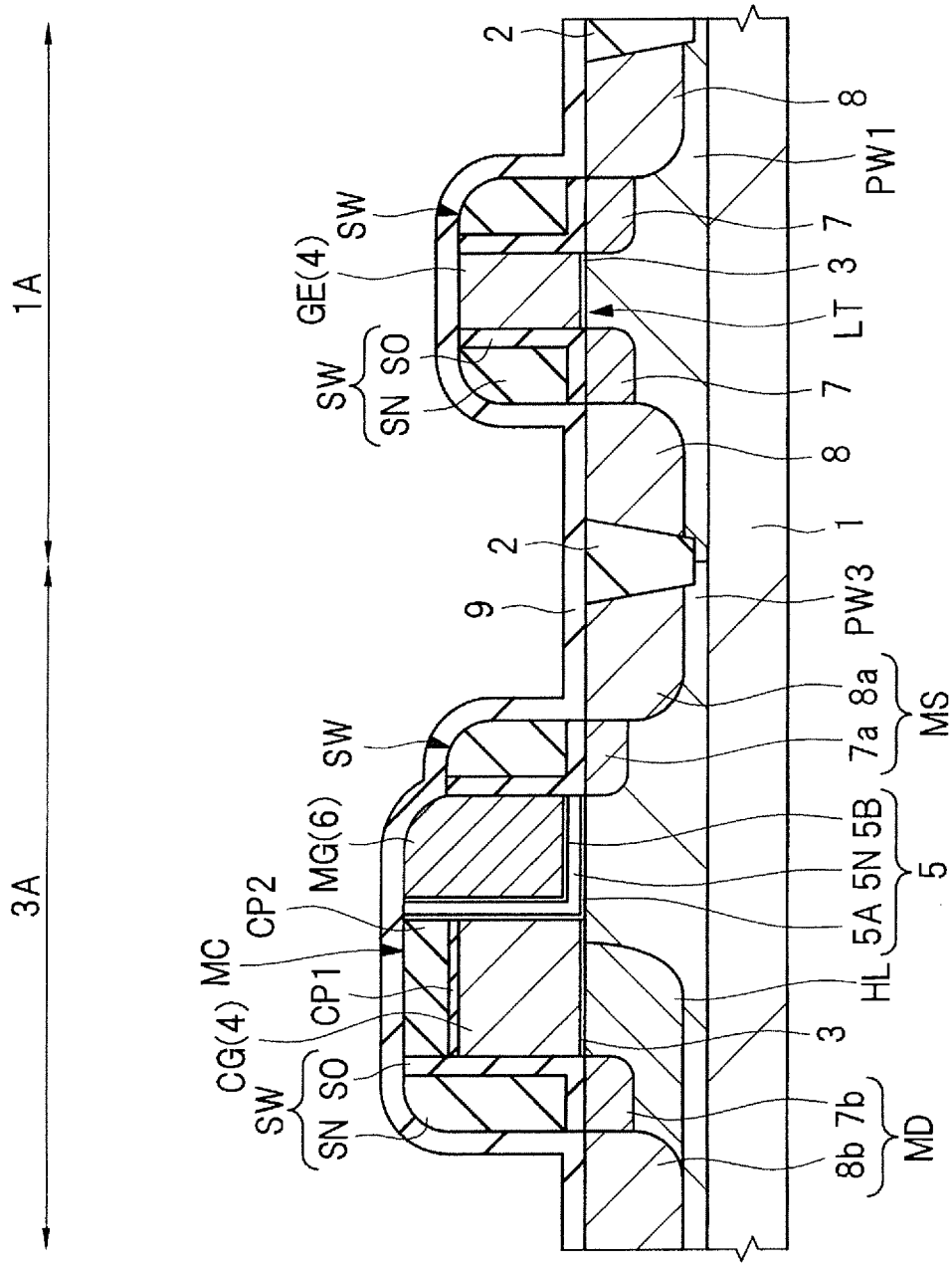
FIG. 30 is a main-portion cross-sectional view showing the manufacturing process of the semiconductor device in Embodiment 2, which is subsequent to FIG. 29.

Next, as shown in FIG. 30, over the semiconductor substrate 1 including the MISFET (LT), and the memory cell MC, a silicon oxide film is formed as the stopper film 9 to a thickness of about 13 nm using a CVD method. For example, the silicon oxide film is formed by a CVD method using, e.g., TEOS (Tetraethoxysilane) and ozone ($O_3$) as raw material gases. The stopper film 9 functions as the etching stopper in the etching of the stress application film 10 described later. The stopper film 9 can prevent undesired etching of each of the patterns (such as, e.g., portions each made of the silicon film) forming the MISFET (LT), and the memory cell MC.

Figure 31:
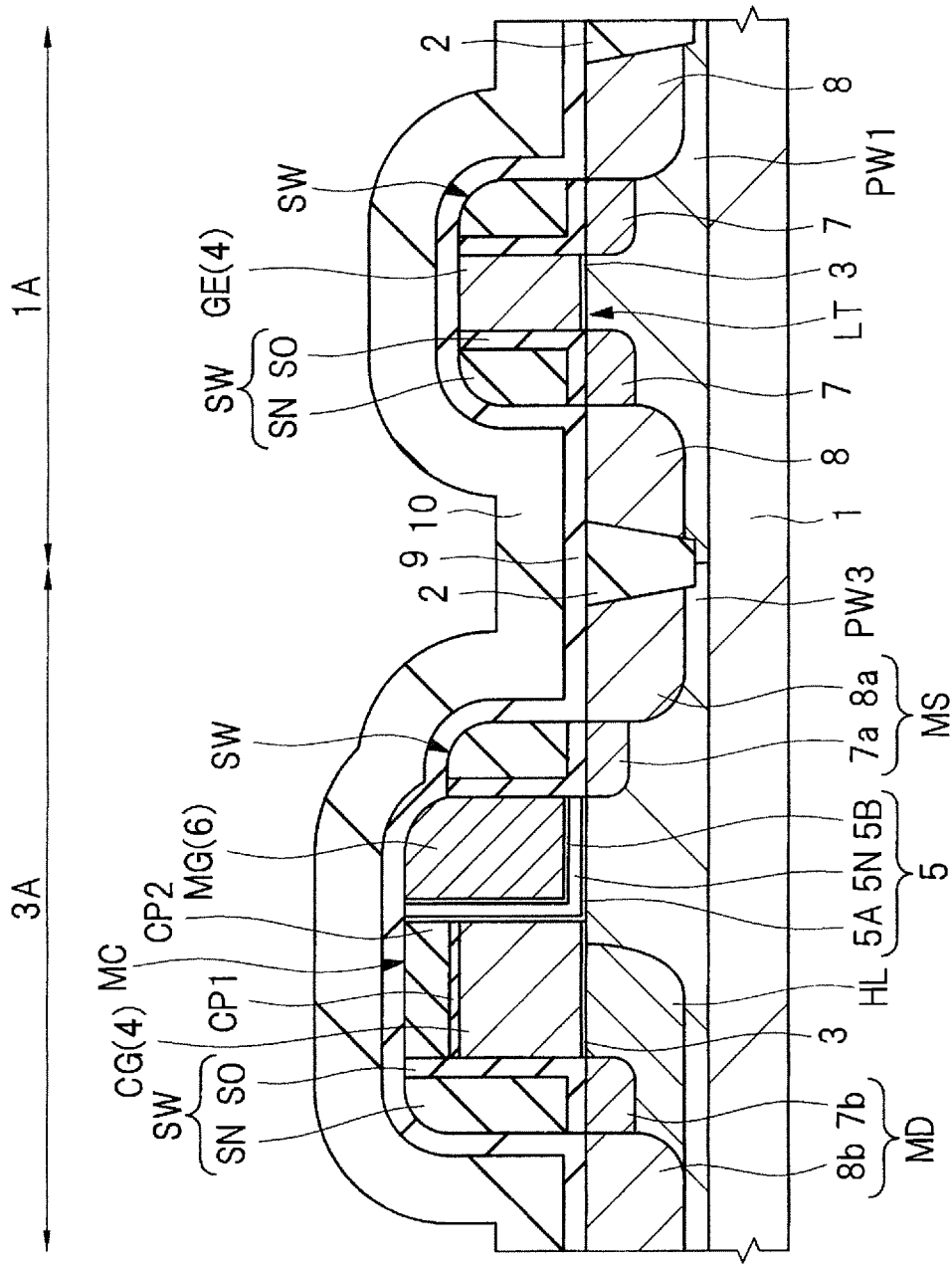
FIG. 31 is a main-portion cross-sectional view showing the manufacturing process of the semiconductor device in Embodiment 2, which is subsequent to FIG. 30.

Next, as shown in FIG. 31, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Figure 32:
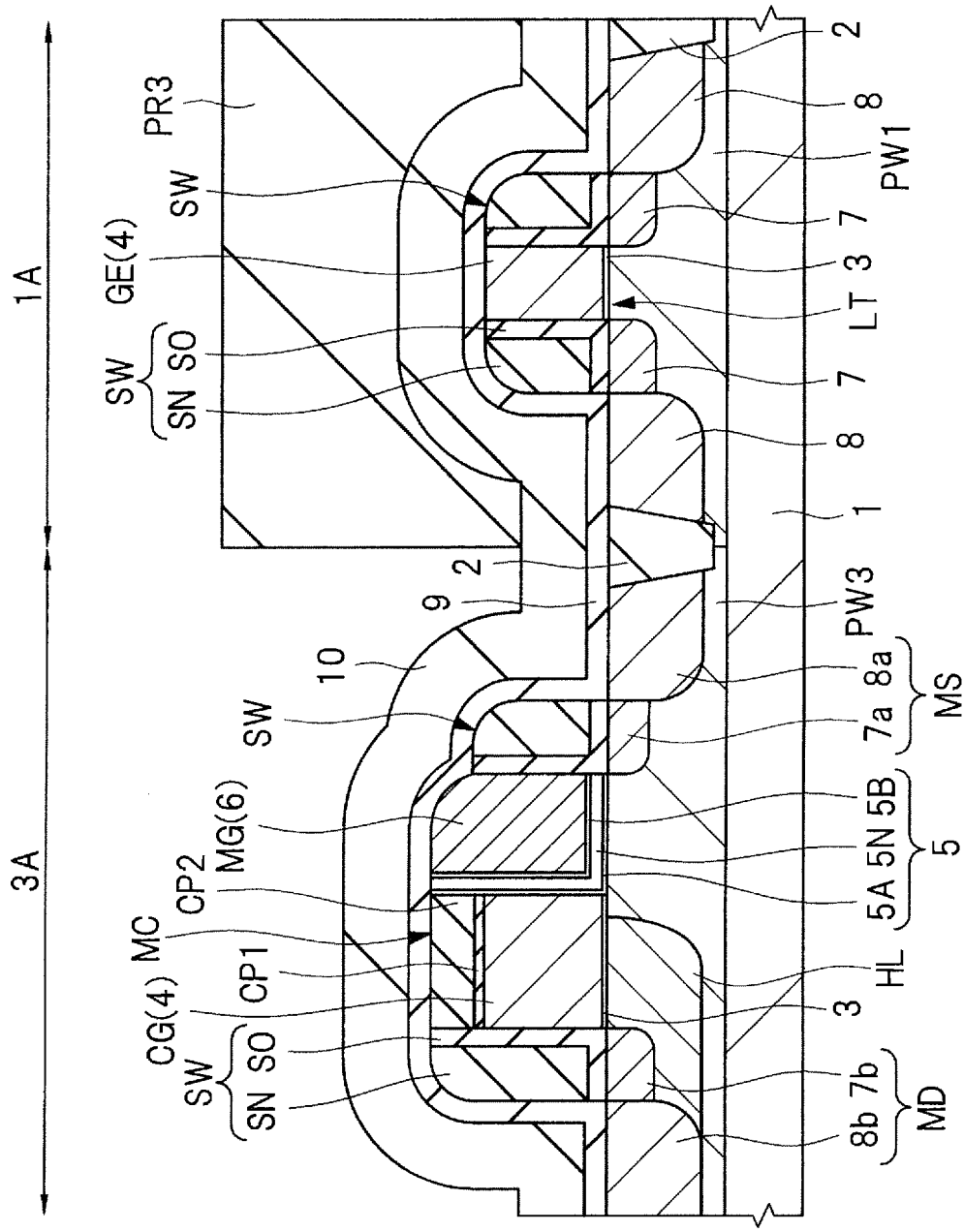
FIG. 32 is a main-portion cross-sectional view showing the manufacturing process of the semiconductor device in Embodiment 2, which is subsequent to FIG. 31.
Figure 33:
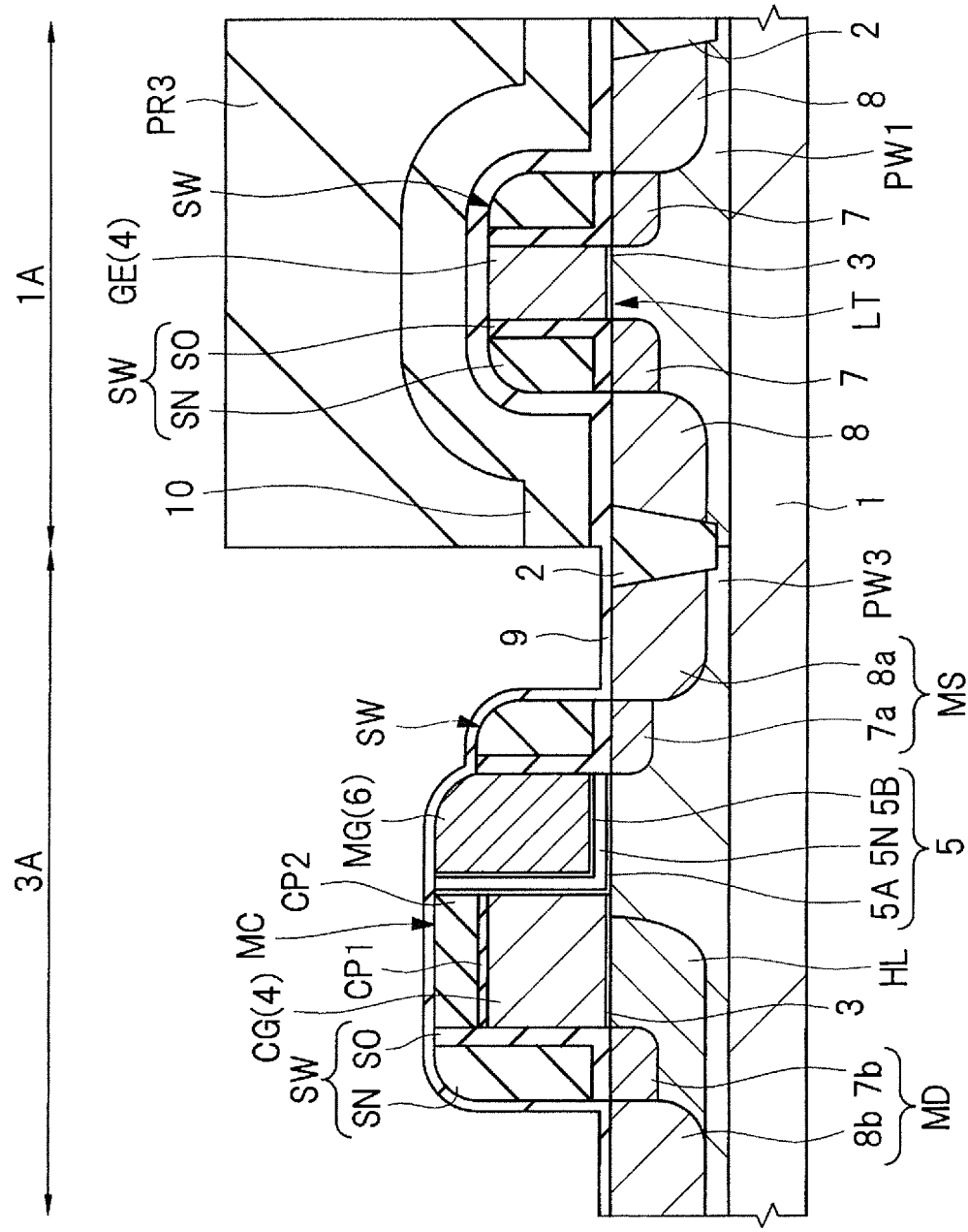
FIG. 33 is a main-portion cross-sectional view showing the manufacturing process of the semiconductor device in Embodiment 2, which is subsequent to FIG. 32.

Next, the stress application film 10 in the memory cell region 3A is removed therefrom. First, as shown in FIG. 32, over the stress application film 10 in the core MIS formation region 1A, a photoresist film PR3 is formed using photolithographic method. Then, as shown in FIG. 33, using the photoresist film PR3 as a mask, the stress application film 10 is etched. Here, the silicon nitride film forming the stress application film 10 is dry-etched. For example, using $CH_4$ as an etching gas, isotropic dry etching is performed. As a result, only the core MIS formation region 1A is covered with the stress application film 10. In other words, only the MISFET (LT) is covered with the stress application film 10. On the other hand, the stopper film 9 in the memory cell region 3A is exposed.

Here, the foregoing etching is performed under such condition that the etching selectivity is high, i.e., the ratio of the etching speed of the stress application film 10 to the etching speed of the stopper film 9 is high, but the stopper film 9 is also etched slightly. Accordingly, the thickness of the stopper film 9 in the memory cell region 3A becomes smaller than the thickness of the stopper film 9 remaining under the stress application film 10 in the core MIS formation region 1A (FIG. 33). Note that, when the thickness of the stopper film 9 in the memory cell region 3A is T93 and the thickness of the stopper film 9 in the core MIS formation region 1A is T91, a relationship given by T93<T91 is established.

Figure 34:
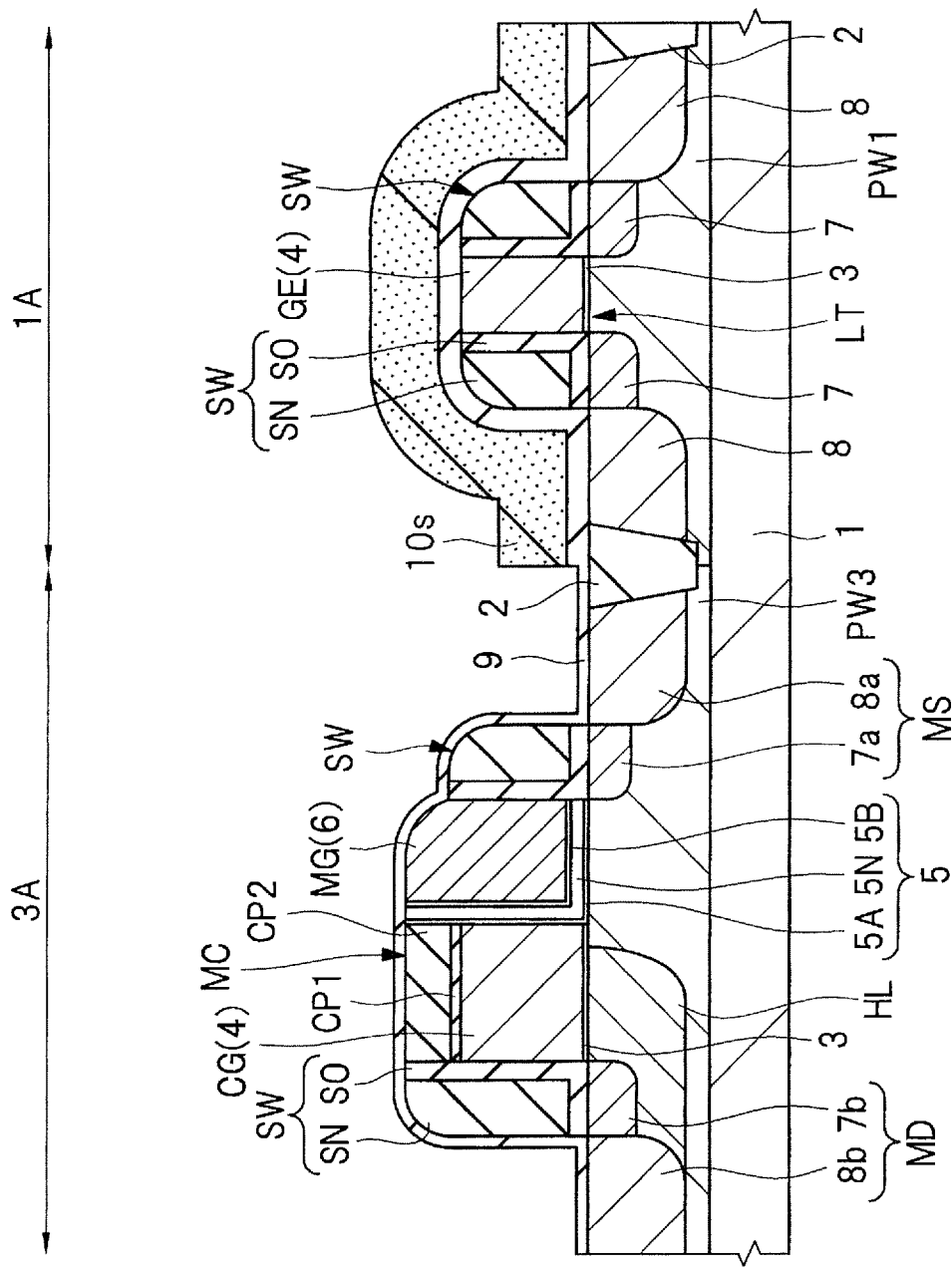
FIG. 34 is a main-portion cross-sectional view showing the manufacturing process of the semiconductor device in Embodiment 2, which is subsequent to FIG. 33.

Then, as shown in FIG. 34, after the photoresist film PR3 is removed by ashing treatment or the like, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to the MISFET (LT) in the core MIS formation region 1A. On the other hand, the stress application film 10 has been removed from the memory cell region 3A so that no stress is applied to the memory cell MC.

It may also be possible to activate the impurity introduced into the source region MS ($n^-$-type semiconductor region 7a and $n^+$-type semiconductor region 8a), the drain region MD ($n^-$-type semiconductor region 7b and $n^+$-type semiconductor region 8b), and the source/drain regions (7 and 8) using the heat treatment and omit the previous heat treatment (activation treatment). It may also be possible to crystallize the silicon films 4 and 6 each made of the amorphous silicon film by the heat treatment (crystallization treatment).

Figure 35:
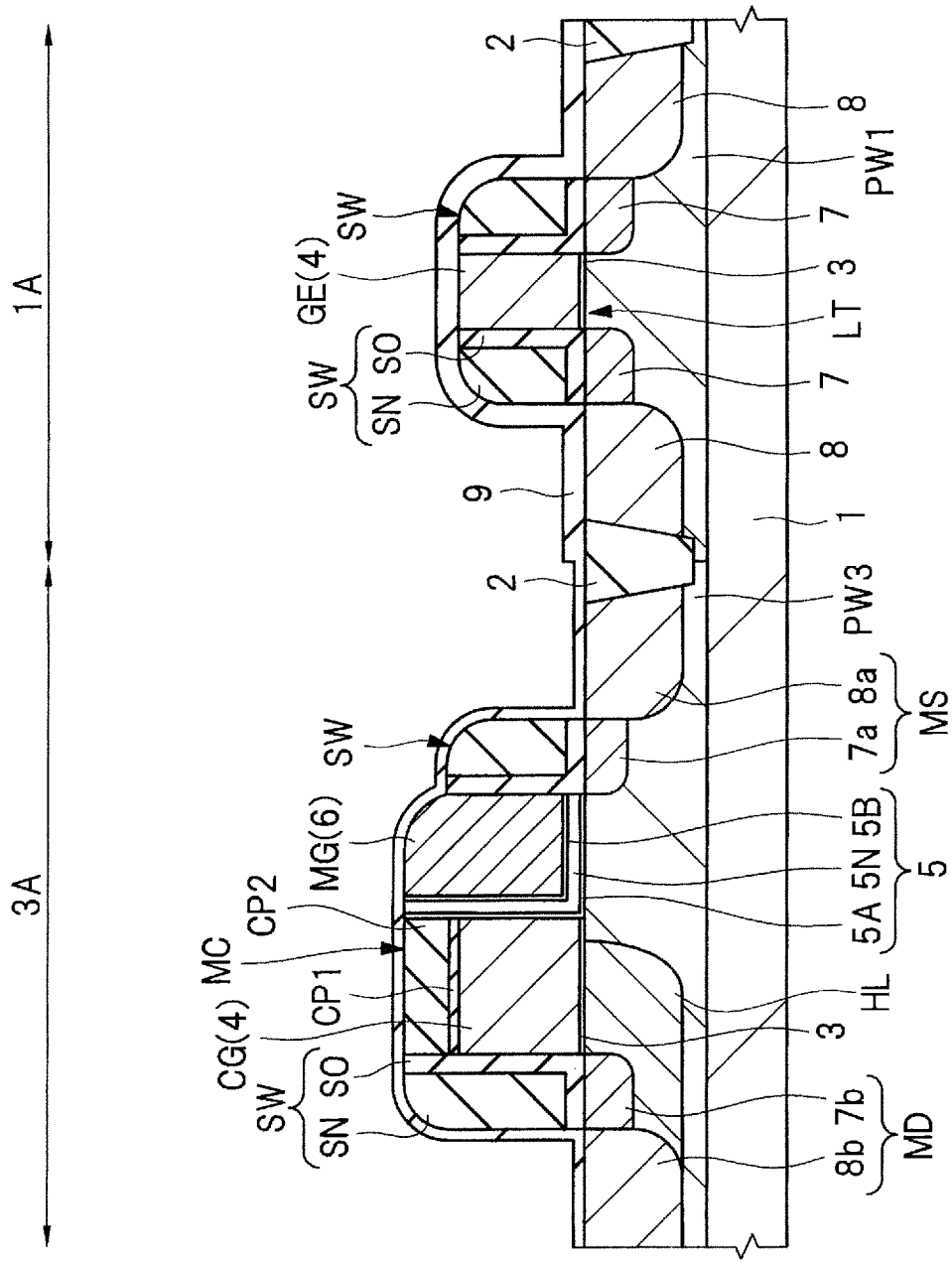
FIG. 35 is a main-portion cross-sectional view showing the manufacturing process of the semiconductor device in Embodiment 2, which is subsequent to FIG. 34.

Next, as shown in FIG. 35, the stress application film 10S in the core MIS formation region 1A is removed. Here, the silicon nitride film forming the stress application film 10S is wet-etched under such a condition that the etching selectivity is high, i.e., the ratio of the etching speed of the stress application film 10S to the etching speed of the stopper film 9 is high. For example, using a phosphoric acid ($H_3PO_4$) solution as an etchant, the wet etching is performed at 155° C. for 600 seconds. As a result, the stopper film 9 in each of the core MIS formation region 1A and the memory cell region 3A is exposed.

Figure 36:
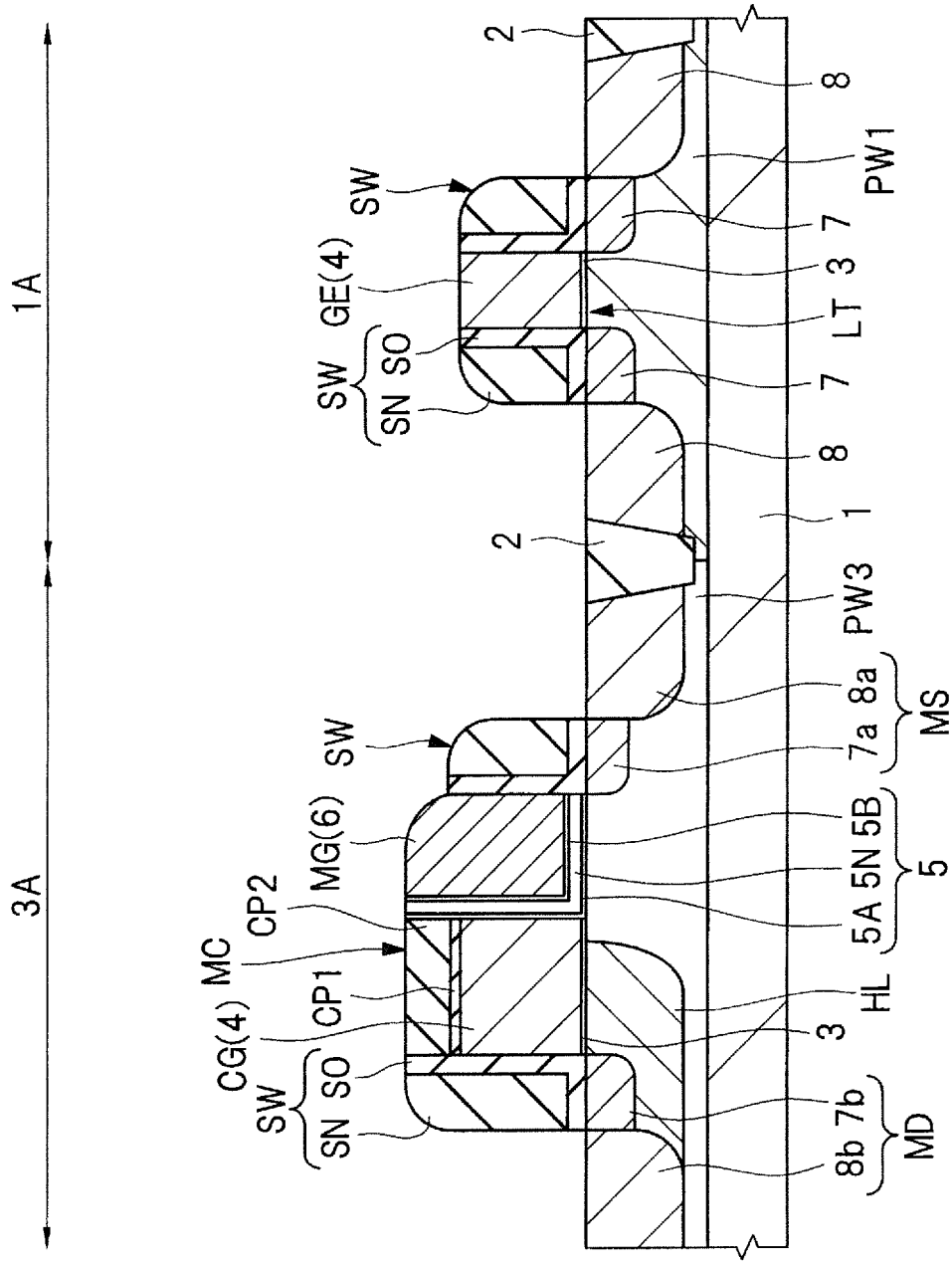
FIG. 36 is a main-portion cross-sectional view showing the manufacturing process of the semiconductor device in Embodiment 2, which is subsequent to FIG. 35.

Next, as shown in FIG. 36, the foregoing stopper film 9 is removed. Here, the silicon oxide film forming the stopper film 9 is wet-etched under such a condition that the etching selectivity is high, i.e., the ratio of the etching speed of the stopper film 9 to the etching speed of the semiconductor substrate 1 is high. For example, using a HF solution as an etchant, the wet etching is performed at 25° C. for 100 seconds.

Figure 37:
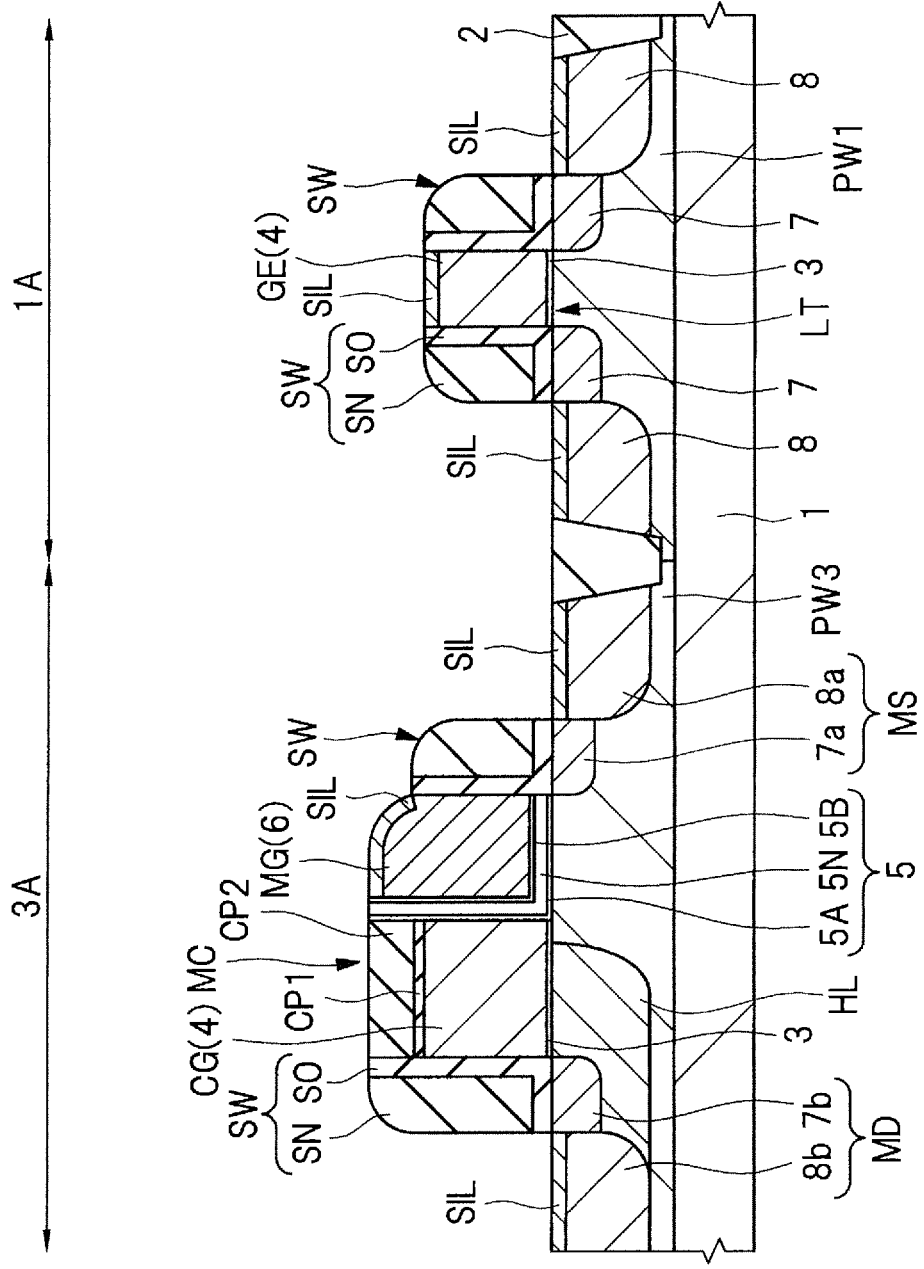
FIG. 37 is a main-portion cross-sectional view showing the manufacturing process of the semiconductor device in Embodiment 2, which is subsequent to FIG. 36.

Next, as shown in FIG. 37, using a salicide technique, in the respective upper portions of the memory gate electrodes MG, the $n^+$-type semiconductor region 8a, and the $n^+$-type semiconductor region 8b in the memory cell region 3A, the metal silicide layers (metal silicide films) SIL are formed. On the other hand, in the respective upper portions of the gate electrode GE and the $n^+$-type semiconductor regions 8 in the core MIS formation region 1A, the metal silicide layers SIL are formed.

The metal silicide layers SIL can reduce diffusion resistance, contact resistance, and the like. The metal silicide layers SIL can be formed as follows.

For example, over the entire main surface of the semiconductor substrate 1, a metal film (not shown) is formed and, by performing heat treatment on the semiconductor substrate 1, the respective upper-layer portions of the memory gate electrode MG, the gate electrodes GE, and the $n^+$-type semiconductor regions 8, 8a, and 8b are caused to react with the foregoing metal film. In this manner, in the respective upper portions of the memory gate electrode MG, the gate electrodes GE, and the $n^+$-type semiconductor regions 8, 8a, and 8b, the metal silicide layers SIL are formed. The foregoing metal film is made of, e.g., a cobalt (Co) film, a nickel (Ni) film, or the like and can be formed using a sputtering method or the like. Then, the unreacted metal film is removed.

Thereafter, over the entire main surface of the semiconductor substrate 1, an interlayer insulating film (not shown) is formed, though the illustration thereof is omitted. Then, in the interlayer insulating film, contact holes (not shown) which expose, e.g., the surfaces of the $n^+$-type semiconductor regions 8, 8a, and 8b are formed. By embedding a conductive film in the contact holes, plugs (not shown) are formed. Then, over the interlayer insulating film in which the plugs are embedded, wires (not shown) are formed.

Thus, according to the present embodiment, the SMT is applied only to the MISFET (LT) of the MISFET (LT) and the memory cell MC. This can generally improve the characteristics of the semiconductor device.

Figures 38, 39:
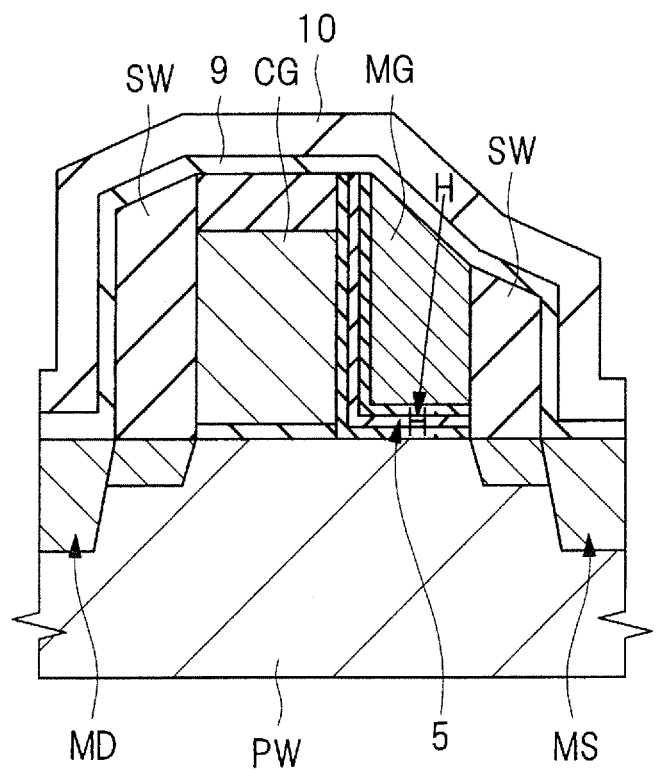
FIG. 38 is a view showing the characteristics of the MISFET (LT) and a memory cell MC after the SMT has been applied thereto.
FIG. 39 is a cross-sectional view of a memory cell provided with a silicon nitride film as a stress application film.

The present inventors have studied the case where the SMT is applied to each of the MISFET (LT) and the memory cell MC and obtained the result shown in FIG. 38. FIG. 38 is a view showing the characteristics of the MISFET (LT) and the memory cell MC after the SMT has been applied thereto.

That is, the present inventors have studied the case where, in a state in which the silicon nitride film as the stress application film 10 is present over each of the core MIS formation region 1A and the memory cell region 3A (see, e.g., FIG. 31), heat treatment is performed to apply a stress to each of the elements.

As shown in FIG. 38, with regard to the MISFET (LT), an increase in channel current (simply shown as "Current" in FIG. 38) due to the effect of the SMT can be recognized. However, the channel current in each of the MISFET (HT) and the memory cell MC has not changed. This may be conceivably because, with regard to the memory cell MC having a relatively large gate length, the effect of the SMT is poor and consequently the channel current has not increased.

On the other hand, the HC has decreased in each of the elements of the MISFET (LT) and the memory cell MC. This may be conceivably because the hydrogen (H) contained in the silicon nitride film used as the stress application film 10 affects the HC.

FIG. 39 is a cross-sectional view of a memory cell provided with the silicon nitride film as the stress application film. With regard to the memory cell shown in FIG. 39, the member having the same function as that of the memory cell MC shown in FIG. 20 is designated by the same reference numeral and a repeated description thereof is omitted. Note that "PW" denotes a p-type well.

As shown in FIG. 39, the H (hydrogen) in the silicon nitride film used as the stress application film 10 is diffused into the memory cell by the heat treatment for applying a stress. For example, when the H (hydrogen) reaches the silicon nitride film 5N as a middle layer forming the insulating film (ONO film) 5, shallow trap levels increase in the charge storage portion of the memory cell. When charges to be "written" to the memory cell are held by such shallow trap levels, the charges tend to be released to degrade the holding characteristic of the memory cell.

By contrast, in the present embodiment, the SMT is not applied to the memory cell MS to which the effect of the SMT is poor, and the stress application film (silicon nitride film) 10 over the memory cell MC is removed therefrom. Therefore, it is possible to avoid the degradation of the characteristics of the memory cell MC due to the H (hydrogen) in the foregoing silicon nitride film.

It will be appreciated that, for the MISFET (LT), an improvement in channel current can be achieved using the SMT.

By thus selectively applying the SMT, it is possible to generally improve the characteristics of the semiconductor device.

(Description of Application Example)

In the foregoing process, the stress application film 10 in the memory cell region 3A is entirely removed therefrom to expose the stopper film 9 in the region (see FIGS. 32 and 33). However, it may also be possible to remove the portion of the stress application film 10 in the memory cell region 3A which corresponds to a predetermined thickness from the surface thereof so as to reduce the thickness of the stress application film 10 in the memory cell region 3A.

Figure 40:
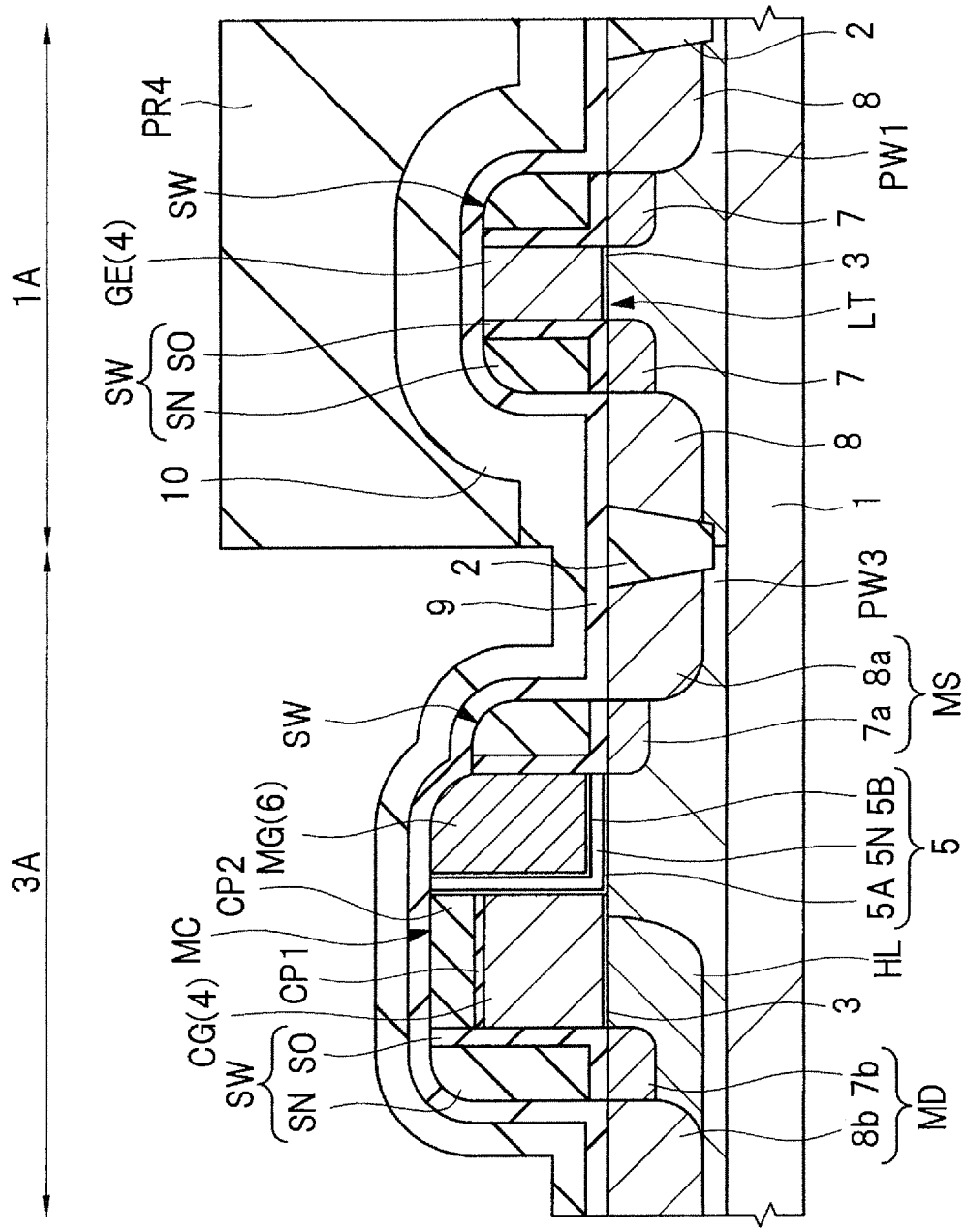
FIG. 40 is a main-portion cross-sectional view showing the manufacturing process of a semiconductor device in an application example of Embodiment 2.
Figure 41:
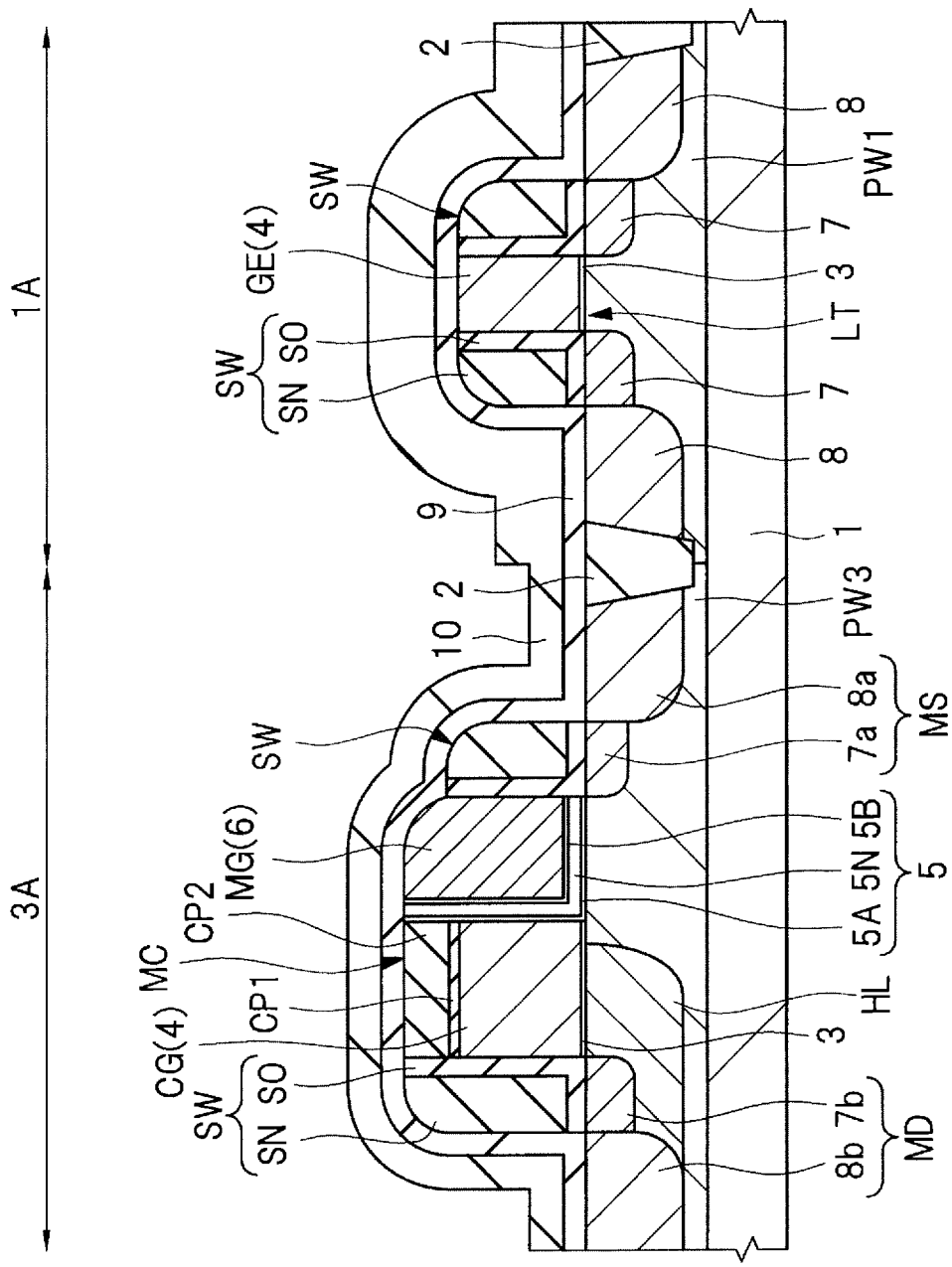
FIG. 41 is a main-portion cross-sectional view showing the manufacturing process of the semiconductor device in the application example of Embodiment 2, which is subsequent to FIG. 40.

FIGS. 40 and 41 are main-portion cross-sectional views showing the manufacturing process of the semiconductor device in an application example of the present embodiment.

<Process of Forming MISFET (LT) and Memory Cell MC)>

As has been described with reference to FIGS. 21 to 29, the MISFET (LT) is formed in the core MIS formation region 1A, and the memory cell MC is formed in the memory cell region 3A (FIG. 29).

<SMT and Silicide Process>

Next, as shown in FIG. 40, over the semiconductor substrate 1 including the MISFET (LT), and the memory cell MC, a silicon oxide film is formed as the stopper film 9 to a thickness of about 5 nm using a CVD method. Then, over the stopper film 9, a silicon nitride film is formed as the stress application film 10 to a thickness of about 35 nm using a CVD method.

Next, over the stress application film 10 in the core MIS formation region 1A, a photoresist film PR4 is formed using a photolithographic method. Then, using the photoresist film PR4 as a mask, the portion of the stress application film 10 corresponding to the predetermined thickness is etched from the surface thereof. Here, from the surface of the silicon nitride film forming the stress application film 10, the portion thereof corresponding to a thickness of about 25 nm is anisotropically or isotropically dry-etched. In other words, the dry etching is performed until the thickness of the silicon nitride film becomes about 10 nm. For example, using $CF_4$ as an etching gas, the dry etching is performed. As a result, the thickness of the stress application film 10 in the memory cell region 3A becomes smaller than the thickness of the stress application film 10 in the core MIS formation region 1A (FIG. 40). Note that, when the thickness of the stress application film 10 in the memory cell region 3A is T103 and the thickness of the stress application film 10 in the core MIS formation region 1A is T101, a relationship given by T103<T101 is established.

Then, as shown in FIG. 41, the photoresist film PR4 is removed by ashing treatment or the like. Thereafter, heat treatment is performed. For example, as first treatment, momentary anneal (referred to also as spike RTA) is performed at 1010° C. for a moment of not longer than one second. Then, as second treatment, laser anneal at 1230° C. is performed. This causes a stress in the stress application film 10. By the stress application film 10, the stress is applied to the MISFET (LT) in the core MIS formation region 1A. Here, as the heat treatment for applying the stress to the stress application film 10, heat treatment performed at a temperature of not less than 1000° C. for a moment of not longer than one second is preferred. On the other hand, since the stress application film 10 in the memory cell region 3A has a small thickness, a large stress is not applied to the memory cell MC. The thickness of the stress application film 10 in the memory cell region 3A is preferably adjusted to be not more than 20 nm.

Thereafter, as has been described with reference to FIGS. 34 to 37, the stress application film 10 after the heat treatment is removed, and the stopper film 9 is further removed. Then, using a salicide technique, the metal silicide layers (metal silicide films) SIL are formed.

Thus, according to the present embodiment, over the MISFET (LT) and the memory cell MC, the stress application film 10 is formed and subjected to the heat treatment. However, since the thickness of the stress application film 10 in the memory cell region 3A is reduced, it is possible to reduce the influence of the H (hydrogen) in the silicon nitride film used as the stress application film. Therefore, it is possible to reduce the degree of degradation of the characteristics of the memory cell MC due to the H (hydrogen) in the silicon nitride film described above.

Also, in the present embodiment, the thin stress application film 10 remains in the memory cell region 3A so that no thickness difference is produced between the stopper film 9 in the memory cell region 3A and the stopper film 9 in the core MIS formation region 1A.

That is, in FIG. 35, the thickness of the stopper film 9 in the memory cell region 3A is smaller than the thickness of the stopper film 9 in the core MIS formation region 1A. In such a case, depending on the thickness of the remaining stopper film 9 and a thickness difference therein, it becomes difficult to control the etching.

Figure 42:
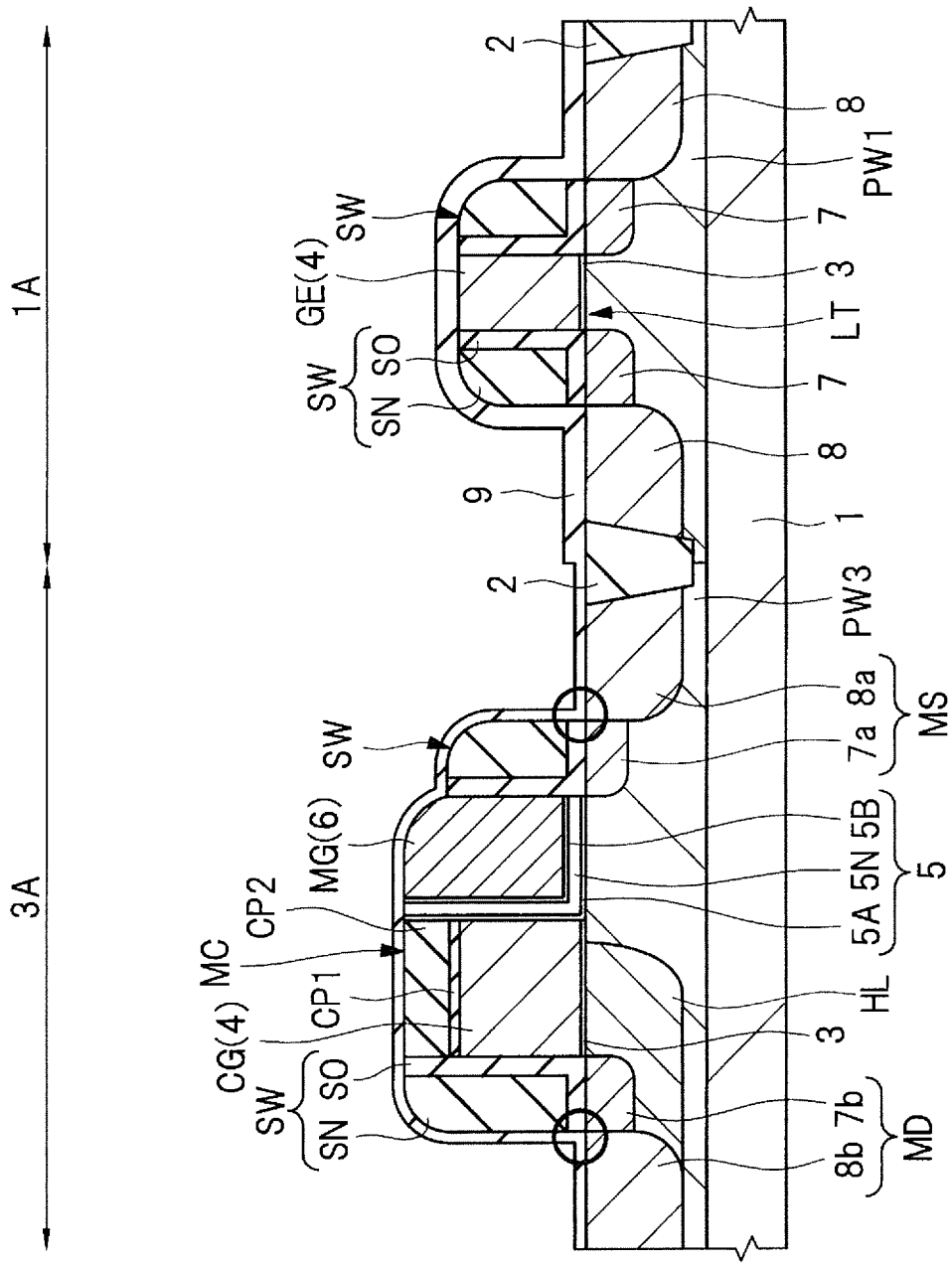
FIG. 42 is a main-portion cross-sectional view for illustrating the effect of the manufacturing process of the semiconductor device in the application example of Embodiment 2.

That is, when the etching is performed based on a thicker film portion, a thinner film portion is brought into an over-etched state. For example, an end portion of the silicon oxide film SO forming the side wall insulating films SW and the portions enclosed in the circles in FIG. 42 are etched undesirably. If the metal silicide layers SIL grow in such portions, an increase in leakage current or the degradation of a breakdown voltage may occur. FIG. 42 is a main-portion cross-sectional view for illustrating the effect of the manufacturing process of the semiconductor device in the application example of the present embodiment.

On the other hand, when the etching is performed based on the thinner film portion, the residues of the stopper film 9 may be left in the thicker film portion. Over such residues, the metal silicide layers SIL do not sufficiently grow to result in a problem.

By contrast, according to the present embodiment, by preventing a thickness difference in the stopper film 9, it is possible to avoid the growth of the metal silicide layers SIL in the foregoing portions where it is undesired as well as no growth of the metal silicide layers SIL due to the residues of the stopper film 9. As a result, even when the silicon oxide film is formed of a thin film having a thickness of, e.g., about 5 nm, a thickness difference in the stopper film 9 can be prevented to allow the excellent metal silicide layers SIL to be formed.

In the present embodiment, as the memory cell MC, the memory cell MC of the type having the insulating film (ONO film) 5, i.e., the split-gate memory cell MC using the silicon nitride film 5N serving as the middle layer of the insulating film 5 as the charge storage portion has been described by way of example. However, the structure of the memory cell may also be configured to have only the memory gate MG, and the charge storage film made of the insulating film (ONO film) without having the control gate electrode CG. Instead, a memory cell having a charge storage portion made not of an insulating film, but of a conductive film of polysilicon or the like may also be used.

For example, as the memory cell, a memory (hereinafter referred to as the "FG memory cell" and referred to also as a NOR flash memory, an NAND flash memory, or the like) of a type having a floating gate electrode FG in an insulating film may also be used.

Figure 43:
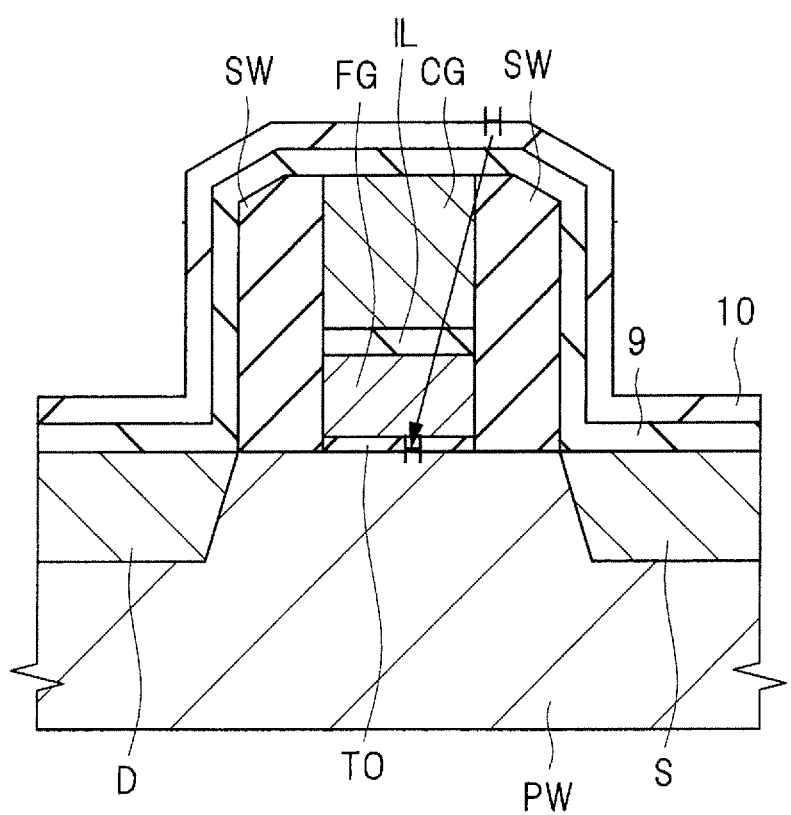
FIG. 43 is a cross-sectional view of an FG memory cell provided with a silicon nitride film as a stress application film.

FIG. 43 is a cross-sectional view of the FG memory cell provided with a silicon nitride film as a stress application film. The FG memory cell has a floating gate electrode (gate electrode) FG disposed over the semiconductor substrate (p-type well PW) via a tunnel oxide film (insulating film) TO, and a control gate electrode (gate electrode) CG disposed over the floating gate electrode (gate electrode) FG via an insulating film IL. The memory cell MC further has a source region S and a drain region D which are formed in the p-type well PW of the semiconductor substrate 1. Over the side wall portions of the laminated portions of the floating gate electrode FG, the control gate electrode CG, and the like, the side wall insulating films SW each made of an insulating film are formed. Thus, the memory cell has the floating gate electrode FG surrounded by the insulating films (referred to also as gate insulating films TO, IL, and SW) as the charge storage portion.

In a memory cell of such a type also, as shown in FIG. 43, the H (hydrogen) in the silicon nitride film used as the stress application film is diffused into the memory cell by the heat treatment for applying a stress. For example, upon reaching the tunnel oxide film TO under the floating gate electrode FG, the H (hydrogen) is bonded to silicon (Si) to form a Si—H bond. Then, when hot carriers are generated by a rewrite operation to the memory cell or the like, the Si—H bond is cut to result in an interfacial level. If a large number of such interfacial levels are formed, the carriers are trapped to degrade a rewrite characteristic (write characteristic and erase characteristic).

Accordingly, by removing the stress application film 10 in the memory cell region therefrom and selectively applying the SMT in the semiconductor device having the MISFET (LT) and the FG memory cell as in the present embodiment, it is possible to generally improve the characteristics of the semiconductor device.

Additionally, by removing the portion of the stress application film in the memory cell region which corresponds to a predetermined thickness from the surface thereof so as to reduce the thickness of the stress application film in the semiconductor device having the MISFET (LT) and the FG memory cell as in the application example of the present embodiment, it is possible to reduce the degree of degradation of the characteristics of the memory cell due to the H (hydrogen) in the silicon nitride film used as the stress application film. It is also possible to prevent a thickness difference in the stopper film 9 and form excellent metal silicide layers.

As an example of the memory cell having the flowing gate electrode FG, a memory cell having a single-gate structure as shown in FIG. 43 is shown. However, a memory cell having a split-gate structure and the floating gate electrode FG, like the memory cell in the present embodiment, may also be used.

(Embodiment 3)

Referring to the drawings, a description will be given of a structure of a semiconductor device (semiconductor storage device) in the present embodiment.

—Description of Structure—

Figure 44:
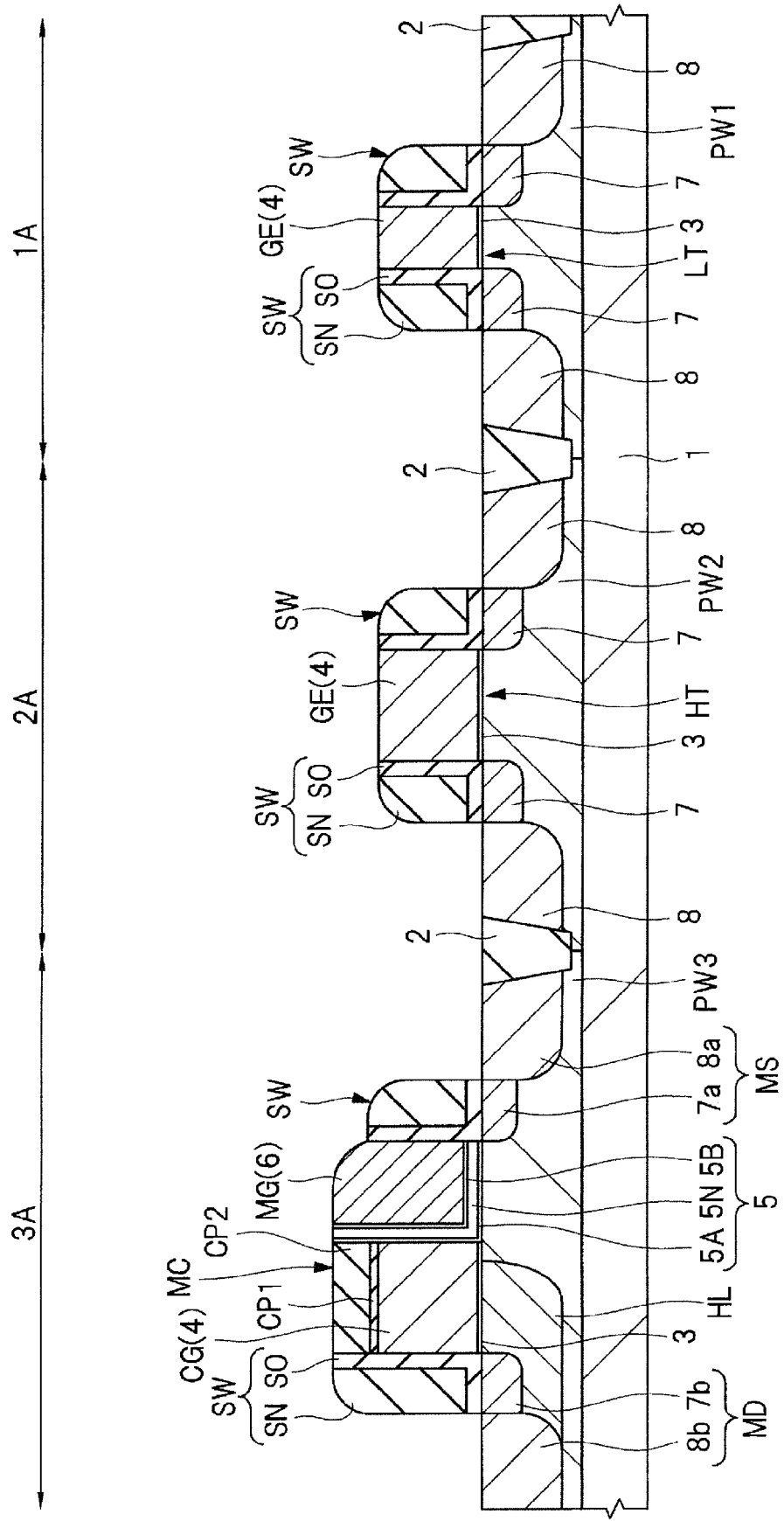
FIG. 44 is a main-portion cross-sectional view showing a configuration of a semiconductor device in Embodiment 3.

FIG. 44 is a main-portion cross-sectional view showing a configuration of the semiconductor device in the present embodiment. The semiconductor device in the present embodiment has the MISFET (LT), the MISFET (HT), and the memory cell MC.

The MISFET (LT) is the MISFET formed in the core MIS formation region 1A and having the gate length smaller than that of the MISFET (HT). The gate length of the MISFET (LT) is, e.g., about 40 nm. Such a MISFET having a relatively small gate length is used in, e.g., a circuit (referred to also as a core circuit or peripheral circuit) for driving the memory cell MC. The drive voltage of the MISFET (LT) tends to be lower than that of the MISFET (HT). The insulating film 3 of the MISFET (LT) may be thinner than the insulating film 3 of the MISFET (HT).

On the other hand, the MISFET (HT) is the MISFET formed in the I/O MIS formation region 2A and having the gate length larger than that of the MISFET (LT). The gate length of the MISFET (HT) is, e.g., about 1000 nm. Such a MISFET having a relatively large gate length is used in, e.g., an input/output circuit (referred to also as an I/O circuit) or the like. The drive voltage of the MISFET (HT) tends to be higher than that of the MISFET (LT). The insulating film 3 of the MISFET (HT) may be thicker than the insulating film 3 of the MISFET (LT).

The MISFET (LT) has the gate electrode GE disposed over the semiconductor substrate 1 (p-type well PW1) via the insulating film 3, and the source/drain regions disposed in the semiconductor substrate 1 (p-type well PW1) located on both sides of the gate electrode GE. Over the side wall portions of the gate electrode GE, the side wall insulating films SW each made of an insulating film are formed. Here, each of the side wall insulating films SW is formed of the laminated body of the silicon oxide film SO and the silicon nitride film SN. Each of the source/drain regions has the LDD structure and includes the $n^+$-type semiconductor region 8, and the $n^-$-type semiconductor region 7. The $n^-$-type semiconductor regions 7 are formed by self-alignment with the side walls of the gate electrode GE. The $n^+$-type semiconductor regions 8 are formed by self-alignment with the side surfaces of the side wall insulating films SW to have the junction depths deeper than those of the $n^-$-type semiconductor regions 7 and the impurity concentrations higher than those of the $n^-$-type semiconductor regions 7.

The MISFET (HT) has the gate electrode GE disposed over the semiconductor substrate 1 (p-type well PW2) via the insulating film 3, and the source/drain regions disposed in the semiconductor substrate 1 (p-type well PW2) located on both sides of the gate electrode GE. Over the side wall portions of the gate electrode GE, the side wall insulating films SW each made of an insulating film are formed. Here, each of the side wall insulating films SW is formed of the laminated body of the silicon oxide film SO and the silicon nitride film SN. Each of the source/drain regions has the LDD structure and includes the $n^+$-type semiconductor region 8, and the $n^-$-type semiconductor region 7. The $n^-$-type semiconductor regions 7 are formed by self-alignment with the side walls of the gate electrode GE. The $n^+$-type semiconductor regions 8 are formed by self-alignment with the side surfaces of the side wall insulating films SW to have the junction depths deeper than those of the $n^-$-type semiconductor regions 7 and the impurity concentrations higher than those of the $n^-$-type semiconductor regions 7.

The memory cell MC has the control gate electrode (gate electrode) CG disposed over the semiconductor substrate 1 (p-type well PW3), and the memory gate electrode (gate electrode) MG disposed over the semiconductor substrate 1 (p-type well PW3) to be adjacent to the control gate electrode CG. Over the control gate electrode CG, the thin silicon oxide film CP1 and the silicon nitride film (cap insulating film) CP2 are disposed. The memory cell MC further has the insulating film 3 disposed between the control gate electrode CG and the semiconductor substrate 1 (p-type well PW3), and the insulating film 5 disposed between the memory gate electrode MG and the semiconductor substrate 1 (p-type well PW3) and disposed between the memory gate electrode MG and the control gate electrode CG.

The memory cell MC further has the source region MS, and the drain region MD which are formed in the p-type well PW3 of the semiconductor substrate 1. Over the side wall portions of the combined pattern of the memory gate electrode MG and the control gate electrode CG, the side wall insulating films SW each made of an insulating film are formed. Here, each the side wall insulating films SW is formed of the laminated body of the silicon oxide film SO and the silicon nitride film SN. The source region MS includes the $n^+$-type semiconductor region $8a$, and the $n^-$-type semiconductor region $7a$. The $n^-$-type semiconductor region $7a$ is formed by self-alignment with the side wall of the memory gate electrode MG. The $n^+$-type semiconductor region $8a$ is formed by self-alignment with the side surface of the side wall insulating film SW closer to the memory gate electrode MG to have the junction depth deeper than that of the $n^-$-type semiconductor region $7a$, and the impurity concentration higher than that of the $n^-$-type semiconductor region $7a$. The drain region MD includes the $n^+$-type semiconductor region $8b$, and the $n^-$-type semiconductor region $7b$. The $n^-$-type semiconductor region $7b$ is formed by self-alignment with the side wall of the control gate electrode CG. The $n^+$-type semiconductor region $8b$ is formed by self-alignment with the side surface of the side wall insulating film SW closer to the control gate electrode CG to have a junction depth deeper than that of the $n^-$-type semiconductor regions $7b$, and an impurity concentration higher than that of the $n^-$-type semiconductor region $7b$.

Here, in the present embodiment (FIG. 44), to the channel region of the MISFET (LT) among the MISFET (LT), the MISFET (HT), and the memory cell MC, a stress is applied using the SMT while, to the channel regions of the MISFET (HT) and the memory cell MC, no stress is applied.

The SMT is the technique which applies a stress from the upper portion and side surface portions of the gate electrode of a MISFET to the channel region thereof to cause the crystal in the channel region to strain and thus improve the mobility of carriers in the channel region.

Specifically, a stress application film is formed over the upper portion of each of the gate electrodes and subjected to heat treatment. By the heat treatment, a stress (compressive stress or tensile stress) is applied to the stress application film. The stress reaches the channel region under the gate electrode GE to change a crystal spacing in the channel region and thus allow an improvement in the mobility of carriers. The stress applied to the channel region is maintained even after the stress application film is removed.

As a result, in the present embodiment (FIG. 44), the crystal spacing in the channel region of the MISFET (LT) among the MISFET (LT), the MISFET (HT), and the memory cell MC has been changed by the SMT. On the other hand, since the SMT is not applied to the MISFET (HT) and the memory cell MC, there is no change due to the SMT in the crystal spacing in the channel region of each of the MISFET (HT) and the memory cell MC. Thus, in the semiconductor device of the present embodiment, the SMT is not applied to each of the elements, but is selectively applied to be able to generally improve the characteristics of the semiconductor device. A detailed description will be further given in the following "Description of Manufacturing Method" section.

—Description of Manufacturing Method—

Next, referring to FIGS. 45 to 61, a method of manufacturing the semiconductor device in the present embodiment will be described. FIGS. 45 to 61 are main-portion cross-sectional views showing the manufacturing process of the semiconductor device in the present embodiment.

<Process of Forming MISFET (LT), MISFET (HT), and Memory Cell MC>

First, a description will be given of an example of the process of forming the MISFET (LT), the MISFET (HT), and the memory cell MC.

Figure 45:
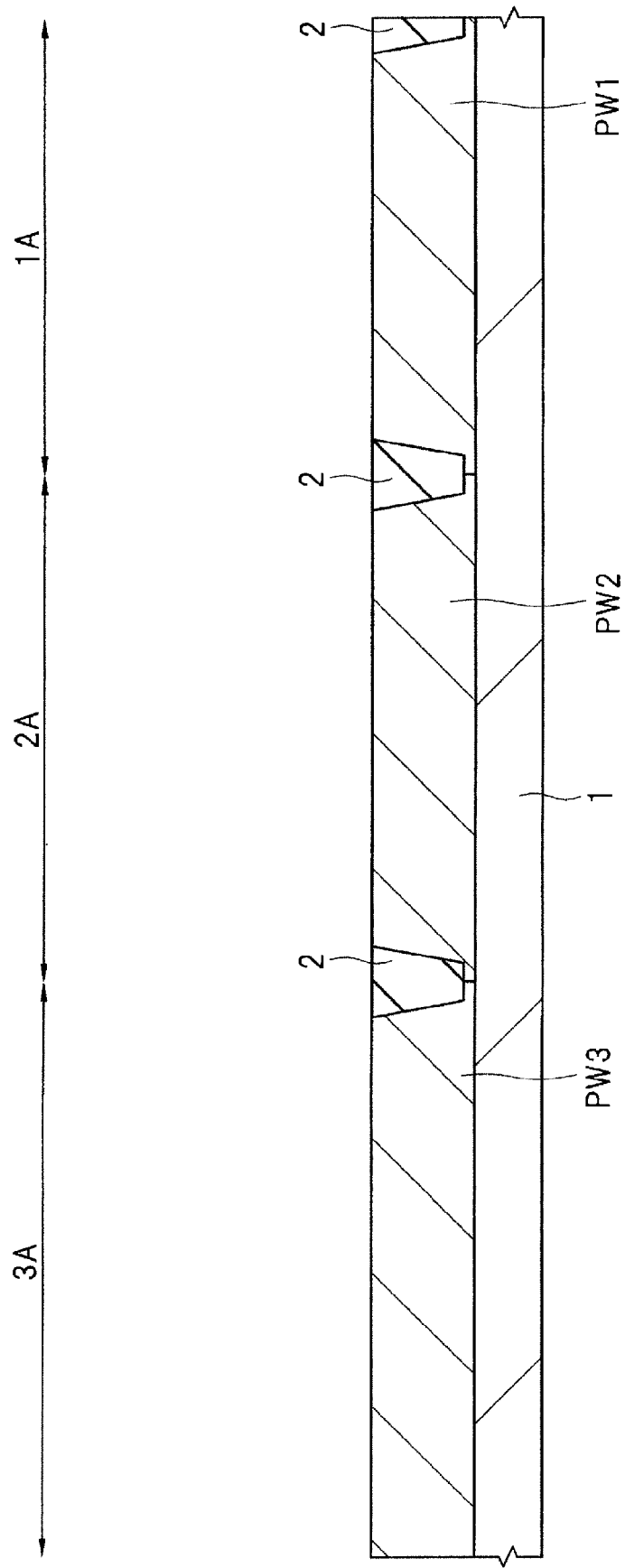
FIG. 45 is a main-portion cross-sectional view showing the manufacturing process of the semiconductor device in Embodiment 3.

As shown in FIG. 45, as the semiconductor substrate 1, silicon substrate made of p-type monocrystalline silicon having a specific resistance of, e.g., about 1 to 10 Ωcm is provided. Note that the semiconductor substrate 1 other than the silicon substrate may also be used.

Next, in the main surface of the semiconductor substrate 1, the isolation region 2 is formed. For example, in the semiconductor substrate 1, an isolation trench is formed and an insulating film such as a silicon oxide film is embedded in the isolation trench to form the isolation region 2. Such an isolation method is referred to as a STI (Shallow Trench Isolation) method. Instead, a LOCOS (Local Oxidization of Silicon) method or the like may also be used to form the isolation region 2.

Then, in the core MIS formation region 1A of the semiconductor substrate 1, the p-type well PW1 is formed and, in the I/O MIS formation region 2A thereof, the p-type well PW2 is formed while, in the memory cell region 3A thereof, the p-type well PW3 is formed. The p-type wells PW1, PW2, and PW3 are formed by ion-implanting a p-type impurity (such as, e.g., boron (B)).

Figure 46:
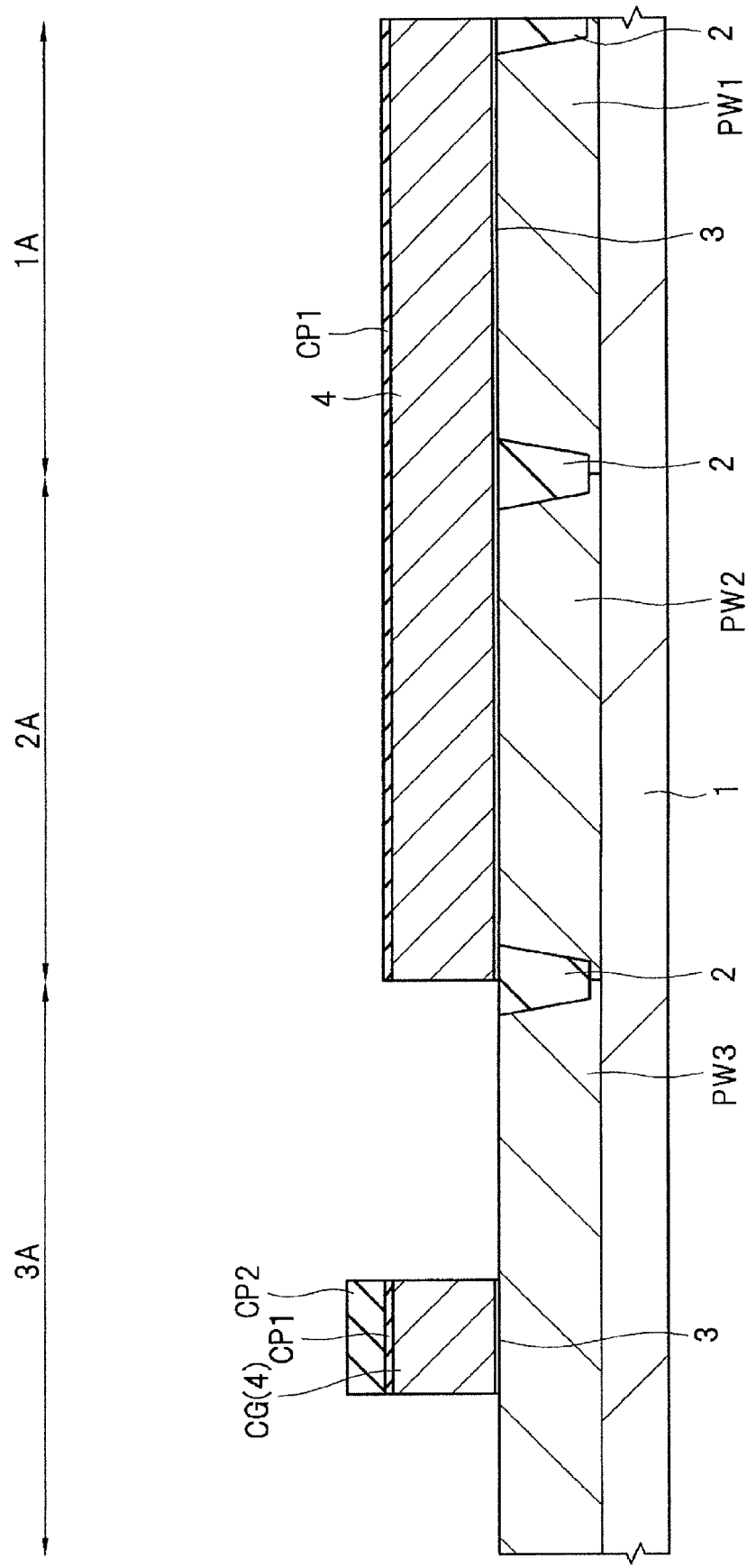
FIG. 46 is a main-portion cross-sectional view showing the manufacturing process of the semiconductor device in Embodiment 3, which is subsequent to FIG. 45.

Next, by diluted hydrofluoric acid cleaning or the like, the surface of the semiconductor substrate 1 (p-type wells PW1, PW2, and PW3) is cleaned. Then, as shown in FIG. 46, over the main surface of the semiconductor substrate 1 (surfaces of the p-type wells PW1, PW2, and PW3), e.g., a silicon oxide film is formed as the insulating film (gate insulating film) 3 to a thickness of about 2 to 3 nm by a thermal oxidation method. As the insulating film 3, instead of the silicon oxide film, another insulating film such as a silicon oxynitride film may also be used. Besides, a metal oxide film having a dielectric constant higher than that of a silicon nitride film such as a hafnium oxide film, an aluminum oxide film (alumina), or a tantalum oxide film and a laminated film of an oxide film or the like and the metal oxide film may also be formed. Instead of the thermal oxidation method, a CVD method may also be used to form the insulating film 3. The insulating film (gate insulating film) 3 over the core MIS formation region, the insulating film (gate insulating film) 3 over the I/O MIS formation region 2A, and the insulating film (gate insulating film) 3 over the memory cell region 3A may also be formed of different types of films or to different thicknesses.

Then, over the entire surface of the semiconductor substrate 1, the silicon film 4 is formed as the conductive film (conductor film). As the silicon film 4, e.g., a polycrystalline silicon film is formed to a thickness of about 100 to 200 nm using a CVD method or the like. As the silicon film 4, an amorphous silicon film may also be deposited and subjected to heat treatment to be crystallized (crystallization treatment). The silicon film 4 serves as the gate electrode GE of the MISFET (LT) in the core MIS formation region 1A, while serving as the gate electrode GE of the MISFET (HT) in the I/O MIS formation region 2A and as the control gate electrode CG of the memory cell MC in the memory cell region 3A.

Next, an n-type impurity (such as arsenic (As) or phosphorus (P)) is implanted into the silicon film 4 in the memory cell region 3A.

Next, the surface of the silicon film 4 is thermally oxidized to form the thin silicon oxide film CP1 having a thickness of, e.g., about 3 to 10 nm. Note that the silicon oxide film CP1 may also be formed using a CVD method. Then, over the silicon oxide film CP1, using a CVD method or the like, the silicon nitride film (cap insulating film) CP2 having a thickness of about 50 to 150 nm is formed.

Next, in the region where the control gate electrode CG is to be formed, a photoresist film (not shown) is formed using a photolithographic method and, using the photoresist film as a mask, the silicon nitride film CP2, the silicon oxide film CP1, and the silicon film 4 are etched. Thereafter, the photoresist film is removed by ashing or the like to form the control gate electrode CG (having a gate length of, e.g., about 80 nm). Such a series of process steps from photolithography to the removal of a photoresist film is referred to as patterning. Here, over the control gate electrode CG, the silicon nitride film CP2 and the silicon oxide film CP1 are formed, but such films can also be omitted.

Here, in the memory cell region 3A, the insulating film 3 remaining under the control gate electrode CG serves as the gate insulating film of the control transistor. Note that the insulating film 3 except for the portion thereof covered with the control gate electrode CG may also be removed by the subsequent patterning process or the like. On the other hand, in the core MIS formation region 1A and the I/O MIS formation region 2A, the silicon nitride film CP2, the silicon oxide film CP1, and the silicon film 4 are left.

Next, in the core MIS formation region 1A, the silicon nitride film CP2 over the silicon film 4 is removed therefrom.

Figure 47:
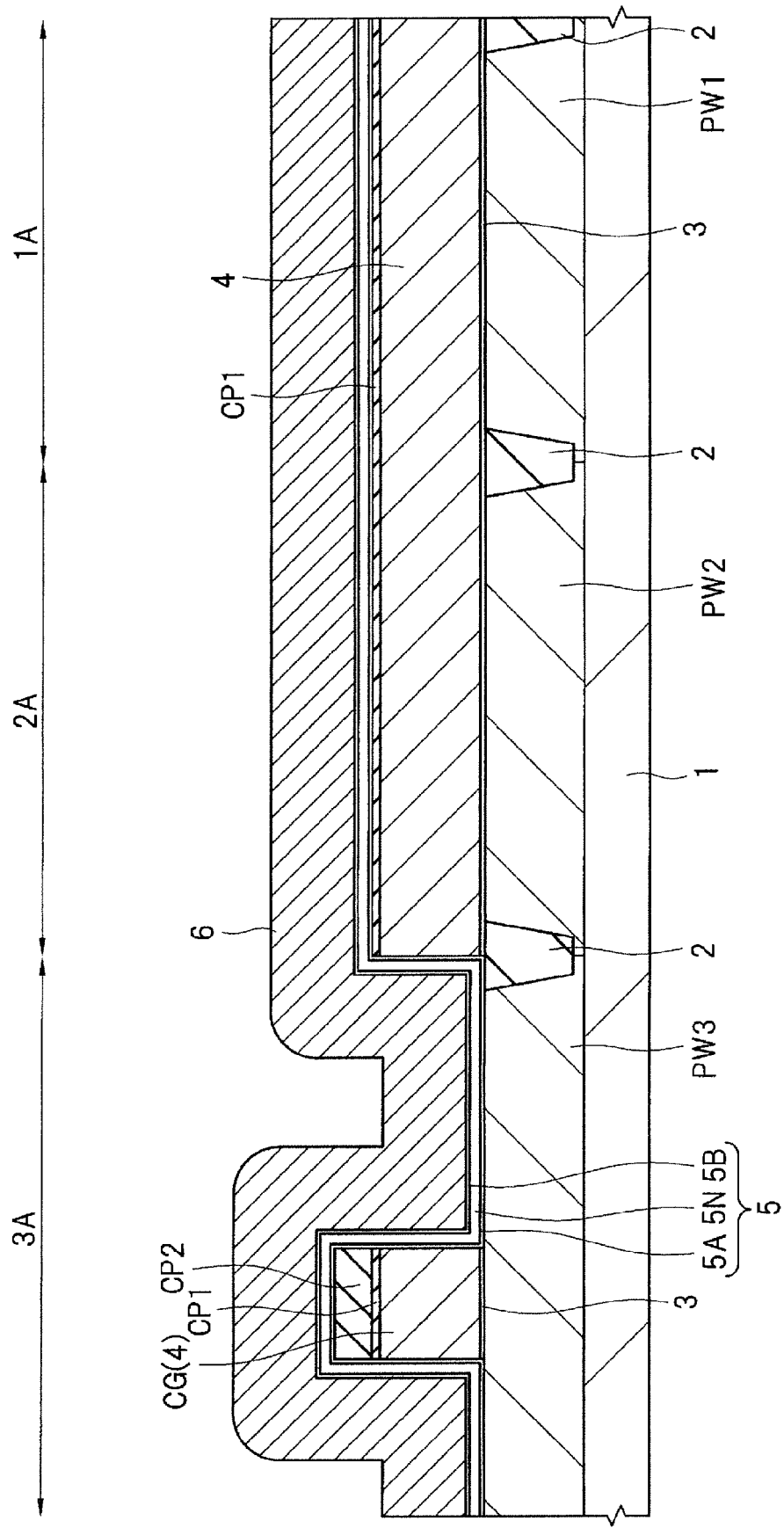
FIG. 47 is a main-portion cross-sectional view showing the manufacturing process of the semiconductor device in Embodiment 3, which is subsequent to FIG. 46.

Next, as shown in FIG. 47, over the semiconductor substrate 1 including the silicon nitride film CP2, and the silicon oxide film CP1, the insulating film 5 (5A, 5N, and 5B) is formed. First, after the main surface of the semiconductor substrate 1 is subjected to cleaning treatment, as shown in FIG. 47, the silicon oxide film 5A is formed over the semiconductor substrate 1 including the silicon nitride film CP2 and the silicon oxide film CP1. The silicon oxide film 5A is formed to a thickness of, e.g., about 4 nm by, e.g., a thermal oxidation method (preferably ISSG oxidation). Note that the silicon oxide film 5A may also be formed using a CVD method. In the drawing, the shape of the silicon oxide film 5A when formed by the CVD method is shown. Then, over the silicon oxide film 5A, the silicon nitride film 5N is formed to a thickness of, e.g., about 10 nm by a CVD method. The silicon nitride film 5N serves as the charge storage portion of the memory cell to form the middle layer forming the insulating film (ONO film) 5.

Then, over the silicon nitride film 5N, the silicon oxide film 5B is deposited to a thickness of, e.g., about 5 nm by a CVD method.

By the foregoing process, the insulating film (ONO film) 5 including the silicon oxide film 5A, the silicon nitride film 5N, and the silicon oxide film 5B can be formed. Note that, over the silicon nitride film (cap insulating film) CP2 in the core MIS formation region 1A and the I/O MIS formation region 2A shown in FIG. 47, the insulating film (ONO film) 5 may also remain.

Also, in the present embodiment, as the charge storage portion (charge storage layer or insulating film having a trap level) in the insulating film 5, the silicon nitride film 5N is formed. However, another insulating film such as, e.g., a silicon oxynitride film, an aluminum oxide film, a hafnium oxide film, or a tantalum oxide film may also be used as the charge storage portion. Such films are high-dielectric-constant films each having a dielectric constant higher than that of the silicon nitride film. Alternatively, the charge storage layer may also be formed using an insulating film having silicon nano-dots.

The insulating film 5 formed in the memory cell region 3A functions as the gate insulating film of the memory gate electrode MG and has a charge holding (charge storing) function. Accordingly, the insulating film 5 has a laminated structure including at least three layers and is configured such that the potential barrier height of the inner layer (silicon nitride film 5N) is lower than the potential barrier heights of the outer layers (silicon oxide films 5A and 5B). The thickness of each of the layers has an optimal value for each of the operation methods of the memory cell.

Then, over the insulating film 5, the silicon film 6 is formed as the conductive (conductor film). Over the insulating film 5, as the silicon film 6, e.g., a polycrystalline silicon film is formed to a thickness of about 50 to 200 nm using a CVD method or the like. As the silicon film 6, an amorphous silicon film may also be deposited and subjected to heat treatment to be crystallized (crystallization treatment). Note that, into the silicon film 6, an impurity may also be introduced as necessary. As will be described later, the silicon film 6 serves as the memory gate electrode MG (having a gate length of, e.g., about 50 nm) in the memory cell region 3A.

Figure 48:
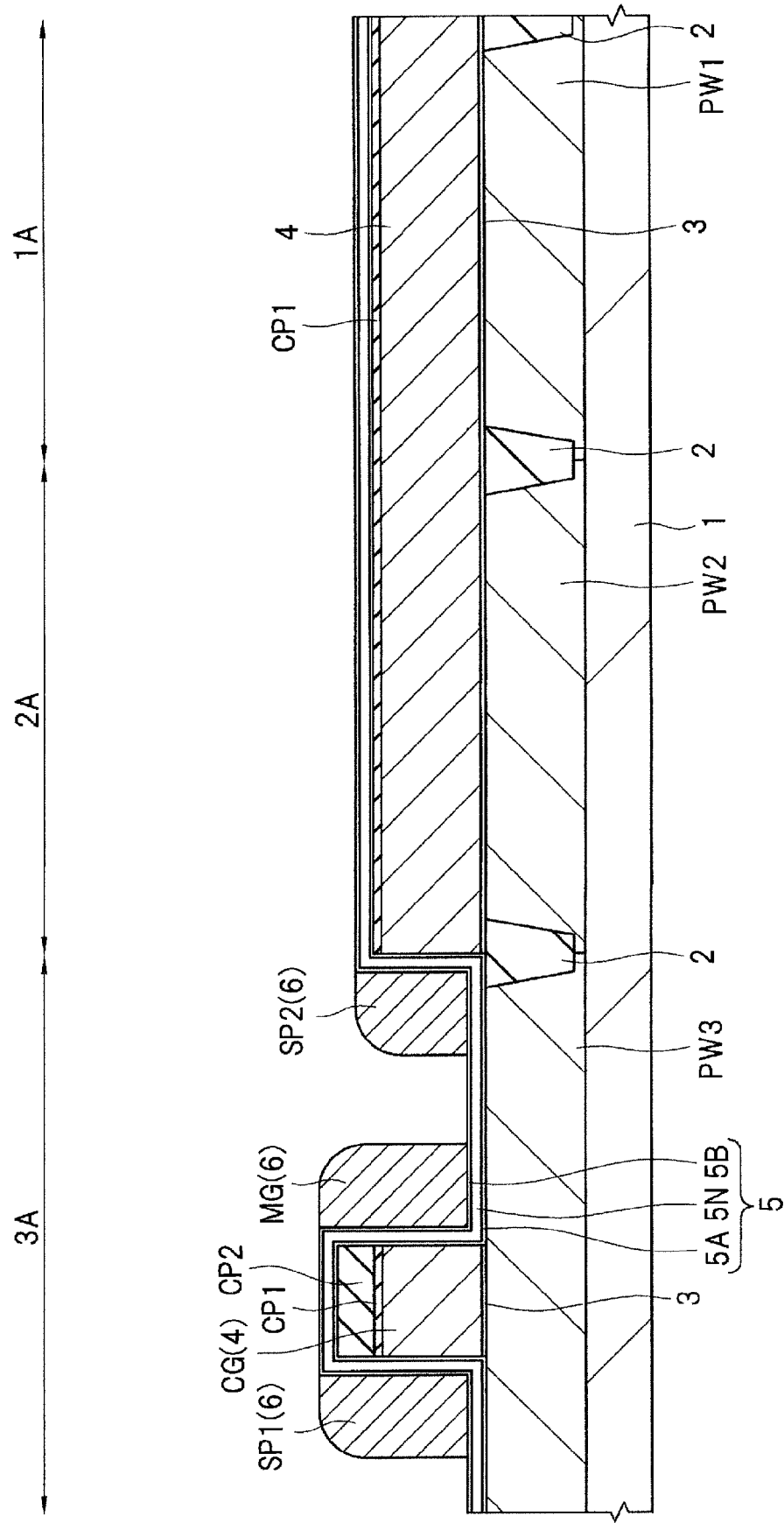
FIG. 48 is a main-portion cross-sectional view showing the manufacturing process of the semiconductor device in Embodiment 3, which is subsequent to FIG. 47.

Next, as shown in FIG. 48, the silicon film 6 is etched back. In the etch-back process, the portion of the silicon film 6 corresponding to a predetermined thickness is removed from the surface thereof by anisotropic dry etching. By the process, the silicon film 6 can be left in sidewall shapes (side wall film shapes) over the both side wall portions of the control gate electrode CG via the insulating film 5. At this time, in the core MIS formation region 1A and the I/O MIS formation region 2A, the silicon film 6 is etched to expose the insulating film 5. Note that in the boundary portion between the I/O MIS formation region 1A and the memory cell region 3A, over the side wall of the laminated film of the silicon oxide film CP1 and the silicon film 4, the silicon film 6 remains in the sidewall shape (side wall film shape) as the silicon spacer SP2 via the insulating film 5.

The silicon film 6 remaining over one of the both side wall portions of the foregoing control gate electrode CG forms the memory gate electrode MG. On the other hand, the silicon film 6 remaining over the other side wall portion forms the silicon spacer SP1. The insulating film 5 under the foregoing memory gate electrode MG serves as the gate insulating film of the memory transistor. The memory gate length (gate length of the memory gate electrode MG) is determined in correspondence to the thickness of the deposited silicon film 6.

Figure 49:
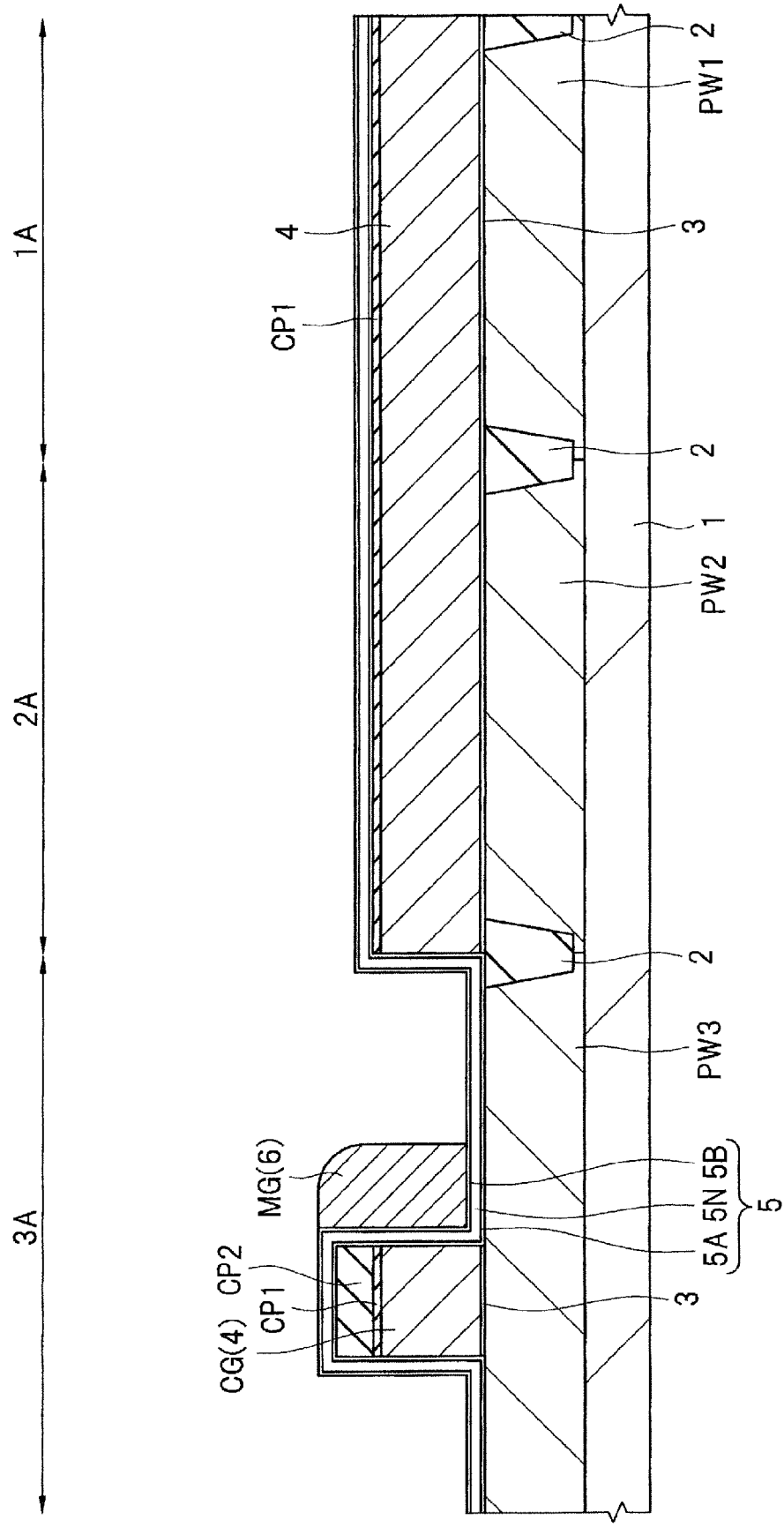
FIG. 49 is a main-portion cross-sectional view showing the manufacturing process of the semiconductor device in Embodiment 3, which is subsequent to FIG. 48.

Next, as shown in FIG. 49, the silicon spacer SP1 over the side wall portion of the control gate electrode CG over which the memory gate electrode MG is not formed and the silicon spacer SP2 (silicon film 6) in the boundary portion between the core MIS formation region 1A and the memory cell region 3A are removed.

Next, the insulating film 5 is removed by etching. As a result, in the memory cell region 3A, the silicon nitride film CP2 over the control gate electrode CG is exposed, and the p-type well PW3 is exposed. On the other hand, in the core MIS formation region 1A, the silicon oxide film CP1 is also removed to expose the silicon film 4.

Next, in the core MIS formation region 1A, an impurity is introduced into the silicon film 4. For example, into the silicon film 4, an n-type impurity such as phosphorus is introduced.

Figure 50:
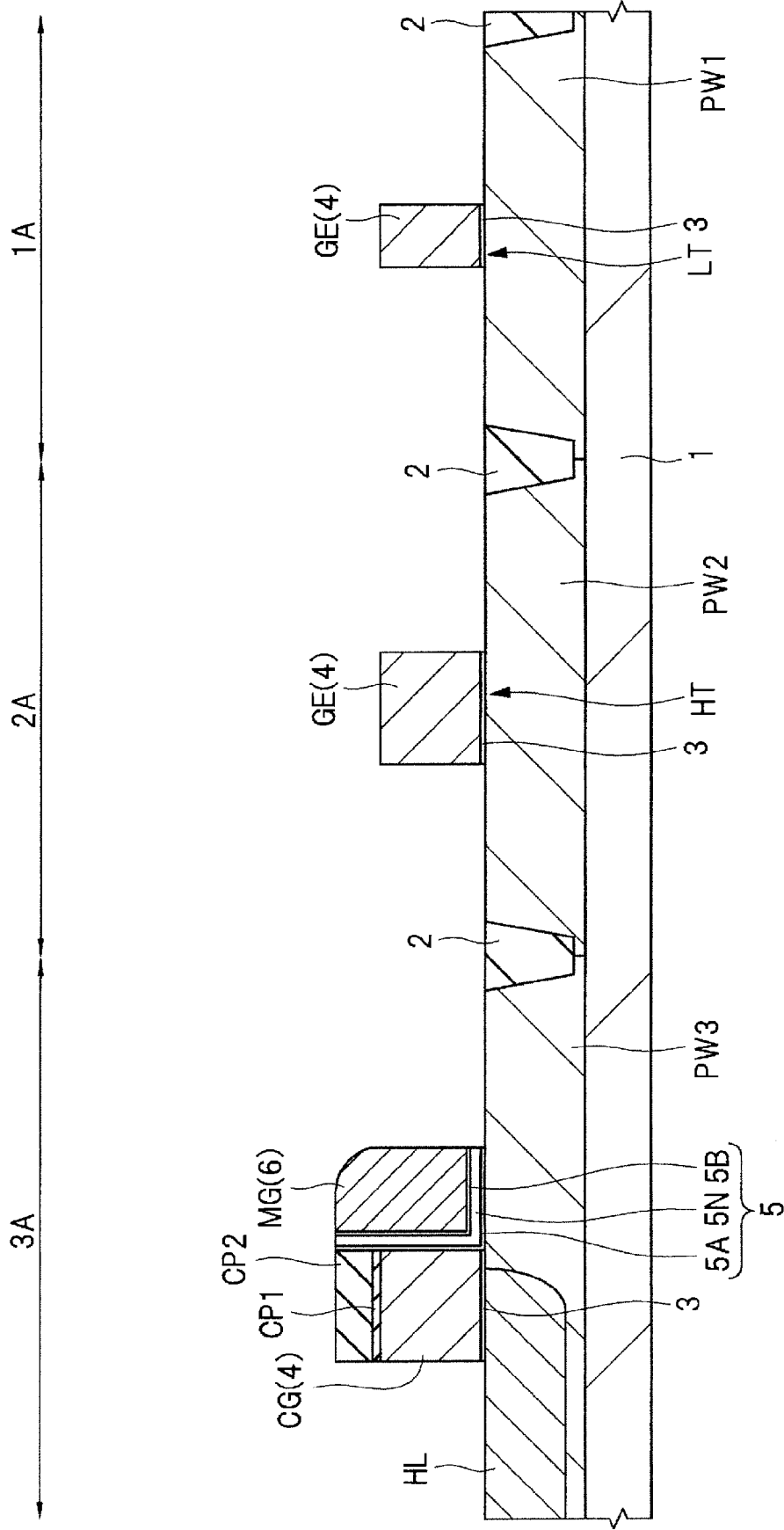
FIG. 50 is a main-portion cross-sectional view showing the manufacturing process of the semiconductor device in Embodiment 3, which is subsequent to FIG. 49.

Next, in the region of the silicon film 4 where the gate electrode GE of the MISFET (LT) is to be formed and in the region of the silicon film 4 where the gate electrode GE of the MISFET (HT) is to be formed, a photoresist film (not shown) is formed using a photolithographic method and, using the photoresist film as a mask, the silicon film 4 is etched. Thereafter, the photoresist film (not shown) is removed by ashing or the like to form the gate electrode GE of the MISFET (LT) in the core MIS formation region 1A and form the gate electrode GE of the MISFET (HT) in the I/O MIS formation region 2A, as shown in FIG. 50. The gate length of the gate electrode GE of the MISFET (LT) is, e.g., about 40 nm, while the gate length of the gate electrode GE of the MISFET (HT) is, e.g., about 1000 nm.

The insulating film 3 remaining under each of the gate electrodes GE serves as the gate insulating film of each of the MISFETs (LT and HT). The insulating film 3 other than the portions thereof covered with the gate electrodes GE may also be removed during the formation of the foregoing gate electrodes GE or by the subsequent patterning process or the like.

Figure 51:
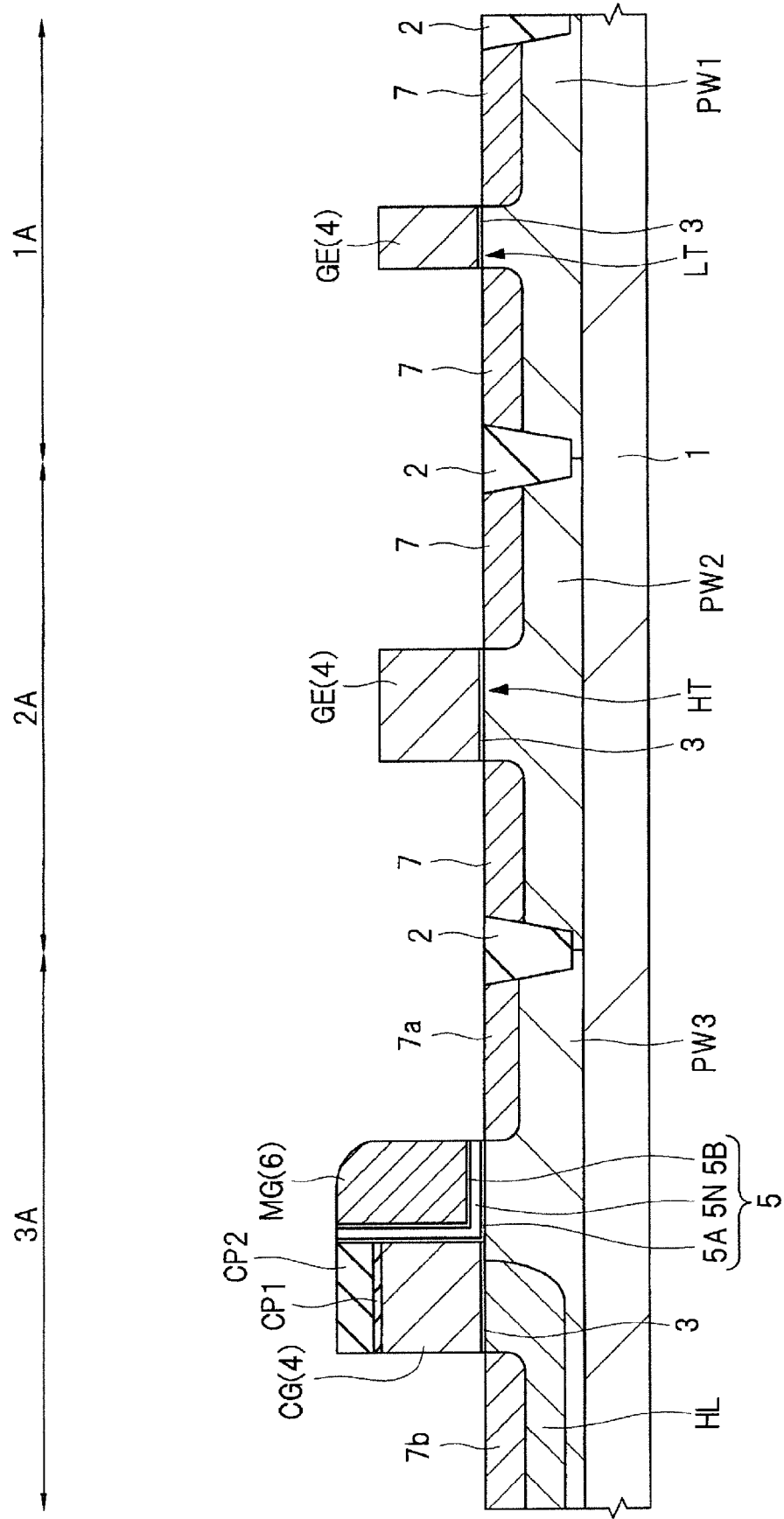
FIG. 51 is a main-portion cross-sectional view showing the manufacturing process of the semiconductor device in Embodiment 3, which is subsequent to FIG. 50.

Next, as shown FIG. 51, using a photoresist film (not shown) having an opening on one side (opposite to the memory gate electrode MG) of the control gate electrode CG as a mask, a p-type impurity is obliquely implanted (oblique implantation is performed). Thus, in the semiconductor substrate 1 located under the control gate electrode CG, the p-type halo region (p-type impurity region) HL is formed. The p-type halo region HL need not necessarily be formed. However, when the p-type halo region HL is formed, a depletion layer is inhibited from expanding from the drain region MD to the channel region of the memory transistor so that the short-channel effect in a memory transistor is suppressed. This can inhibit a reduction in the threshold voltage of the memory transistor. Thereafter, the foregoing photoresist film (not shown) is removed.

Next, in the memory cell region 3A, in the semiconductor substrate 1 (p-type well PW1), an n-type impurity such as arsenic (As) or phosphorus (P) is implanted to form the $n^-$-type semiconductor region 7a and the $n^-$-type semiconductor region 7b. At this time, the $n^-$-type semiconductor region 7a is formed by self-alignment with the side wall (side wall opposite to the side wall adjacent to the control gate electrode CG via the insulating film 5) of the memory gate electrode MG. On the other hand, the $n^-$-type semiconductor region 7b is formed by self-alignment with the side wall (side wall opposite to the side wall adjacent to the memory gate electrode MG via the insulating film 5) of the control gate electrode CG. In the core MIS formation region 1A and the I/O MIS formation region 2A, into the semiconductor substrate 1 (p-type wells PW1 and PW2) located on both sides of the gate electrodes GE, an n-type impurity such as arsenic (As) or phosphorus (P) is implanted to form the $n^-$-type semiconductor regions 7. At this time, the $n^-$-type semiconductor regions 7 are formed by self-alignment with the side walls of the gate electrodes GE.

The $n^-$-type semiconductor region 7a, the $n^-$-type semiconductor region 7b, and the $n^-$-type semiconductor regions 7 may be formed by the same ion implantation process, but are formed herein by different ion implantation processes. By thus forming the $n^-$-type semiconductor region 7a, the $n^-$-type semiconductor region 7b, and the $n^-$-type semiconductor regions 7 by the different ion implantation processes, the $n^-$-type semiconductor region 7a, the $n^-$-type semiconductor region 7b, and the $n^-$-type semiconductor regions 7 can be formed to have respective desired impurity concentrations and desired junction depths. It may also be possible that the $n^-$-type semiconductor regions 7 in the core MIS formation region 1A and the $n^-$-type semiconductor regions 7 in the I/O MIS formation region 2A are formed to have different impurity concentrations, and different junction depths.

Figure 52:
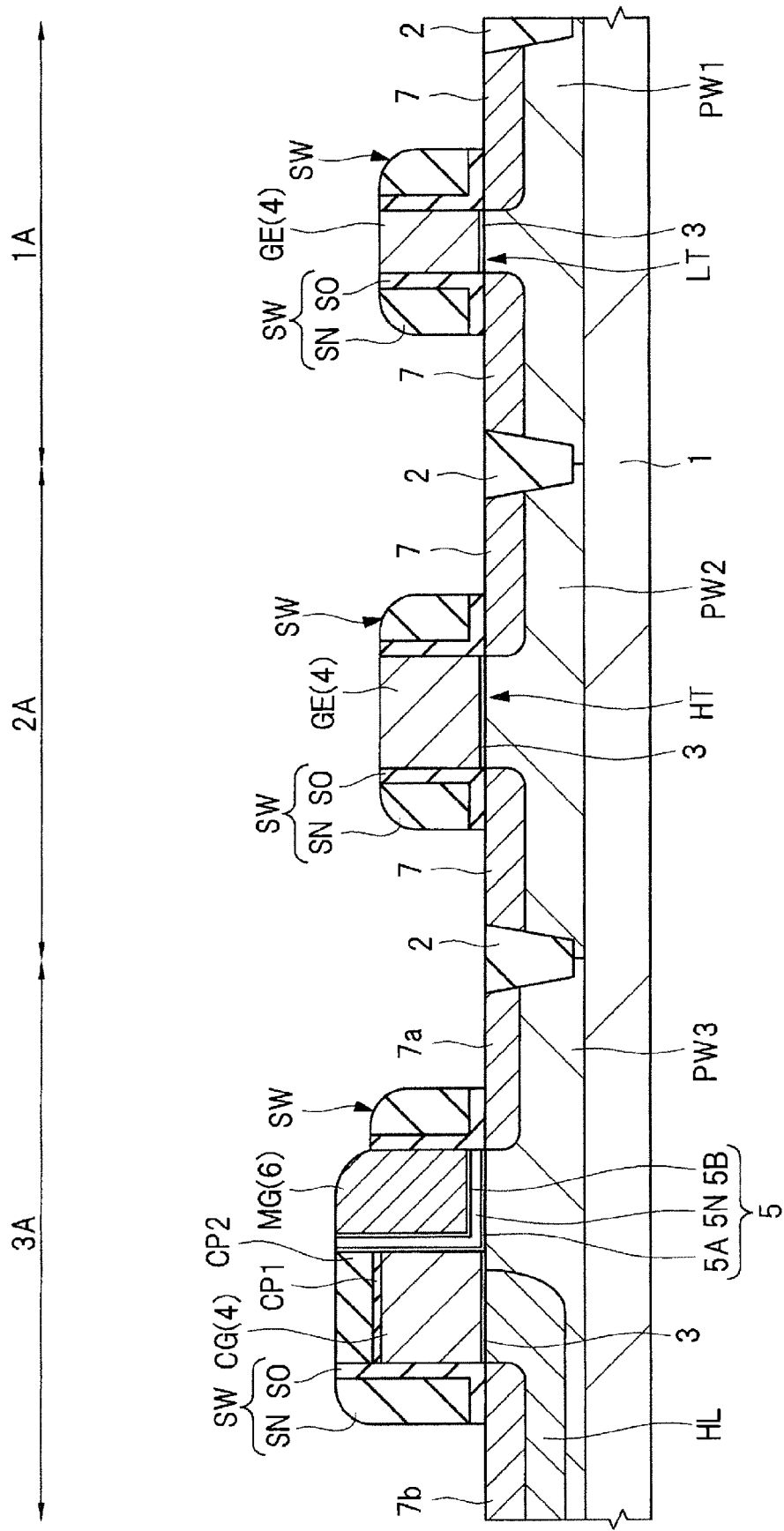
FIG. 52 is a main-portion cross-sectional view showing the manufacturing process of the semiconductor device in Embodiment 3, which is subsequent to FIG. 51.

Next, as shown in FIG. 52, in the memory cell region 3A, the side wall insulating films SW are formed over the side wall portions of the combined pattern of the control gate electrode CG and the memory gate electrode MG. On the other hand, in the core MIS formation region 1A and the I/O MIS formation region 2A, the side wall insulating films SW are formed over the side wall portions of the gate electrodes GE. For example, by depositing the silicon oxide film SO over the entire main surface of the semiconductor substrate 1 and further depositing the silicon nitride film SN thereover, the insulating film made of the laminated film of the silicon oxide film SO and the silicon nitride film SN is formed. By etching back the insulating film, the side wall insulating films SW are formed over the side wall portions of the foregoing combined pattern (CG and MG) and over the side wall portions of the gate electrode GE. As each of the side wall insulating films SW, instead of the laminated film of the silicon oxide film and the silicon nitride film, an insulating film such as a single-layer silicon oxide film or a single-layer silicon nitride film may also be used.

Figure 53:
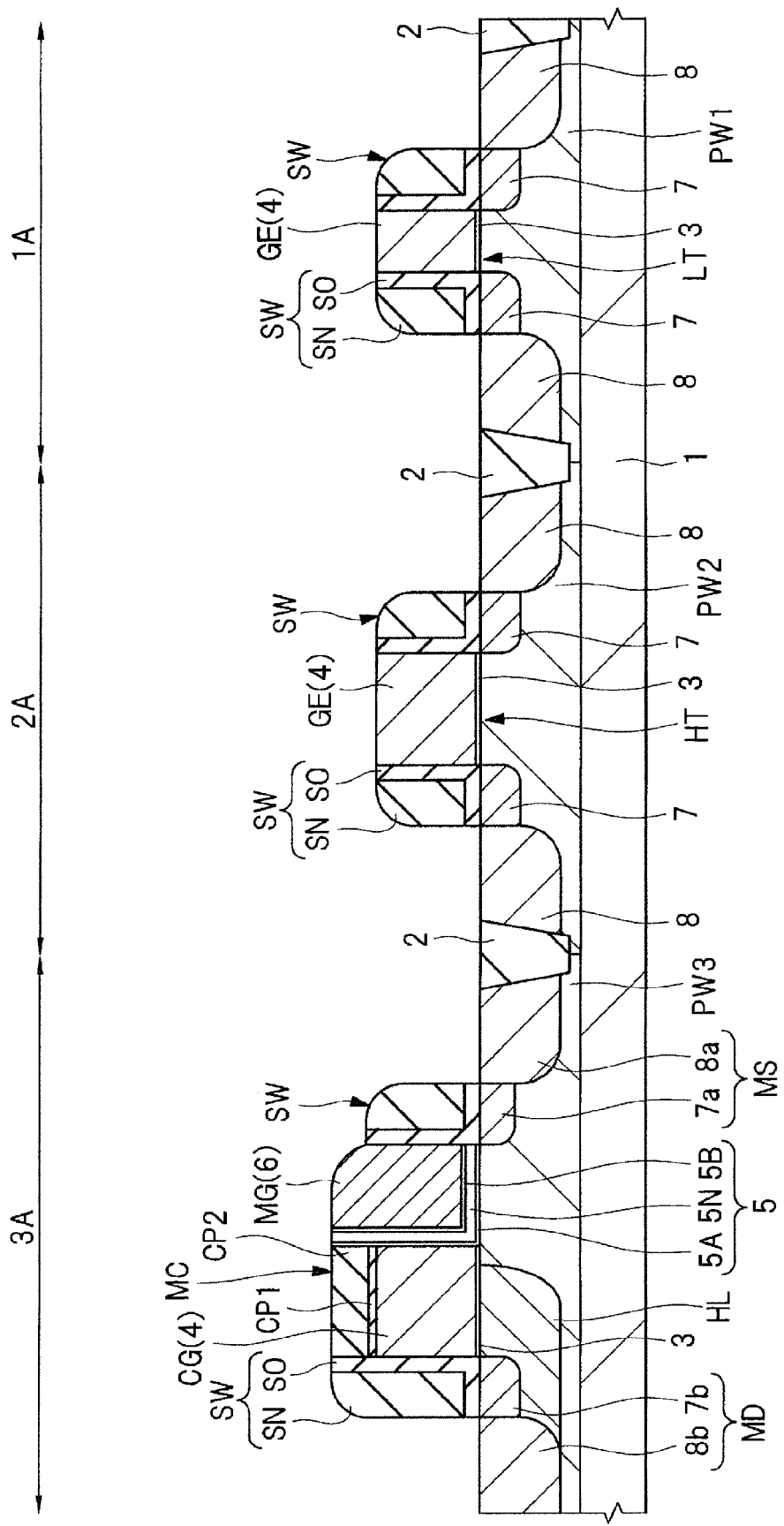
FIG. 53 is a main-portion cross-sectional view showing the manufacturing process of the semiconductor device in Embodiment 3, which is subsequent to FIG. 52.

Next, as shown in FIG. 53, using the control gate electrode CG, the memory gate electrode MG, and the side wall insulating films SW as a mask, an n-type impurity such as arsenic (As) or phosphorus (P) is implanted into the semiconductor substrate 1 (p-type well PW 3) to form the high-impurity-concentration $n^+$-type semiconductor region 8a, and the high-impurity-concentration $n^+$-type semiconductor region 8b. At this time, the $n^+$-type semiconductor region 8a is formed by self-alignment with the side wall insulating film SW closer to the memory gate electrode MG in the memory cell region 3A. On the other hand, the $n^+$-type semiconductor region 8b is formed by self-alignment with the side wall insulating film SW closer to the control gate electrode CG in the memory cell region 3A. The $n^+$-type semiconductor region 8a is formed as the semiconductor region having the impurity concentration higher than that of the $n^-$-type semiconductor region 7a, and the junction depth deeper than that of the $n^-$-type semiconductor region 7a. The $n^+$-type semiconductor region 8b is formed as the semiconductor region having the impurity concentration higher than that of the $n^-$-type semiconductor region 7b, and the junction depth deeper than that of the $n^-$-type semiconductor region 7b. In each of the core MIS formation region 1A and the I/O MIS formation region 2A, into the semiconductor substrate 1 (p-type wells PW1 and PW2) located on both sides of the gate electrodes GE, an n-type impurity such as arsenic (As) or phosphorus (P) is implanted to form the $n^+$-type semiconductor regions 8. At this time, the $n^+$-type semiconductor regions 8 are formed by self-alignment with the side wall insulating films SW over the side wall portions of the gate electrodes GE. The $n^+$-type semiconductor regions 8 are formed as the semiconductor regions having the impurity concentrations higher than those of the $n^-$-type semiconductor regions 7 and the junction depths deeper than those of the $n^-$-type semiconductor regions 7. The $n^+$-type semiconductor region 8a, the $n^+$-type semiconductor region 8b, and the $n^+$-type semiconductor regions 8 may be formed to have different impurity concentrations, and different junction depths. It may also be possible that the $n^+$-type semiconductor regions 8 in the core MIS formation region 1A and the $n^+$-type semiconductor regions 8 in the I/O MIS formation region 2A are formed to have different impurity concentrations, and different junction depths.

By the foregoing process, in the memory cell region 3A, the n-type drain region MD including the $n^-$-type semiconductor region 7b, and the $n^+$-type semiconductor region 8b and functioning as the drain region of the memory transistor is formed, and the n-type source region MS including the $n^-$-type semiconductor region 7a, and the $n^+$-type semiconductor region 8a and functioning as the source region of the memory transistor is formed. On the other hand, in the core MIS formation region 1A and the I/O MIS formation region 2A, the source/drain regions each having the LDD structure including the n⁻-type semiconductor region 7, and the n⁺-type semiconductor region 8 are formed.

Next, heat treatment (activation treatment) for activating the impurity introduced into the source region MS (n⁻-type semiconductor region 7a and n⁺-type semiconductor region 8a), the drain region MD (n⁻-type semiconductor region 7b and n⁺-type semiconductor region 8b), and the source/drain regions (7 and 8) is performed.

By the foregoing process, the MISFET (LT) is formed in the core MIS formation region LA, the MISFET (HT) is formed in the I/O MIS formation region 2A, and the memory cell MC is formed in the memory cell region 3A (FIG. 53).

Note that the process of forming the MISFET (LT), the MISFET (HT), and the memory cell MC is not limited to the foregoing process.

<SMT and Silicide Process>

Figure 54:
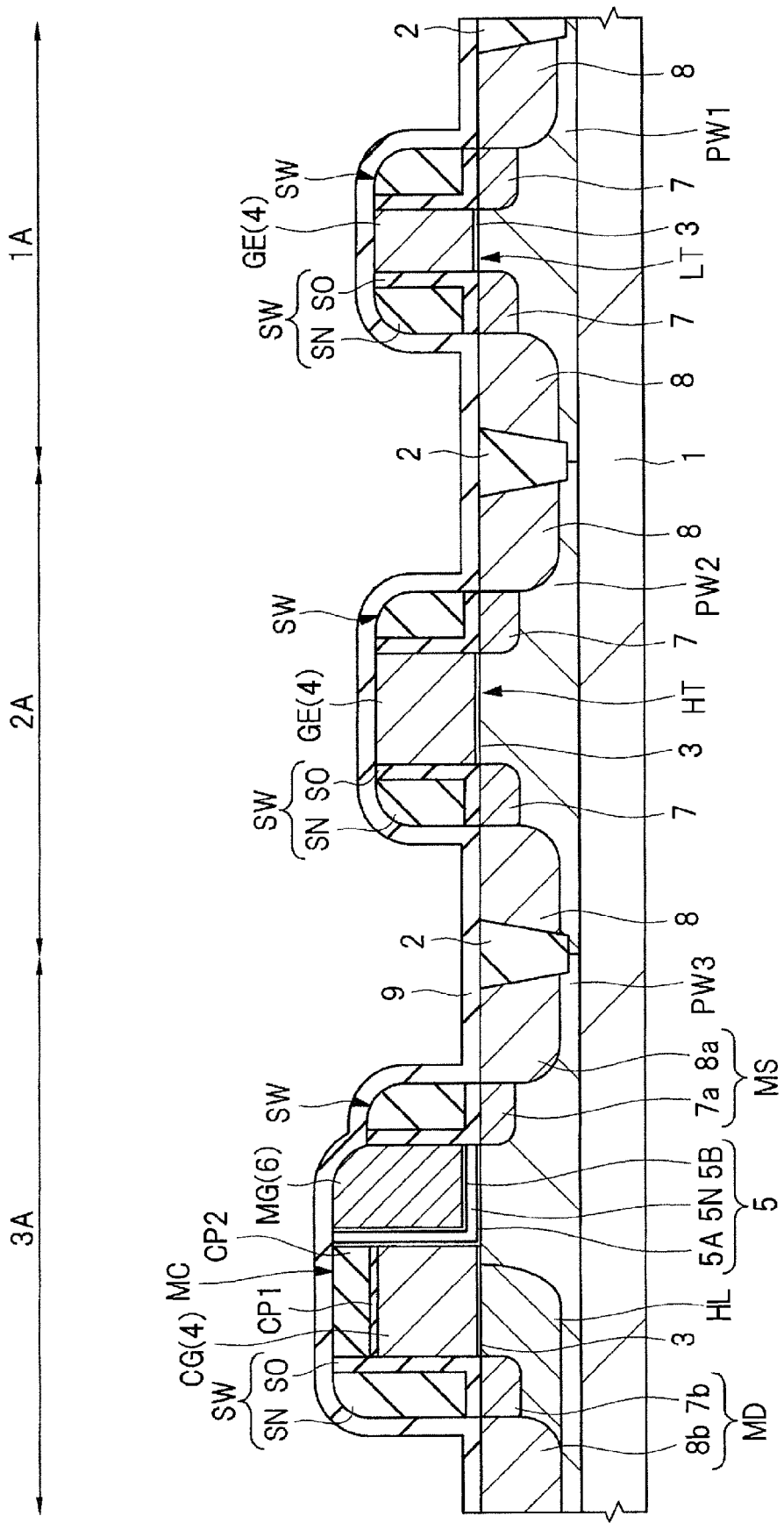
FIG. 54 is a main-portion cross-sectional view showing the manufacturing process of the semiconductor device in Embodiment 3, which is subsequent to FIG. 53.

Next, as shown in FIG. 54, over the semiconductor substrate 1 including the MISFET (LT), the MISFET (HT), and the memory cell MC, a silicon oxide film is formed as the stopper film 9 to a thickness of about 13 nm using a CVD method. For example, the silicon oxide film is formed by a CVD method using, e.g., TEOS (Tetraethoxysilane) and ozone ($O_3$) as raw material gases. The stopper film 9 functions as the etching stopper in the etching of the stress application film 10 described later. The stopper film 9 can prevent undesired etching of each of the patterns (such as, e.g., portions each made of the silicon film) forming the MISFET (LT), the MISFET (HT), and the memory cell MC.

Figure 55:
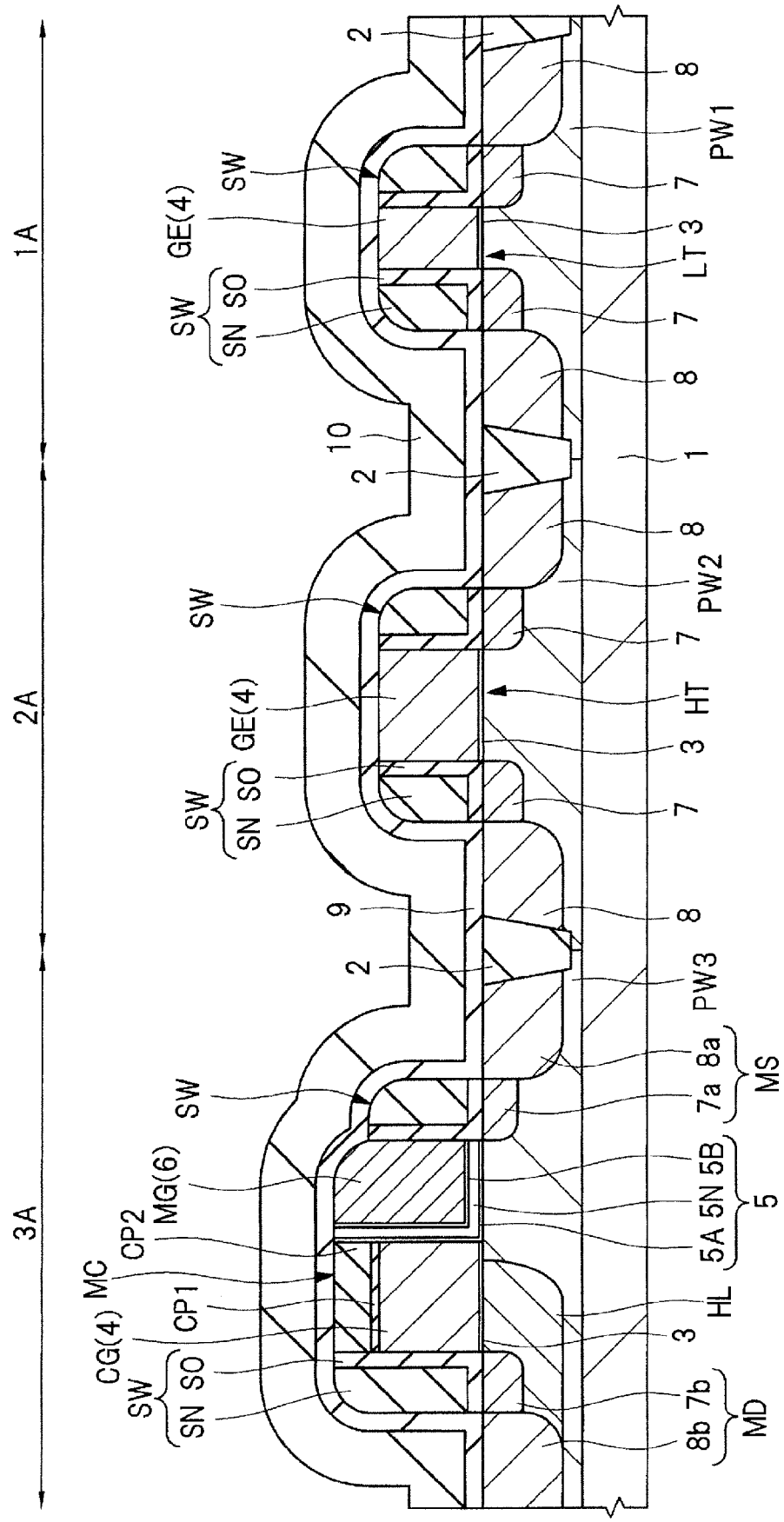
FIG. 55 is a main-portion cross-sectional view showing the manufacturing process of the semiconductor device in Embodiment 3, which is subsequent to FIG. 54.

Next, as shown in FIG. 55, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Figure 56:
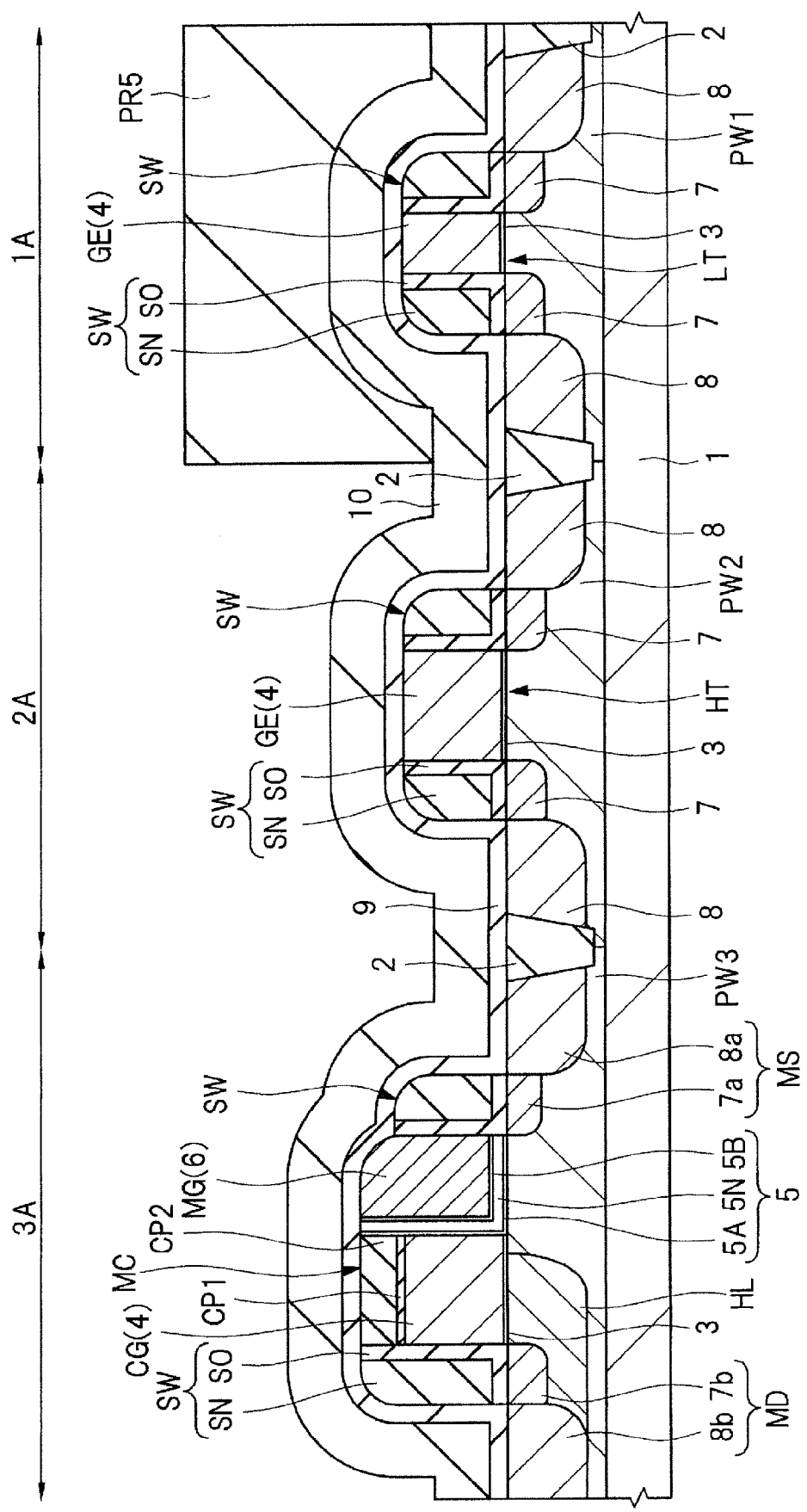
FIG. 56 is a main-portion cross-sectional view showing the manufacturing process of the semiconductor device in Embodiment 3, which is subsequent to FIG. 55.
Figure 57:
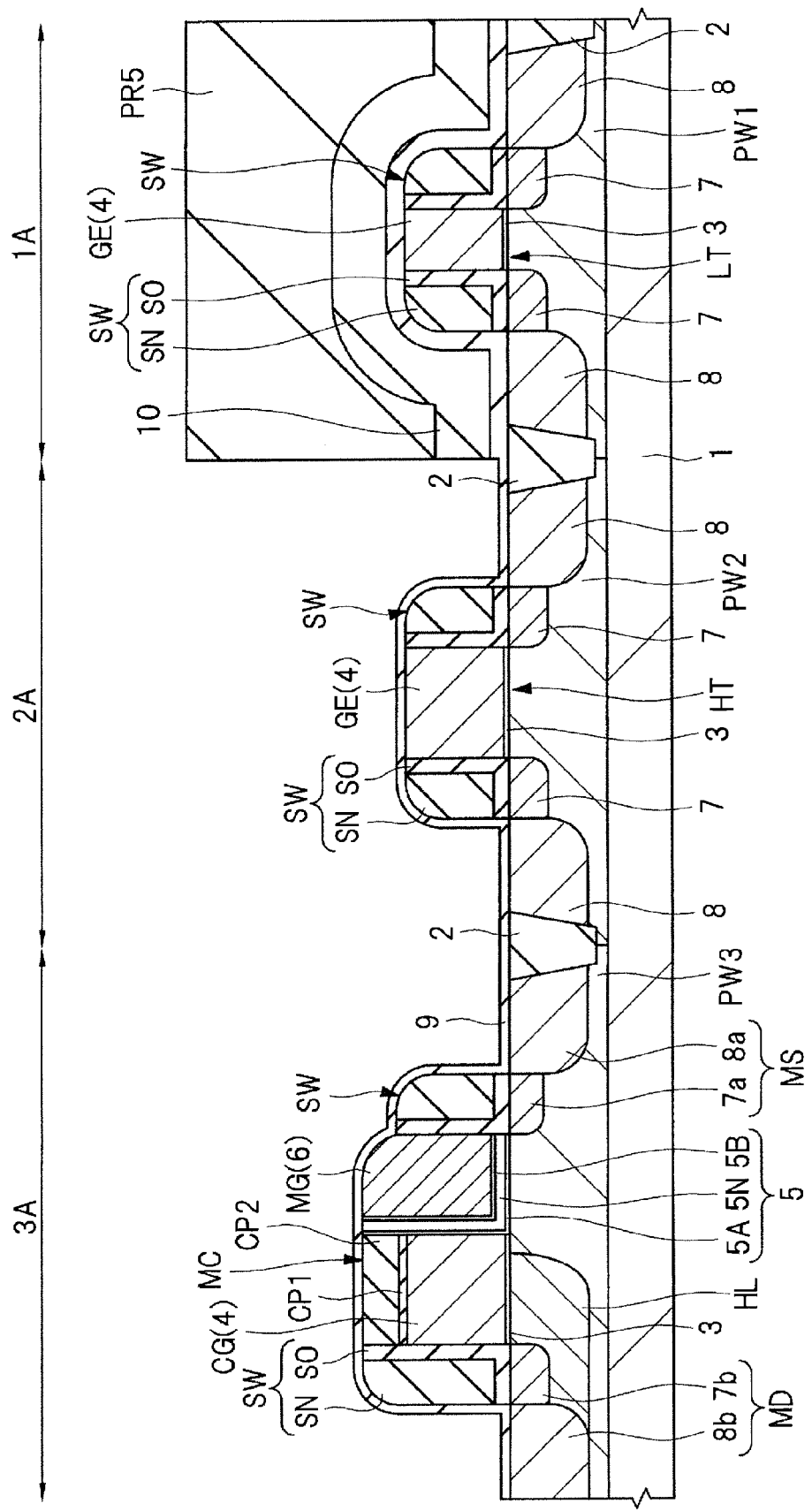
FIG. 57 is a main-portion cross-sectional view showing the manufacturing process of the semiconductor device in Embodiment 3, which is subsequent to FIG. 56.

Next, the stress application film 10 in each of the I/O MIS formation region 2A and the memory cell region 3A is removed therefrom. First, as shown in FIG. 56, over the stress application film 10 in the core MIS formation region 1A, a photoresist film PR5 is formed using a photolithographic method. Then, as shown in FIG. 57, using the photoresist film PR5 as a mask, the stress application film 10 is etched. Here, the silicon nitride film forming the stress application film 10 is dry-etched. For example, using $CH_4$ as an etching gas, isotropic dry etching is performed. As a result, only the core MIS formation region 1A is covered with the stress application film 10. In other words, only the MISFET (LT) is covered with the stress application film 10. On the other hand, the stopper film 9 in each of the I/O MIS formation region 2A and the memory cell region 3A is exposed.

Here, the foregoing etching is performed under such a condition that the etching selectivity is high, i.e., the ratio of the etching speed of the stress application film 10 to the etching speed of the stopper film 9 is high, but the stopper film 9 is also etched slightly. Accordingly, the thickness of the stopper film 9 in each of the I/O MIS formation region 2A and the memory cell region 3A becomes smaller than the thickness of the stopper film 9 remaining under the stress application film 10 in the core MIS formation region 1A (FIG. 57). Note that, when the thickness of the stopper film 9 in the I/O MIS formation region 2A is T92, the thickness of the stopper film 9 in the memory cell region 3A is T93, and the thickness of the stopper film 9 in the core MIS formation region 1A is T91, a relationship given by T92≈T93<T91 is established.

Figure 58:
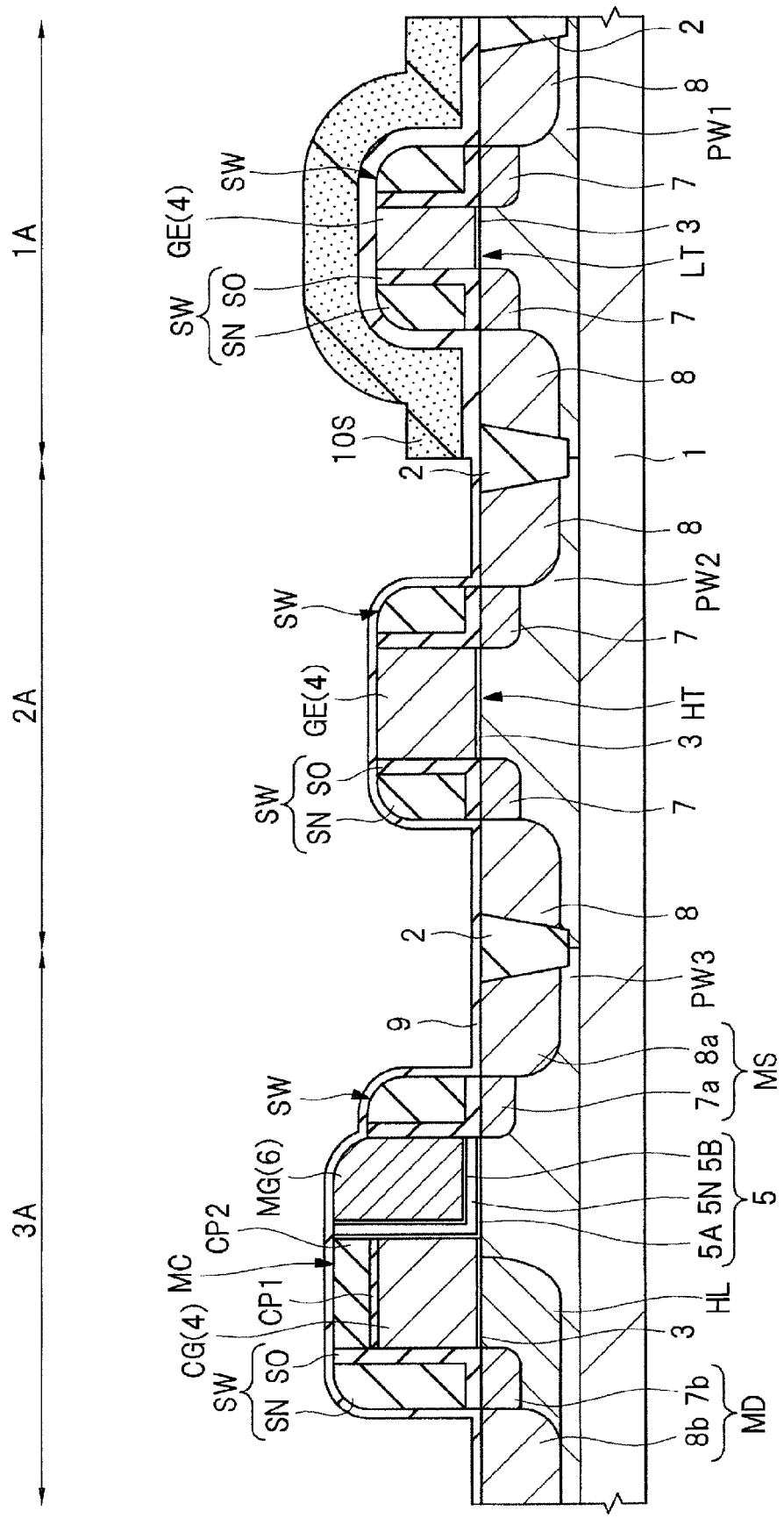
FIG. 58 is a main-portion cross-sectional view showing the manufacturing process of the semiconductor device in Embodiment 3, which is subsequent to FIG. 57.

Then, as shown in FIG. 58, after the photoresist film PR5 is removed by ashing treatment or the like, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to the MISFET (LT) in the core MIS formation region 1A. On the other hand, the stress application film 10 has been removed from each of the I/O MIS formation region 2A and the memory cell region 3A so that no stress is applied to the MISFET (HT) and the memory cell MC.

It may also be possible to activate the impurity introduced into the source region MS (n⁻-type semiconductor region 7a and n⁺-type semiconductor region 8a), the drain region MD (n⁻-type semiconductor region 7b and n⁺-type semiconductor region 8b), and the source/drain regions (7 and 8) using the heat treatment and omit the previous heat treatment (activation treatment). It may also be possible to crystallize the silicon films 4 and 6 each made of the amorphous silicon film by the heat treatment (crystallization treatment).

Figure 59:
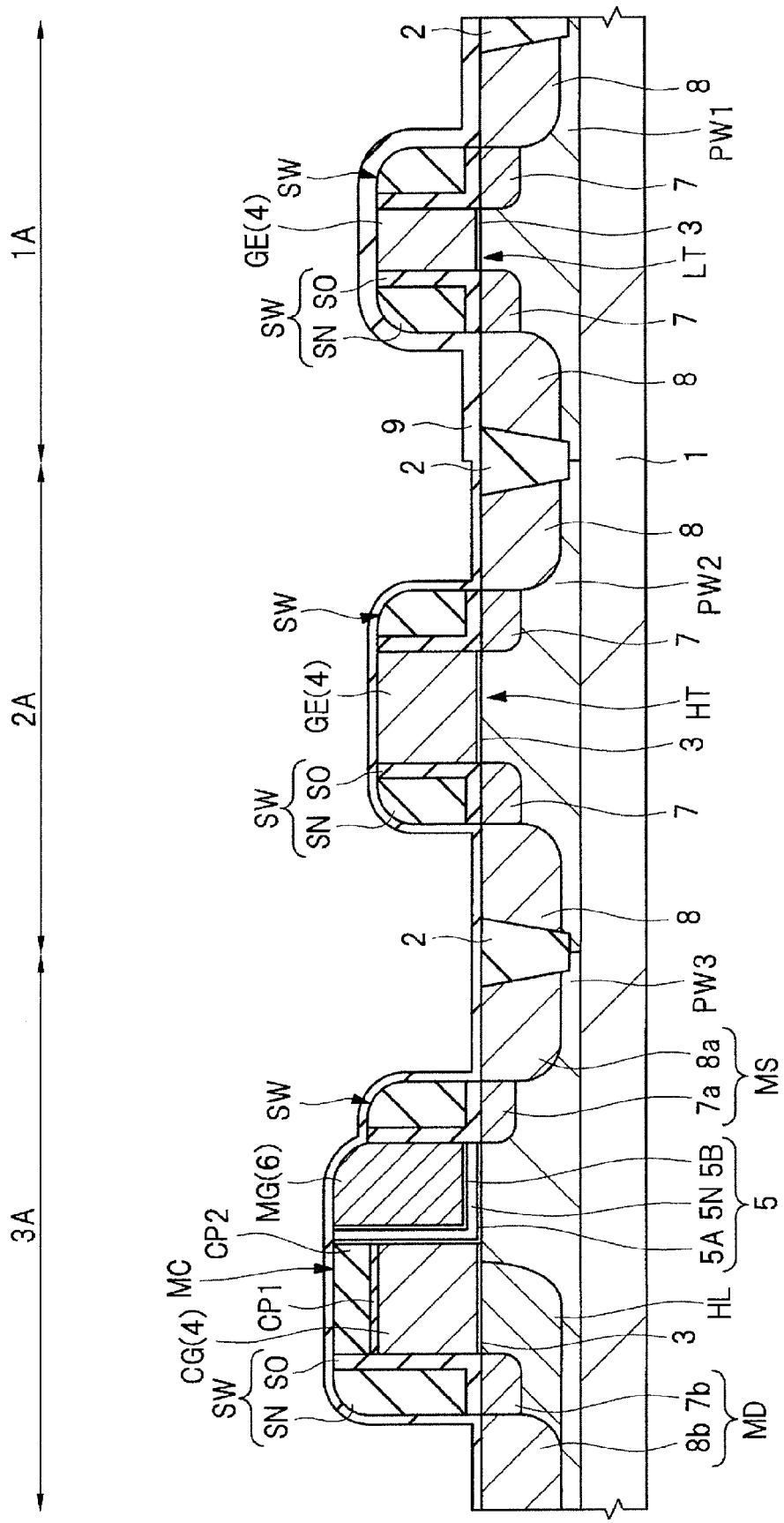
FIG. 59 is a main-portion cross-sectional view showing the manufacturing process of the semiconductor device in Embodiment 3, which is subsequent to FIG. 58.

Next, as shown in FIG. 59, the stress application film 10S in the core MIS formation region 1A is removed. Here, the silicon nitride film forming the stress application film 10S is wet-etched under such a condition that the etching selectivity is high, i.e., the ratio of the etching speed of the stress application film 10S to the etching speed of the stopper film 9 is high. For example, using a phosphoric acid ($H_3PO_4$) solution as an etchant, the wet etching is performed at 155° C. for 600 seconds. As a result, the stopper film 9 in each of the core MIS formation region 1A, the I/O MIS formation region 2A, and the memory cell region 3A is exposed.

Figure 60:
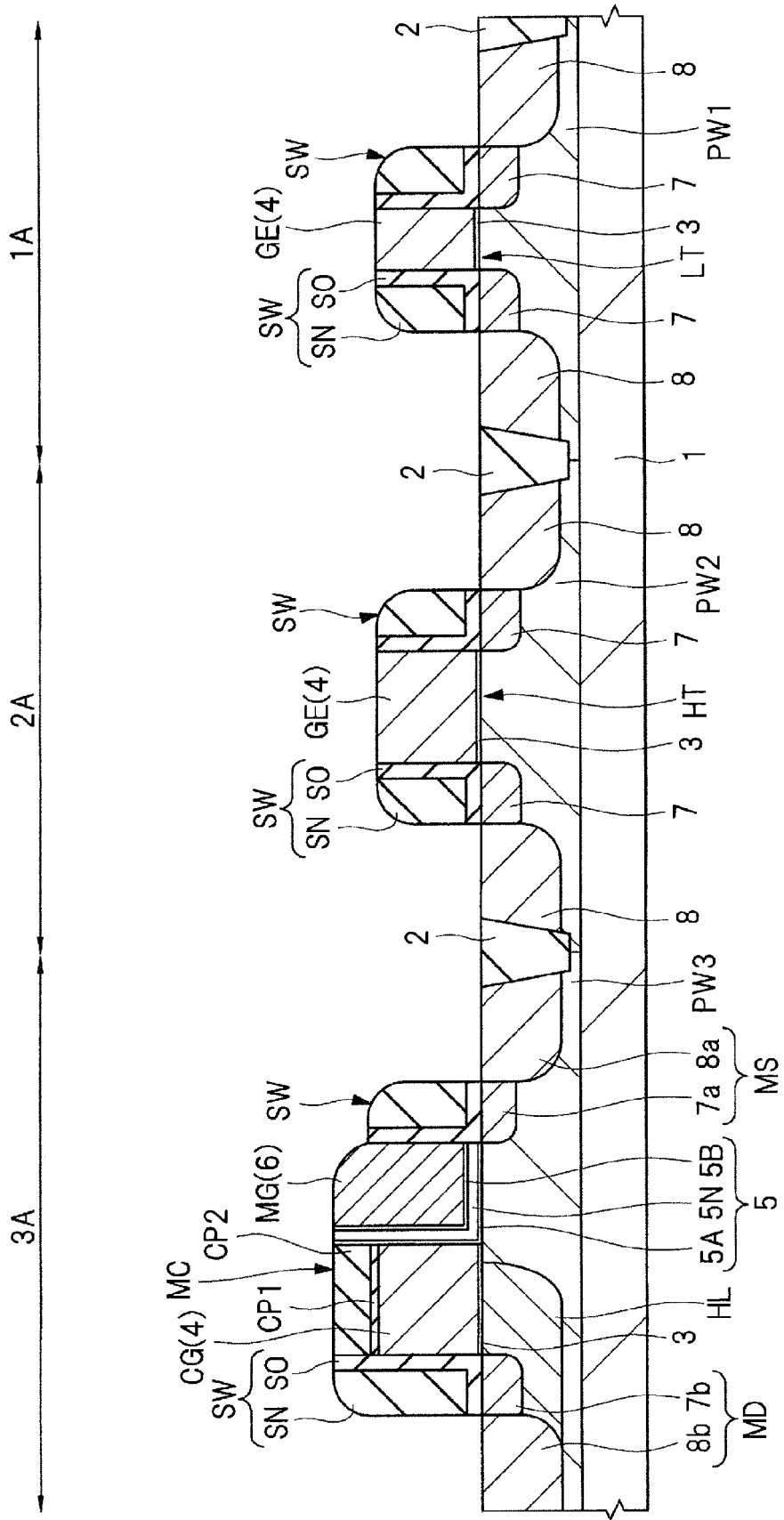
FIG. 60 is a main-portion cross-sectional view showing the manufacturing process of the semiconductor device in Embodiment 3, which is subsequent to FIG. 59.

Next, as shown in FIG. 60, the foregoing stopper film 9 is removed. Here, the silicon oxide film forming the stopper film is wet-etched under such a condition that the etching selectivity is high, i.e., the ratio of the etching speed of the stopper film 9 to the etching speed of the semiconductor substrate 1 is high. For example, using a HF solution as an etchant, the wet etching is performed at 25° C. for 100 seconds.

Figure 61:
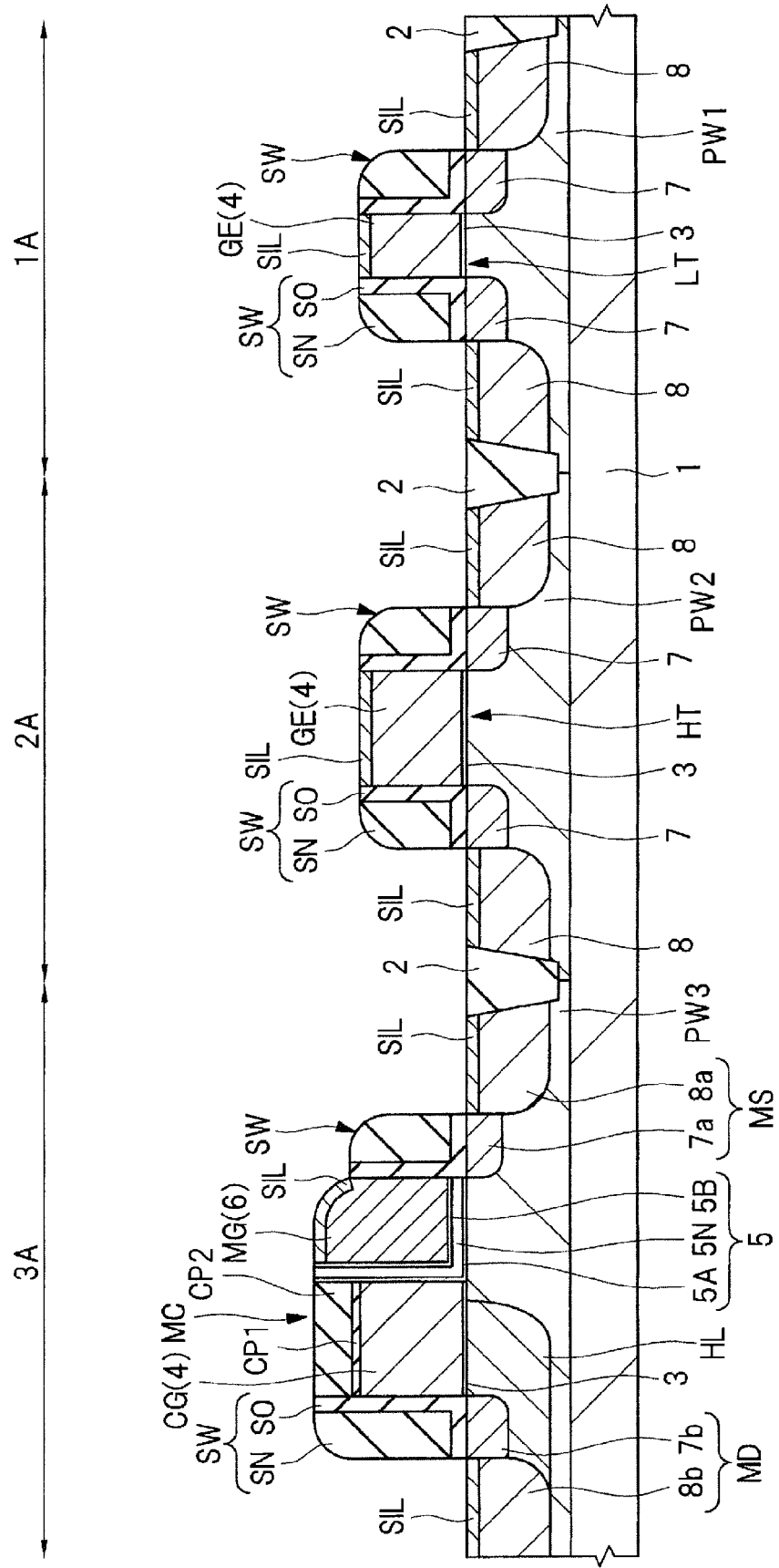
FIG. 61 is a main-portion cross-sectional view showing the manufacturing process of the semiconductor device in Embodiment 3, which is subsequent to FIG. 60.

Next, as shown in FIG. 61, using a salicide technique, in the respective upper portions of the memory gate electrodes MG, the n⁺-type semiconductor region 8a, and the n⁺-type semiconductor region 8b in the memory cell region 3A, the metal silicide layers (metal silicide films) SIL are formed. On the other hand, in the core MIS formation region 1A and the I/O MIS formation region 2A, in the respective upper portions of the gate electrodes GE and the n⁺-type semiconductor regions 8, the metal silicide layers SIL are formed.

The metal silicide layers SIL can reduce diffusion resistance, contact resistance, and the like. The metal silicide layers SIL can be formed as follows.

For example, over the entire main surface of the semiconductor substrate 1, a metal film (not shown) is formed and, by performing heat treatment on the semiconductor substrate 1, the respective upper-layer portions of the memory gate electrode MG, the gate electrodes GE, and the n⁺-type semiconductor regions 8, 8a, and 8b are caused to react with the foregoing metal film. In this manner, in the respective upper portions of the memory gate electrode MG, the gate electrodes GE, and the n⁺-type semiconductor regions 8, 8a, and 8b, the metal silicide layers SIL are formed. The foregoing metal film is made of, e.g., a cobalt (Co) film, a nickel (Ni) film, or the like and can be formed using a sputtering method or the like. Then, the unreacted metal film is removed.

Thereafter, over the entire main surface of the semiconductor substrate 1, an interlayer insulating film (not shown) is formed, though the illustration thereof is omitted. Then, in the interlayer insulating film, contact holes (not shown) which expose, e.g., the surfaces of the n+-type semiconductor regions 8, 8a, and 8b are formed. By embedding a conductive film in the contact holes, plugs (not shown) are formed. Then, over the interlayer insulating film in which the plugs are embedded, wires (not shown) are formed.

Thus, according to the present embodiment, the SMT is applied only to the MISFET (LT) among the MISFET (LT), the MISFET (HT), and the memory cell MC. This can generally improve the characteristics of the semiconductor device.

The present inventors have studied the case where the SMT is applied to each of the MISFET (LT), the MISFET (HT), and the memory cell MC and obtained the result shown in FIG. 62. FIG. 62 is a view showing the characteristics of the MISFET (LT), the MISFET (HT), and the memory cell MC after the SMT has been applied thereto.

That is, the present inventors have studied the case where, in a state in which the silicon nitride film as the stress application film 10 is present over each of the core MIS formation region 1A, the I/O MIS formation region 2A, and the memory cell region 3A (see, e.g., FIG. 55), heat treatment is performed to apply a stress to each of the elements.

As shown in FIG. 62, with regard to the MISFET (LT), an increase in channel current (simply shown as "Current" in FIG. 62) due to the effect of the SMT can be recognized. However, the channel current in each of the MISFET (HT) and the memory cell MC has not changed. This may be conceivably because, with regard to the MISFET (HT) and the memory cell MC each having a relatively large gate length, the effect of the SMT is poor and consequently the channel current has not increased.

On the other hand, the HC has decreased in each of the elements of the MISFET (LT), the MISFET (HT), and the memory cell MC. This may be conceivably because the hydrogen (H) contained in the silicon nitride film used as the stress application film 10 affects the HC.

As has been described with reference to FIG. 16, the silicon nitride film used as the stress application film 10 contains a large amount of H (hydrogen). The H (hydrogen) in the silicon nitride film is diffused into the MISFET by the heat treatment for applying the stress. For example, when the H (hydrogen) reaches the interface between the semiconductor substrate 1 (p-type well) and the insulating film 3, the H (hydrogen) is bonded to silicon (Si) to form a Si—H bond. When the MISFET performs a driving operation, if hot carriers are generated in the drain region to which a high potential is applied, the Si—H bond is cut to result in an interfacial level. If a large number of such interfacial levels are formed, the carriers are trapped to degrade the driving ability of the MISFET.

As has been also described with reference to FIG. 39, the H (hydrogen) in the silicon nitride film used as the stress application film 10 is diffused into the memory cell by the heat treatment for applying a stress. For example, when the H (hydrogen) reaches the silicon nitride film 5N as the middle layer forming the insulating film (ONO film) 5, the shallow trap levels increase in the charge storage portion of the memory cell. When the charges to be "written" to the memory cell are held by such shallow trap levels, the charges tend to be released to degrade the holding characteristic of the memory cell.

By contrast, in the present embodiment, the SMT is not applied to the MISFET (HT) to which the effect of the SMT is poor, and the stress application film (silicon nitride film) over the MISFET (HT) is removed therefrom. Therefore, it is possible to avoid the degradation of the driving ability of the MISFET due to the H (hydrogen) in the foregoing silicon nitride film.

Likewise, to the memory cell MC to which the effect of the SMT is poor also, the SMT is not applied, and the stress application film (silicon nitride film) 10 over the memory cell MC is removed therefrom. Therefore, it is possible to avoid the degradation of the characteristics of the memory cell MC due to the H (hydrogen) in the foregoing silicon nitride film.

It will be appreciated that, for the MISFET (LT), an improvement in channel current can be achieved using the SMT.

By thus selectively applying the SMT, it is possible to generally improve the characteristics of the semiconductor device.

(Description of Application Example)

In the foregoing process, the stress application film 10 in each of the I/O MIS formation region 2A and the memory cell region 3A is entirely removed therefrom to expose the stopper film 9 in the regions (see FIGS. 56 and 57). However, it may also be possible to remove the portion of the stress application film 10 in each of the I/O MIS formation region 2A and the memory cell region 3A which corresponds to a predetermined thickness from the surface thereof so as to reduce the thickness of the stress application film 10 in each of the I/O MIS formation region 2A and the memory cell region 3A.

Figure 63:
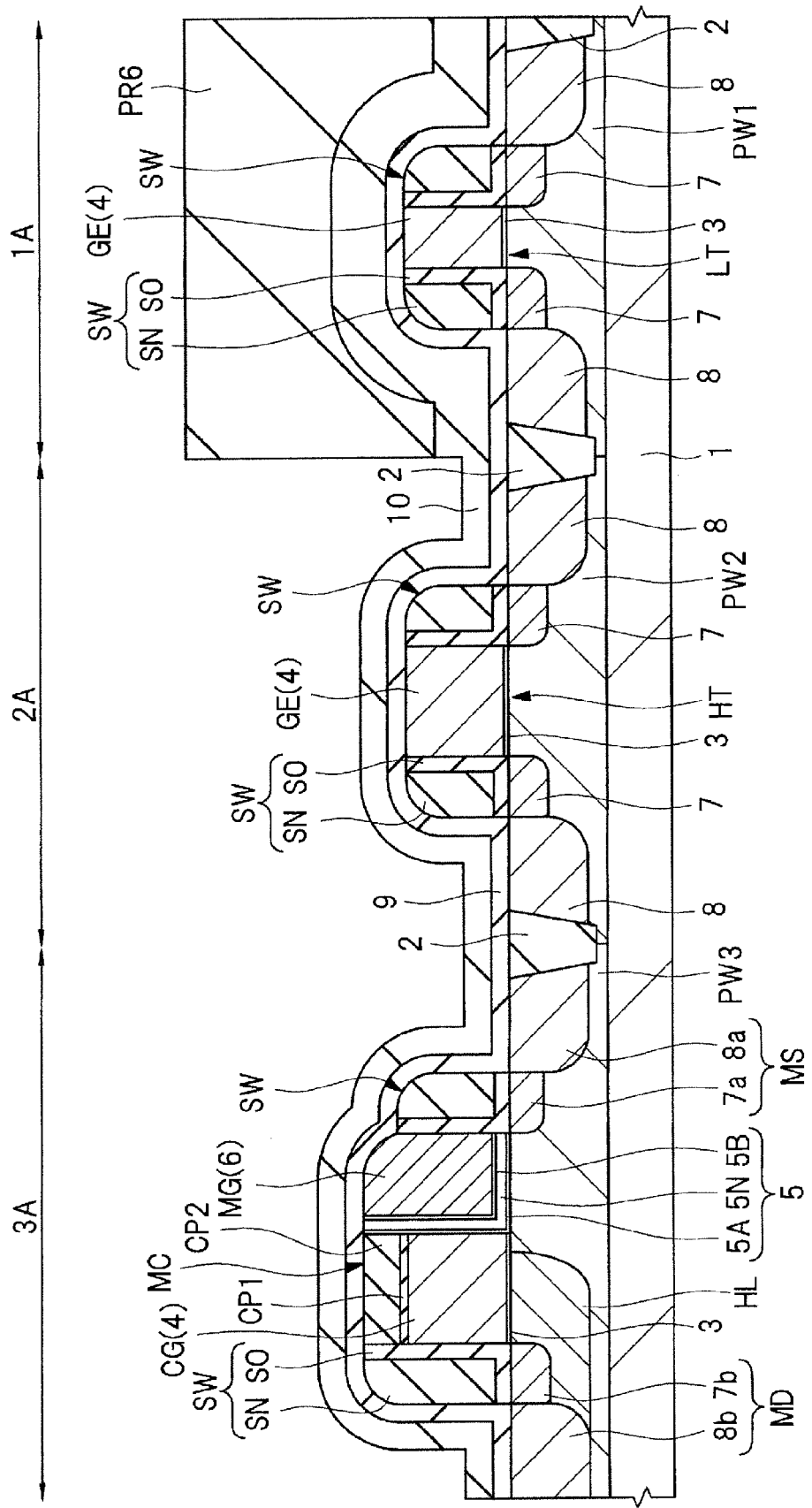
FIG. 63 is a main-portion cross-sectional view showing the manufacturing process of a semiconductor device in an application example of Embodiment 3.
Figure 64:
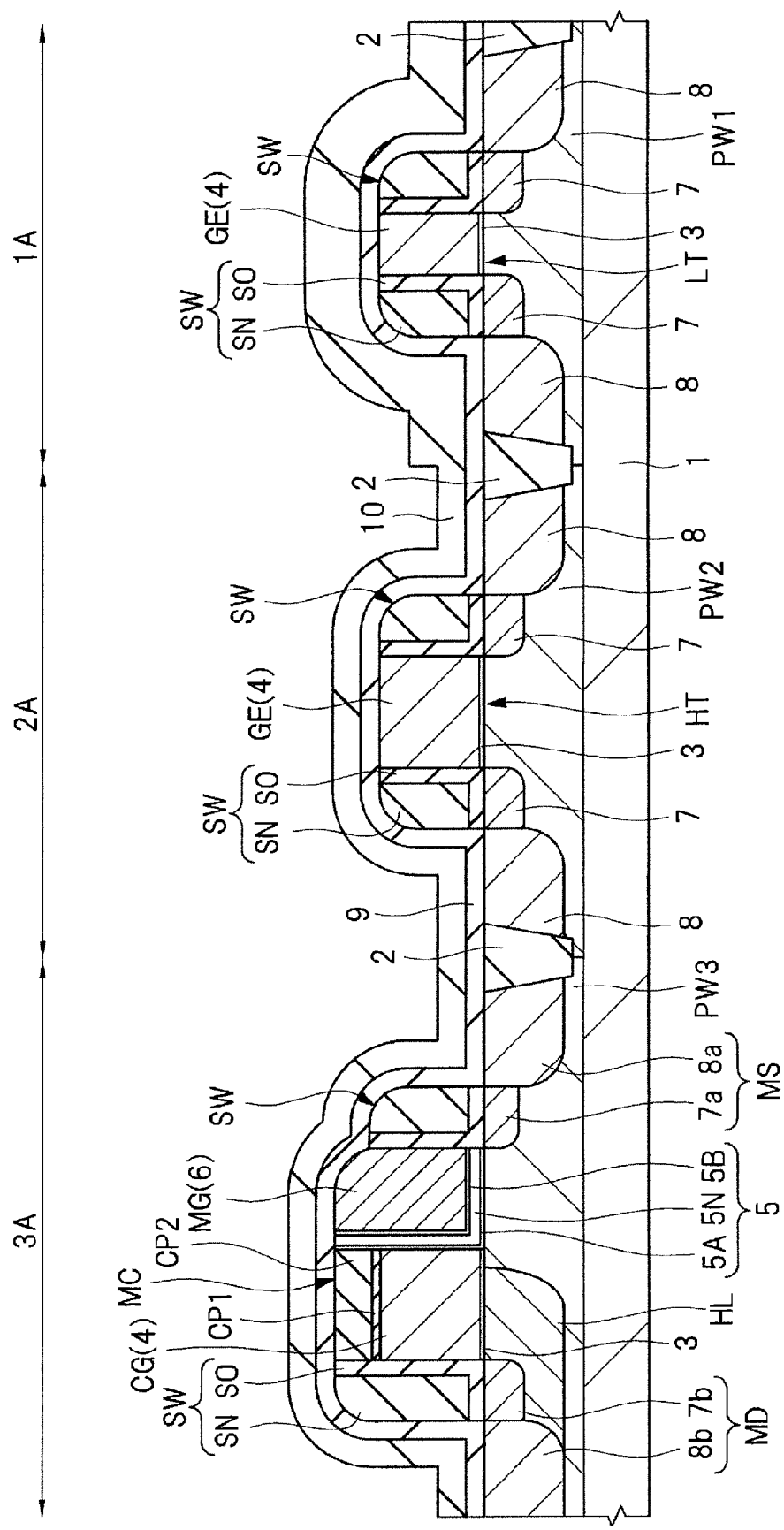
FIG. 64 is a main-portion cross-sectional view showing the manufacturing process of the semiconductor device in the application example of Embodiment 3, which is subsequent to FIG. 63.

FIGS. 63 and 64 are main-portion cross-sectional views showing the manufacturing process of the semiconductor device in an application example of the present embodiment.

<Process of Forming MISFET (LT), MISFET (HT), and Memory Cell MC>

As has been described with reference to FIGS. 45 to 53, the MISFET (LT) is formed in the core MIS formation region 1A, the MISFET (HT) is formed in the I/O MIS formation region 2A, and the memory cell MC is formed in the memory cell region 3 (FIG. 53).

<SMT and Silicide Process>

Next, as shown in FIG. 63, over the semiconductor substrate 1 including the MISFET (LT), the MISFET (HT), and the memory cell MC, a silicon oxide film is formed as the stopper film 9 to a thickness of about 5 nm using a CVD method. Then, over the stopper film 9, a silicon nitride film is formed as the stress application film 10 to a thickness of about 35 nm using a CVD method.

Next, over the stress application film 10 in the core MIS formation region 1A, a photoresist film PR6 is formed using a photolithographic method. Then, using the photoresist film PR6 as a mask, the portion of the stress application film 10 corresponding to the predetermined thickness is etched from the surface thereof. Here, from the surface of the silicon nitride film forming the stress application film 10, the portion thereof corresponding to a thickness of about 25 nm is anisotropically or isotropically dry-etched. In other words, the dry etching is performed until the thickness of the silicon nitride film becomes about 10 nm. For example, using $CF_4$ as an etching gas, the dry etching is performed. As a result, the thickness of the stress application film 10 in each of the I/O MIS formation region 2A and the memory cell region 3A becomes smaller than the thickness of the stress application film 10 in the core MIS formation region 1A (FIG. 63). Note that, when the thickness of the stress application film 10 in the I/O MIS formation region 2A is T102, the thickness of the stress application film 10 in the memory cell region 3A is T103, and the thickness of the stress application film 10 in the core MIS formation region 1A is T101, a relationship given by T102≈T103<T101 is established.

Then, as shown in FIG. 64, the photoresist film PR6 is removed by ashing treatment or the like. Thereafter, heat treatment is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. By the stress application film 10, the stress is applied to the MISFET (LT) in the core MIS formation region 1A. Here, as the heat treatment for applying the stress to the stress application film 10, heat treatment performed at a temperature of not less than 1000° C. for a moment of not longer than one second is preferred. On the other hand, since the stress application film 10 in each of the I/O MIS formation region 2A and the memory cell region 3A has a small thickness, a large stress is not applied to the MISFET (HT) and the memory cell MC. The thickness of the stress application film 10 in each of the I/O MIS formation region 2A and the memory cell region 3A is preferably adjusted to be not more than 25 nm.

Thereafter, as has been described with reference to FIGS. 58 to 61, the stress application film 10 after the heat treatment is removed, and the stopper film 9 is further removed. Then, using a salicide technique, the metal silicide layers (metal silicide films) SIL are formed.

Thus, according to the present embodiment, over the MISFET (LT), the MISFET (HT), and the memory cell MC, the stress application film 10 is formed and subjected to the heat treatment. However, since the thickness of the stress application film 10 in each of the I/O MIS formation region 2A and the memory cell region 3A is reduced, it is possible to reduce the influence of the H (hydrogen) in the silicon nitride film used as the stress application film. Therefore, it is possible to reduce the degree of degradation of the characteristics of the MISFET HT and the memory cell MC due to the H (hydrogen) in the silicon nitride film described above.

Also, in the present embodiment, the thin stress application film 10 remains in each of the I/O MIS formation region 2A and the memory cell region 3A so that no thickness difference is produced between the stopper film 9 in the I/O MIS formation region 2A, the stopper film 9 in the memory cell region 3A, and the stopper film 9 in the core MIS formation region 1A.

That is, in FIG. 59, the thickness of the stopper film 9 in each of the I/O MIS formation region 2A and the memory cell region 3A is smaller than the thickness of the stopper film 9 in the core MIS formation region 1A. In such a case, depending on the thickness of the remaining stopper film 9 and a thickness difference therein, it becomes difficult to control the etching.

Figure 65:
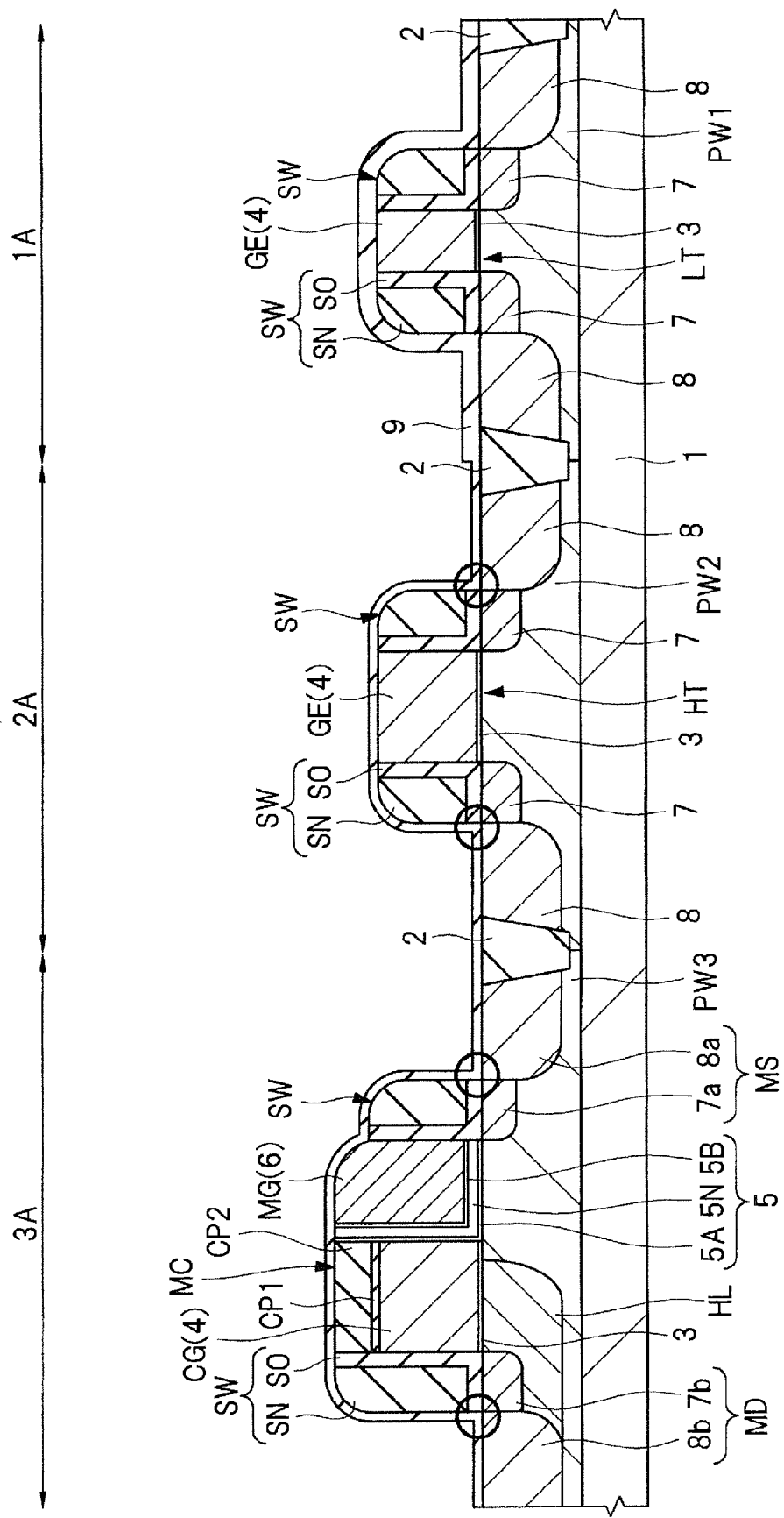
FIG. 65 is a main-portion cross-sectional view for illustrating the effect of the manufacturing process of the semiconductor device in the application example of Embodiment 3.

That is, when the etching is performed based on a thicker film portion, a thinner film portion is brought into an overetched state. For example, an end portion of the silicon oxide film SO forming the side wall insulating films SW and the portions enclosed in the circles in FIG. 65 are etched undesirably. If the metal silicide layers SIL grow in such portions, an increase in leakage current or the degradation of a breakdown voltage may occur. FIG. 65 is a main-portion cross-sectional view for illustrating the effect of the manufacturing process of the semiconductor device in the application example of the present embodiment.

On the other hand, when the etching is performed based on the thinner film portion, the residues of the stopper film 9 may be left in the thicker film portion. Over such residues, the metal silicide layers SIL do not sufficiently grow to result in a problem.

By contrast, according to the present embodiment, by preventing a thickness difference in the stopper film 9, it is possible to avoid the growth of the metal silicide layers SIL in the foregoing portions where it is undesired as well as no growth of the metal silicide layers SIL due to the residues of the stopper film 9. As a result, even when, e.g., the silicon oxide film is formed of a thin film having a thickness of about 5 nm, a thickness difference in the stopper film 9 can be prevented to allow the excellent metal silicide layers SIL to be formed.

Note that, in the present embodiment also, as the memory cell, an FG memory cell may also be used. That is, in the semiconductor device having the MISFET (LT), the MISFET (HT), and the FG memory cell, by removing the stress application film 10 in the memory cell region or the like therefrom and selectively applying the SMT as in the present embodiment, it is possible to generally improve the characteristics of the semiconductor device.

In addition, in the semiconductor device having the MISFET (LT), the MISFET (HT), and the FG memory cell, the portion of the stress application film in the memory cell region or the like which corresponds to a predetermined thickness is removed from the surface thereof so as to reduce the thickness of the stress application film in the memory cell region or the like as in the application example of the present embodiment. Accordingly, it is possible to reduce the degree of degradation of the characteristics of the memory cell due to the (hydrogen) in the silicon nitride film used as the stress application film. It is also possible to prevent a thickness difference in the stopper film 9 and form excellent metal silicide layers.

(Embodiment 4)

Referring to the drawings, a description will be given of a structure of a semiconductor device (semiconductor storage device) in the present embodiment. FIGS. 66 to 72 are main-portion cross-sectional views showing the manufacturing process of the semiconductor device in the present embodiment. The structure of the semiconductor device in the present embodiment will be described with reference to FIG. 72 which is the final process view of the drawings showing the manufacturing process of the semiconductor device in the present embodiment.

(Description of Structure)

Figure 72:
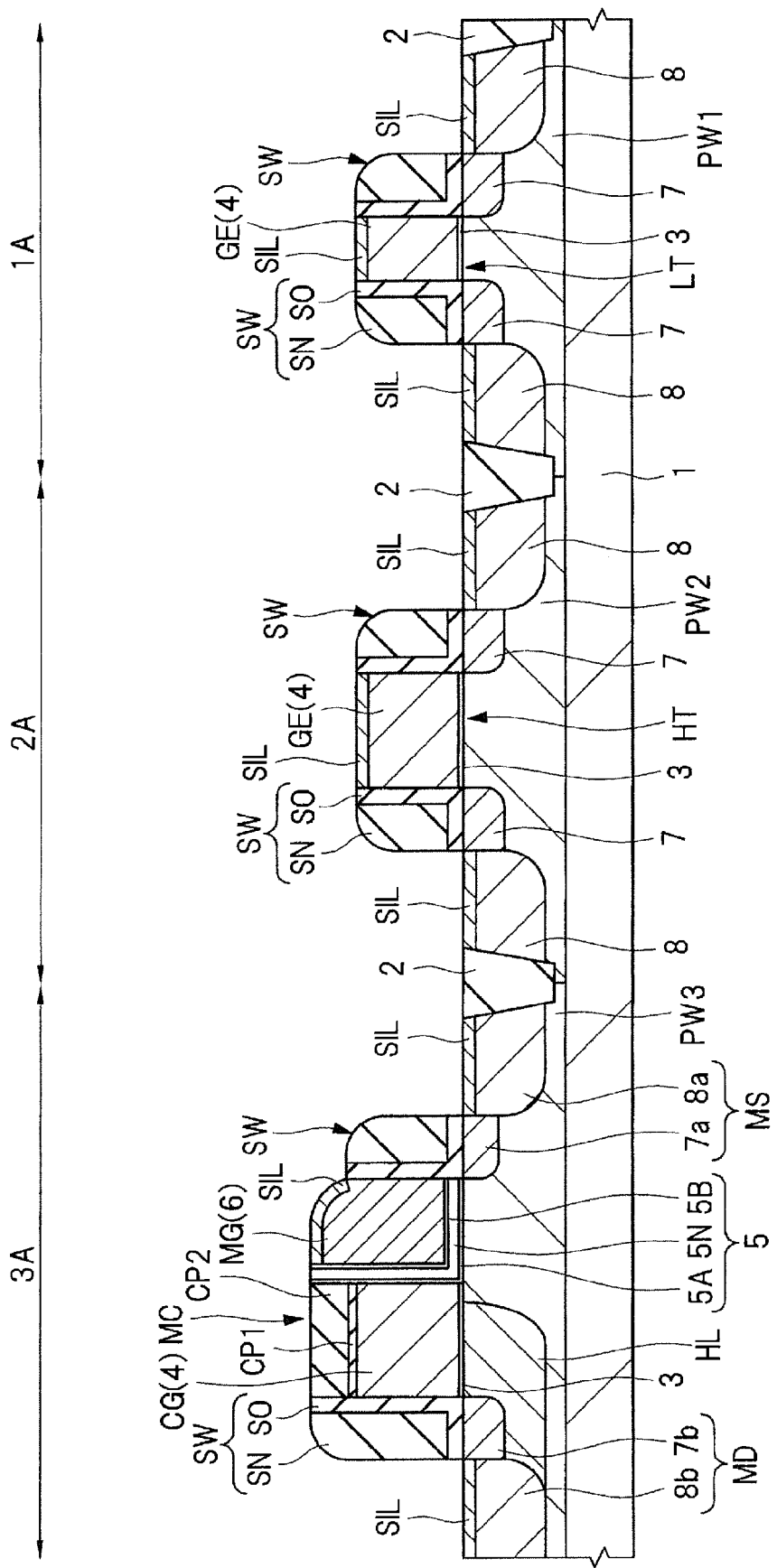
FIG. 72 is a main-portion cross-sectional view showing the manufacturing process of the semiconductor device in Embodiment 4, which is subsequent to FIG. 71.

As shown in FIG. 72, the semiconductor device in the present embodiment has the MISFET (LT), the MISFET (HT), and the memory cell MC in the same manner as in Embodiment 3.

The main configuration of the MISFET (LT), the MISFET (HT), and the memory cell MC is the same as in the case of Embodiment 3.

Here, in the present embodiment (FIG. 72), to the channel region of each of the MISFET (LT) and the MISFET (HT), a stress is applied using the SMT while, to the channel region of the memory cell MC, no stress is applied.

As described above, the SMT is a technique which applies a stress from the upper portion and side surface portions of the gate electrode of a MISFET to the channel region thereof to cause the crystal in the channel region to strain and thus improve the mobility of carriers in the channel region.

As a result, in the present embodiment (FIG. 72), the crystal spacing in the channel region of each of the MISFET (LT) and the MISFET (HT) has been changed by the SMT. On the other hand, since the SMT is not applied to the memory cell MC, there is no change due to the SMT in the crystal spacing in the channel region of the memory cell MC. Thus, in the semiconductor device of the present embodiment, the SMT is not applied to each of the elements, but is selectively applied to be able to generally improve the characteristics of the semiconductor device. A detailed description will be further given in the following "Description of Manufacturing Method" section.

—Description of Manufacturing Method—

Next, referring to FIGS. 66 to 72, a method of manufacturing the semiconductor device in the present embodiment will be described.

<Process of Forming MISFET (LT), MISFET (HT), and Memory Cell MC>

As has been described with reference to FIGS. 45 to 53 in Embodiment 3, the MISFET (LT) is formed in the core MIS formation region 1A, the MISFET (HT) is formed in the I/O MIS formation region 2A, and the memory cell MC is formed in the memory cell region 3A (FIG. 53).

<SMT and Silicide Process>

Figure 66:
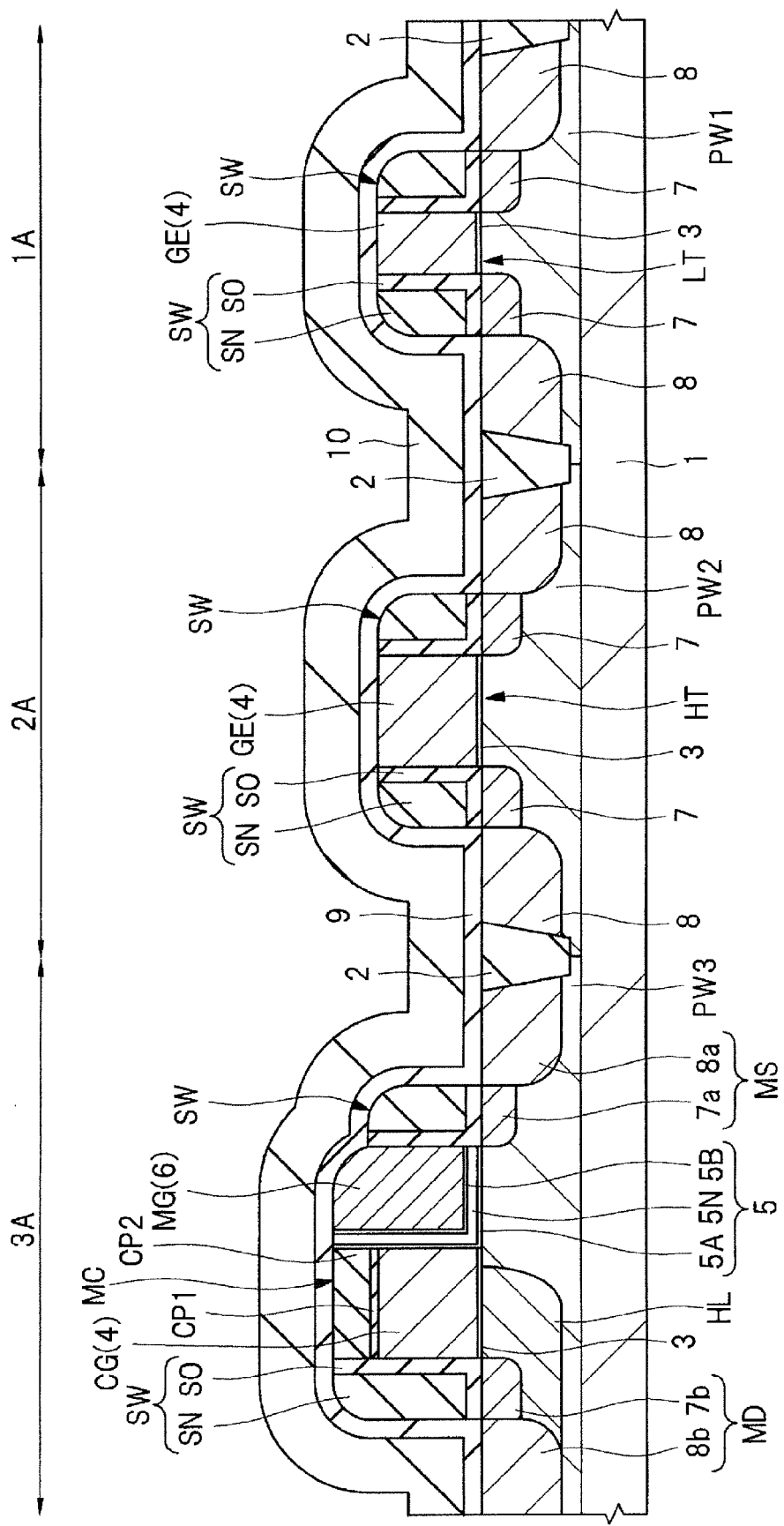
FIG. 66 is a main-portion cross-sectional view showing the manufacturing process of a semiconductor device in Embodiment 4.

Next, as shown in FIG. 66, over the semiconductor substrate 1 including the MISFET (LT), the MISFET (HT), and the memory cell MC, a silicon oxide film is formed as the stopper film 9 to a thickness of about 13 nm using a CVD method. For example, the silicon oxide film is formed by a CVD method using, e.g., TEOS (Tetraethoxysilane) and ozone ($O_3$) as raw material gases. The stopper film 9 functions as the etching stopper in the etching of the stress application film 10 described later. The stopper film 9 can prevent undesired etching of each of the patterns (such as, e.g., portions each made of the silicon film) forming the MISFET (LT), the MISFET (HT), and the memory cell MC.

Then, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Figure 67:
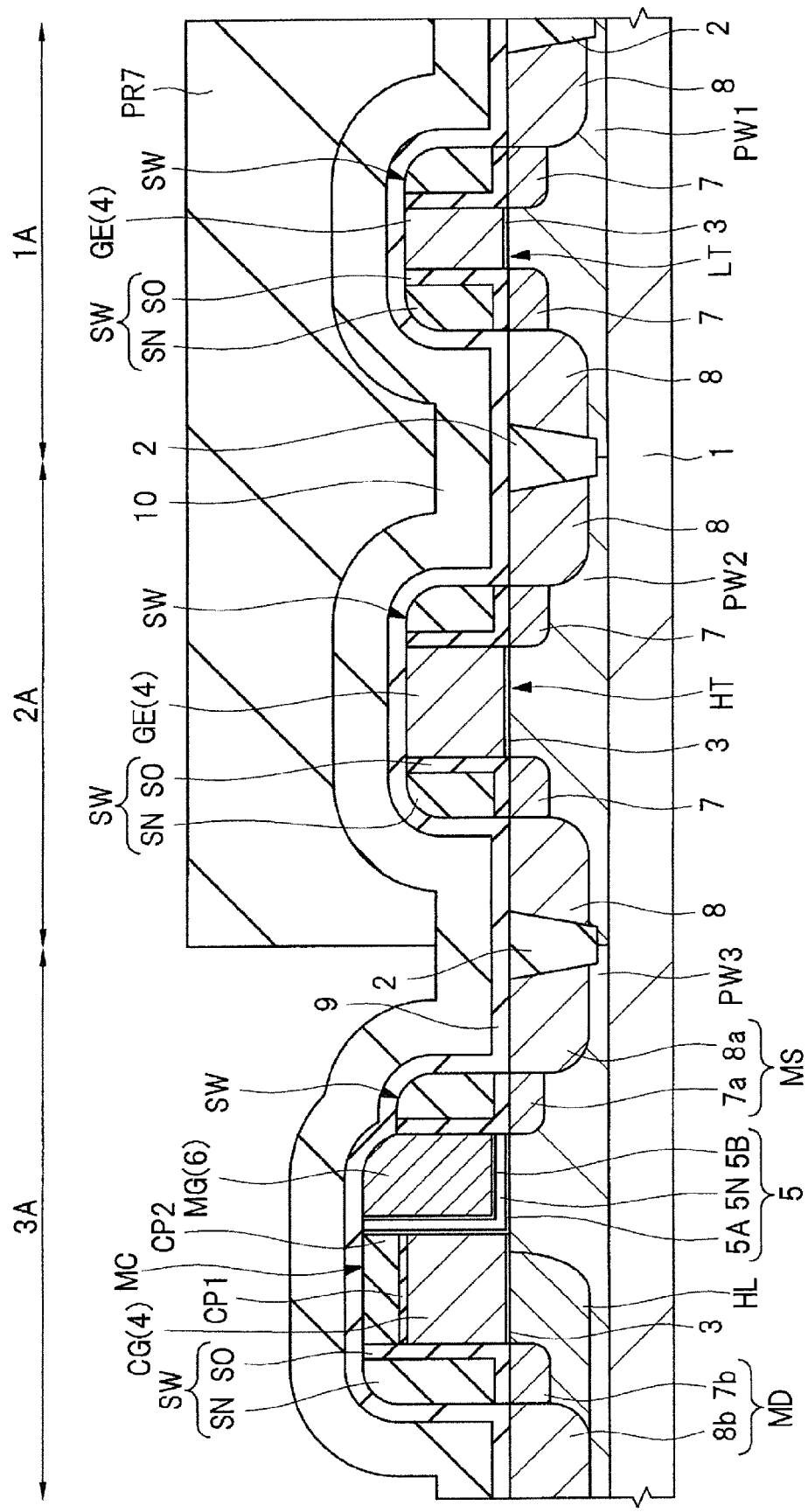
FIG. 67 is a main-portion cross-sectional view showing the manufacturing process of the semiconductor device in Embodiment 4, which is subsequent to FIG. 66.
Figure 68:
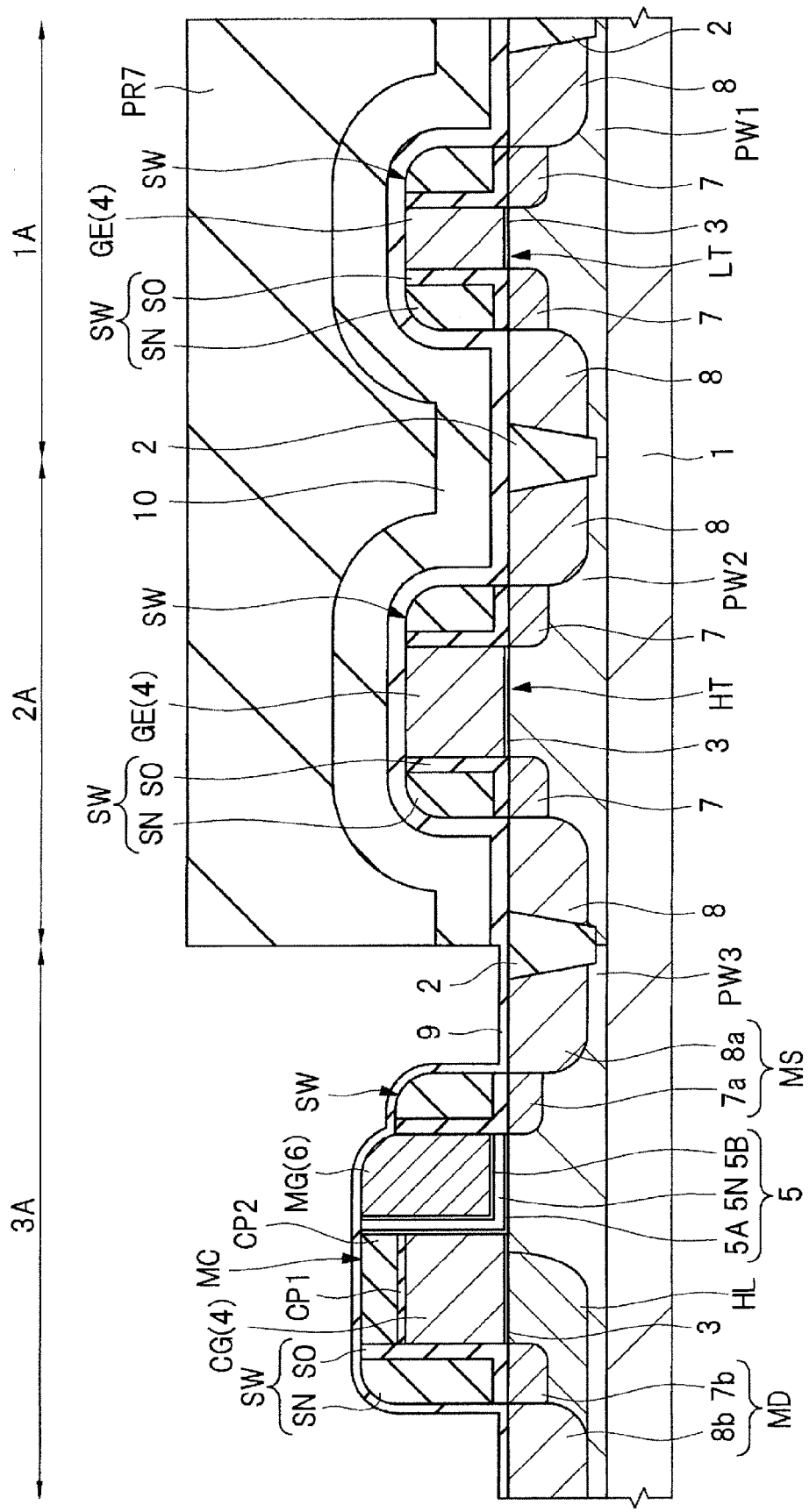
FIG. 68 is a main-portion cross-sectional view showing the manufacturing process of the semiconductor device in Embodiment 4, which is subsequent to FIG. 67.

Next, the stress application film 10 in the memory cell region 3A is removed therefrom. First, as shown in FIG. 67, over the stress application film 10 in the core MIS formation region 1A and the I/O MIS formation region 2A, a photoresist film PR7 is formed using a photolithographic method. Then, as shown in FIG. 68, using the photoresist film PR7 as a mask, the stress application film 10 is etched. Here, the silicon nitride film forming the stress application film 10 is dry-etched. For example, using $CH_4$ as an etching gas, isotropic dry etching is performed. As a result, the core MIS formation region 1A and the I/O MIS formation region 2A are covered with the stress application film 10. In other words, the MISFET (LT) and the MISFET (HT) are covered with the stress application film 10. On, the other hand, the stopper film 9 in the memory cell region 3A is exposed.

Here, the foregoing etching is performed under such a condition that the etching selectivity is high, i.e., the ratio of the etching speed of the stress application film 10 to the etching speed of the stopper film 9 is high, but the stopper film 9 is also etched slightly. Accordingly, the thickness of the stopper film 9 in the memory cell region 3A becomes smaller than the thickness of the stopper film 9 remaining under the stress application film 10 in each of the core MIS formation region 1A and the I/O MIS formation region 2A (FIG. 68). Note that, when the thickness of the stopper film 9 in the I/O MIS formation region 2A is T92, the thickness of the stopper film 9 in the memory cell region 3A is T93, and the thickness of the stopper film 9 in the core MIS formation region 1A is T91, a relationship given by T93<T92≈T91 is established.

Figure 69:
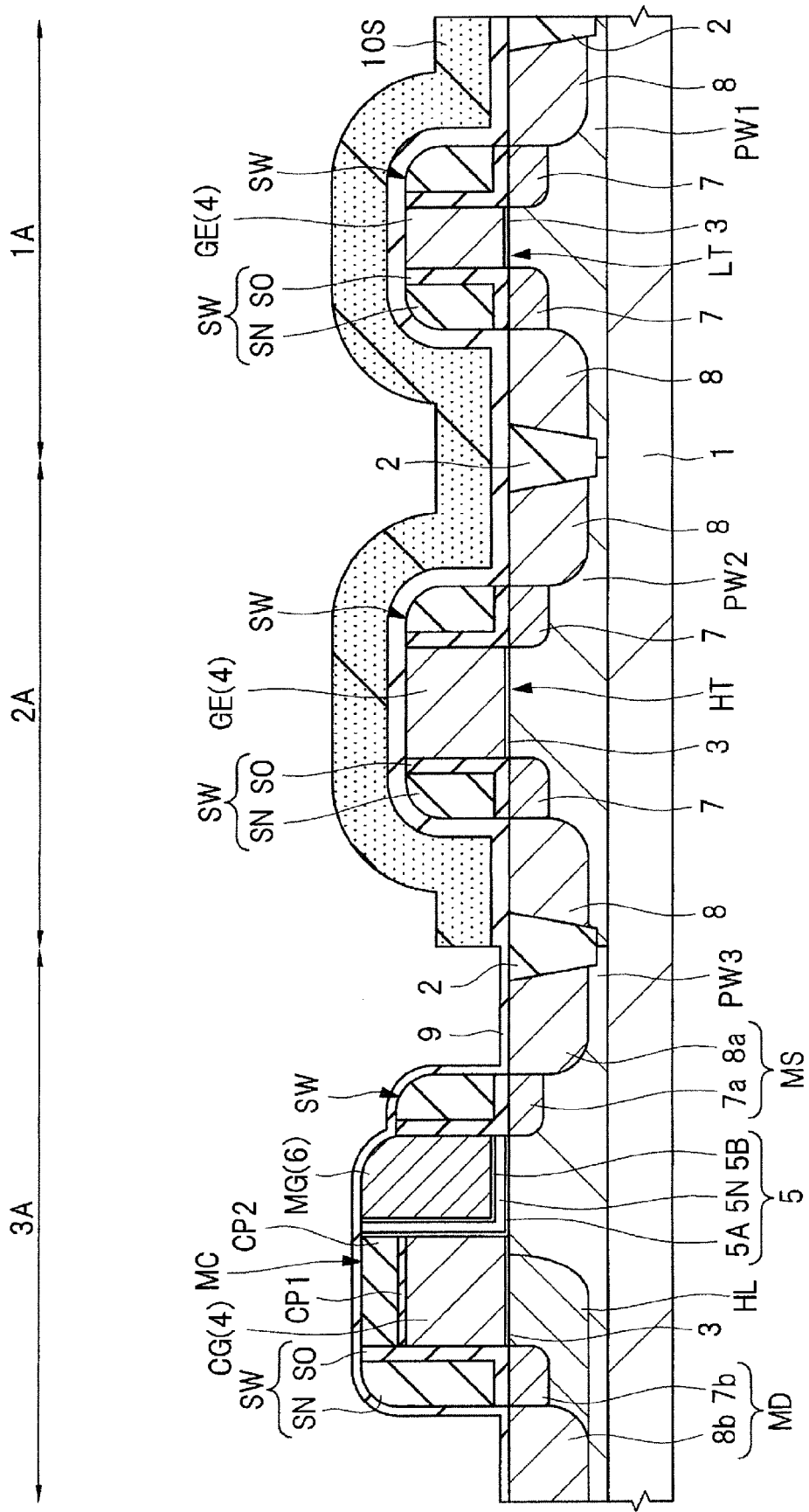
FIG. 69 is a main-portion cross-sectional view showing the manufacturing process of the semiconductor device in Embodiment 4, which is subsequent to FIG. 68.

Then, as shown in FIG. 69, after the photoresist film PR7 is removed by ashing treatment or the like, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to each of the MISFET (LT) in the core MIS formation region 1A and the MISFET (HT) in the I/O MIS formation region 2A. On the other hand, the stress application film 10 has been removed from the memory cell region 3A so that no stress is applied to the memory cell MC.

It may also be possible to activate the impurity introduced into the source region MS ($n^-$-type semiconductor region 7a and $n^+$-type semiconductor region 8a), the drain region MD ($n^-$-type semiconductor region 7b and $n^+$-type semiconductor region 8b), and the source/drain regions (7 and 8) using the heat treatment and omit the previous heat treatment (activation treatment). It may also be possible to crystallize the silicon films 4 and 6 each made of the amorphous silicon film by the heat treatment (crystallization treatment).

Figure 70:
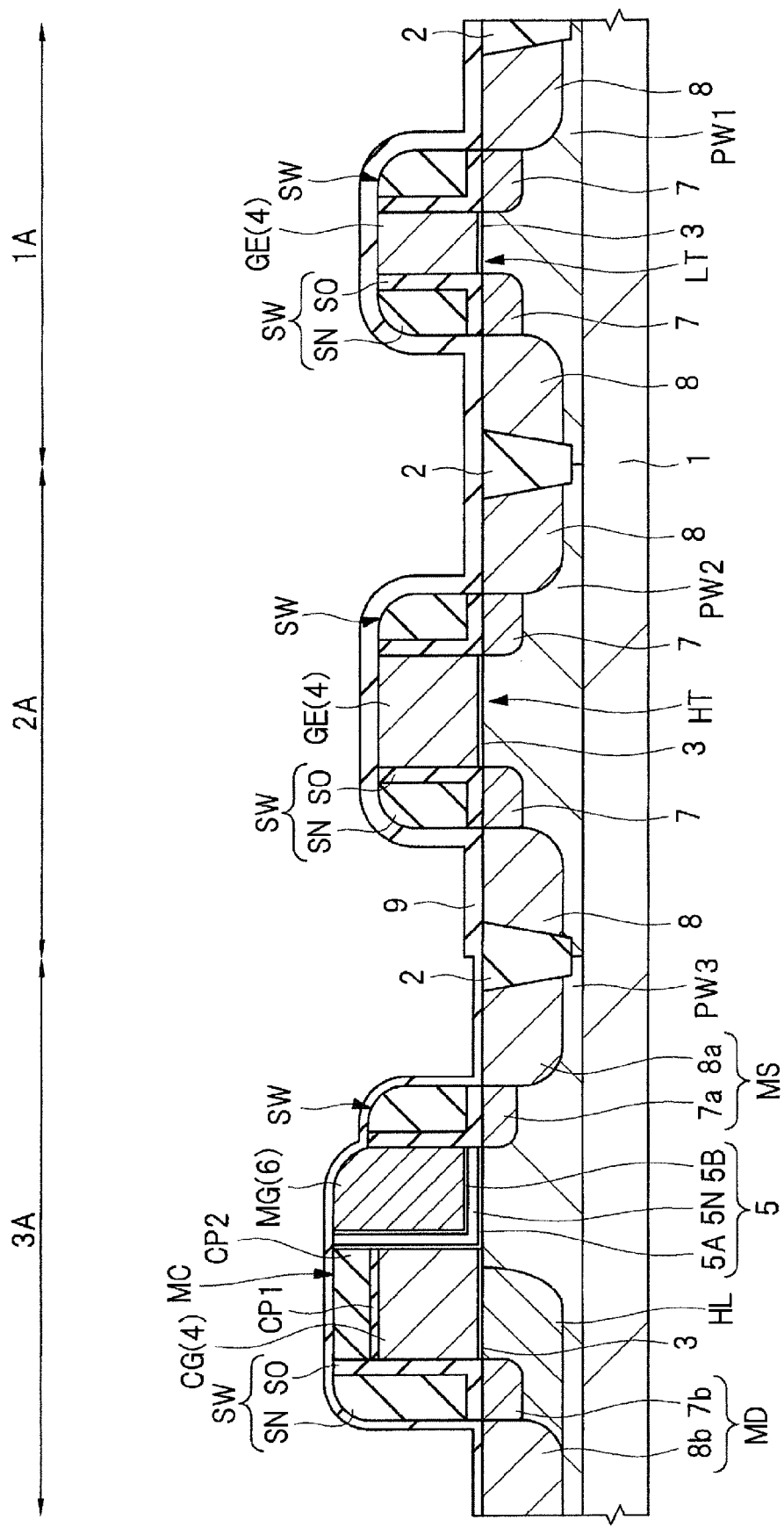
FIG. 70 is a main-portion cross-sectional view showing the manufacturing process of the semiconductor device in Embodiment 4, which is subsequent to FIG. 69.

Next, as shown in FIG. 70, the stress application film 10S in the core MIS formation region 1A and the I/O MIS formation region 2A is removed therefrom. Here, the silicon nitride film forming the stress application film 10S is wet-etched under such a condition that the etching selectivity is high, i.e., the ratio of the etching speed of the stress application film 10 to the etching speed of the stopper film 9 is high. For example, using a phosphoric acid ($H_3PO_4$) solution as an etchant, the wet etching is performed at 155° C. for 600 seconds. As a result, the stopper film 9 in each of the core MIS formation region 1A, the I/O MIS formation region 2A, and the memory cell region 3A is exposed.

Figure 71:
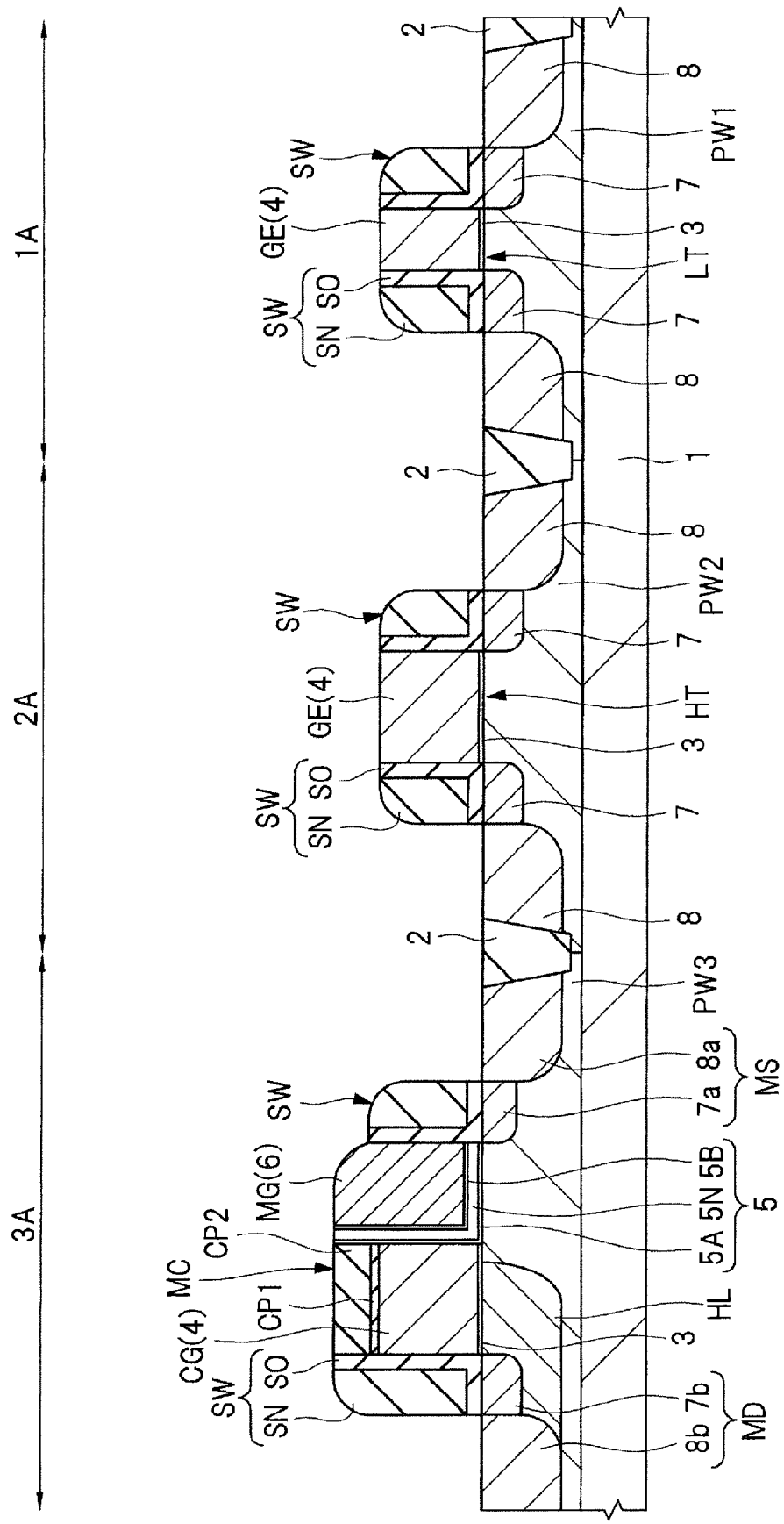
FIG. 71 is a main-portion cross-sectional view showing the manufacturing process of the semiconductor device in Embodiment 4, which is subsequent to FIG. 70.

Next, as shown in FIG. 71, the foregoing stopper film 9 is 9 removed. Here, the silicon oxide film forming the stopper film is wet-etched under such a condition that the etching selectivity is high, i.e., the ratio of the etching speed of the stopper film 9 to the etching speed of the semiconductor substrate 1 is high. For example, using a HF solution as an etchant, the wet etching is performed at 25° C. for 100 seconds.

Next, as shown in FIG. 72, using a salicide technique, in the respective upper portions of the memory gate electrodes MG, the $n^+$-type semiconductor region 8a, and the $n^+$-type semiconductor region 8b in the memory cell region 3A, the metal silicide layers (metal silicide films) SIL are formed. On the other hand, in the core MIS formation region 1A and the I/O MIS formation region 2A, in the respective upper portions of the gate electrodes GE and the $n^+$-type semiconductor regions 8, the metal silicide layers SIL are formed.

The metal silicide layers SIL can reduce diffusion resistance, contact resistance, and the like. The metal silicide layers SIL can be formed in the same manner as in the case of Embodiment 3.

Thereafter, over the entire main surface of the semiconductor substrate 1, an interlayer insulating film (not shown) is formed, though the illustration thereof is omitted. Then, in the interlayer insulating film, contact holes (not shown) which expose, e.g., the surfaces of the $n^+$-type semiconductor regions 8, 8a, and 8b are formed. By embedding a conductive film in the contact holes, plugs (not shown) are formed. Then, over the interlayer insulating film in which the plugs are embedded, wires (not shown) are formed.

Thus, in the present embodiment also, the SMT is not applied to the memory cell MC to which the effect of the SMT is poor, and the stress application film (silicon nitride film) 10 over the memory cell MC is removed therefrom. Therefore, as described in detail in Embodiment 3, it is possible to avoid the degradation of the characteristics of the memory cell MC due to the H (hydrogen) in the silicon nitride film (see FIG. 39).

It will be appreciated that, for the MISFET (LT), an improvement in channel current can be achieved using the SMT.

To the MISFET (HT), the effect of the SMT is poor so that the HC deteriorates therein due to the H (hydrogen) in the silicon nitride film (see FIG. 62). However, the degree of the deterioration is not so high as in the memory cell MC and is about 10% of the HC deterioration in the memory cell. Accordingly, even when the stress application film (silicon nitride film) 10 is left over the MISFET (HT), the influence of the HC deterioration is small. Therefore, in the present embodiment also, it is possible to generally improve the characteristics of the semiconductor device.

By thus selectively applying the SMT, it is possible to generally improve the characteristics of the semiconductor device.

(Description of Application Example)

In the foregoing process, the stress application film 10 in the memory cell region 3A is entirely removed therefrom to expose the stopper film 9 in the region (see FIGS. 67 and 68). However, it may also be possible to remove the portion of the stress application film 10 in the memory cell region 3A which corresponds to a predetermined thickness from the surface thereof so as to reduce the thickness of the stress application film 10 in the memory cell region 3A.

Figure 73:
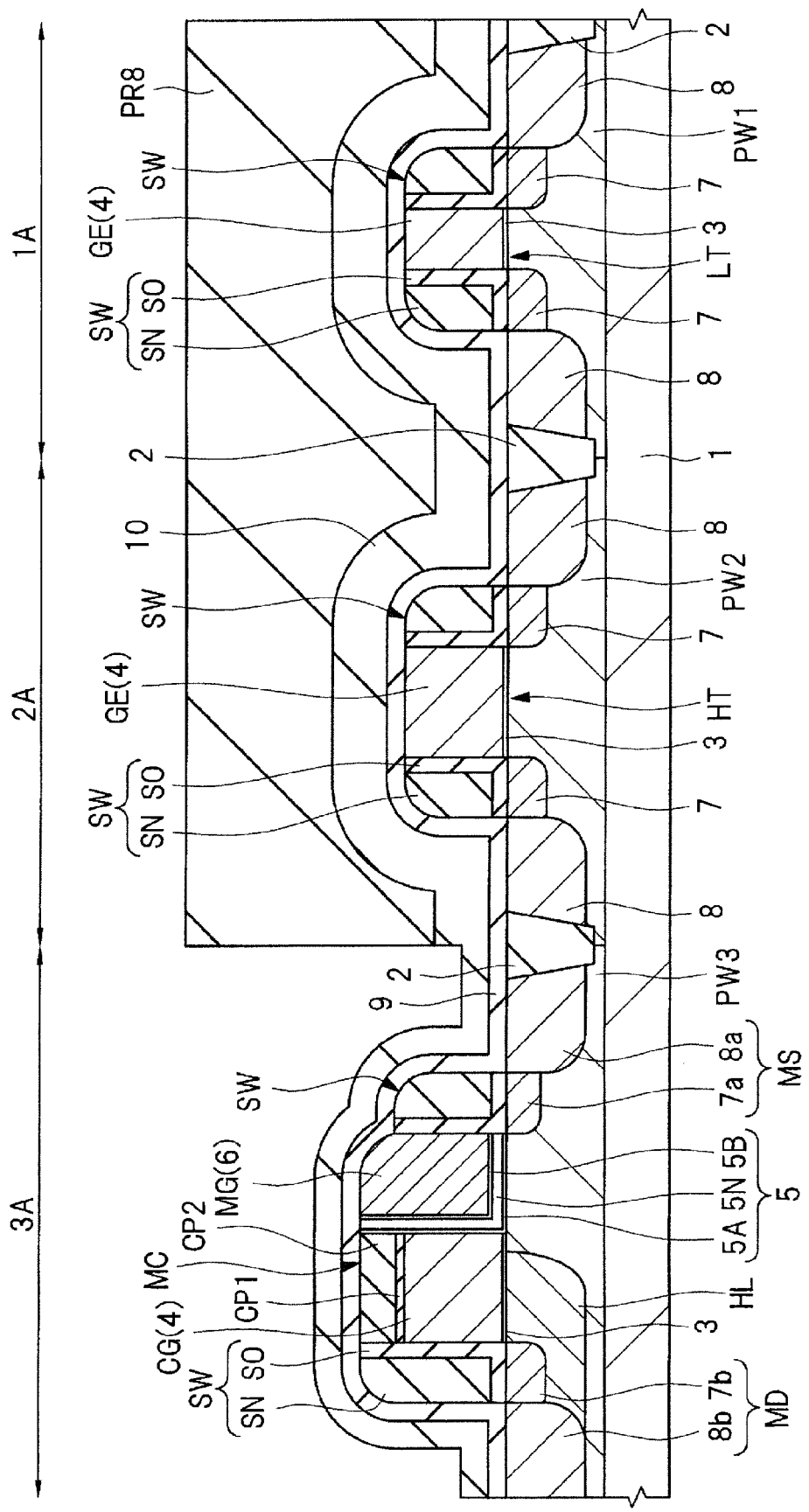
FIG. 73 is a main-portion cross-sectional view showing the manufacturing process of a semiconductor device in an application example of Embodiment 4.
Figure 74:
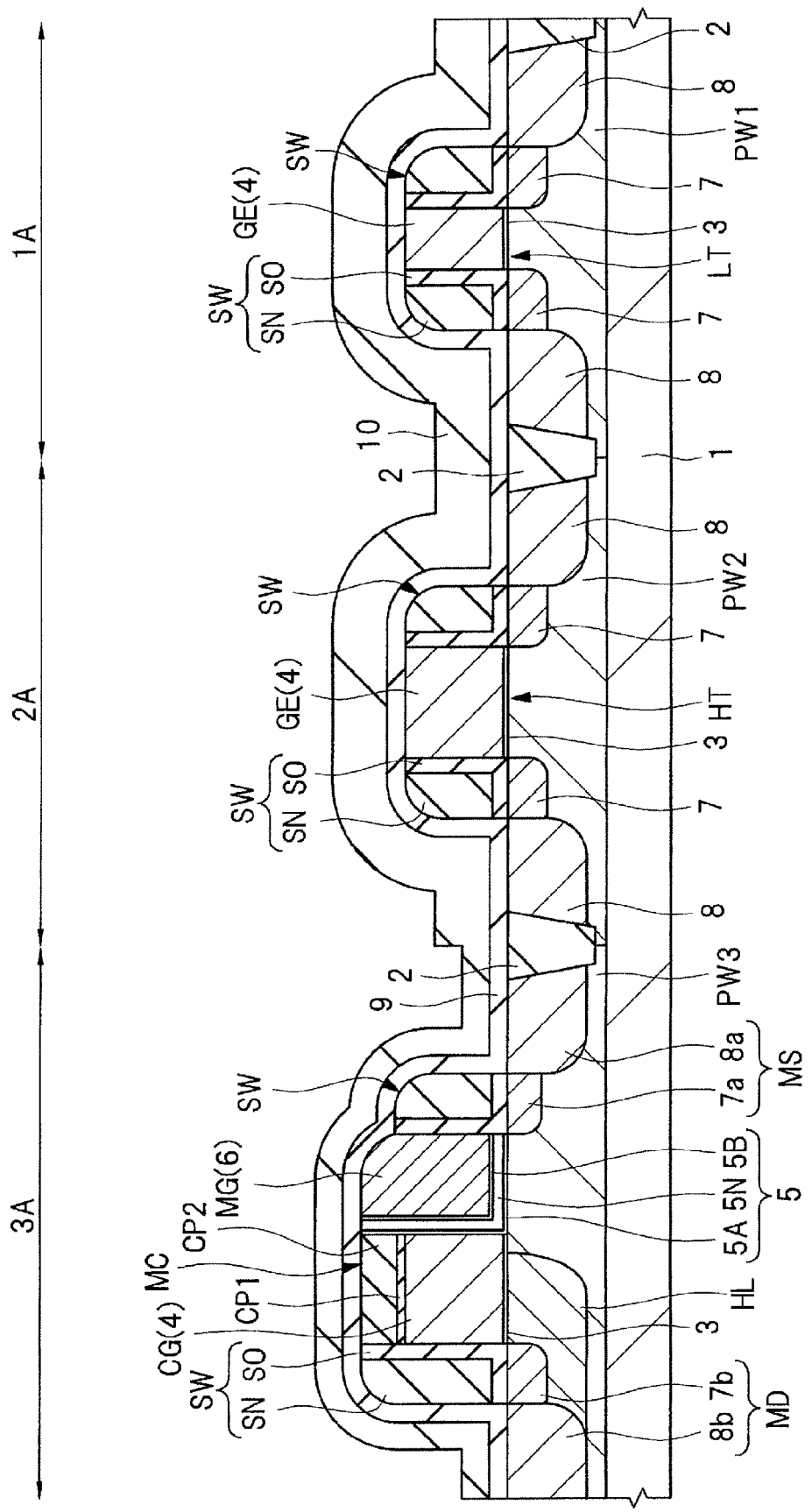
FIG. 74 is a main-portion cross-sectional view showing the manufacturing process of the semiconductor device in the application example of Embodiment 4, which is subsequent to FIG. 73.

FIGS. 73 and 74 are main-portion cross-sectional views showing the manufacturing process of the semiconductor device in an application example of the present embodiment.

<Process of Forming MISFET (LT), MISFET (HT), and Memory Cell MC)>

As has been described with reference, to FIGS. 45 to 53 in Embodiment 3, the MISFET (LT) is formed in the core MIS formation region 1A, the MISFET (HT) is formed in the I/O MIS formation region 2A, and the memory cell MC is formed in the memory cell region 3A (FIG. 53).

<SMT and Silicide Process>

Next, as shown in FIG. 73, over the semiconductor substrate 1 including the MISFET (LT), the MISFET (HT), and the memory cell MC, a silicon oxide film is formed as the stopper film 9 to a thickness of about 5 nm using a CVD method. Then, over the stopper film 9, a silicon nitride film is formed as the stress application film 10 to a thickness of about 35 nm using a CVD method.

Next, over the stress application film 10 in the core MIS formation region 1A and the I/O MIS formation region 2A, a photoresist film PR8 is formed using a photolithographic method. Then, using the photoresist film PR8 as a mask, the portion of the stress application film 10 corresponding to the predetermined thickness is etched from the surface thereof. Here, from the surface of the silicon nitride film forming the stress application film 10, the portion thereof corresponding to a thickness of about 25 nm is anisotropically or isotropically dry-etched. In other words, the dry etching is performed until the thickness of the silicon nitride film becomes about 10 nm. For example, using $CF_4$ as an etching gas, the dry etching is performed. As a result, the thickness of the stress application film 10 in the memory cell region 3A becomes smaller than the thickness of the stress application film 10 in each of the core MIS formation region 1A and the I/O MIS formation region 2A (FIG. 73). Note that, when the thickness of the stress application film 10 in the I/O MIS formation region 2A is T102, the thickness of the stress application film 10 in the memory cell region 3A is T103, and the thickness of the stress application film 10 in the core MIS formation region 1A is T101, a relationship given by T103<T102≈T101 is established.

Then, as shown in FIG. 74, the photoresist film PR8 is removed by ashing treatment or the like. Thereafter, heat treatment is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. By the stress application film 10, the stress is applied to the MISFET (LT) in the core MIS formation region 1A. Here, as the heat treatment for applying the stress to the stress application film 10, heat treatment performed at a temperature of not less than 1000° C. for a moment of not longer than one second is preferred. On the other hand, since the stress application film 10 in the memory cell region 3A has a small thickness, a large stress is not applied to the memory cell MC. The thickness of the stress application film 10 in the memory cell region 3A is preferably adjusted to be not more than 20 nm.

Thereafter, as has been described with reference to FIGS. 69 to 72, the stress application film 10 after the heat treatment is removed, and the stopper film 9 is, further removed. Then, using a salicide technique, the metal silicide layers (metal silicide films) SIL are formed.

Thus, according to the present embodiment, over the MISFET (LT), the MISFET (HT), and the memory cell MC, the stress application film 10 is formed and subjected to the heat treatment. However, since the thickness of the stress application film 10 in the memory cell region 3A is reduced, it is possible to reduce the influence of the H (hydrogen) in the silicon nitride film used as the stress application film. Therefore, it is possible to reduce the degree of degradation of the characteristics of the memory cell MC due to the H (hydrogen) in the silicon nitride film described above.

Also, in the present embodiment, the thin stress application film 10 remains in the memory cell region 3A so that no thickness difference is produced between the stopper film 9 in the memory cell region 3A and the stopper film 9 in each of the core MIS formation region 1A and the I/O MIS formation region 2A.

Therefore, as has been described in detail in the application example of Embodiment 3, it is possible to avoid the growth of the metal silicide layers SIL in the foregoing portions where it is undesired as well as no growth of the metal silicide layers SIL due to the residues of the stopper film 9. As a result, even when the silicon oxide film is formed of a thin film having a thickness of, e.g., about 5 nm, a thickness difference in the stopper film 9 can be prevented to allow the excellent metal silicide layers SIL to be formed.

As described above, to the MISFET (HT), the effect of the SMT is poor so that the HC deteriorates therein due to the H (hydrogen) in the silicon nitride film (see FIG. 62). However, the degree of the deterioration is not so high as in the memory cell MC so that the influence thereof is small.

Note that, in the present embodiment also, as the memory cell, an FG memory cell may also be used. That is, in the semiconductor device having the MISFET (LT), the MISFET (HT), and the FG memory cell, by removing the stress application film 10 in the memory cell region or the like therefrom and selectively applying the SMT as in the present embodiment, it is possible to generally improve the characteristics of the semiconductor device.

In addition, in the semiconductor device having the MISFET (LT), the MISFET (HT), and the FG memory cell, the portion of the stress application film in the memory cell region or the like which corresponds to a predetermined thickness is removed from the surface thereof so as to reduce the thickness of the stress application film in the memory cell region or the like as in the application example of the present embodiment. Accordingly, it is possible to reduce the degree of degradation of the characteristics of the memory cell due to the H (hydrogen) in the silicon nitride film used as the stress application film. It is also possible to prevent a thickness difference in the stopper film 9 and form excellent metal silicide layers.

(Embodiment 5)

In Embodiment 4 described above, using the photoresist film PR7 as a mask, the stress application film 10 is isotropically dry-etched (see FIG. 68). However, the stress application film 10 may also be etched using a hard mask made of a silicon oxide film or the like as a mask.

FIGS. 75 to 83 are main-portion cross-sectional views showing the manufacturing process of the semiconductor device in the present embodiment. The structure of the semiconductor device in the present embodiment is the same as in the case of Embodiment 4.

Next, referring to FIGS. 75 to 83, a method of manufacturing the semiconductor device in the present embodiment will be described.

<Process of Forming MISFET (LT), MISFET (HT), and Memory Cell MC>

As has been described with reference to FIGS. 45 to 53 in Embodiment 3, the MISFET (LT) is formed in the core MIS formation region 1A, the MISFET (HT) is formed in the I/O MIS formation region 2A, and the memory cell MC is formed in the memory cell region 3A (FIG. 53).

<SMT and Silicide Process>

Figure 75:
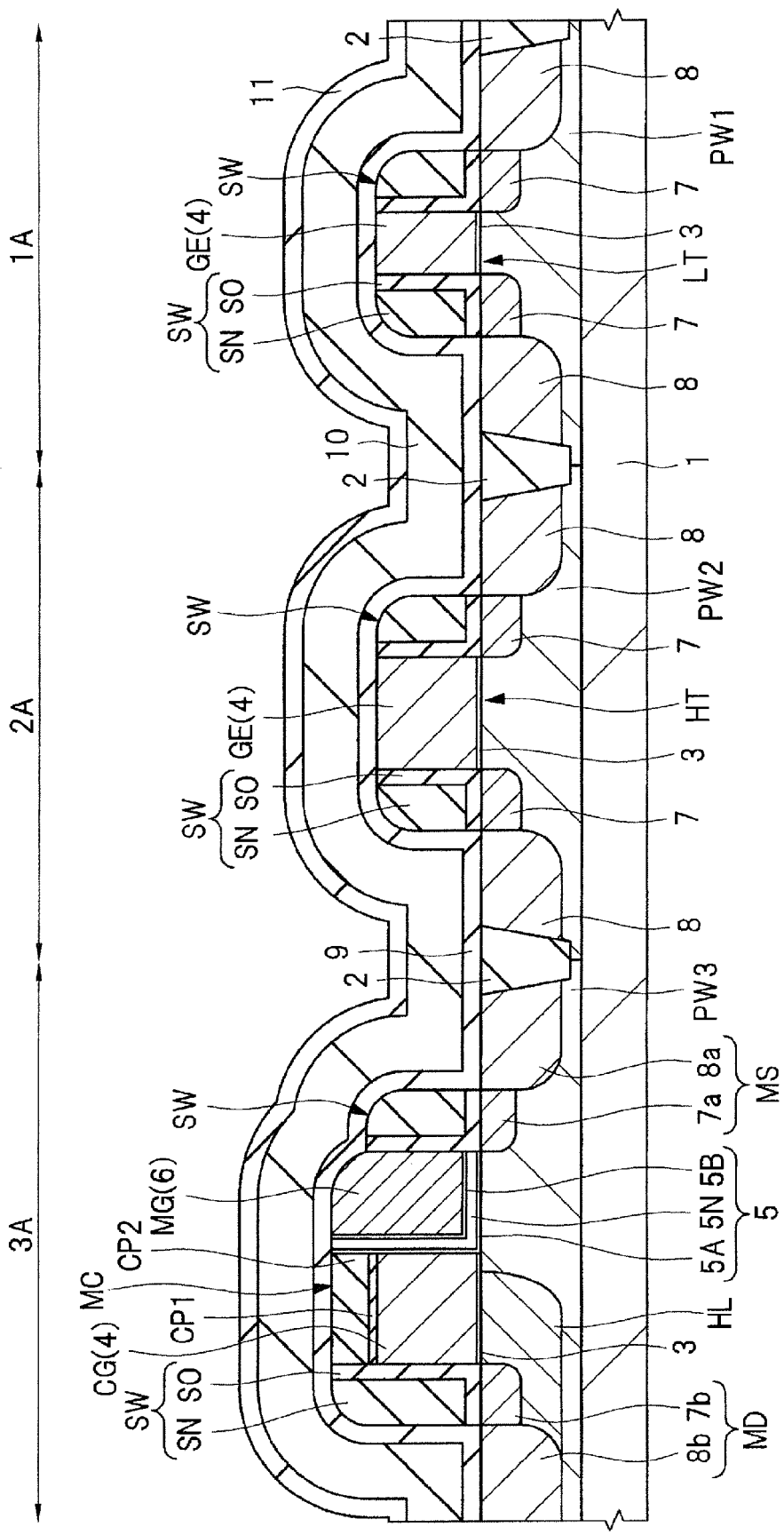
FIG. 75 is a main-portion cross-sectional view showing the manufacturing process of a semiconductor device in Embodiment 5.

Next, as shown in FIG. 75, over the semiconductor substrate 1 including the MISFET (LT), the MISFET (HT), and the memory cell MC, a silicon oxide film is formed as the stopper film 9 to a thickness of about 5 nm using a CVD method. For example, the silicon oxide film is formed by a CVD method using, e.g., TEOS (Tetraethoxysilane) and ozone ($O_3$) as raw material gases. The stopper film 9 functions as the etching stopper in the etching of the stress application film 10 described later. The stopper film 9 can prevent undesired etching of each of the patterns (such as, e.g., portions each made of the silicon film) forming the MISFET (LT), the MISFET (HT), and the memory cell MC.

Then, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Next, over the stress application film 10, as a hard mask (mask film) 11, an insulating film made of the same material as that of the stopper film 9 is formed. Here, the silicon oxide film is formed using a CVD method using e.g., TEOS (Tetraethoxysilane) and ozone ($O_3$) as raw material gases.

Figure 76:
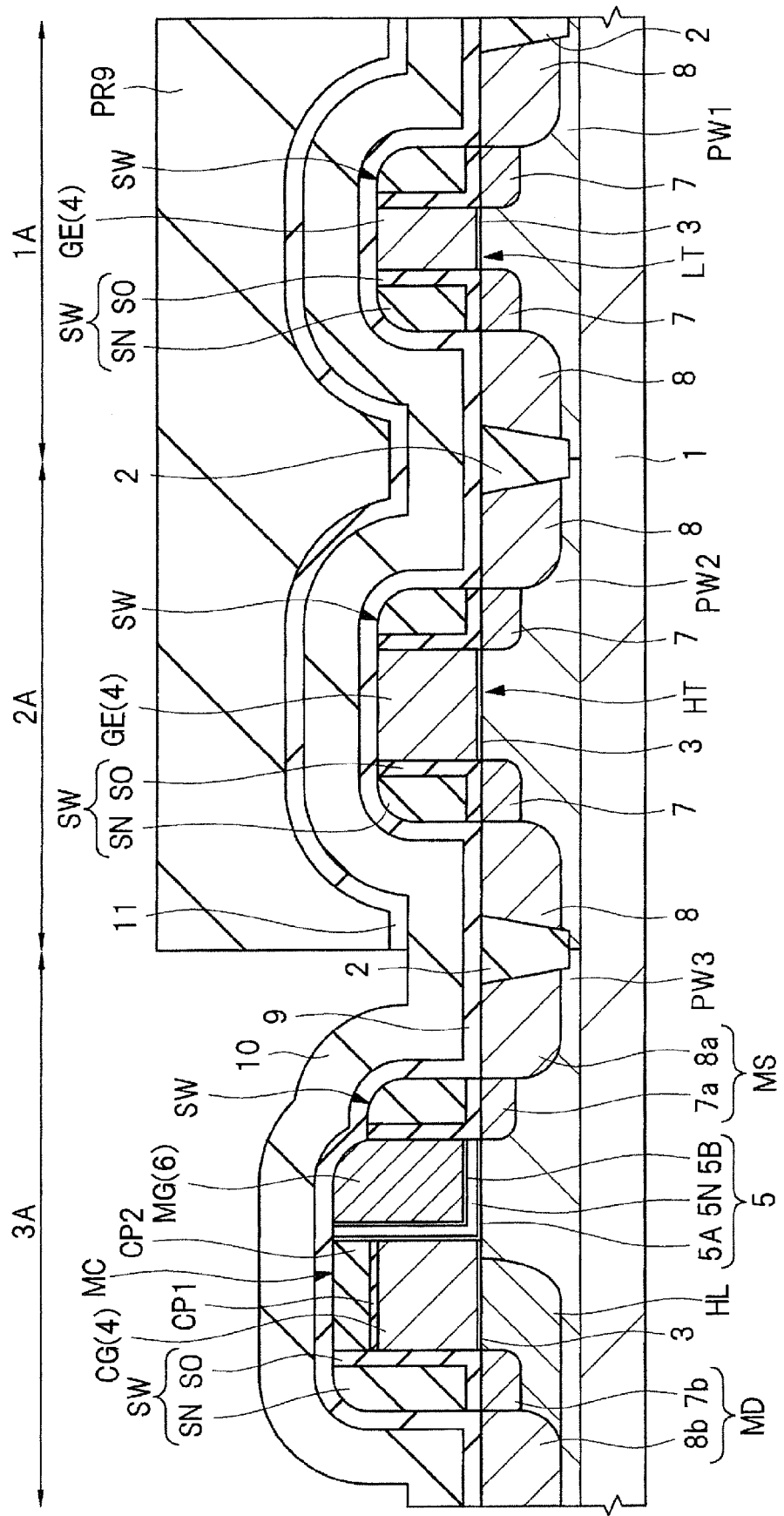
FIG. 76 is a main-portion cross-sectional view showing the manufacturing process of the semiconductor device in Embodiment 5, which is subsequent to FIG. 75.

Next, as shown in FIG. 76, over the stress application film 10 in the core MIS formation region 1A and the I/O MIS formation region 2A, a photoresist film PR9 is formed using a photolithographic method.

Figure 77:
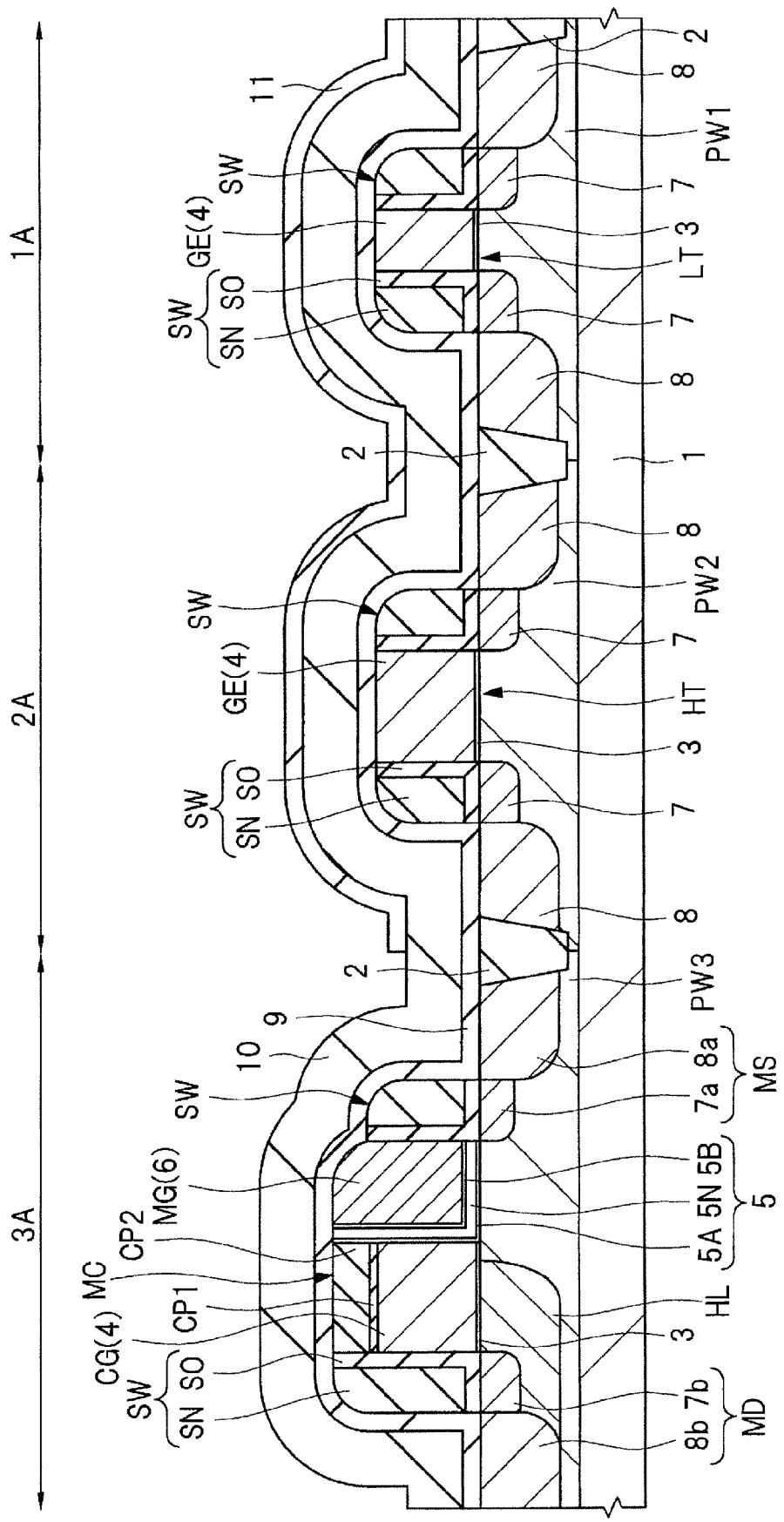
FIG. 77 is a main-portion cross-sectional view showing the manufacturing process of the semiconductor device in Embodiment 5, which is subsequent to FIG. 76.

Then, as shown in FIG. 76, using the photoresist film PR9 as a mask, the hard mask 11 is etched. Here, the silicon oxide film forming the hard mask 11 is dry-etched. For example, using $CH_4$ as an etching gas, isotropic dry etching is performed. As a result, the core MIS formation region 1A and the I/O MIS formation region 2A are covered with the hard mask 11. Here, the foregoing etching is performed under such a condition that the etching selectivity is high, i.e., the ratio of the etching speed of the hard mask 11 to the etching speed of the stress application film 10 is high. Then, as shown in FIG. 77, the photoresist film PR9 is removed by ashing treatment or the like.

Figure 78:
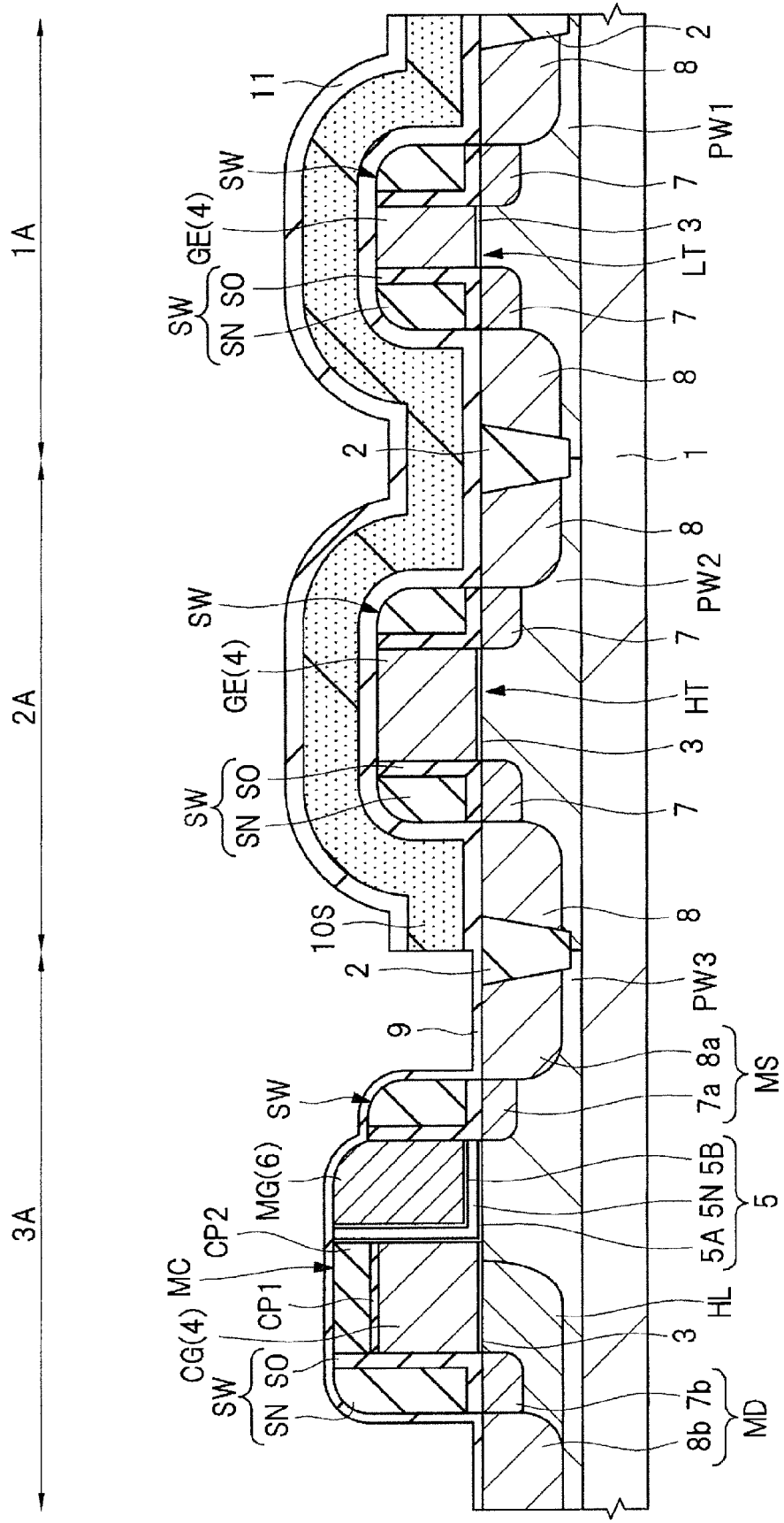
FIG. 78 is a main-portion cross-sectional view showing the manufacturing process of the semiconductor device in Embodiment 5, which is subsequent to FIG. 77.

Next, as shown in FIG. 78, using the hard mask 11 as a mask, the stress application film 10 is etched. Here, the silicon nitride film forming the stress application film 10 is wet-etched. For example, using a phosphoric acid ($H_3PO_4$) solution as an etchant, the wet etching is performed. As a result, the core MIS formation region 1A and the I/O MIS formation region 2A are covered with the stress application film 10. On the other hand, the stopper film 9 in the memory cell region 3A is exposed.

Then, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to each of the MISFET (LT) in the core MIS formation region 1A and the MISFET (HT) in the I/O MIS formation region 2A. On the other hand, the stress application film 10 has been removed from the memory cell region 3A so that no stress is applied to the memory cell MC.

It may also be possible to activate the impurity introduced into the source region MS ($n^-$-type semiconductor region 7a and $n^+$-type semiconductor region 8a), the drain region MD ($n^-$-type semiconductor region 7b and $n^+$-type semiconductor region 8b), and the source/drain regions (7 and 8) using the heat treatment and omit the previous heat treatment (activation treatment). It may also be possible to crystallize the silicon films 4 and 6 each made of the amorphous silicon film by the heat treatment (crystallization treatment).

Figure 79:
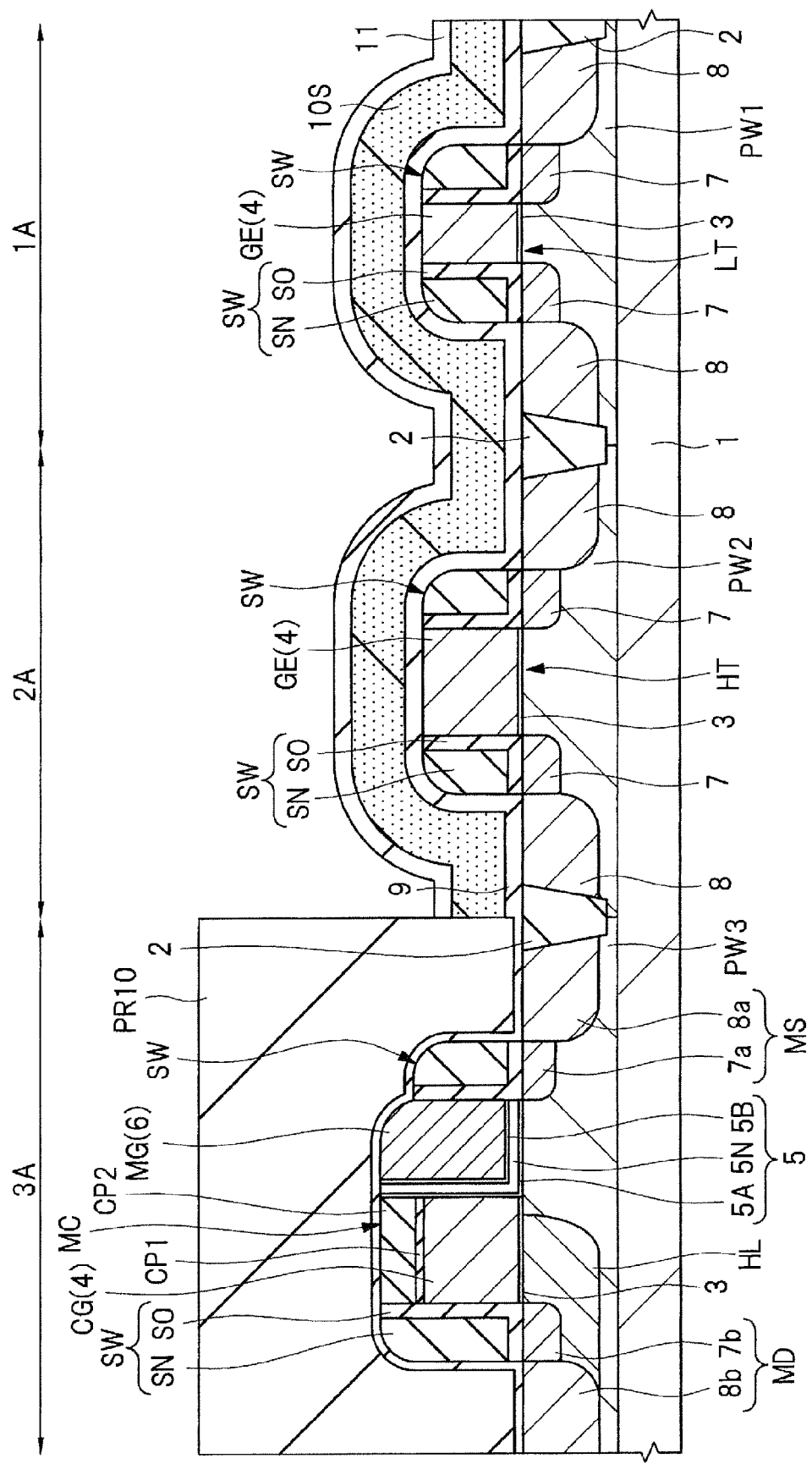
FIG. 79 is a main-portion cross-sectional view showing the manufacturing process of the semiconductor device in Embodiment 5, which is subsequent to FIG. 78.
Figure 80:
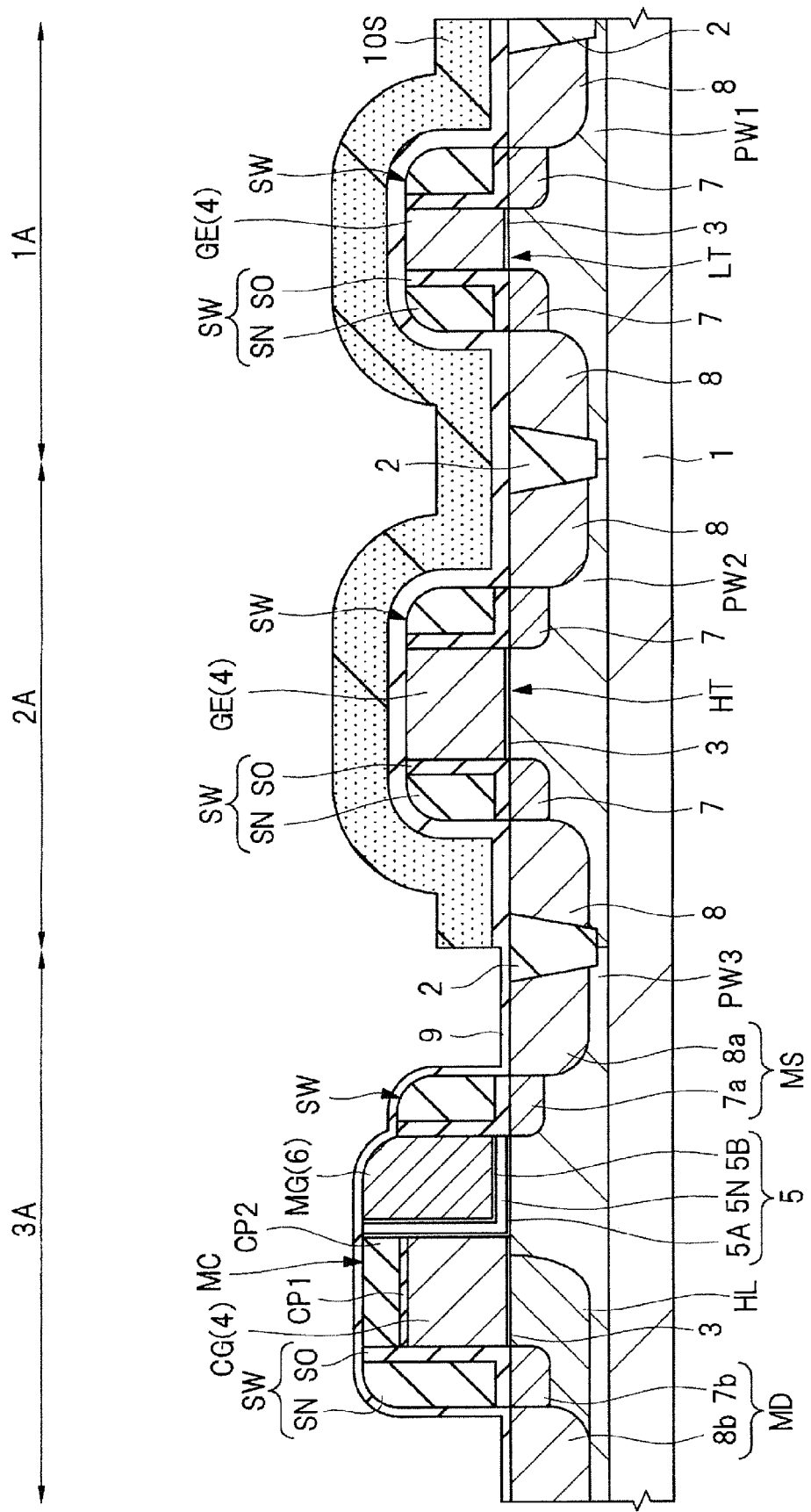
FIG. 80 is a main-portion cross-sectional view showing the manufacturing process of the semiconductor device in Embodiment 5, which is subsequent to FIG. 79.

Next, as shown in FIG. 79, over the stopper film 9 in the memory cell region 3A, a photoresist film PR10 is formed using a photolithographic method. Then, using the photoresist film PR10 as a mask, the hard mask 11 is etched. Here, the silicon oxide film forming the hard mask 11 is wet-etched. For example, using HF as an etchant, the wet etching is performed. Then, as shown in FIG. 80, the photoresist film PR10 is removed by ashing treatment or the like.

Figure 81:
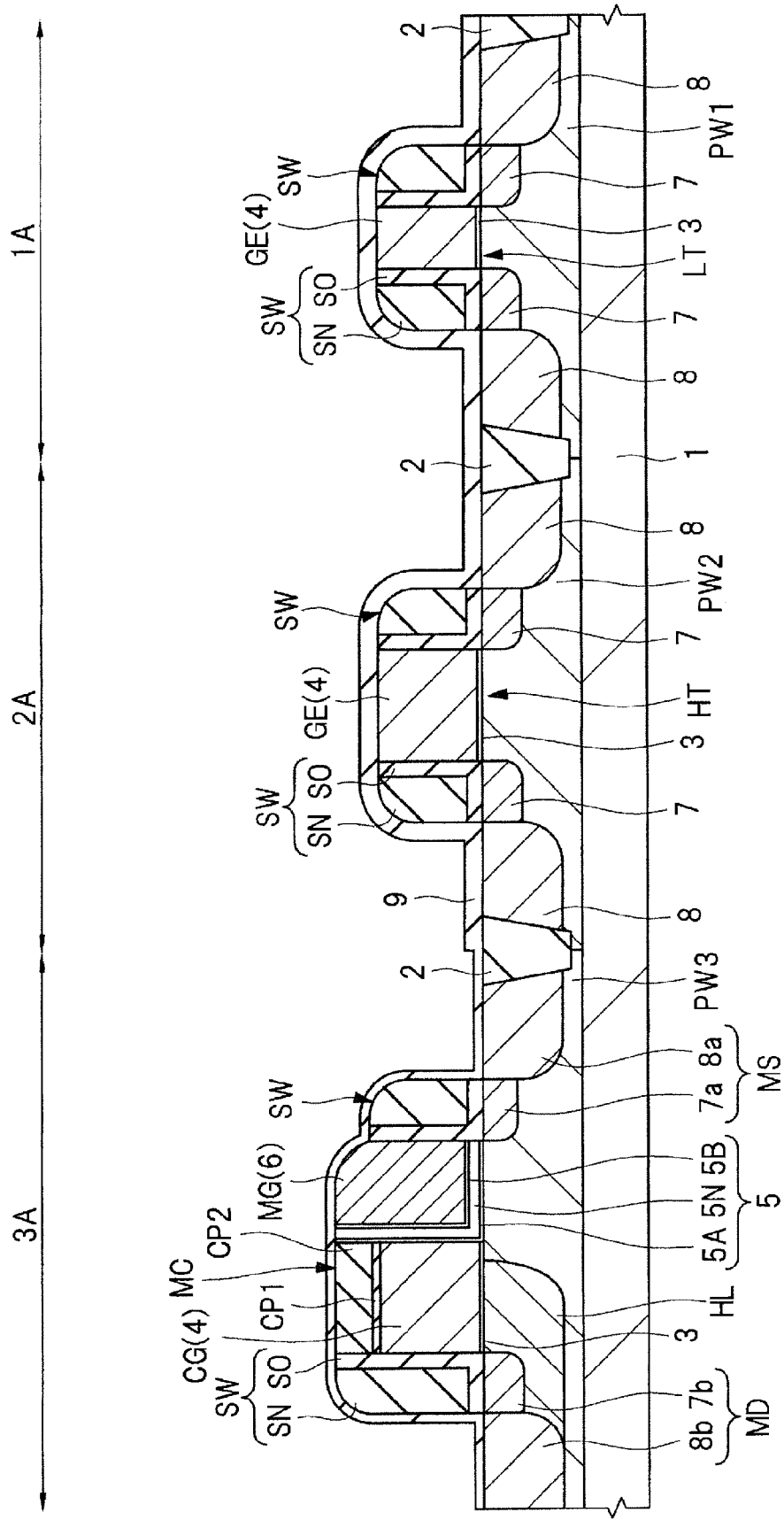
FIG. 81 is a main-portion cross-sectional view showing the manufacturing process of the semiconductor device in Embodiment 5, which is subsequent to FIG. 80.

Next, as shown in FIG. 81, the stress application film 10S in each of the core MIS formation region 1A and the I/O MIS formation region 2A is removed therefrom. Here, the silicon nitride film forming the stress application film 10S is wet-etched under such a condition that the etching selectivity is high, i.e., the ratio of the etching speed of the stress application film 10S to the etching speed of the stopper film 9 is high. For example, using a phosphoric acid ($H_3PO_4$) solution as an etchant, the wet etching is performed at 155° C. for 600 seconds. As a result, the stopper film 9 in each of the core MIS formation region 1A, the I/O MIS formation region 2A, and the memory cell region 3A is exposed.

Figure 82:
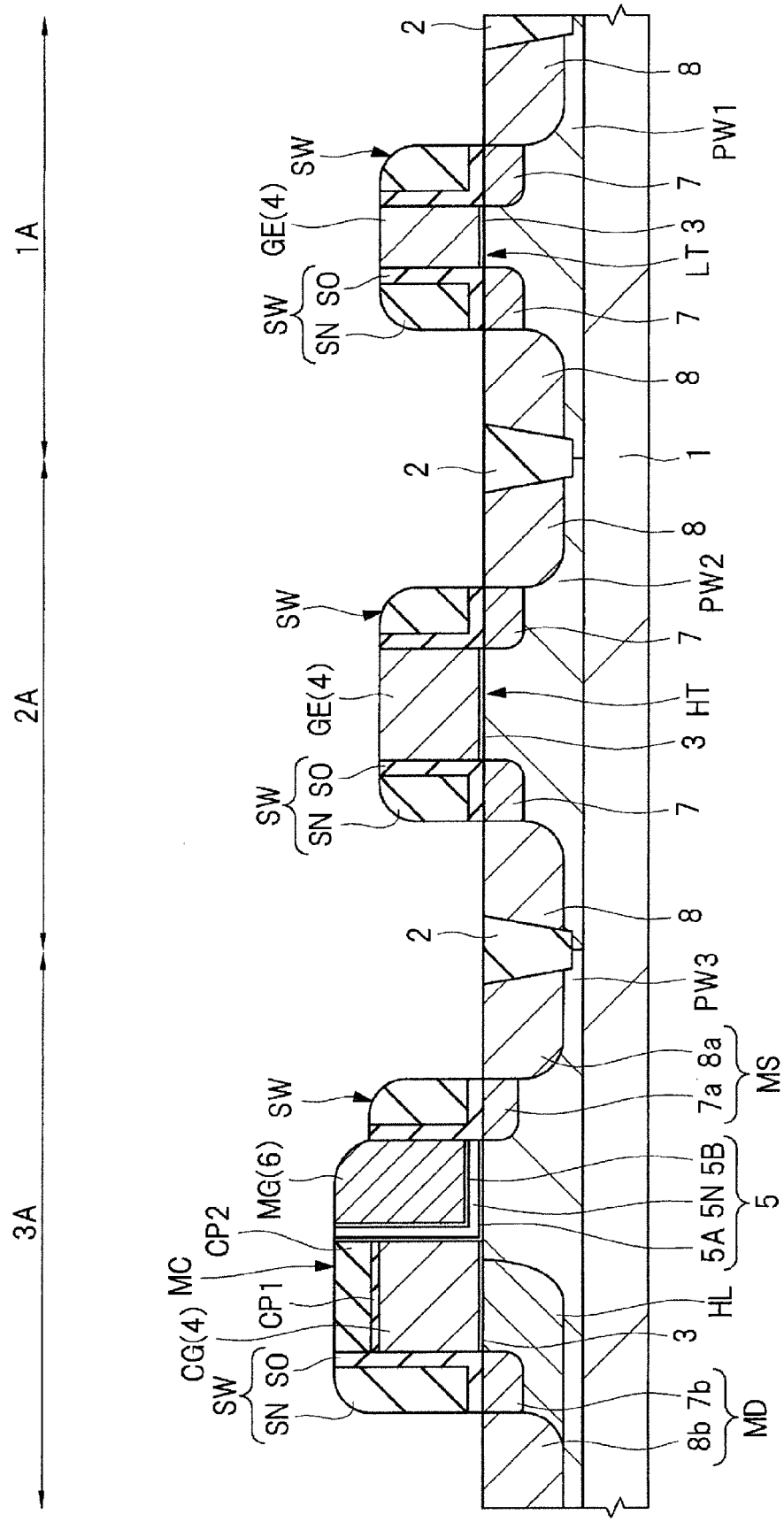
FIG. 82 is a main-portion cross-sectional view showing the manufacturing process of the semiconductor device in Embodiment 5, which is subsequent to FIG. 81.

Next, as shown in FIG. 82, the foregoing stopper film 9 is removed. Here, the silicon oxide film forming the stopper film 9 is wet-etched under such a condition that the etching selectivity is high, i.e., the ratio of the etching speed of the stopper film 9 to the etching speed of the semiconductor substrate 1 is high. For example, using a HF solution as an etchant, the wet etching is performed at 25° C. for 100 seconds.

Figure 83:
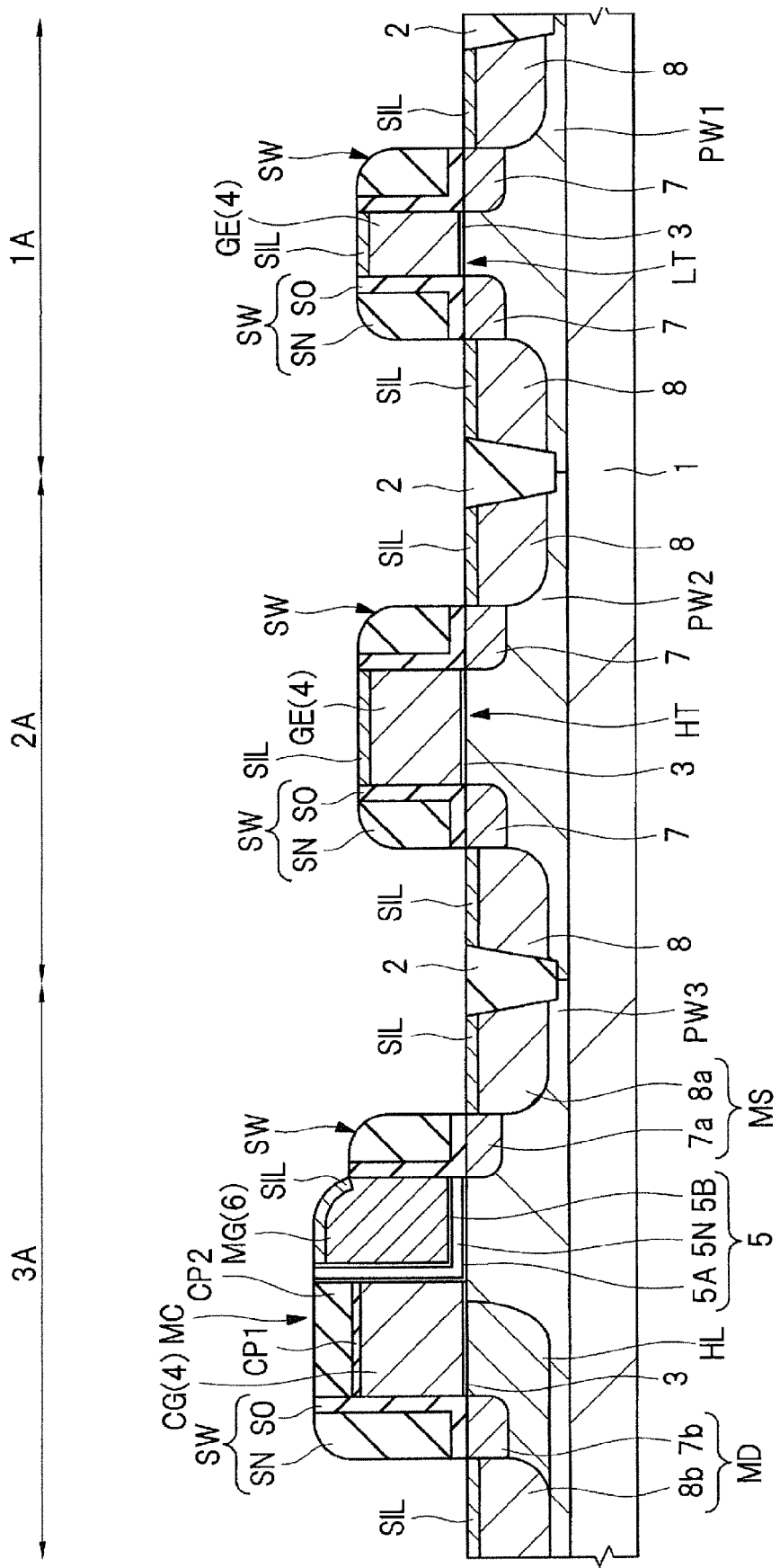
FIG. 83 is a main-portion cross-sectional view showing the manufacturing process of the semiconductor device in Embodiment 5, which is subsequent to FIG. 82.

Next, as shown in FIG. 83, using a salicide technique, in the respective upper portions of the memory gate electrodes MG, the $n^+$-type semiconductor region 8a, and the $n^+$-type semiconductor region 8b in the memory cell region 3A, the metal silicide layers (metal silicide films) SIL are formed. On the other hand, in the core MIS formation region 1A and the I/O MIS formation region 2A, in the respective upper portions of the gate electrodes GE and the n$^+$-type semiconductor regions 8, the metal silicide layers SIL are formed.

The metal silicide layers SIL can reduce diffusion resistance, contact resistance, and the like. The metal silicide layers SIL can be formed in the same manner as in the case of Embodiment 3.

Thereafter, over the entire main surface of the semiconductor substrate 1, an interlayer insulating film (not shown) is formed, though the illustration thereof is omitted. Then, in the interlayer insulating film, contact holes (not shown) which expose, e.g., the surfaces of the n$^+$-type semiconductor regions 8, 8a, and 8b are formed. By embedding a conductive film in the contact holes, plugs (not shown) are formed. Then, over the interlayer insulating film in which the plugs are embedded, wires (not shown) are formed.

Thus, according to the present embodiment, since the stress application film 10 is wet-etched using the hard mask 11 as a mask, the stress application film 10 in a corner portion is more easily removed than in the case of using dry etching. Therefore, in addition to the effect described in Embodiment 4, the effect of reducing the residues of the stress application film 10 can be obtained.

(Embodiment 6)

In Embodiments 4 and 5 described above, when the stress application film 10 in the memory cell region 3A is removed therefrom, a thickness difference may be produced between the stopper film 9 in the memory cell region 3A and the stopper film 9 in each of the core MIS formation region 1A and the I/O MIS formation region 2A (see FIGS. 68 and 78). The film thickness difference may also be improved using a film thickness adjustment film.

First Example

Figure 84:
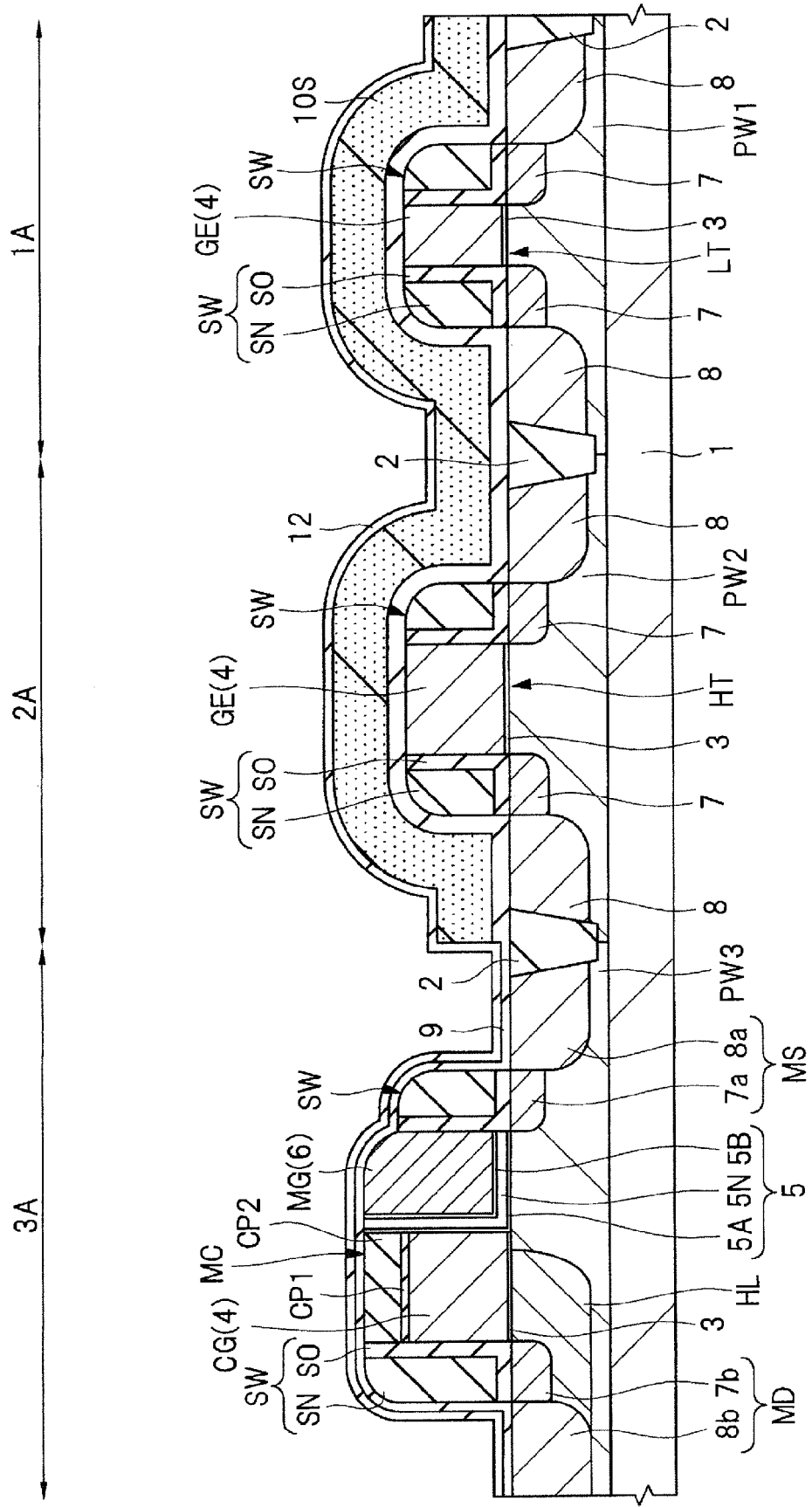
FIG. 84 is a main-portion cross-sectional view showing the manufacturing process of a semiconductor device in a first example of Embodiment 6.
Figure 85:
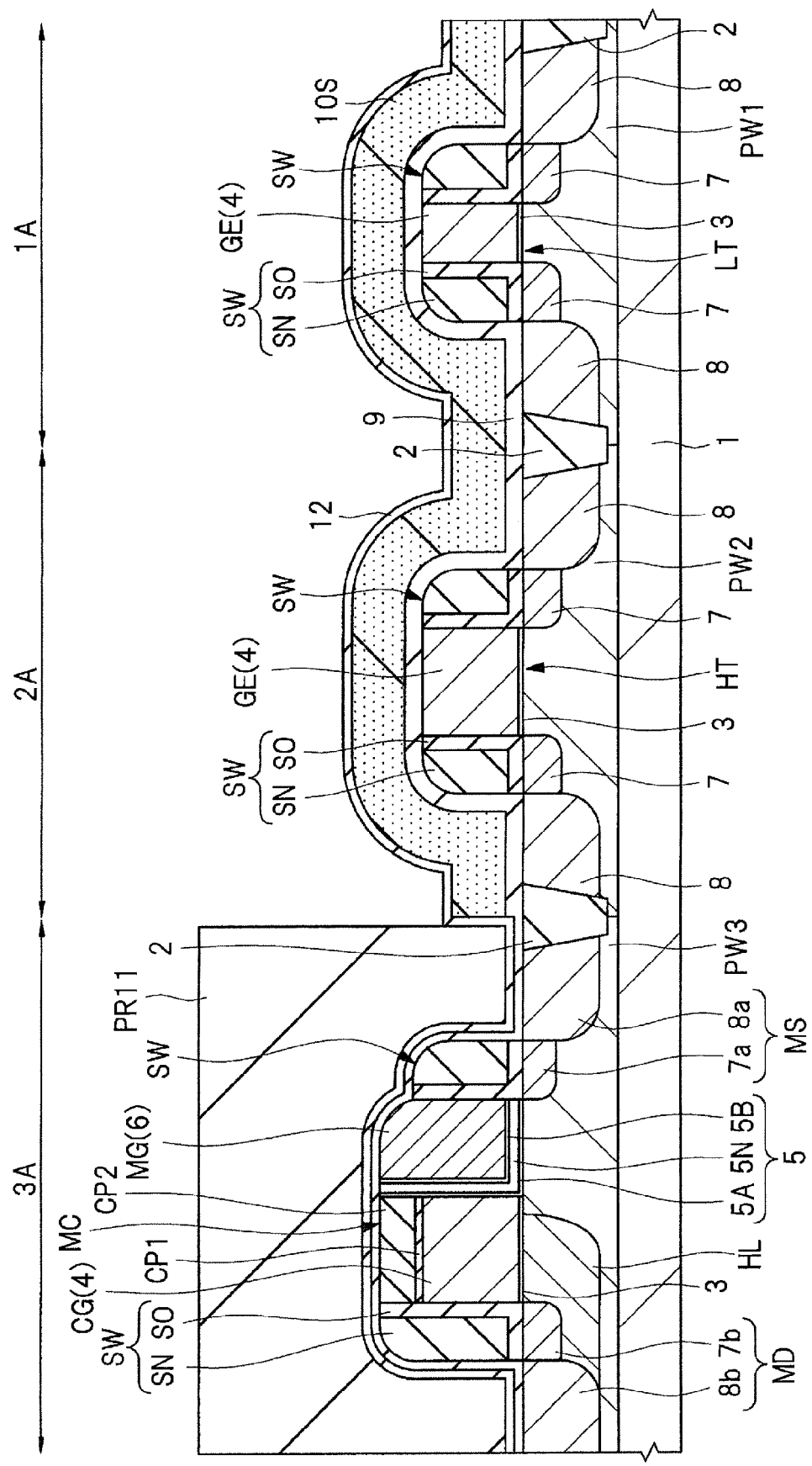
FIG. 85 is a main-portion cross-sectional view showing the manufacturing process of the semiconductor device in the first example of Embodiment 6, which is subsequent to FIG. 84.
Figure 86:
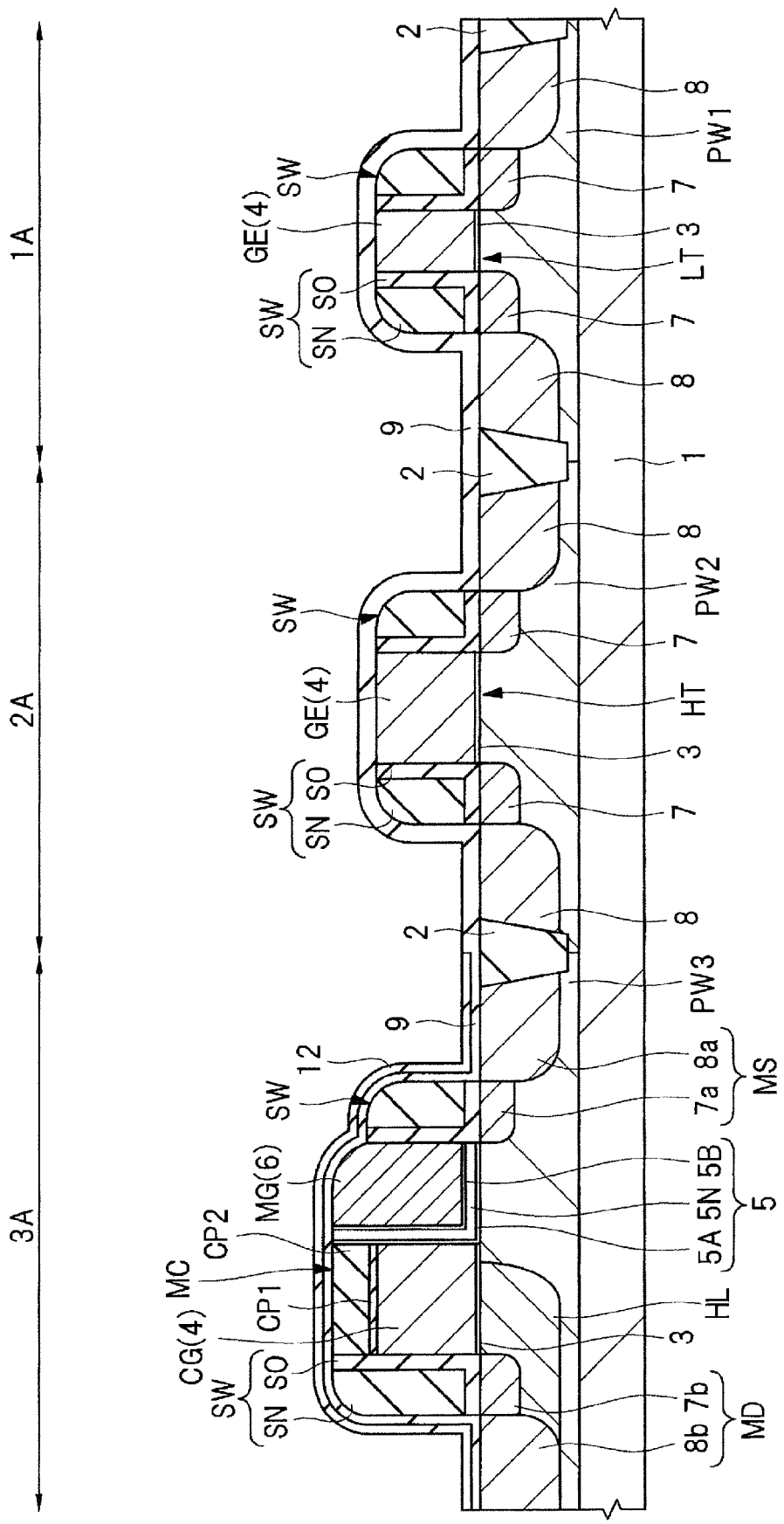
FIG. 86 is a main-portion cross-sectional view showing the manufacturing process of the semiconductor device in the first example of Embodiment 6, which is subsequent to FIG. 85.

FIGS. 84 to 86 are main-portion cross-sectional views showing the manufacturing process of a semiconductor device in a first example of the present embodiment. A structure of the semiconductor device in the present embodiment is the same as in the case of Embodiment 4. Also, the manufacturing process up to the step in FIG. 69 is the same as in Embodiment 4. However, as the stopper film 9, a silicon oxide film having a thickness of about 5 nm is formed.

In Embodiment 4 described above, as shown in FIG. 69, the thickness of the stopper film 9 in the memory cell region 3A becomes smaller than the thickness of the stopper film 9 in each of the core MIS formation region 1A and the I/O MIS formation region 2A. When the thickness of the stopper film 9 in the I/O MIS formation region 2A is T92, the thickness of the stopper film 9 in the memory cell region 3A is T93, and the thickness of the stopper film 9 in the core MIS formation region 1A is T91, a relationship given by T93<T92≈T91 is established.

Accordingly, as shown in FIG. 84, over the semiconductor substrate 1 including the MISFET (LT), the MISFET (HT), and the memory cell MC, a film made of the same material as that of the stopper film 9 is formed as a film thickness adjustment film 12. Here, a silicon oxide film (insulating film) is formed to a thickness of about 5 nm using a CVD method. The silicon oxide film is formed by a CVD method using, e.g., TEOS (Tetraethoxysilane) and ozone ($O_3$) as raw material gases.

Next, as shown in FIG. 85, over the film thickness adjustment film 12 in the memory cell region 3A, a photoresist film PR11 is formed using a photolithographic method.

Next, using the photoresist film PR11 as a mask, the film thickness adjustment film 12 is etched. Here, the silicon oxide film forming the film thickness adjustment film 12 is dry-etched. Then, the photoresist film PR11 is removed by ashing treatment or the like, and the stress application film 10S is further removed. Thus, as shown in FIG. 86, in the memory cell region 3A, a laminated film of the stopper film 9 and the film thickness adjustment film 12 is formed while, in each of the core MIS formation region 1A and the I/O MIS formation region 2A, the stopper film 9 is exposed.

Note that, here, the thickness of the film thickness adjustment film 12 is adjusted to be about 5 nm, but the thickness of the film thickness adjustment film 12 can be adjusted appropriately based on the difference between T92 and T91.

Next, in the same manner as in Embodiment 4, the film thickness adjustment film 12 and the stopper film 9 are removed. Here, according to the present embodiment, the thickness difference between the silicon oxide film over each of the MISFET (LT) and the MISFET (HT) and the silicon oxide films (film thickness adjustment film 12 and stopper film 9) over the memory cell MC has been improved by the film thickness adjustment film 12 so that the etching is easily controlled. For example, it is possible to avoid a problem due to the film thickness difference such as, e.g., the growth of the metal silicide layers SIL in portions where it is undesired or no growth of the metal silicide layers SIL due to the residues of the stopper film 9 that has been described in detail in the application example of Embodiment 3.

Thereafter, in the same manner as in Embodiment 4, using a salicide technique, the metal silicide layers (metal silicide films) SIL are formed.

Thus, according to the present embodiment, in addition to the effect described in Embodiment 4, the effect of avoiding the problem due to the film thickness difference in the stopper film 9 can be obtained.

Second Example

Figure 87:
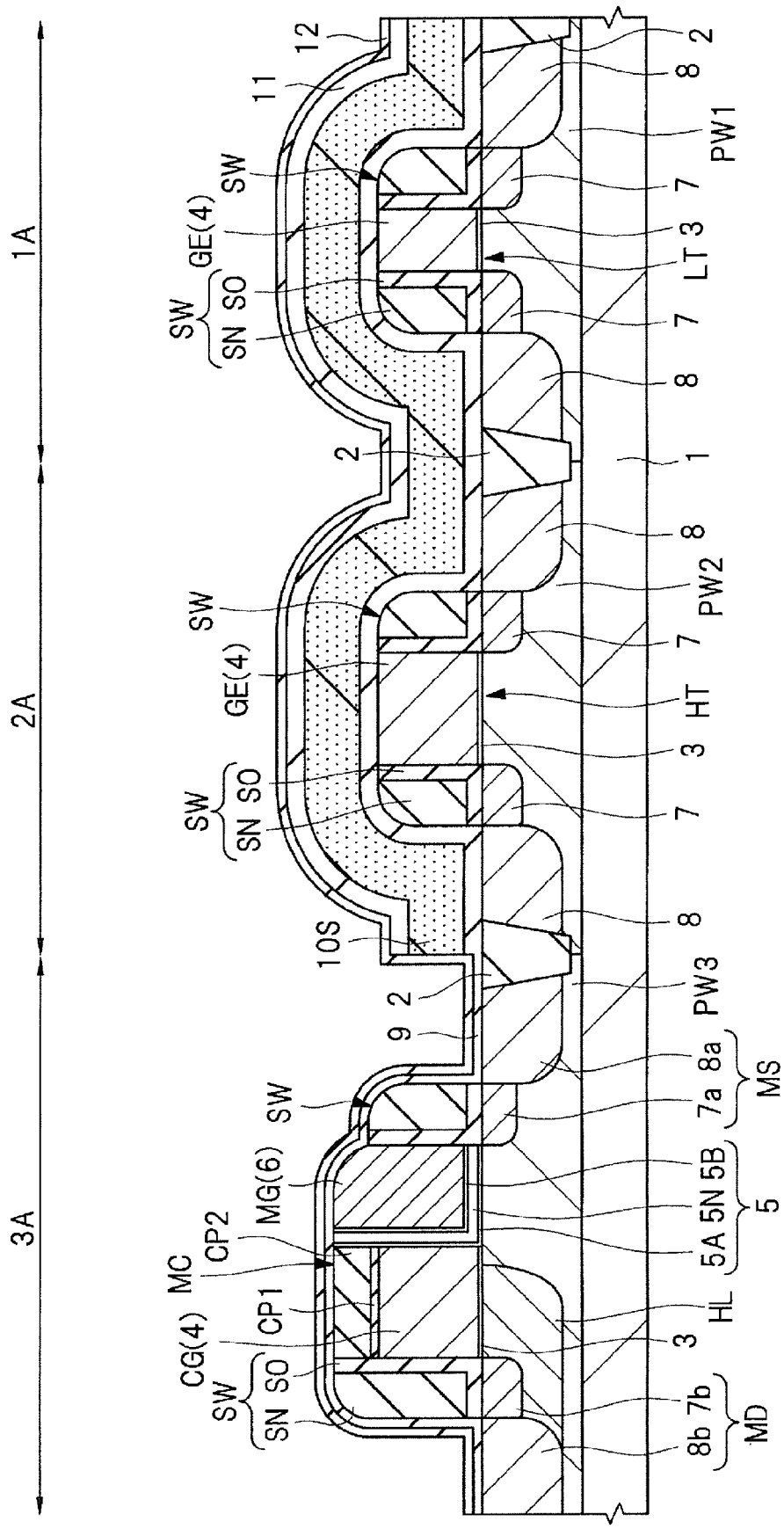
FIG. 87 is a main-portion cross-sectional view showing the manufacturing process of a semiconductor device in a second example of Embodiment 6.
Figure 88:
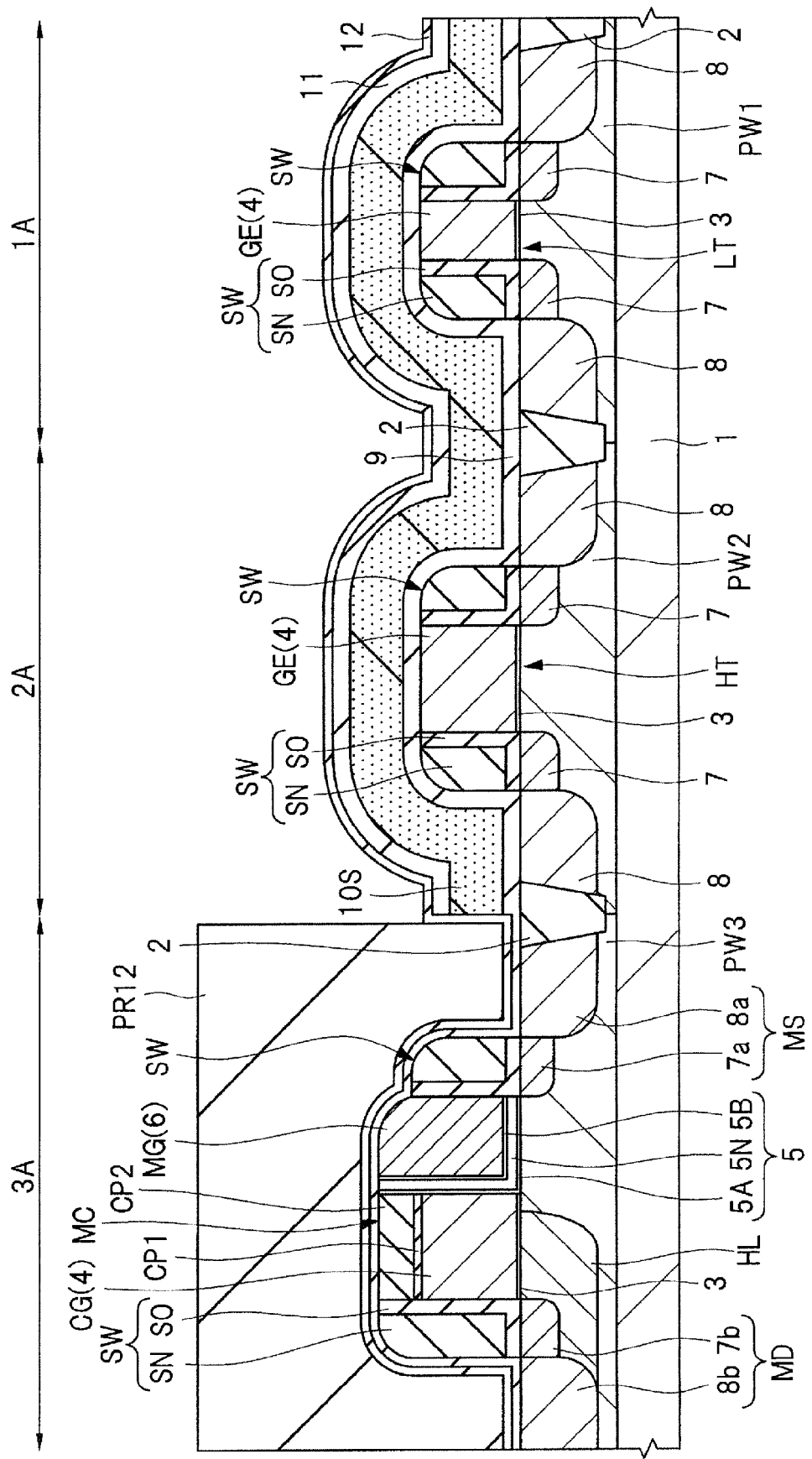
FIG. 88 is a main-portion cross-sectional view showing the manufacturing process of the semiconductor device in the second example of Embodiment 6, which is subsequent to FIG. 87.
Figure 89:
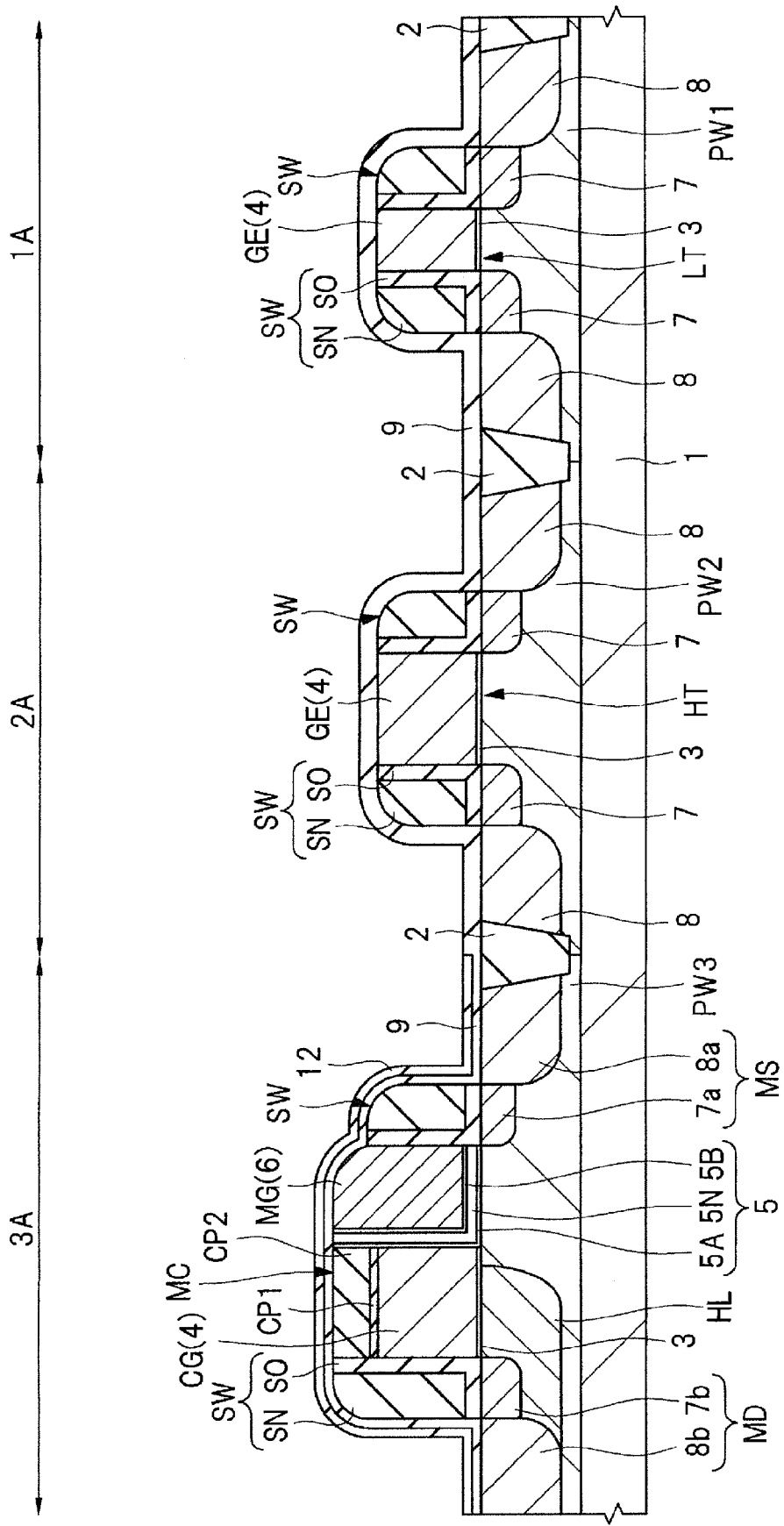
FIG. 89 is a main-portion cross-sectional view showing the manufacturing process of the semiconductor device in the second example of Embodiment 6, which is subsequent to FIG. 88.

FIGS. 87 to 89 are main-portion cross-sectional views showing the manufacturing process of a semiconductor device in a second example of the present embodiment. A structure of the semiconductor device in the present embodiment is the same as in the case of Embodiment 5. Also, the manufacturing process up to the step in FIG. 78 is the same as in Embodiment 5.

In Embodiment 5 described above, as shown in FIG. 78, the thickness of the stopper film 9 in the memory cell region 3A becomes smaller than the thickness of the stopper film 9 in each of the core MIS formation region 1A and the I/O MIS formation region 2A. When the thickness of the stopper film 9 in the I/O MIS formation region 2A is T92, the thickness of the stopper film 9 in the memory cell region 3A is T93, and the thickness of the stopper film 9 in the core MIS formation region 1A is T91, a relationship given by T93<T92≈T91 is established.

Accordingly, as shown in FIG. 87, over the semiconductor substrate 1 including the MISFET (LT), the MISFET (HT), and the memory cell MC, a film made of the same material as that of the stopper film 9 is formed as the film thickness adjustment film 12. Here, a silicon oxide film (insulating film) is formed to a thickness of about 5 nm using a CVD method. The silicon oxide film is formed by a CVD method using, e.g., TEOS (Tetraethoxysilane) and ozone ($O_3$) as raw material gases.

Next, as shown in FIG. 88, over the film thickness adjustment film 12 in the memory cell region 3A, a photoresist film PR12 is formed using a photolithographic method.

Next, using the photoresist film PR12 as a mask, the film thickness adjustment film 12 and the hard mask 11 are etched. Here, the silicon oxide films forming the film thickness adjustment film 12 and the hard mask 11 are dry-etched. Then, the photoresist film PR12 is removed by ashing treatment or the like, and the stress application film 10S is further removed. Thus, as shown in FIG. 89, in the memory cell region 3A, a laminated film of the stopper film 9 and the film thickness adjustment film 12 is formed while, in each of the core MIS formation region 1A and the I/O MIS formation region 2A, the stopper film 9 is exposed.

Note that, here, the thickness of the film thickness adjustment film 12 is adjusted to be about 5 nm, but the thickness of the film thickness adjustment film 12 can be adjusted appropriately based on the difference between T92 and T91.

Next, in the same manner as in Embodiment 5, the film thickness adjustment film 12 and the stopper film 9 are removed. Here, according to the present embodiment, the thickness difference between the silicon oxide film over each of the MISFET (LT) and the MISFET (HT) and the silicon oxide films (film thickness adjustment film 12 and stopper film 9) over the memory cell MC has been improved by the film thickness adjustment film 12 so that the etching is easily controlled. For example, it is possible to avoid the problem due to the film thickness difference such as, e.g., the growth of the metal silicide layers SIL in portions where it is undesired or no growth of the metal silicide layers SIL due to the residues of the stopper film 9 that has been described in detail in the application example of Embodiment 3.

Thereafter, in the same manner as in Embodiment 5, using a salicide technique, the metal silicide layers (metal silicide films) SIL are formed.

Thus, according to the present embodiment, in addition to the effect described in Embodiment 5, the effect of avoiding the problem due to the film thickness difference in the stopper film 9 can be obtained.

Note that the step of improving the thickness difference in the stopper film 9 using the film thickness adjustment film 12 that has been described in the present embodiment is also applicable to Embodiments 1 to 3.

For example, the film thickness adjustment film 12 may also be formed prior to the step of removing the stress application film 10S (see FIG. 11) in Embodiment 1. Alternatively, the film thickness adjustment film 12 may also be formed prior to the step of removing the stress application film 10S (see FIG. 34) in Embodiment 2. Otherwise, the film thickness adjustment film 12 may also be formed prior to the step of removing the stress application film 10S (see FIG. 58) in Embodiment 3.

(Embodiment 7)

In each of Embodiments 4 and 5 described above, when the stress application film 10 in the memory cell region 3A is removed therefrom, a thickness difference may be produced between the stopper film 9 in the memory cell region 3A and the stopper film 9 in each of the core MIS formation region 1A and the I/O MIS formation region 2A (see FIGS. 68 and 78). In consideration of the thickness difference, the film thickness of the stopper film 9 may also be adjusted in advance.

First Example

FIGS. 90 to 95 are main-portion cross-sectional views showing the manufacturing process of a semiconductor device in a first example of the present embodiment.

Figure 90:
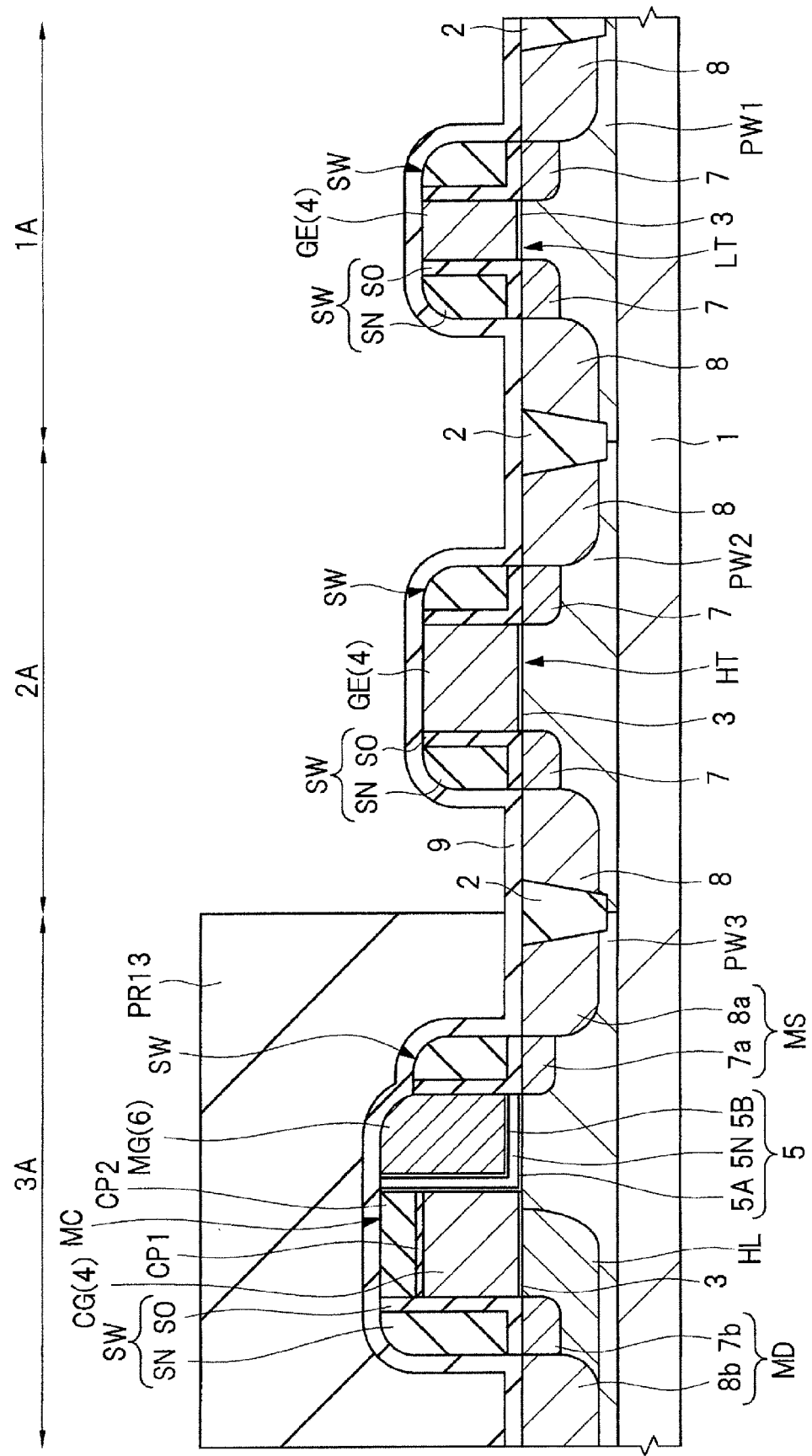
FIG. 90 is a main-portion cross-sectional view showing the manufacturing process of a semiconductor device in a first example of Embodiment 7.

First, in the same manner as in Embodiment 4, the MISFET (LT) is formed in the core MIS formation region 1A, the MISFET (HT) is formed in the I/O MIS formation region 2A, and the memory cell MC is formed in the memory cell region 3A (see FIG. 90).

Next, as shown in FIG. 90, over the semiconductor substrate 1 including the MISFET (LT), the MISFET (HT), and the memory cell MC, a silicon oxide film is formed as the stopper film 9 to a thickness of about 13 nm using a CVD method.

Next, over the stopper film 9 in the memory cell region 3A, a photoresist film PR13 is formed using a photolithographic method.

Figure 91:
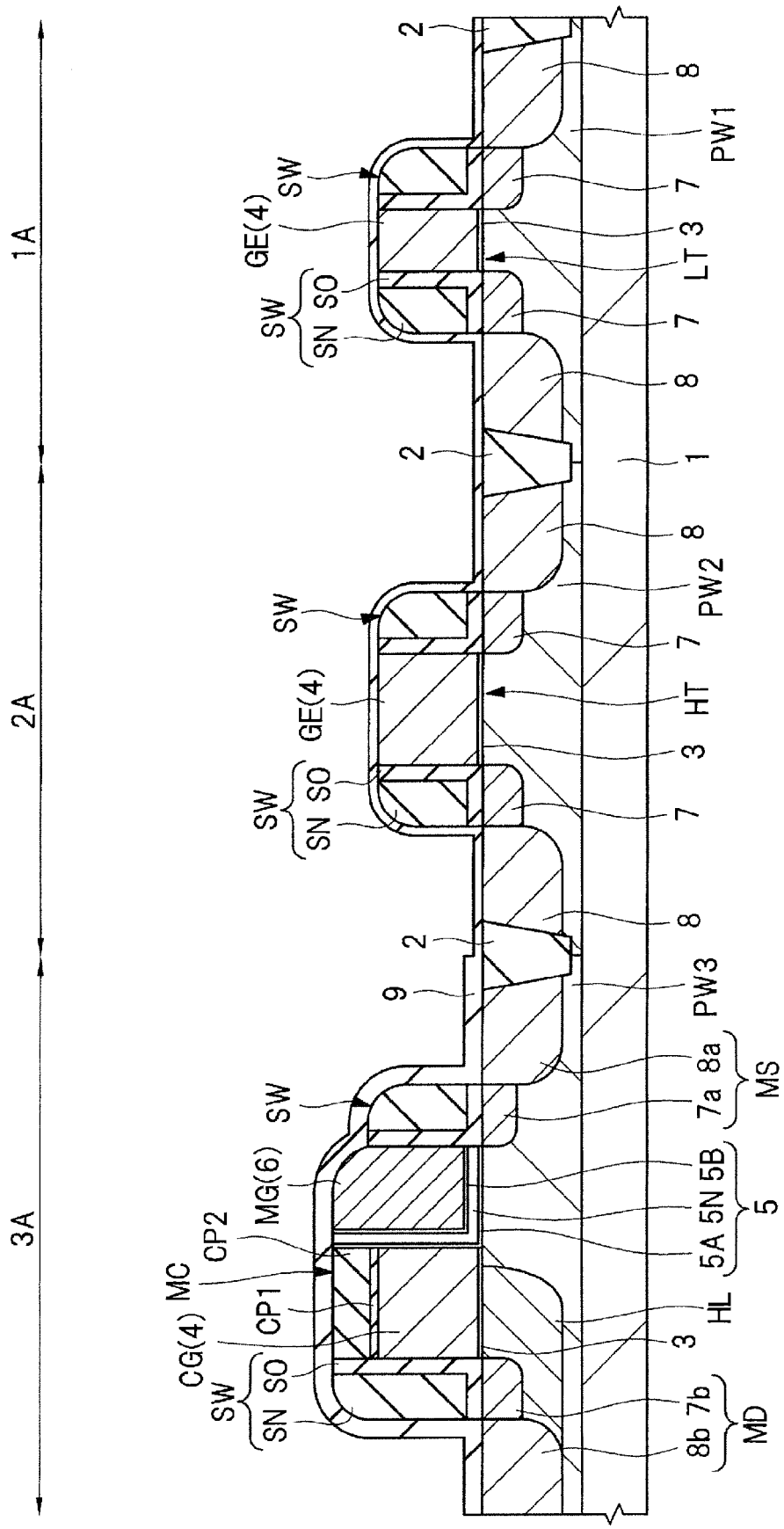
FIG. 91 is a main-portion cross-sectional view showing the manufacturing process of the semiconductor device in the first example of Embodiment 7, which is subsequent to FIG. 90.

Next, as shown in FIG. 91, using the photoresist film PR13 as a mask, the portion of the stopper film 9 corresponding to the predetermined thickness is etched from the surface thereof. Here, from the surface of the silicon oxide film forming the stopper film 9, the portion thereof corresponding to a thickness of about 5 nm is anisotropically or isotropically dry-etched. For example, using $CF_4$ as an etching gas, the dry etching is performed. Then, the photoresist film PR13 is removed by ashing treatment or the like.

Figure 92:
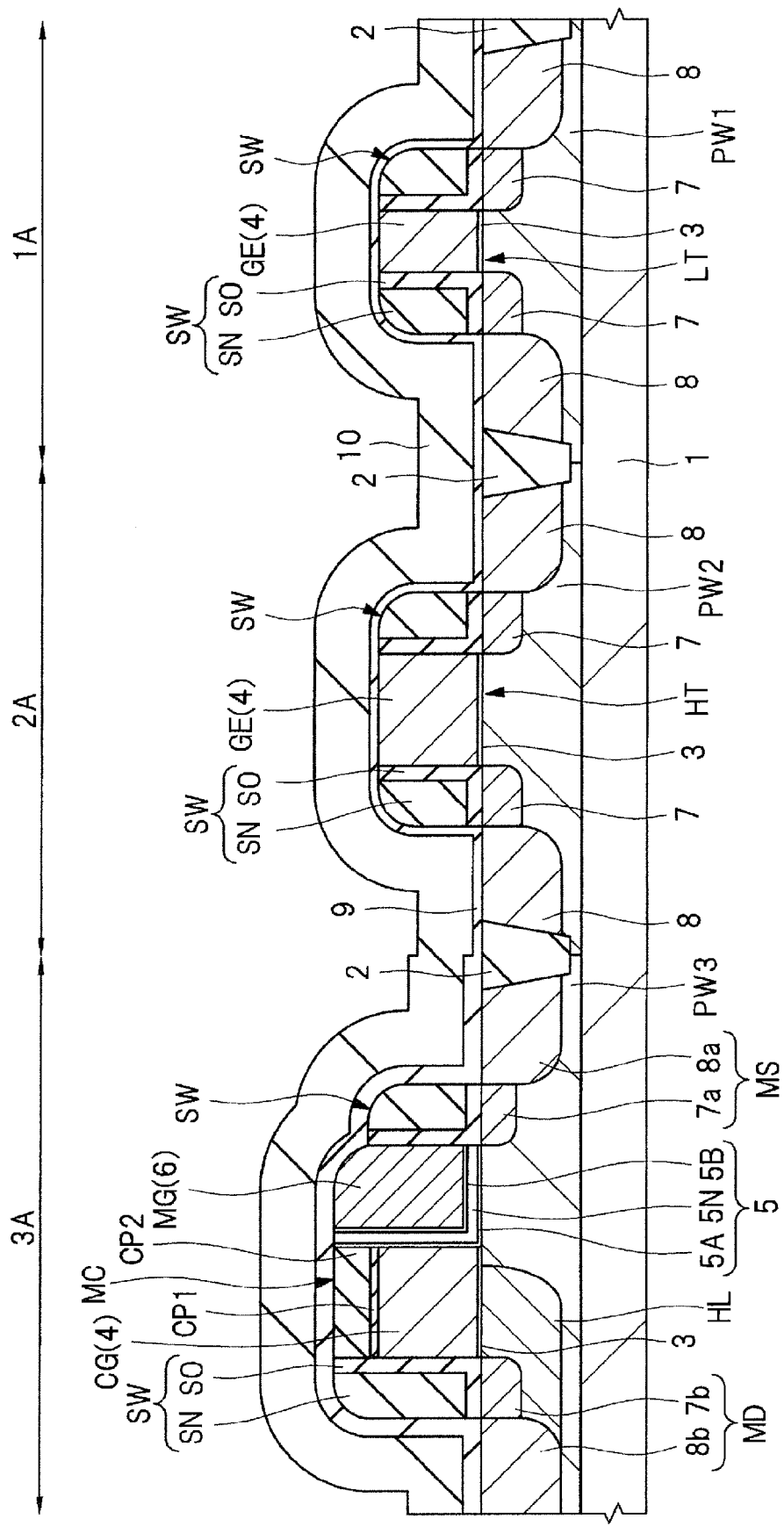
FIG. 92 is a main-portion cross-sectional view showing the manufacturing process of the semiconductor device in the first example of Embodiment 7, which is subsequent to FIG. 91.

Then, as shown in FIG. 92, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Figure 93:
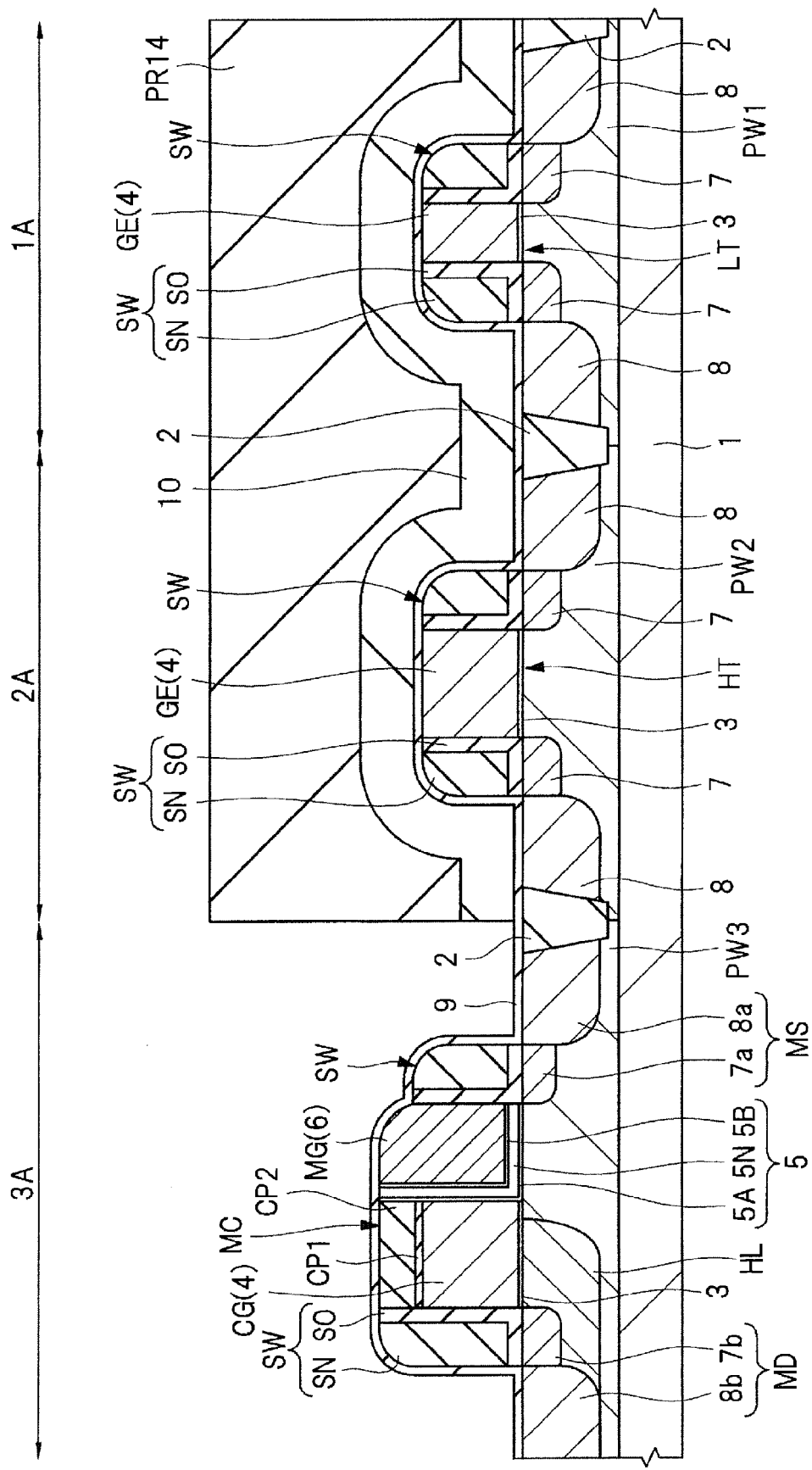
FIG. 93 is a main-portion cross-sectional view showing the manufacturing process of the semiconductor device in the first example of Embodiment 7, which is subsequent to FIG. 92.

Next, the stress application film 10 in the memory cell region 3A is removed therefrom. First, as shown in FIG. 93, over the stress application film 10 in the core MIS formation region 1A and the I/O MIS formation region 2A, a photoresist film PR14 is formed using a photolithographic method. Then, using the photoresist film PR14 as a mask, the stress application film 10 is etched. Here, the silicon nitride film forming the stress application film 10 is dry-etched. For example, using $CH_4$ as an etching gas, isotropic dry etching is performed. As a result, the core MIS formation region 1A and the I/O MIS formation region 2A are covered with the stress application film 10. In other words, the MISFET (LT) and the MISFET (HT) are covered with the stress application film 10. On the other hand, the stopper film 9 in the memory cell region 3A is exposed.

Here, the foregoing etching is performed under such a condition that the etching selectivity is high, i.e., the ratio of the etching speed of the stress application film 10 to the etching speed of the stopper film 9 is high, but the stopper film 9 is also etched slightly (by a thickness of, e.g., about 5 nm).

However, in the present embodiment, the portion of the stopper film 9 in each of the core MIS formation region 1A and the I/O MIS formation region 2A which corresponds to about 5 nm has been etched in advance from the surface thereof. Consequently, after the step of removing the stress application film 10 from the foregoing memory cell region 3A, the thickness difference in the stopper film 9 is improved. In other words, compared to the case of Embodiment 4 (FIG. 68), the thickness difference in the stopper film 9 has been reduced. For example, when the thickness of the stopper film 9 in the I/O MIS formation region 2A is T92, the thickness of the stopper film 9 in the memory cell region 3A is T93, and the thickness of the stopper film 9 in the core MIS formation region 1A is T 91, the relation given by T93≈T92≈T91 is established.

Figure 94:
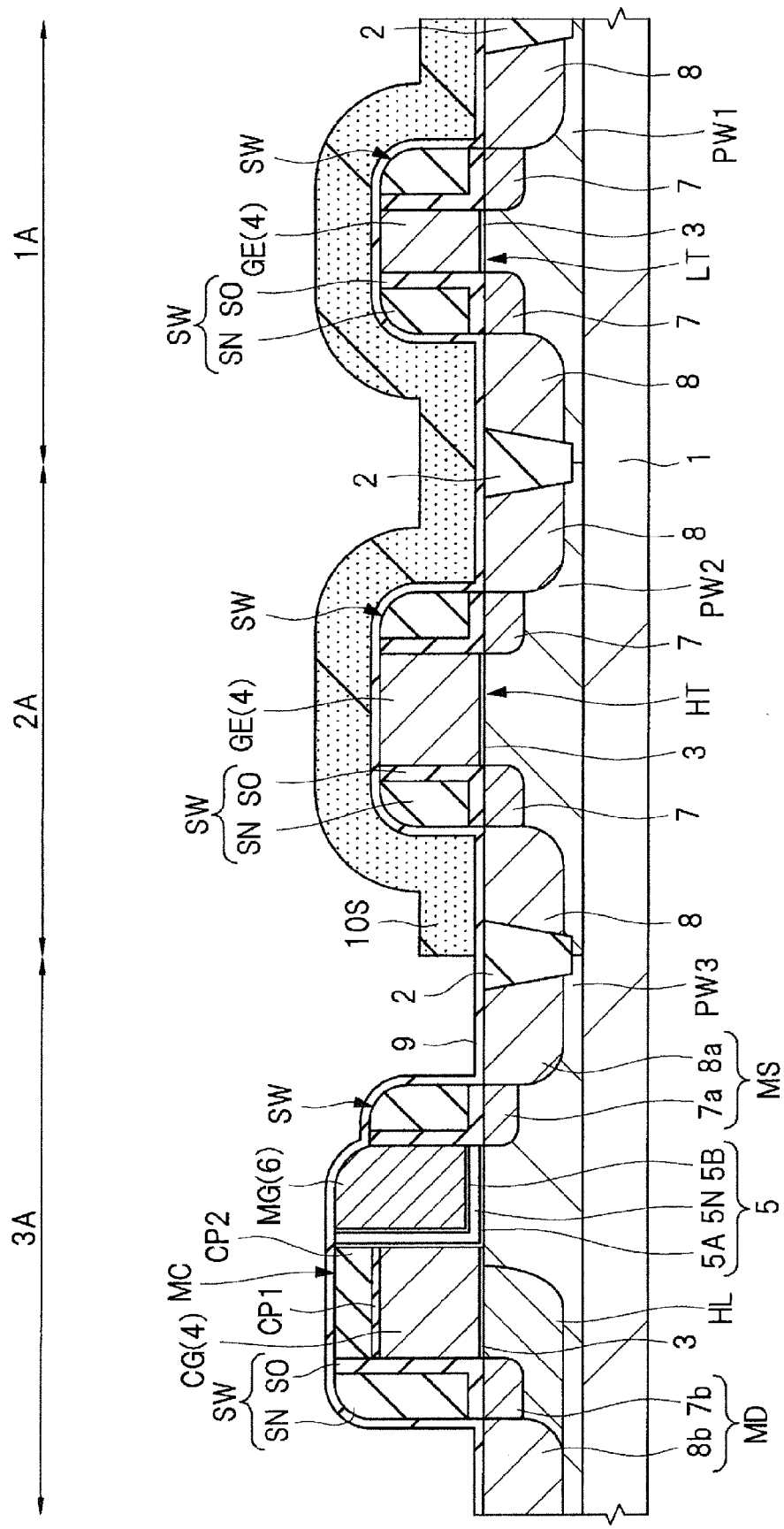
FIG. 94 is a main-portion cross-sectional view showing the manufacturing process of the semiconductor device in the first example of Embodiment 7, which is subsequent to FIG. 93.

Then, as shown in FIG. 94, after the photoresist film PR14 is removed by ashing treatment or the like, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to each of the MISFET (LT) in the core MIS formation region 1A and the MISFET (HT) in the I/O MIS formation region 12A. On the other hand, the stress application film 10 has been removed from the memory cell region 3A so that no stress is applied to the memory cell MC.

Figure 95:
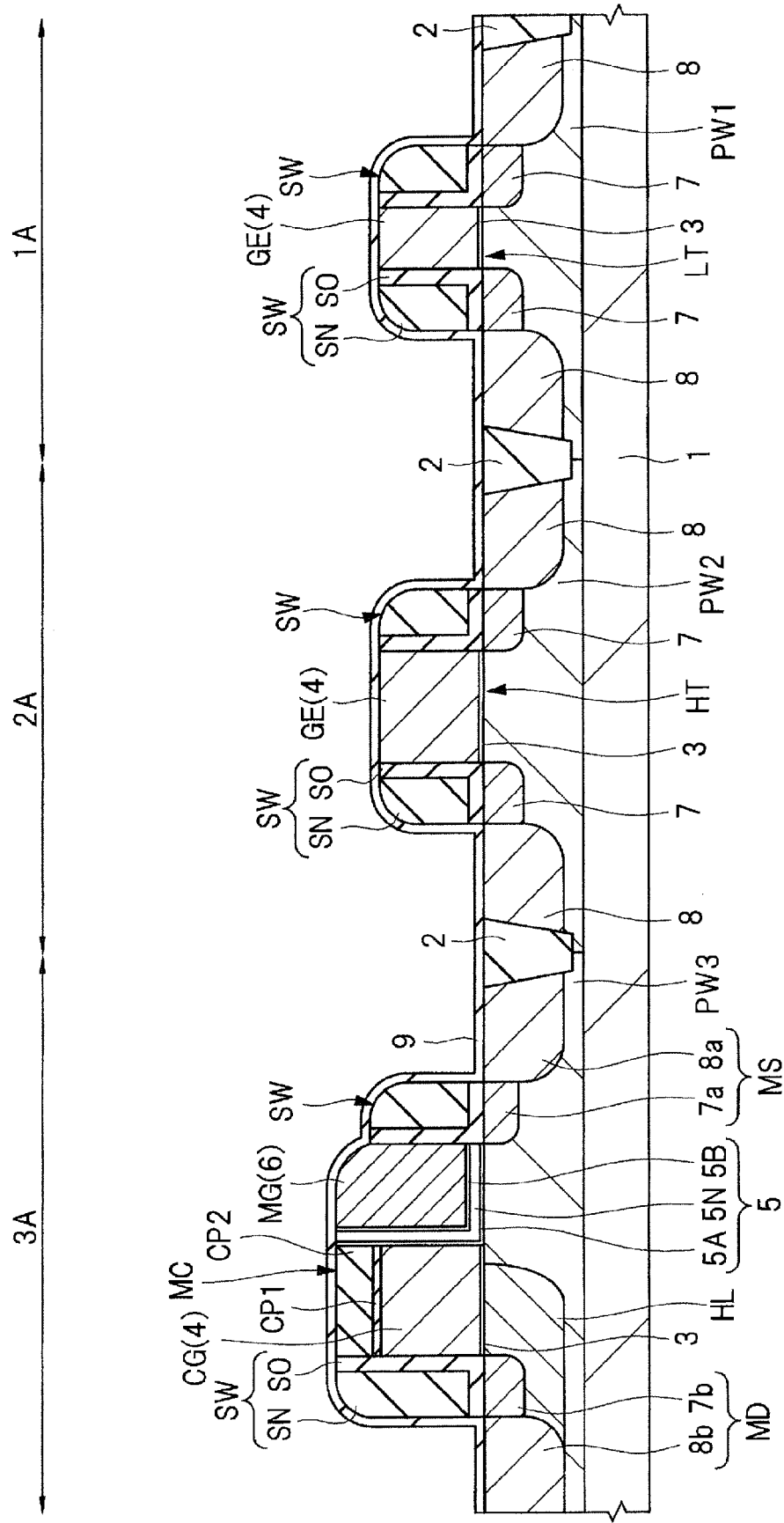
FIG. 95 is a main-portion cross-sectional view showing the manufacturing process of the semiconductor device in the first example of Embodiment 7, which is subsequent to FIG. 94.

Next, as shown FIG. 95, the stress application film 10 in the core MIS formation region 1A and the I/O MIS formation region 2A is removed therefrom. As a result, the stopper film 9 in each of the core MIS formation region 1A, the I/O MIS formation region 2A, and the memory cell region 3A is exposed.

Next, the foregoing stopper film 9 is removed (dry-etched). For example, using $CH_4$ as an etching gas, isotropic dry etching is performed. Here, according to the present embodiment, the portion of the stopper film 9 in each of the core MIS formation region 1A and the I/O MIS formation region 2A which corresponds to the predetermined thickness has been etched in advance from the surface thereof. Accordingly, a thickness difference in the stopper film 9 remaining after the step of removing the stress application film 10S is improved (FIG. 95). As a result, the etching of the stopper film 9 is controlled easily. For example, it is possible to avoid the problem due to the film thickness difference such as, e.g., the growth of the metal silicide layers SIL in portions where it is undesired or no growth of the metal silicide layers SIL due to the residues of the stopper film 9 that has been described in detail in the application example of Embodiment 3.

Then, in the same manner as in Embodiment 4, using a salicide technique, the metal silicide layers (metal silicide films) SIL are formed.

Thus, according to the present embodiment, in addition to the effect described in Embodiment 4, the effect of avoiding the problem due to the film thickness difference in the stopper film 9 can be obtained.

Second Example

FIGS. 96 to 102 are main-portion cross-sectional views showing the manufacturing process of a semiconductor device in a second example of the present embodiment.

Figure 96:
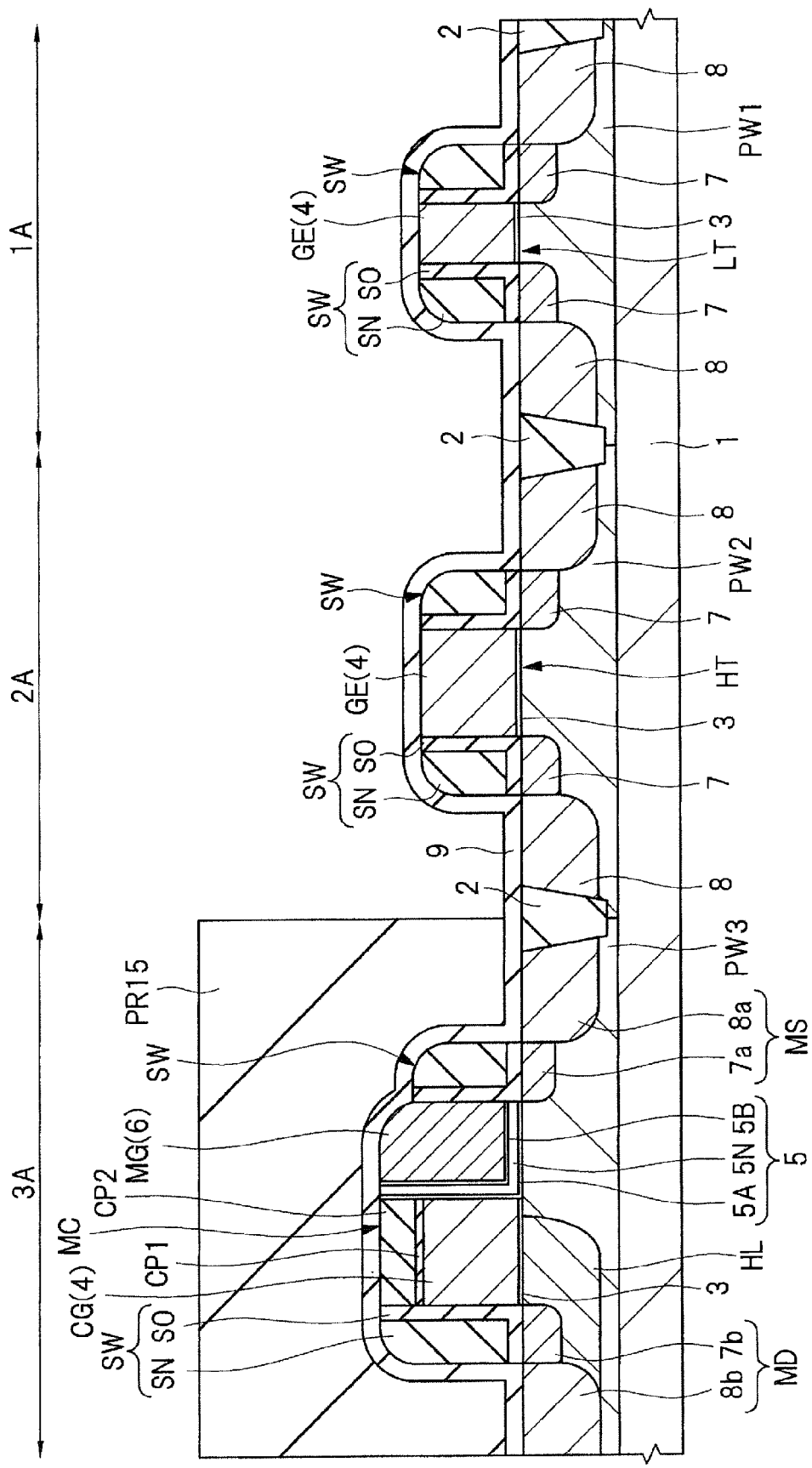
FIG. 96 is a main-portion cross-sectional view showing the manufacturing process of a semiconductor device in a second example of Embodiment 7.

First, in the same manner as in Embodiment 5, the MISFET (LT) is formed in the core MIS formation region 1A, the MISFET (HT) is formed in the I/O MIS formation region 2A, and the memory cell MC is formed in the memory cell region 3A (FIG. 96).

Next, as shown in FIG. 96, over the semiconductor substrate 1 including the MISFET (LT), the MISFET (HT), and the memory cell MC, a silicon oxide film is formed as the stopper film 9 using a CVD method in the same manner as in Embodiment 5. Here, the silicon oxide film having a thickness of about 13 nm is formed.

Next, over the stopper film 9 in the memory cell region 3A, a photoresist film PR15 is formed using a photolithographic method.

Figure 97:
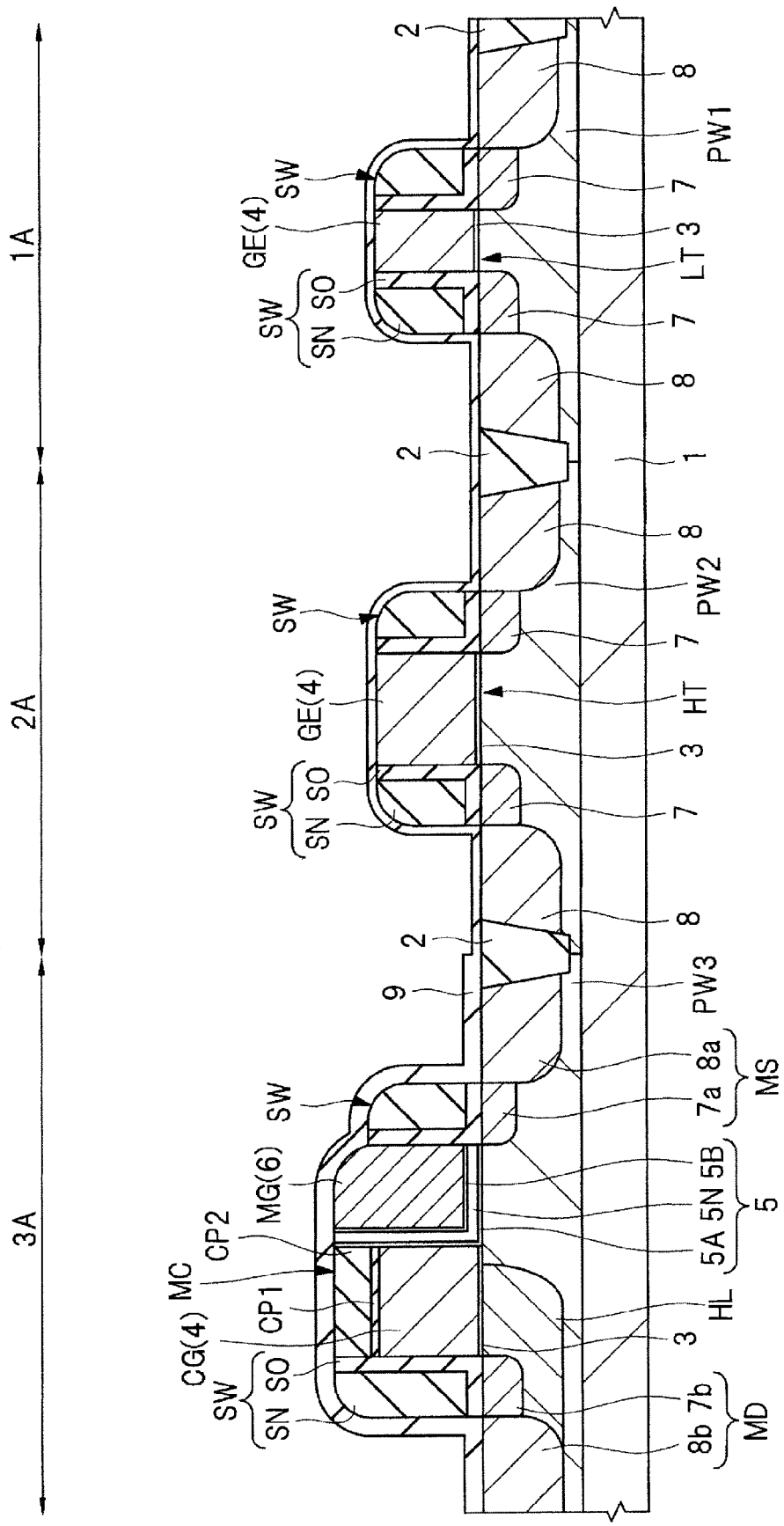
FIG. 97 is a main-portion cross-sectional view showing the manufacturing process of the semiconductor device in the second example of Embodiment 7, which is subsequent to FIG. 96.

Next, as shown in FIG. 97, using the photoresist film PR15 as a mask, the portion of the stopper film 9 corresponding to the predetermined thickness is etched from the surface thereof. Here, from the surface of the silicon oxide film forming the stopper film 9, the portion thereof corresponding to a thickness of about 5 nm is anisotropically or isotropically dry-etched. For example, using $CF_4$ as an etching gas, the dry etching is performed. Then, the photoresist film PR15 is removed by ashing treatment or the like.

Figure 98:
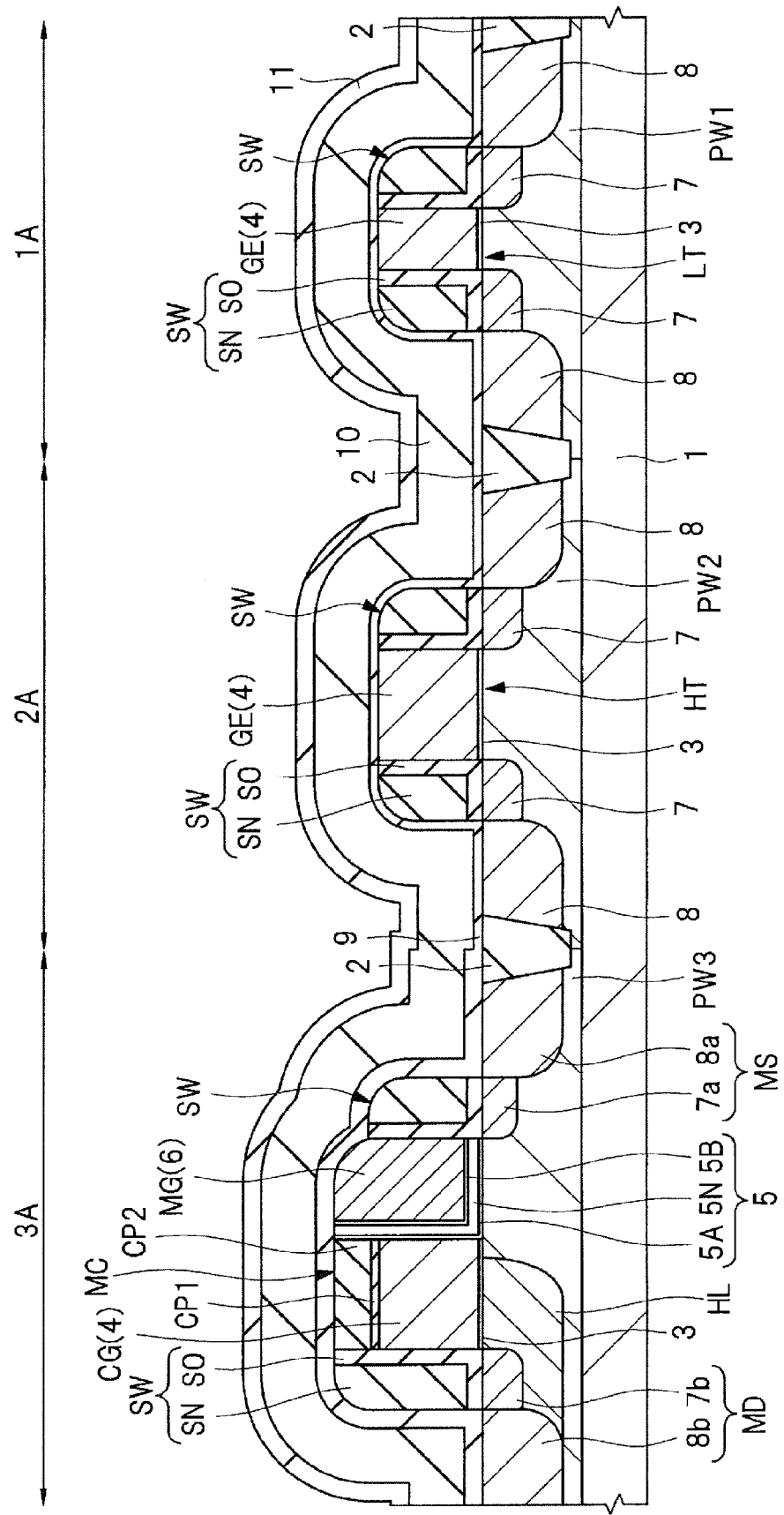
FIG. 98 is a main-portion cross-sectional view showing the manufacturing process of the semiconductor device in the second example of Embodiment 7, which is subsequent to FIG. 97.

Then, as shown in FIG. 98, over the stopper film 9, a silicon nitride film is formed as the stress application film 10 to a thickness of about 20 nm using a CVD method. For example, the silicon nitride film is formed by a CVD method using HCD (Hexachlorodisilane) and $NH_3$ (ammonia) as raw material gases.

Next, over the stopper film 9, as the hard mask 11, an insulating film made of the same material as that of the stopper film 9 is formed. Here, the silicon oxide film is formed using a CVD method using e.g., TEOS (Tetraethoxysilane) and ozone ($O_3$) as raw material gases.

Figure 99:
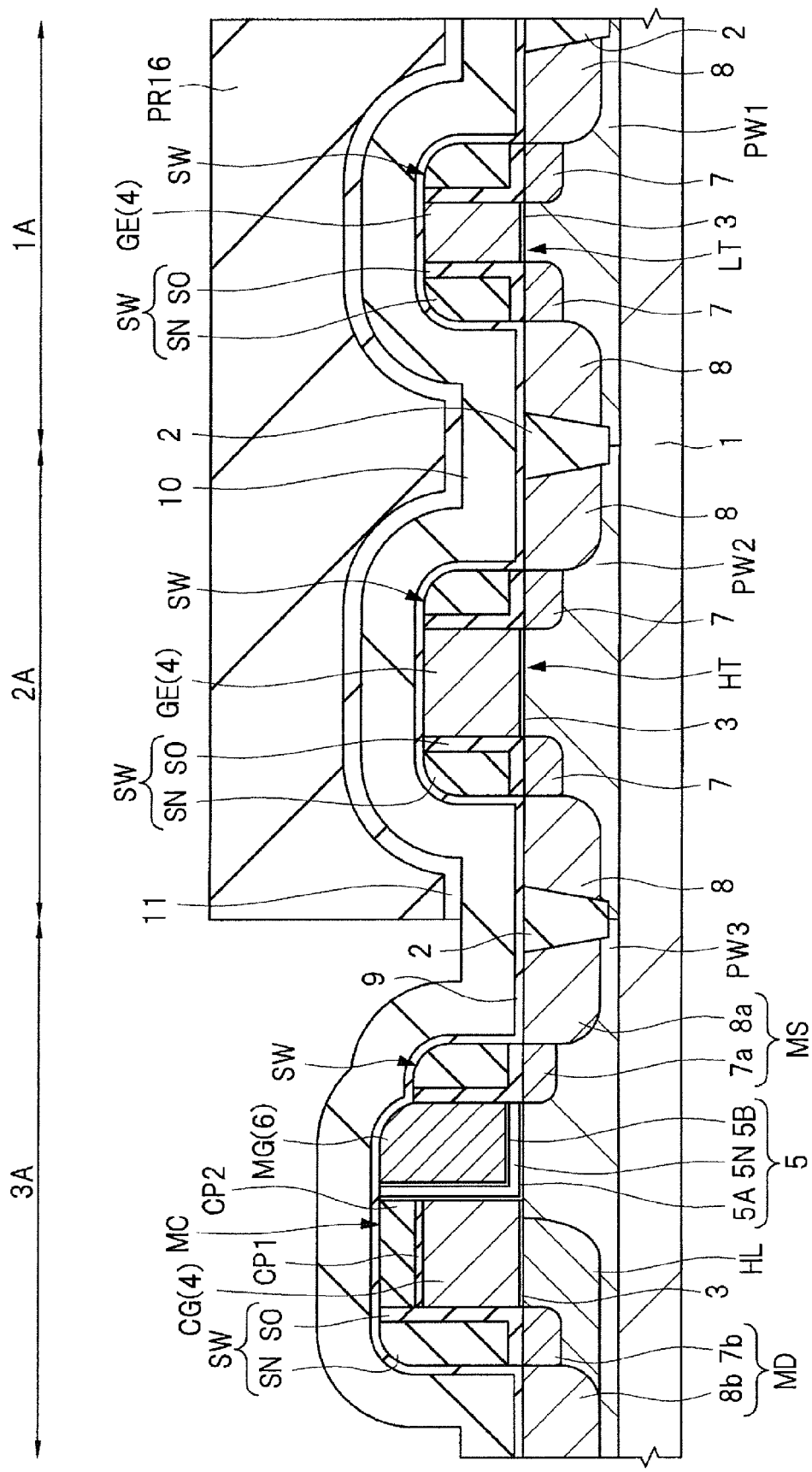
FIG. 99 is a main-portion cross-sectional view showing the manufacturing process of the semiconductor device in the second example of Embodiment 7, which is subsequent to FIG. 98.

Next, as shown in FIG. 99, over the hard mask 11 in the core MIS formation region 1A and the I/O MIS formation region 2A, a photoresist film PR16 is formed using a photolithographic method. Then, using the photoresist film PR16 as a mask, the hard mask 11 is etched in the same manner as in Embodiment 5. Then, the photoresist film PR16 is removed by ashing treatment or the like.

Figure 100:
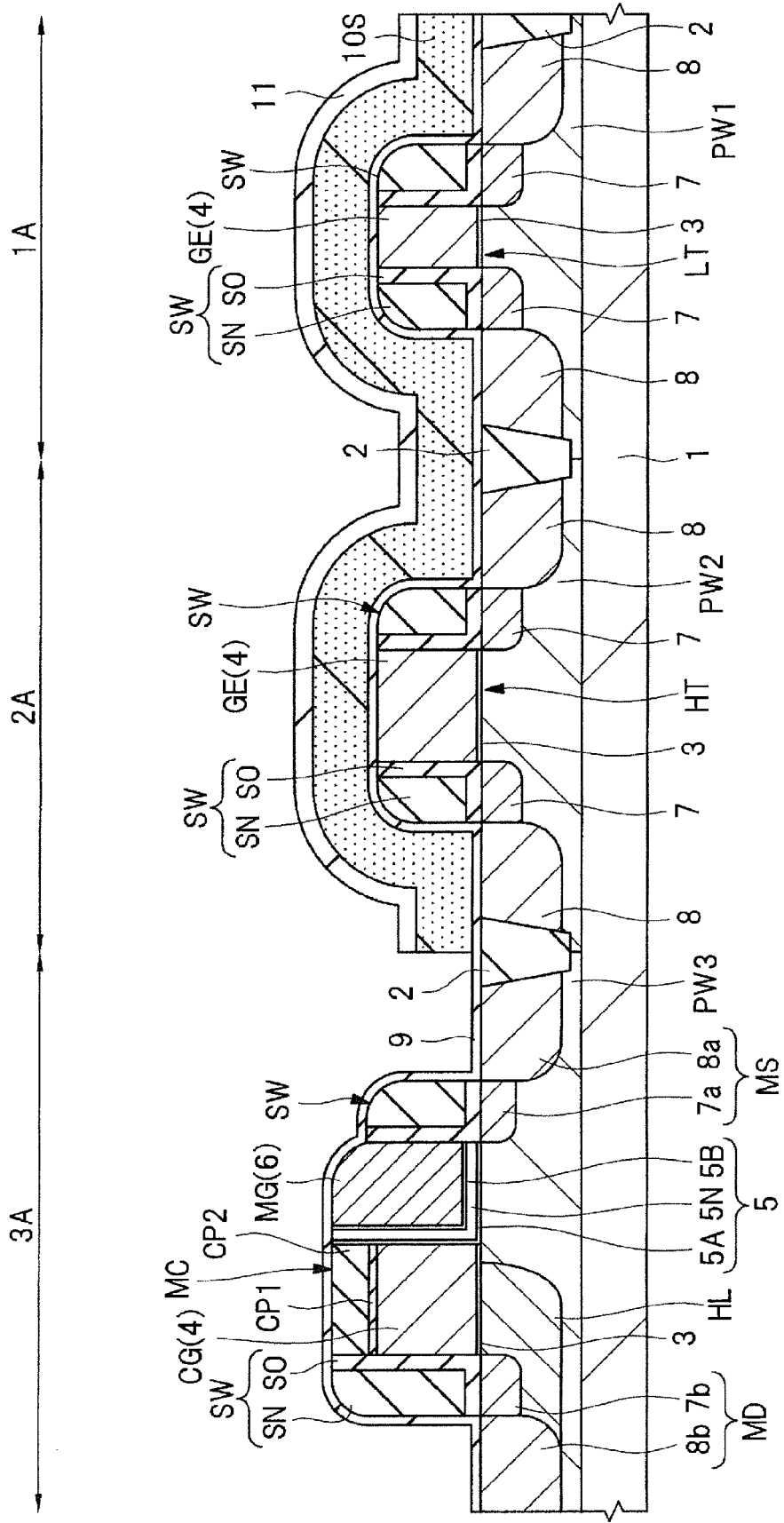
FIG. 100 is a main-portion cross-sectional view showing the manufacturing process of the semiconductor device in the second example of Embodiment 7, which is subsequent to FIG. 99.

Next, as shown in FIG. 100, using the hard mask 11 as a mask, the stress application film 10 is etched. Here, the silicon nitride film forming the stress application film 10 is wet-etched. For example, using a phosphoric acid ($H_3PO_4$) as an etchant, the wet etching is performed. As a result, the core MIS formation region 1A and the I/O MIS formation region 2A are covered with the stress application film 10. On the other hand, the stopper film 9 in the memory cell region 3A is exposed.

Then, heat treatment (referred to also as anneal) is performed. For example, as first treatment, momentary anneal (referred to also as spike RTA) is performed at about 1000° C. for a moment of not longer than one second. Then, as second treatment, laser anneal at about 1200° C. is performed. This causes a stress in the stress application film 10. The stress application film after the heat treatment, i.e., in a state where the stress is applied thereto is denoted by "10S". By the stress application film 10S, the stress is applied to each of the MISFET (LT) in the core MIS formation region 1A and the MISFET (HT) in the I/O MIS formation region 2A. On the other hand, the stress application film 10 has been removed from the memory cell region 3A so that no stress is applied to the memory cell MC.

Figure 101:
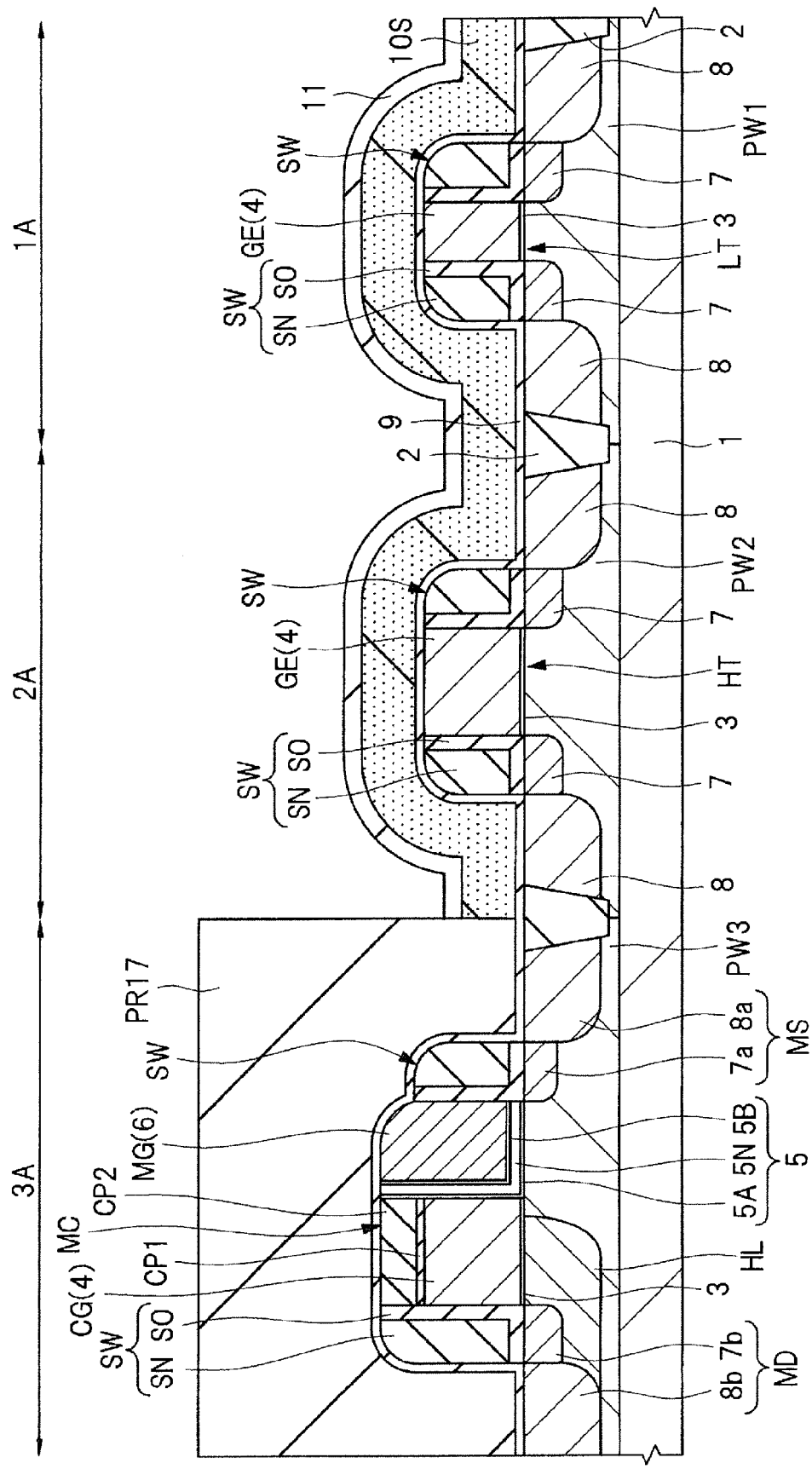
FIG. 101 is a main-portion cross-sectional view showing the manufacturing process of the semiconductor device in the second example of Embodiment 7, which is subsequent to FIG. 100.
Figure 102:
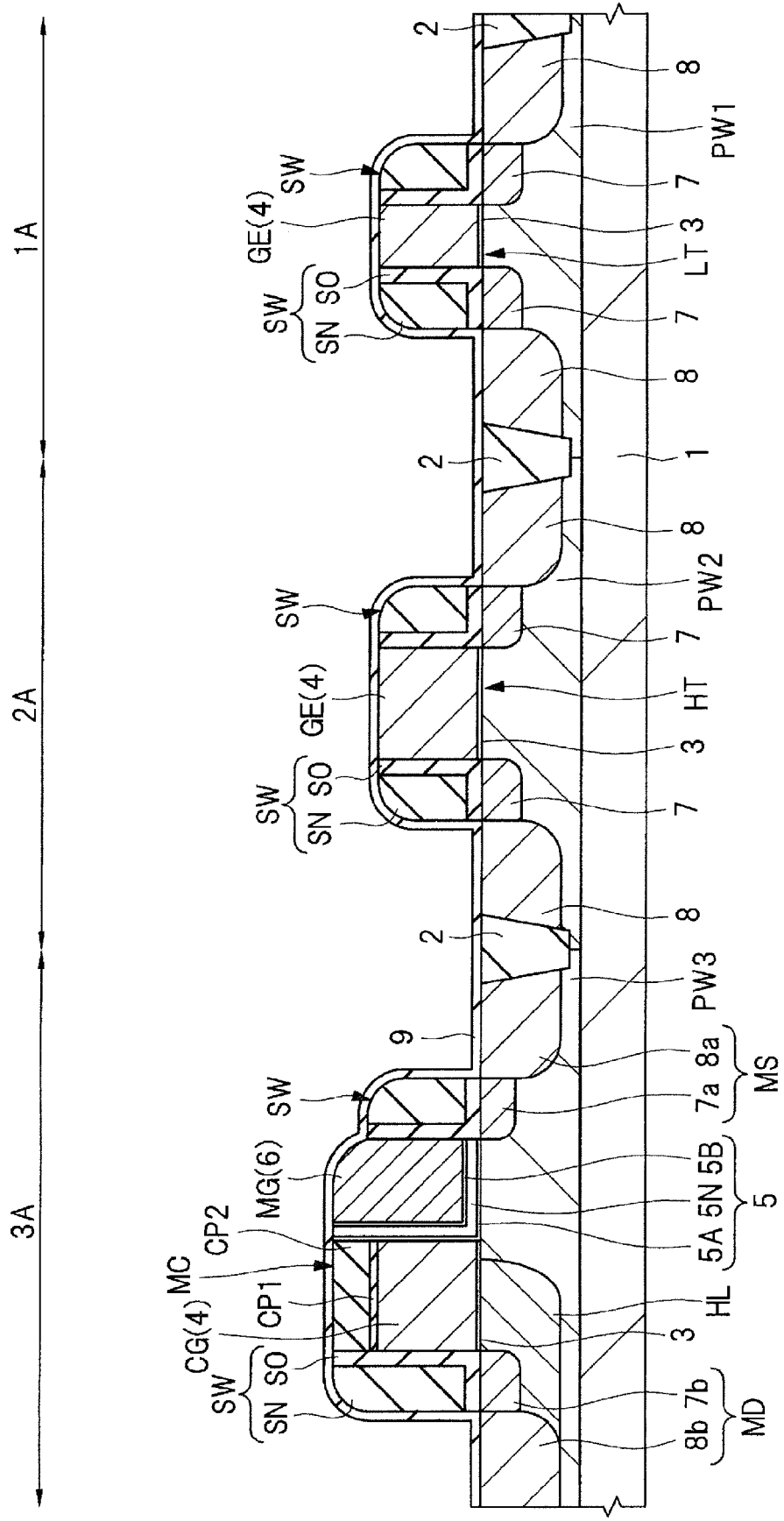
FIG. 102 is a main-portion cross-sectional view showing the manufacturing process of the semiconductor device in the second example of Embodiment 7, which is subsequent to FIG. 101.

Next, as shown in FIG. 101, over the stopper film 9 in the memory cell region 3A, a photoresist film PR17 is formed using a photolithographic method. Then, using the photoresist film PR17 as a mask, the hard mask 11 is etched. Here, the silicon oxide film forming the hard mask 11 is wet-etched. For example, using HF as an etchant, the wet etching is performed. Then, as shown in FIG. 102, the photoresist film PR17 is removed by ashing treatment or the like.

Next, the stress application film 10S in each of the core MIS formation region 1A and the I/O MIS formation region 2A is removed. As a result, the stopper film 9 in each of the core MIS formation region 1A, the I/O MIS formation region 2A, and the memory cell region 3A is exposed.

Next, the foregoing stopper film 9 is removed (dry-etched). For example, using $CH_4$ as an etching gas, isotropic dry etching is performed. Here, according to the present embodiment, the portion of the stopper film 9 in each of the core MIS formation region 1A and the I/O MIS formation region 2A which corresponds to the predetermined thickness has been etched in advance from the surface thereof. Accordingly, a thickness difference in the stopper film 9 remaining after the step of removing the stress application film 10S is improved (FIG. 102). As a result, the etching of the stopper film 9 is controlled easily. For example, it is possible to avoid the problem due to the film thickness difference such as, e.g., the growth of the metal silicide layers SIL in portions where it is undesired or no growth of the metal silicide layers SIL due to the residues of the stopper film 9 that has been described in detail in the application example of Embodiment 3.

Next, in the same manner as in Embodiment 5, using a salicide technique, the metal silicide layers (metal silicide films) SIL are formed.

Thus, according to the present embodiment, in addition to the effect described in Embodiment 5, the effect of avoiding the problem due to the film thickness difference in the stopper film 9 can be obtained.

Note that the step of improving the thickness difference in the stopper film 9 by adjusting the thickness of the stopper film 9 in advance is also applicable to Embodiments 1 to 3.

For example, the thickness of the stopper film 9 may also be adjusted in advance prior to the step of forming the stress application film 10 (see FIG. 7) in Embodiment 1. Alternatively, the thickness of the stopper film 9 may also be adjusted in advance prior to the step of forming the stress application film (see FIG. 30) in Embodiment 2. Otherwise, the thickness of the stopper film 9 may also be adjusted in advance prior to the step of forming the stress application film 10 (see FIG. 54) in Embodiment 3.

In Embodiments 1 to 7 described above, the description has been given using the n-channel MISFET as an example of each of the MISFET (LT) and the MISFET (HT). However, the study conducted by the inventors has proved that a p-channel MISFET also achieves the same effect. That is, even when the p-channel MISFET is used as each of the MISFET (LT) and the MISFET (HT), by using the SMT process in each of Embodiments 1 to 7 described above, the effect described in each of the embodiments is achieved.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

(Note 1)

A method of manufacturing a semiconductor device, including the steps of: (a) providing a semiconductor substrate having a first MISFET formed in a first region, a second MISFET formed in a second region, and a nonvolatile memory cell formed in a third region; (b) forming a first insulating film over the foregoing first MISFET, the foregoing second MISFET, and the foregoing nonvolatile memory cell; (c) forming a second insulating film over the foregoing first insulating film; (d) removing the foregoing second insulating film in the foregoing second region and the foregoing third region therefrom; and (e) after the foregoing step (d), performing heat treatment to apply a stress to the foregoing first MISFET, wherein a gate length of the foregoing first MISFET is smaller than a gate length of the foregoing second MISFET, and wherein the foregoing nonvolatile memory cell has a first gate electrode formed over the foregoing semiconductor substrate, and a first gate insulating film formed between the foregoing first gate electrode and the foregoing semiconductor substrate and having a charge storage portion in the inside thereof.

(Note 2)

A method of manufacturing a semiconductor device, including the steps of: (a) providing a semiconductor substrate having a first MISFET formed in a first region, a second MISFET formed in a second region, and a nonvolatile memory cell formed in a third region; (b) forming a first insulating film over the foregoing first MISFET, the foregoing second MISFET, and the foregoing nonvolatile memory cell; (c) forming a second insulating film over the foregoing first insulating film; (d) removing the foregoing second insulating film in the foregoing third region therefrom; and (e) after the foregoing step (d), performing heat treatment to apply a stress to the foregoing first MISFET, wherein a gate length of the foregoing first MISFET is smaller than a gate length of the foregoing second MISFET, and wherein the foregoing nonvolatile memory cell has a first gate electrode formed over the foregoing semiconductor substrate, and a first gate insulating film formed between the foregoing first gate electrode and the foregoing semiconductor substrate and having a charge storage portion in the inside thereof.

(Note 3)

A method of manufacturing a semiconductor device, including the steps of: (a) providing a semiconductor substrate having a first MISFET formed in a first region, and a second MISFET formed in a second region; (b) forming a first insulating film over the foregoing first MISFET, and the foregoing second MISFET; (c) forming a second insulating film over the foregoing first insulating film; (d) removing a part of the foregoing second insulating film in the foregoing second region from a surface thereof such that a thickness of the foregoing second insulating film in the foregoing second region is smaller than the thickness of the foregoing second insulating film in the foregoing first region; and (e) after the foregoing step (d), performing heat treatment to apply a stress to the foregoing first MISFET, wherein a gate length of the foregoing first MISFET is smaller than a gate length of the foregoing second MISFET.

(Note 4)

The method of manufacturing the semiconductor device according to Note 3 further includes the step of: (f) after the foregoing step (e), removing the foregoing second insulating film; (g) after the foregoing step (f), removing the foregoing first insulating film; and (h) after the foregoing step (g), forming a silicide film over each of source/drain regions of the foregoing first MISFET or the foregoing second MISFET formed in the foregoing semiconductor substrate formed of a silicon substrate.

(Note 5)

In the method of manufacturing the semiconductor device according to Note 3, the foregoing first insulating film is a silicon oxide film, and the foregoing second insulating film is a silicon nitride film.

(Note 6)

A method of manufacturing a semiconductor device, including the steps of: (a) providing a semiconductor substrate having a first MISFET formed in a first region, and a nonvolatile memory cell formed in a second region; (b) forming a first insulating film over the foregoing first MISFET and the foregoing nonvolatile memory cell; (c) forming a second insulating film over the foregoing first insulating film; (d) removing a part of the foregoing second insulating film in the foregoing second region from a surface thereof such that a thickness of the foregoing second insulating film in the foregoing second region is smaller than the thickness of the foregoing second insulating film in the foregoing first region; and (e) after the foregoing step (d), performing heat treatment to apply a stress to the foregoing first MISFET, wherein the foregoing nonvolatile memory cell has a first gate electrode formed over the foregoing semiconductor substrate, and a first gate insulating film formed between the foregoing first gate electrode and the foregoing semiconductor substrate and having a charge storage portion in the inside thereof.

(Note 7)

A method of manufacturing a semiconductor device, including the steps of: (a) providing a semiconductor substrate having a first MISFET formed in a first region, a second MISFET formed in a second region, and a nonvolatile memory cell formed in a third region; (b) forming a first insulating film over the foregoing first MISFET, the foregoing second MISFET, and the foregoing nonvolatile memory cell; (c) forming a second insulating film over the foregoing first insulating film; (d) removing a part of the foregoing second insulating film in the foregoing second region and the foregoing third region therefrom such that a thickness of the foregoing second insulating film in each of the foregoing second region and the foregoing third region is smaller than the thickness of the foregoing second insulating film in the foregoing first region; and (e) after the foregoing step (d), performing heat treatment to apply a stress to the foregoing first MISFET, wherein a gate length of the foregoing first MISFET is smaller than a gate length of the foregoing second MISFET, and wherein the foregoing nonvolatile memory cell has a first gate electrode formed over the foregoing semiconductor substrate, and a first gate insulating film formed between the foregoing first gate electrode and the foregoing semiconductor substrate and having a charge storage portion in the inside thereof.

(Note 8)

A method of manufacturing a semiconductor device, including the steps of: (a) providing a semiconductor substrate having a first MISFET formed in a first region, a second MISFET formed in a second region, and a nonvolatile memory cell formed in a third region; (b) forming a first insulating film over the foregoing first MISFET, the foregoing second MISFET, and the foregoing nonvolatile memory cell; (c) forming a second insulating film over the foregoing first insulating film; (d) removing a part of the foregoing second insulating film in the foregoing third region therefrom such that a thickness of the foregoing second insulating film in the foregoing third region is smaller than the thickness of the foregoing second insulating film in each of the foregoing first region and the foregoing second region; and (e) after the foregoing step (d), performing heat treatment to apply a stress to the foregoing first MISFET, wherein a gate length of the foregoing first MISFET is smaller than a gate length of the foregoing second MISFET, and wherein the foregoing nonvolatile memory cell has a first gate electrode formed over the foregoing semiconductor substrate, and a first gate insulating film formed between the foregoing first gate electrode and the foregoing semiconductor substrate and having a charge storage portion in the inside thereof.

What is claimed is:

1. A method of manufacturing a semiconductor device, comprising the steps of:
   (a) providing a semiconductor substrate having a first MISFET formed in a first region, and a second MISFET formed in a second region;
   (b) forming a first insulating film over the first MISFET and the second MISFET;
   (c) forming a second insulating film over the first insulating film;
   (d) removing the second insulating film in the second region therefrom; and
   (e) after the step (d), performing heat treatment to apply a stress to the first MISFET,
   wherein a gate length of the first MISFET is smaller than a gate length of the second MISFET.

2. A method of manufacturing a semiconductor device according to claim 1, further comprising the step of:
   (f) after the step (e), removing the second insulating film.

3. A method of manufacturing a semiconductor device according to claim 2,
   wherein, after the step (d), a thickness of the first insulating film in the second region is smaller than the thickness of the first insulating film in the first region.

4. A method of manufacturing a semiconductor device according to claim 3, further comprising the step of:
   (g) after the step (f), removing the first insulating film.

5. A method of manufacturing a semiconductor device according to claim 4, further comprising the step of:
   (h) after the step (g), forming a silicide film over each of source/drain regions of the first MISFET or the second MISFET formed in the semiconductor substrate formed of a silicon substrate.

6. A method of manufacturing a semiconductor device according to claim 1,
   wherein the first insulating film is a silicon oxide film, and the second insulating film is a silicon nitride film.

7. A method of manufacturing a semiconductor device according to claim 6,
   wherein the step (d) is the step of etching the second insulating film in the second region using, as a mask, a photoresist film formed over the second insulating film in the first region.

8. A method of manufacturing a semiconductor device according to claim 6,
   wherein the step (d) is the step of etching the second insulating film in the second region using, as a mask, a mask film made of a silicon oxide formed over the second insulating film in the first region.

9. A method of manufacturing a semiconductor device according to claim 3, further comprising the steps of:
   (g1) prior to the step (f), forming, over the first insulating film and the second insulating film, a third insulating film made of the same material as that of the first insulating film;
   (g2) removing the third insulating film and the second insulating film in the first region therefrom; and
   (g3) after the step (g2), removing the first insulating film and the third insulating film in the second region therefrom and removing the first insulating film in the first region therefrom.

10. A method of manufacturing a semiconductor device according to claim 2, further comprising, between the steps (b) and (c), the step of:
    removing a part of the first insulating film in the first region from a surface thereof such that a thickness of the first insulating film in the first region is smaller than the thickness of the first insulating film in the second region.

* * * * *